United States Patent [19]
Ema et al.

[11] Patent Number: 5,514,615
[45] Date of Patent: May 7, 1996

[54] METHOD OF PRODUCING A SEMICONDUCTOR MEMORY DEVICE HAVING THIN FILM TRANSISTOR LOAD

[75] Inventors: Taiji Ema; Kazuo Itabashi, both of Kawasaki, Japan

[73] Assignee: Fujitsu Limited, Kawasaki, Japan

[21] Appl. No.: 441,441

[22] Filed: May 15, 1995

Related U.S. Application Data

[62] Division of Ser. No. 373,502, Jan. 17, 1995, which is a continuation of Ser. No. 851,485, Mar. 13, 1992, abandoned.

[30] Foreign Application Priority Data

| Mar. 20, 1991 | [JP] | Japan | 3-080420 |
| Mar. 20, 1991 | [JP] | Japan | 3-080421 |
| Mar. 20, 1991 | [JP] | Japan | 3-080422 |
| Jun. 18, 1991 | [JP] | Japan | 3-145940 |

[51] Int. Cl.$^6$ .................. H01L 21/70; H01L 27/00
[52] U.S. Cl. .................. 437/52; 437/919
[58] Field of Search ............... 437/47, 60, 52, 437/919; 257/903–904

[56] References Cited

U.S. PATENT DOCUMENTS

| 4,764,801 | 8/1988 | McLaughlin et al. | 257/588 |
| 4,805,147 | 2/1989 | Yamanaka et al. | 365/154 |
| 4,833,644 | 5/1989 | Plus et al. | 365/53 |
| 4,849,801 | 7/1989 | Honjyo et al. | 365/154 |
| 4,853,894 | 8/1989 | Yamanaka et al. | 356/154 |
| 4,882,289 | 11/1989 | Moriuchi et al. | 437/52 |
| 4,984,200 | 1/1991 | Saitoo et al. | 365/154 |
| 5,051,951 | 9/1991 | Maly et al. | 365/150 |
| 5,111,427 | 5/1992 | Kobayashi et al. | 365/185 |
| 5,194,749 | 3/1993 | Meguro et al. | 257/903 |
| 5,204,834 | 4/1993 | Ochii et al. | 365/154 |
| 5,214,296 | 5/1993 | Nakata et al. | 257/71 |
| 5,214,304 | 5/1993 | Ema et al. | 257/412 |
| 5,239,196 | 8/1993 | Ikeda et al. | 257/385 |

FOREIGN PATENT DOCUMENTS

| 63-119254 | 9/1988 | Japan |
| 1-298763 | 12/1989 | Japan |
| 2-134869 | 5/1990 | Japan |
| 2-295164 | 12/1990 | Japan |
| 2-312271 | 12/1990 | Japan |

OTHER PUBLICATIONS

Yamanaka, et al., "A 25 µm$^2$ New Poly–Si PMOS Load (PPL) SRAM Having Excellent Soft Error Immunity", International Electron Devices Meeting, Dec. 1988, pp. 48–51.
Ishibashi, et al., "A α–Immune, 2–V Supply Voltage SRAM Using a Polysilicon PMOS Load Cell", IEEE Journal of Solid–State Circuits, vol. 25, No. 1, Feb. 1990, pp. 55–60.
Adan, et al., "A Half–Micron SRAM Cell Using a Double-–Gated Self–Aligned Polysilicon PMOS Thin Film Transistor (TFT) Load", Symposium on VLSI Technology, Jun. 1990, pp. 19–20.

Primary Examiner—Mary Wilczewski
Assistant Examiner—H. Jey Tsai
Attorney, Agent, or Firm—Staas & Halsey

[57] ABSTRACT

A method of producing a memory cell on a semiconductor substrate. The memory cell includes two transfer transistors, two driver transistors, two thin film transistor loads, and two memory capacitors. A field insulator layer is formed on the semiconductor substrate. A gate insulator layer is formed above the field insulator layer. A gate electrode of a driver transistor is produced by forming a first conductor layer above the gate insulator layer. Impurity regions are formed in the semiconductor substrate using the field insulator layer and the first conductor layer as masks. A first insulator layer is then formed. Source, drain and channel regions of a thin film transistor load are produced by forming a second conductor layer and injecting impurities into the second conductor layer. A second insulator layer is formed above the second conductor layer. A contact hole is formed to extend from the second insulator layer, through the second conductor layer, and to the first conductor layer. A storage electrode of a memory capacitor is produced by forming a third conductor layer which makes contact with the first conductor layer and the second conductor layer through the contact hole. A dielectric layer covering the storage electrode of the memory capacitor and a fourth conductor layer forming an opposing electrode of the memory capacitor are then successively produced.

18 Claims, 153 Drawing Sheets

FIG.12C
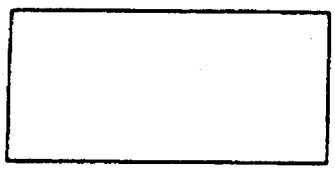

BIT LINE CONTACT HOLE 5,514,615

METHOD OF PRODUCING A SEMICONDUCTOR MEMORY DEVICE HAVING THIN FILM TRANSISTOR LOAD

This application is a division of application Ser. No. 08/373,502, filed Jan. 17, 1995, which is a File-Wrapper Continuation of application Ser. No. 07/851,485, filed Mar. 13, 1992, now abandoned.

BACKGROUND OF THE INVENTION

The present invention generally relates to semiconductor memory devices and methods of producing the same, and more particularly to a thin film transistor (TFT) load type static random access memory (SRAM) and a method of producing such a TFT load type SRAM.

High resistance load type SRAM are popularly used. However, as the integration density improves and the number of memory cells increases, the current consumption increases and various problems are generated. In order to avoid such problems, a SRAM having a TFT load has been realized through advances in semiconductor technology. However, new problems are generated due to the use of the TFT load.

An example of a conventional method of producing the high resistance load type SRAM will be described with reference to FIGS. 1A through 1J and FIGS. 2A through 2F. FIGS. 1A through 1J are side views in cross section showing essential parts of the high resistance load type SRAM at essential stages of the conventional method of producing the high resistance load type SRAM. FIGS. 2A through 2F are plan views of the high resistance load type SRAM at essential stages of the conventional method of producing the high resistance load type SRAM. FIGS. 1A through 1J respectively are cross sections taken along a line which corresponds to a line Y—Y in the plan view of FIG. 2F.

In FIG. 1A, a silicon dioxide ($SiO_2$) layer is used as a pad layer, for example, and a silicon nitride ($Si_3N_4$) layer which is formed on the $SiO_2$ layer is used as an oxidation resistant mask layer when carrying out a selective thermal oxidation (for example, a local oxidation of silicon (LOCOS)) so as to form a field insulator layer 2 on a silicon (Si) semiconductor substrate 1. This field insulator layer 2 is made of $SiO_2$ and has a thickness of 4000 Å, for example.

Then, the $Si_3N_4$ layer and the $SiO_2$ layer, which are used when carrying out the selective thermal oxidation, are removed to expose an active region of the Si semiconductor substrate 1.

In FIG. 1B, a thermal oxidation is carried out to form a gate insulator layer 3 which is made of $SiO_2$ and has a thickness of 100 Å, for example.

By carrying out a resist process of the photolithography technique and a wet etching using hydrofluoric acid as the etchant, the gate insulator layer 3 is selectively etched to form a contact hole 3A.

In FIGS. 1C and 2A, a chemical vapor deposition (CVD) is carried out to form a first polysilicon layer having a thickness of 1500 Å, for example.

Then, a vapor phase diffusion is carried out to introduce phosphorus (P) of $1 \times 10^{20}$ $cm^{-3}$, for example, so as to form an $n^+$-type impurity region 5'.

In FIG. 2A, the illustration of the first polysilicon layer is omitted for the sake of convenience.

In FIG. 1D, a resist process of the photolithography technique and a reactive ion etching (RIE) using $CCl_4/O_2$ as the etching gas are carried out to pattern the first polysilicon layer and form a gate electrode 4. The gate electrode 4 becomes the gate electrode of a word line and a driver transistor.

An ion implantation is carried out to inject As ions with a dosage of $3 \times 10^{15}$ $cm^{-2}$ and an acceleration energy of 40 keV, so as to form a source region 5 and a drain region 6.

In FIGS. 1E and 2B, a CVD is carried out to form an insulator layer 7 which is made of $SiO_2$ and has a thickness of 1000 Å, for example.

By carrying out a resist process of the photolithography technique and a RIE using $CHF_3/He$ as the etching gas, a ground line contact hole 7A is formed. This ground line contact hole 7A cannot be seen in FIG. 1E.

In FIG. 1F, a CVD is carried out to form a second polysilicon layer having a thickness of 1500 Å, for example.

Then, an ion implantation is carried out to inject P ions into the second polysilicon layer with a dosage of $4 \times 10^{15}$ $cm^{-2}$ and an acceleration energy of 30 keV, and an annealing is carried out to reduce the resistance.

A resist process of the photolithography technique and a RIE using $CCl_4/O_2$ as the etching gas are carried out to pattern the second polysilicon layer and form a ground line 8.

In FIGS. 1G and 2C, a CVD is carried out to form an insulator layer 9 which is made of $SiO_2$ and has a thickness of 1000 Å, for example.

A resist process of the photolithography technique and a RIE using $CHF_3/He$ as the etching gas are carried out to selectively etch the insulator layers 9 and 7 and form a load resistor contact hole 9A.

In FIG. 1H, a CVD is carried out to form a third polysilicon layer having a thickness of 1500 Å, for example.

A resist process of the photolithography technique and an ion implantation with a dosage of $1 \times 10^{15}$ $cm^{-2}$ and an acceleration energy of 30 keV are carried out to inject As ions into a part where a supply line of a positive power source voltage Vcc is formed and a part where the high resistance load makes contact with the gate electrode 4.

By carrying out a resist process of the photolithography technique and a RIE using $CCl_4/O_2$ as the etching gas, the third polysilicon layer is patterned to form a contact part 10, a high resistance load 11 and a Vcc supply line 12.

In FIGS. 1I and 2D, a CVD is carried out to form an insulator layer which is made of $SiO_2$ and has a thickness of 1000 Å, for example, and an insulator layer which is made of phosphosilicate glass (PSG) and has a thickness of 5000 Å, for example. In FIG. 1I, these insulator layers are referred to as an insulator layer 13.

A thermal process is thereafter carried out to reflow and planarize the insulator layer 13.

Next, a resist process of the photolithography technique and a RIE using $CHF_3/He$ as the etching gas are carried out to selectively etch the insulator layer 13 and the like and to form a bit line contact hole 13A.

In FIGS. 1J and 2E, a sputtering is carried out to form an aluminum (Al) layer having a thickness of 1 μm, for example. This Al layer is patterned using the normal photolithography technique so as to form a bit line 14. Those elements which are shown in FIGS. 1J and 2E but not yet described such as "BL", will be readily understood from the description given later in conjunction with FIG. 3.

FIG. 2F shows the plan view of the essential part of the high resistance load type SRAM which is completed by the above described processes. In FIG. 2F, those parts which are the same as those corresponding parts in FIGS. 1A through 1J and FIGS. 2A through 2E are designated by the same reference numerals. However, for the sake of convenience, the illustration of the Al bit line 14 shown in FIGS. 1J and 2E is omitted in FIG. 2F.

FIG. 3 shows an equivalent circuit diagram of the essential part of the high resistance load type SRAM described above in conjunction with FIGS. 1A through 1J and 2A through 2F.

FIG. 3 shows driver transistors Q1 and Q2, transfer gate transistors Q3 and Q4, high resistance loads R1 and R2, a word line WL, bit lines BL and/BL, nodes S1 and S2, the positive power source voltage Vcc, and a negative power source voltage Vss.

The operation of this high resistance load type SRAM, the storage operation in particular, is carried out as follows.

If it is assumed that the positive power source voltage Vcc is 5 V, the negative power source voltage Vss is 0 V, the node S1 is 5 V and the node S2 is 0 V, the transistor Q2 is ON and the transistor Q1 is OFF. The potential at the node S1 is maintained to 5 V if the transistor Q1 is OFF and the resistance is sufficiently high compared to the high resistance load R1. The potential at the node S2 is maintained to 0 V if the transistor Q2 is ON and the resistance is sufficiently low compared to the high resistance load R2.

However, under the above described condition, a D.C. current flows from the positive power source voltage Vcc supply line to the negative power source voltage Vss supply line via the node S2, and the current value is inversely proportional to the value of the high resistance load R2.

When the integration density of the above described high resistance load type SRAM increases, the number of memory cells per chip increases and the current consumption of the entire chip would become very large if the current consumption per memory is not reduced. Hence, the D.C. current described above must be reduced, but in order to reduce this D.C. current, the values of the high resistance loads R1 and R2 must be set large. However, when the values of the high resistance loads R1 and R2 are set large, it becomes difficult to stably maintain the potential at the node having the driver transistor which is OFF, that is, the potential at the node S1 in FIG. 3.

Because of the above described background, the TFT load type SRAM which uses the TFT as the load in place of the high resistance load has been developed.

Next, a description will be given of the TFT load type SRAM. Similarly to the description given above in respect of the high resistance load type SRAM, a description will first be given of the method of producing the TFT load type SRAM.

An example of a conventional method of producing the TFT load type SRAM will be described with reference to FIGS. 4A through 4D and FIGS. 5A through 5D. FIGS. 4A through 4D are side views in cross section showing essential parts of the TFT load type SRAM at essential stages of the conventional method of producing the high resistance load type SRAM. FIGS. 5A through 5D are plan views of the TFT load type SRAM at essential stages of the conventional method of producing the TFT load type SRAM. FIGS. 4A through 4D respectively are cross sections taken along a line which corresponds to a line Y—Y in the plan view of FIG. 5D.

The processes of producing the TFT load type SRAM at the beginning are basically the same as the processes described in conjunction with FIGS. 1A through 1G up to the process of forming the load resistor contact hole 9A of the high resistance load type SRAM, and a description thereof will be omitted. The only difference is that a contact hole 8A shown in FIG. 5A is formed with respect to the ground line 8 which is made of the second polysilicon layer, so that a gate electrode of a TFT which is formed by a third polysilicon layer can make contact with an active region and the gate electrode 4 which is formed by the first polysilicon layer. Hence, a description will only be given from the processes thereafter. In FIGS. 4A through 4D and 5A through 5D, those parts which are the same as those corresponding parts in FIGS. 1A through 1J and 2A through 2F are designated by the same reference numerals.

In FIGS. 4A and 5A, a CVD is carried out to form a third polysilicon layer having a thickness of 1500 Å, for example.

Then, an ion implantation is carried out to inject P ions with a dosage of $4\times10^{15}$ cm$^{-2}$ and an acceleration energy of 30 keV.

Further, a resist process of the photolithography technique and a RIE using $CCl_4/O_2$ as the etching gas are carried out to pattern the third polysilicon layer and form a gate electrode 15 of the TFT.

In FIG. 4B, a CVD is carried out to form a gate insulator layer 16 of the TFT, which is made of $SiO_2$ and has a thickness of 300 Å, for example.

A resist process of the photolithography technique and a wet etching using hydrofluoric acid as the etchant are carried out to selectively etch the gate insulator layer 16 and form a drain contact hole 16A.

In FIGS. 4C and 5B, a CVD is carried out to form a fourth polysilicon layer having a thickness of 500 Å, for example. In addition, a resist process of the photolithography technique and an ion implantation are carried out to inject impurities into the fourth polysilicon layer to form a source and a drain of the TFT.

A resist process of the photolithography technique and a RIE using $CCl_4/O_2$ as the etching gas are carried out to pattern the fourth polysilicon layer and form a source region 17, a drain region 18 and a channel region 19 of the TFT and also form a Vcc supply line 20.

In FIGS. 4D and 5C, a CVD is carried out to form an insulator layer made of $SiO_2$ and having a thickness of 1000 Å, for example, and an insulator layer made of PSG and having a thickness of 5000 Å, for example. In FIG. 4D, these two insulator layers are shown as one insulator layer 21, similarly as in the case of FIGS. 1I and 1J.

Then, a thermal process is carried out to reflow and planarize the insulator layer 21.

Next, a resist process of the photolithography technique and a RIE using $CHF_3/He$ as the etching gas are carried out to selectively etch the insulator layer 21 and the like and to form a bit line contact hole.

A sputtering is carried out thereafter to form an Al layer having a thickness of 1 μm, for example, and this Al layer is patterned by the normal photolithography technique to form a bit line 22. Those elements which are shown in FIGS. 4D and 5C but not yet described, such as "BL", will be readily understood from the description given later in conjunction with FIG. 6.

FIG. 5D shows the plan view of the essential part of the TFT load type SRAM which is completed by the above described processes. In FIG. 5D, those parts which are the same as those corresponding parts in FIGS. 4A through 4D and FIGS. 5A through 5D are designated by the same reference numerals. However, for the sake of convenience, the illustration of the Al bit line 22 shown in FIGS. 4D and 5C is omitted in FIG. 5D.

FIG. 6 shows an equivalent circuit diagram of an essential part of the TFT load type SRAM described in conjunction with FIGS. 4A through 4D and 5A through 5D. In FIG. 6, those parts which are the same as those corresponding parts in FIGS. 4A through 4D and 5A through 5D are designated by the same reference numerals.

FIG. 6 shows transistors Q5 and Q6 which are load TFTs used in place of the high resistance loads R1 and R2 shown in FIG. 3.

Next, a description will be given of the operation of the TFT load type SRAM, and the storing operation in particular.

If it is assumed that the positive power source voltage Vcc is 5 V, the negative power source voltage Vss is 0 V, the node S1 is 5 V and the node S2 is 0 V, the transistor Q6 is OFF when the transistor Q2 is ON and the transistor Q5 is ON when the transistor Q1 is OFF. The potential at the node S1 is maintained to 5 V if the transistor Q1 is OFF and the resistance is sufficiently high compared to the transistor Q5 which is ON. The potential at the node S2 is maintained to 0 V if the transistor Q2 is ON and the resistance is sufficiently small compared to the transistor Q6 which is OFF.

Under the above described condition, the resistance of the load transistor Q5 or Q6 changes depending on the stored information and, thus, the problems of the high resistance load type SRAM is eliminated. That is, it is possible to carry out a stable information storage operation. The channels of the transistors Q5 and Q6, that is, the channels of the load TFTs, are made of polysilicon. The crystal state of the polysilicon which forms the channels is considerably poor compared to the single crystal, and a current easily leaks even when the transistor is OFF. Such a leak current increases the current consumption of the chip. Therefore, it is desirable to make the channel as small as possible.

On the other hand, as may be readily seen from FIG. 4D, the bit line 22, which is made of the Al layer, is provided at the top layer of the TFT load type SRAM. In addition, the channel of the load TFT exists immediately under the bit line 22 via the insulator layer 21, which is made of PSG or the like.

But according to this construction, the bit line 22, which is made of the Al layer, can be regarded as a gate electrode of a transistor, and the underlying insulator layer 21 can be regarded as a gate insulator layer of this transistor. In addition, the potential of the bit line 22, which is regarded as the gate electrode, varies between 0 v (Vss) and 5 V (Vcc). As a result, the TFT which should be OFF, that is, the transistor Q6 becomes nearly ON, and the leak current increases and the parasitic effect becomes notable.

Accordingly, a double gate structure TFT load type SRAM was developed in order to eliminate the above described problems of the TFT load type SRAM.

According to the double gate structure TFT load type SRAM, the above described problems of the TFT load type SRAM are eliminated by interposing the third polysilicon layer of the TFT load type SRAM described in conjunction with FIGS. 4 through 6 between the fourth polysilicon layer and the bit line 22 which is made of Al. Particularly, a fifth polysilicon layer forming a second gate electrode which has the same pattern as the gate electrode 15 of the TFT is interposed between the Al bit line 22 and the fourth polysilicon layer which forms the source region 17, the drain region 18, the channel region 19, the Vcc supply line 20 and the like.

FIGS. 7A through 7C are side views in cross section showing essential parts of the double gate structure TFT load type SRAM at essential stages of the conventional method of producing the double gate structure TFT load type SRAM. The processes of producing the double gate structure TFT load type SRAM at the beginning are basically the same as the processes described in conjunction with FIGS. 4A through 4C up to the process of forming the source region 17, the drain region 18, the channel region 19 and the Vcc supply line 20 of the TFT load type SRAM, and a description thereof will be omitted. Hence, a description will only be given from the processes thereafter. In FIGS. 7A through 7C, those parts which are the same as those corresponding parts in FIGS. 1 through 6 are designated by the same reference numerals.

In FIG. 7A, a CVD is carried out to form an insulator layer 23 which is made of $SiO_2$ and has a thickness of 500 Å, for example.

A resist process of the photolithography technique and a RIE using $CHF_3$+He as the etching gas are carried out to selectively etch the insulator layer 23 and to form a contact hole 23A with respect to the drain region 18 of the TFT.

In FIG. 7B, a CVD is carried out to form a fifth polysilicon layer having a thickness of 1000 Å, for example.

Then, an ion implantation is carried out to inject P ions into the fifth polysilicon layer with a dosage of $4 \times 10^{15}$ cm$^{-2}$ for example A resist process of the photolithography technique and a RIE using $CCl_4/O_2$ as the etching gas are carried out to pattern the fifth polysilicon layer and to form a second gate electrode 24 of the TFT.

In FIG. 7C, a CVD is carried out to form an insulator layer which is made of $SiO_2$ and has a thickness of 1000 Å, for example, and an insulator layer which is made of PSG and has a thickness of 5000 Å, for example. As in the case shown in FIG. 4D, these two insulator layers are shown as one insulator layer 25 in FIG. 7C.

Thereafter, a thermal process is carried out to fellow and planarize the insulator layer 25.

Next, a resist process of the photolithography technique and a RIE using $CHF_3$/He as the etching gas are carried out to selectively etch the insulator layer 25 and the like, and to form a bit line contact hole.

In addition, a sputtering is carried out to form an Al layer having a thickness of 1 μm, for example, and this Al layer is patterned by the normal photolithography technique so as to form a bit line 26.

As described heretofore, the SRAM started from the high resistance load type, evolved to the TFT load type, and further evolved to the double gate structure TFT load type. However, as may be seen by comparing FIGS. 1A through 1J with FIGS. 7A through 7C, and FIGS. 1J and 7C in particular, the number of polysilicon layers has increased by two from the high resistance load type SRAM to the double gate structure TFT load type SRAM, and the number of mask processes have increased by four.

In not only the SRAMs described above but for the semiconductor memory devices in general, the highest proposition is to improve the integration density. The SRAMs which have been proposed recently have an even larger integration density compared to those of the existing SRAMs, and this tendency of further increased integration density has introduced new problems.

Generally, the SRAM also requires a memory capacitor, as is well known. Normally, a node between the driver transistor and the load and the stray capacitance in the vicinity of this node are used as the memory capacitor. Accordingly, the capacitance of the memory capacitor is smallest for the high resistance load type SRAM, slightly larger for the TFT load type SRAM, and largest for the double gate structure TFT load type SRAM.

However, even in the case of the double gate structure TFT load type SRAM, the capacitance of the memory capacitor becomes insufficient as the integration density further increases.

Therefore, instead of relying on the stray capacitance, it becomes necessary to intentionally and independently from the memory capacitance. But the number of mask processes is already relatively large as described above. For this reason, it is essential to minimize the number of processes required to form the memory capacitor.

SUMMARY OF THE INVENTION

Accordingly, it is a general object of the present invention to provide a novel and useful thin film transistor (TFT) load type static random access memory (SRAM) in which the problems described above are eliminated.

Another and more specific object of the present invention is to provide a semiconductor memory device comprising a semiconductor substrate, a memory cell provided on the semiconductor substrate and including first and second transfer transistors, first and second driver transistors, first and second thin film transistor loads, and first and second memory capacitors, where each of the first and second transfer transistors and the first and second driver transistors have a source, a drain and a gate electrode, each of the first and second thin film transistor loads have a source electrode, a drain electrode and one or two gate electrodes, and each of the first and second memory capacitors have a storage electrode, a dielectric layer which covers the storage electrode, and an opposing electrode which is formed on the dielectric layer, and a connection region in which the storage electrode of the first memory capacitor, the drain of the second thin film transistor load, the gate electrode of the first thin film transistor load and the gate electrode of the first driver transistor are connected, where the storage electrode of the first memory capacitor is made up of one or a plurality of fins. According to the semiconductor memory device of the present invention, it is possible to produce a semiconductor memory device in which a memory capacitor is intentionally provided in addition to the stray capacitance, by a relatively simple process. As a result, the semiconductor memory device is not easily affected by radiation and the soft error is prevented.

Still another object of the present invention is to provide a semiconductor memory device comprising a semiconductor substrate, a memory cell provided on the semiconductor substrate and including first and second transfer transistors, first and second driver transistors, first and second thin film transistor loads having a double gate structure, and first and second memory capacitors, where each of the first and second transfer transistors and the first and second driver transistors have a source, a drain and a gate electrode, each of the first and second thin film transistor loads have a source electrode, a drain electrode and upper and lower gate electrodes, and each of the first and second memory capacitors have a storage electrode, a dielectric layer which covers the storage electrode, and an opposing electrode which is formed on the dielectric layer, and a connection region in which the storage electrode of the first memory capacitor, the drain of the second thin film transistor load, the gate electrode of the first thin film transistor load and the gate electrode of the first driver transistor are connected, where the storage electrode of the first memory capacitor is used in common as the upper gate electrode of the first thin film transistor load. According to the semiconductor memory device of the present invention, it is possible to produce a semiconductor memory device in which a memory capacitor is intentionally provided, in addition to the stray capacitance, by a relatively simple process. As a result, and the semiconductor memory device is not easily affected by radiation and the soft error is prevented.

A further object of the present invention is to provide a semiconductor memory device comprising a semiconductor substrate, a memory cell provided on the semiconductor substrate and including first and second transfer transistors, first and second driver transistors, first and second thin film transistor loads, and first and second memory capacitors, where each of the first and second transfer transistors and the first and second driver transistors have a source, a drain and a gate electrode, each of the first and second thin film transistor loads have a source electrode, a drain electrode and one or two gate electrodes, and each of the first and second memory capacitors have a storage electrode, a dielectric layer which covers the storage electrode and an opposing electrode which is formed on the dielectric layer, and a connection region in which the storage electrode of the first memory capacitor, the drain of the second thin film transistor load, the gate electrode of the first thin film transistor load and the gate electrode of the first driver transistor are connected, where the storage electrode of the first memory capacitor, the drain of the second thin film transistor load, the gate electrode of the first thin film transistor load and the gate electrode of the first driver transistor are stacked via insulator layers within the connection region, and an uppermost one of the electrodes makes contact with a top surface of a lowermost one of the electrodes and with side surfaces of remaining ones of the electrodes other than the uppermost and lowermost electrodes. According to the semiconductor memory device of the present invention, it is possible to produce a semiconductor memory device in which a memory capacitor is intentionally provided, in addition to the stray capacitance, by a relatively simple process. As a result, and the semiconductor memory device is not easily affected by radiation and the soft error is prevented.

Another object of the present invention is to provide a method of producing a semiconductor memory device which includes a memory cell made up of two transfer transistors, two driver transistors, two thin film transistor loads, and two memory capacitors, comprising the steps of (a) forming a gate insulator layer on a semiconductor substrate after forming a field insulator layer on a surface of the semiconductor substrate, (b) forming a gate electrode of the driver transistor by forming a first conductor layer and patterning the first conductor layer, (c) forming a first insulator layer after forming impurity regions in the semiconductor substrate using the field insulator layer and the first conductor layer as masks, (d) forming source, drain and channel regions of the thin film transistor load by forming a second conductor layer and selectively injecting impurities into the second conductor layer, (e) forming a second insulator layer after patterning the second conductor layer, (f) forming a contact hole which extends from a top surface of the second insulator layer and reaches a top surface of the first conductor layer, (g) forming a storage electrode of the memory capacitor by forming a third conductor layer which makes contact with the top surface of the first conductor layer and with a side surface of the second conductor layer and patterning the third conductor layer, and (h) successively forming a dielectric layer which covers the storage electrode of the memory capacitor and a fourth conductor layer which forms an opposing electrode of the memory capacitor.

Still another object of the present invention is to provide a method of producing a semiconductor memory device which includes a memory cell made up of two transfer transistors, two driver transistors, two thin film transistor loads, and two memory capacitors, comprising the steps of (a) forming a gate insulator layer on a semiconductor substrate after forming a field insulator layer on a surface of the semiconductor substrate, (b) forming a gate electrode of the driver transistor by forming a first conductor layer and patterning the first conductor layer, (c) forming a first insulator layer after forming impurity regions in the semiconductor substrate using the field insulator layer and the first conductor layer as masks, (d) forming source, drain and channel regions of the thin film transistor load by forming a second conductor layer and selectively injecting impurities into the second conductor layer, (e) forming an upper gate insulator layer of the thin film transistor load by forming a second insulator layer after patterning the second conductor layer, (f) forming a third insulator layer after forming a third conductor layer, (g) forming a contact hole which extends from a top surface of the third insulator layer and reaches a top surface of the first conductor layer, (h) forming a storage electrode of the memory capacitor by forming a fourth conductor layer which makes contact with the top surface of the first conductor layer and with side surfaces of the second and third conductor layers and patterning the fourth conductor layer, the third insulator layer and the third conductor layer, the patterned fourth and fifth conductor layers forming fins of the memory capacitor and an upper gate electrode of the thin film transistor load, the patterned third insulator layer forming a spacer of the memory capacitor, (i) removing the third insulator layer which forms the spacer between the storage electrode of the memory capacitor and the upper gate electrode of the thin film transistor load, and (j) successively forming a dielectric layer which covers the storage electrode of the memory capacitor and a fifth conductor layer which forms an opposing electrode of the memory capacitor, where the opposing electrode also functions as a ground line.

A further object of the present invention is to provide a method of producing a semiconductor memory device which includes a memory cell made up of two transfer transistors, two driver transistors, two thin film transistor loads, and two memory capacitors, comprising the steps of (a) forming a gate insulator layer on a semiconductor substrate after forming a field insulator layer on a surface of the semiconductor substrate, (b) forming a gate electrode of the driver transistor by forming a first conductor layer and patterning the first conductor layer, (c) forming a first insulator layer after forming impurity regions in the semiconductor substrate using the field insulator layer and the first conductor layer as masks, (d) forming a lower gate insulator layer of the thin film transistor load by forming a second insulator layer after forming a lower gate electrode of the thin film transistor load by forming and patterning a second conductor layer, (e) forming source, drain and channel regions of the thin film transistor load by forming a third conductor layer and selectively injecting impurities into the third conductor layer, (f) forming a third insulator layer after patterning the third conductor layer, (g) forming a fourth insulator layer after forming a fourth conductor layer, (h) forming a contact hole which extends from a top surface of the fourth insulator layer and reaches a top surface of the first conductor layer, (i) forming a storage electrode of the memory capacitor by forming a fifth conductor layer which makes contact with the top surface of the first conductor layer and with side surfaces of the second, third and fourth conductor layers and patterning the fifth conductor layer, the fourth insulator layer and the fourth conductor layer, the patterned fifth and fourth conductor layers forming fins of the memory capacitor, the patterned fourth insulator layer forming a spacer of the memory capacitor, (j) removing the fourth insulator layer which forms the spacer between the storage electrode of the memory capacitor and the upper gate electrode of the thin film transistor load, and (k) successively forming a dielectric layer which covers the storage electrode of the memory capacitor and a sixth conductor layer which forms an opposing electrode of the memory capacitor, where the opposing electrode also functions as a shield electrode of the thin film transistor load.

Other objects and further features of the present invention will be apparent from the following detailed description when read in conjunction with the accompanying drawings.

BRIEF DESCRIPTION OF THE DRAWINGS

FIGS. 1A through 1J are side views in cross section showing essential parts of a high resistance load type SRAM at essential stages of a conventional method of producing the high resistance load type SRAM;

FIGS. 12A through 12G are plan views of the semiconductor memory device at essential stages of the third embodiment of the method shown in FIGS. 11A through 11J;

DESCRIPTION OF THE PREFERRED EMBODIMENTS

Figure 1A:
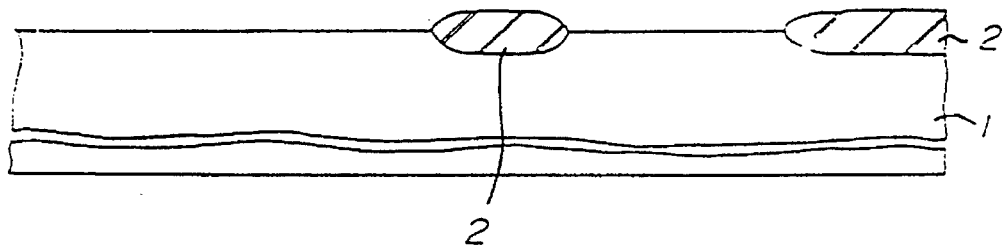
Figure 1B:
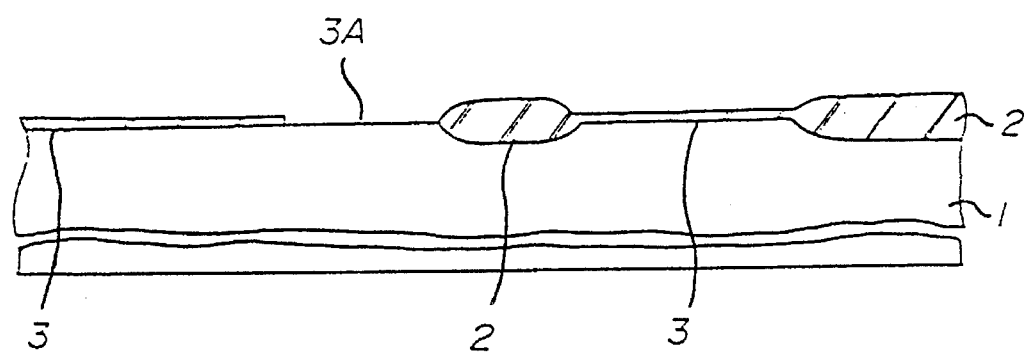
Figure 1C:
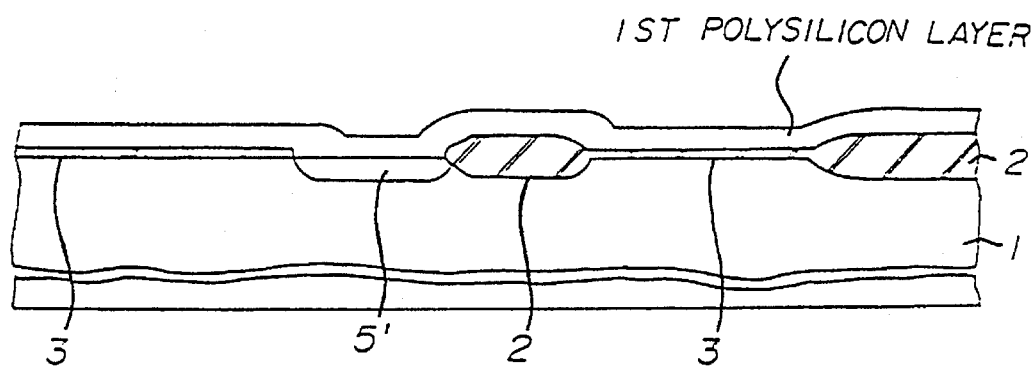

First, a description will be given of a first embodiment of a semiconductor memory device, according to the present invention, which is produced by a first embodiment of a method of producing the semiconductor memory device, according to the present invention. FIGS. 8A through 8F are side views in cross section showing an essential part of the first embodiment of the semiconductor memory device according to the present invention at essential stages of the first embodiment of the method of producing the semiconductor memory device according to the present invention. In FIGS. 8A through 8F, those parts which are the same as those corresponding parts in FIGS. 1A through 1J are designated by the same reference numerals.

In this embodiment of the method, the processes are the same as those of the prior art up to the processes shown in FIGS. 1A through 1F, that is, until the ground line 8 is formed from the second polysilicon layer. Hence, a description will only be given of the processes carried out thereafter.

Figure 8A:
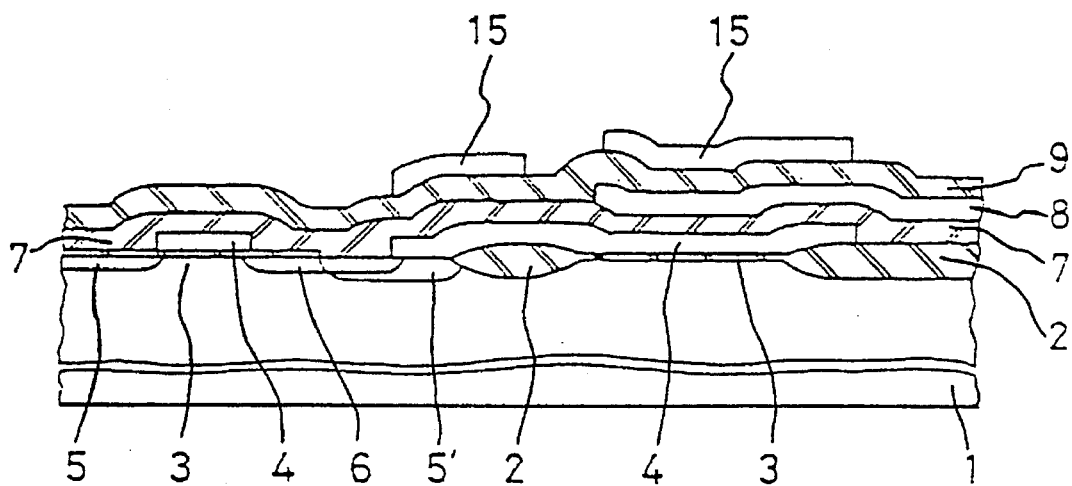
FIGS. 8A through 8F are side views in cross section showing an essential part of a first embodiment of a semiconductor memory device according to the present invention at essential stages of a first embodiment of a method of producing the semiconductor memory device according to the present invention.

In FIG. 8A, the double gate structure TFT load type SRAM already has on the Si semiconductor substrate 1 the field insulator layer 2, the gate insulator layer 3, the gate electrode 4 of the driver transistor formed from the first polysilicon layer, the $n^+$-type impurity region 5', the $n^+$-type source region 5, the $n^+$-type drain region 6, the insulator layer 7, and the ground line 8 formed from the second polysilicon layer.

A CVD is carried out to form on the entire surface an insulator layer 9 which is made of $SiO_2$ and has a thickness of 1000 Å, for example.

Then, a CVD is carried out to form a third polysilicon layer having a thickness of 500 Å, for example.

An ion implantation is carried out to inject P ions into the third polysilicon layer with a dosage of $1 \times 10^{15}$ cm$^{-2}$ and an acceleration energy of 10 keV.

In addition, a resist process of the photolithography technique and a RIE using $CCl_4/O_2$ as the etching gas are carried out to pattern the third polysilicon layer and to form a lower gate electrode 15 of the TFT load.

Figure 8B:
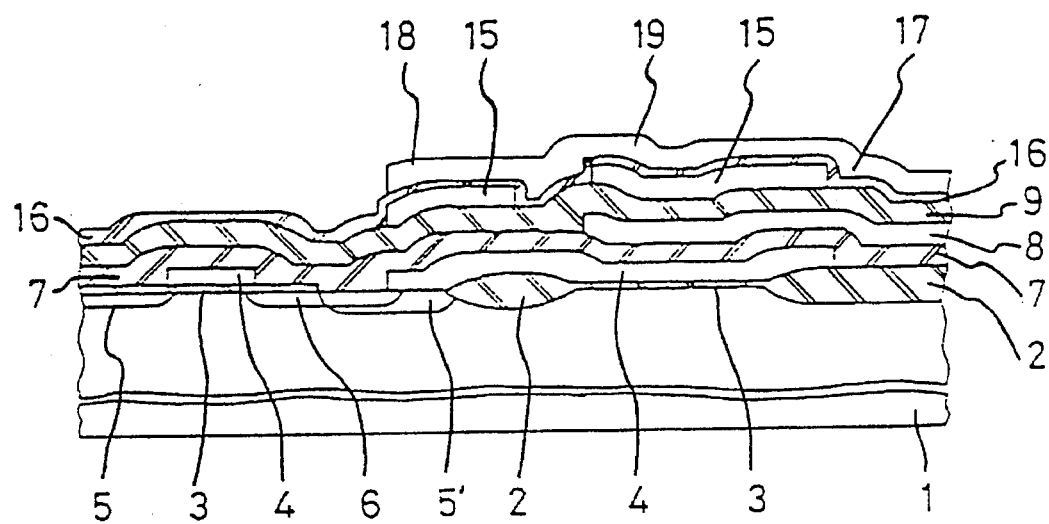

In FIG. 8B, a CVD is carried out to form a lower gate insulator layer 16 of the TFT load which is made of $SiO_2$ and has a thickness of 200 Å, for example.

A CVD is then carried out to form a fourth polysilicon layer having a thickness of 200 Å, for example.

A resist process of the photolithography technique and an ion implantation are carried out to inject B ions with a dosage of $1 \times 10^{14}$ cm$^{-2}$ and an acceleration energy of 5 keV, for example, into parts of the fourth polysilicon layer where source and drain regions of the TFT load are formed.

Next, a resist process of the photolithography technique and a RIE using $CCl_4/O_2$ as the etching gas are carried out to pattern the fourth polysilicon layer and to form a source region 17, a drain region 18 and a channel region 19 of the TFT load, a Vcc supply line and the like. The Vcc supply line cannot be seen in FIG. 8B.

Figure 8C:
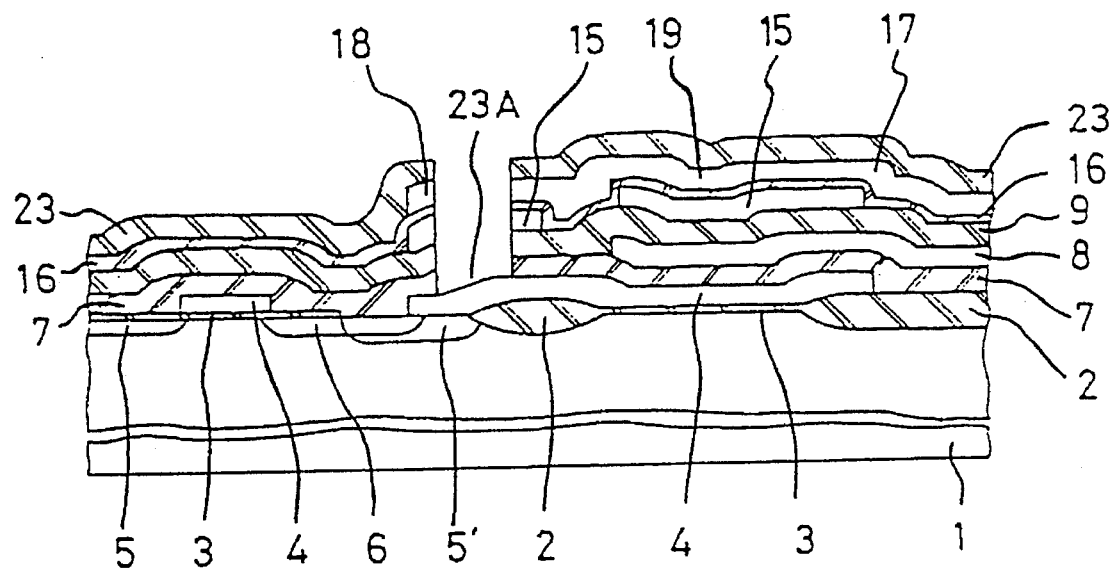

In FIG. 8C, a CVD is carried out to form an insulator layer 23 which is made of $SiO_2$ and has a thickness of 500 Å, for example.

A resist process of the photolithography technique and RIEs using $CHF_3/He$ and $CCl_4/O_2$ as the etching gases for respectively etching $SiO_2$ and polysilicon are carried out to selectively etch the insulator layer 23, the drain region 18 of the TFT load formed from the fourth polysilicon layer, the gate insulator layer 16, the gate electrode 15 formed from the third polysilicon layer, the insulator layer 9 and the insulator layer 7 and to form a contact hole 23A. This contact hole 23A extends from the top surface of the insulator layer 23 to the top surface of the gate electrode 4 of the driver transistor formed from the first polysilicon layer. This process forms an essential part of this embodiment of the method.

Figure 8D:
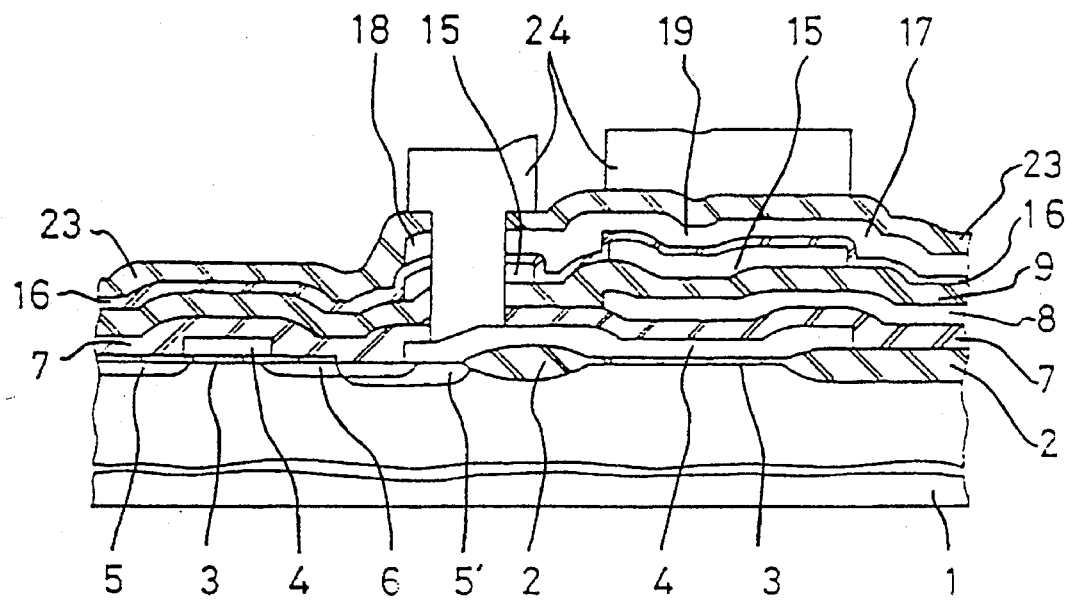

In FIG. 8D, a CVD is carried out to form a fifth polysilicon layer having a thickness of 2000 Å, for example.

A thermal diffusion process is carried out to diffuse P in the fifth polysilicon layer with an impurity concentration of $1 \times 10^{21}$ cm$^{-3}$, for example.

A resist process of the photolithography technique and a RIE using $CCl_4/O_2$ as the etching gas are carried out to pattern the fifth polysilicon layer and to form an electrode 24. This electrode 24 is used in common as an upper gate electrode of the TFT load and the storage electrode of a memory capacitor. This storage electrode forms the characterizing part of this embodiment, because the storage electrode is thick and the side surface area thereof is positively used to realize a large capacitance.

Figure 8E:
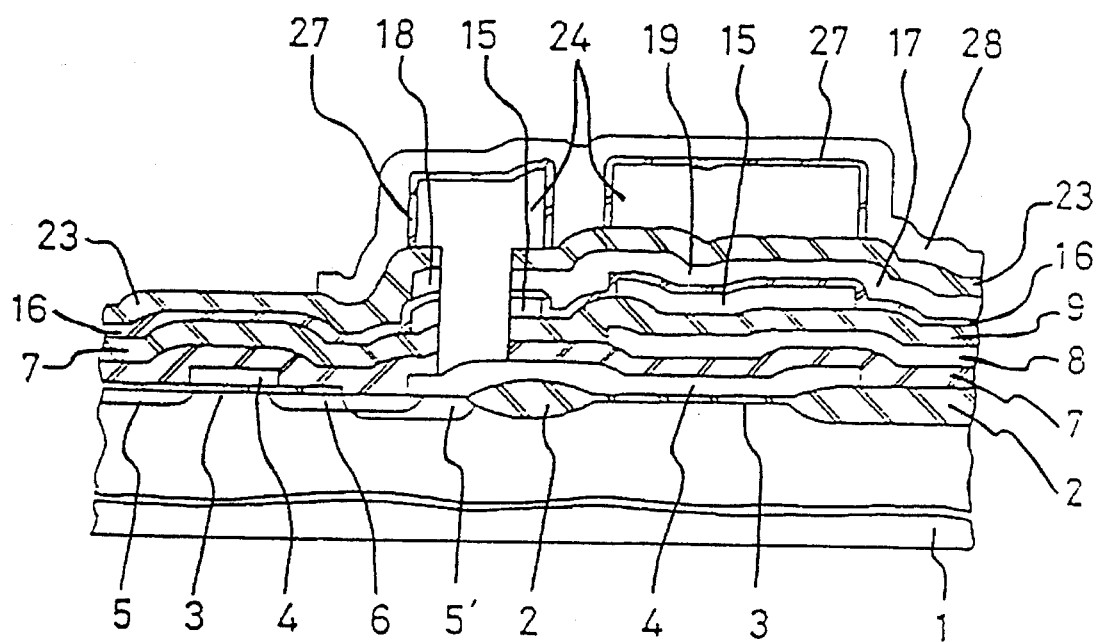

In FIG. 8E, a CVD is carried out to form on the electrode 24 a dielectric layer 27 which is made of $Si_3N_4$ and has a thickness of 100 Å, for example.

Then, a CVD is carried out to form a sixth polysilicon layer having a thickness of 1000 Å, for example.

A thermal diffusion process is carried out to diffuse P in the sixth polysilicon layer with an impurity concentration of $1 \times 10^{21}$ cm$^{-3}$, for example.

A resist process of the photolithography technique and a RIE using $CCl_4/O_2$ as the etching gas are carried out to pattern the sixth polysilicon layer and to form an opposing electrode 28 of the memory capacitor. This process of forming the opposing electrode 28 also forms an essential part of this embodiment of the method.

Figure 8F:
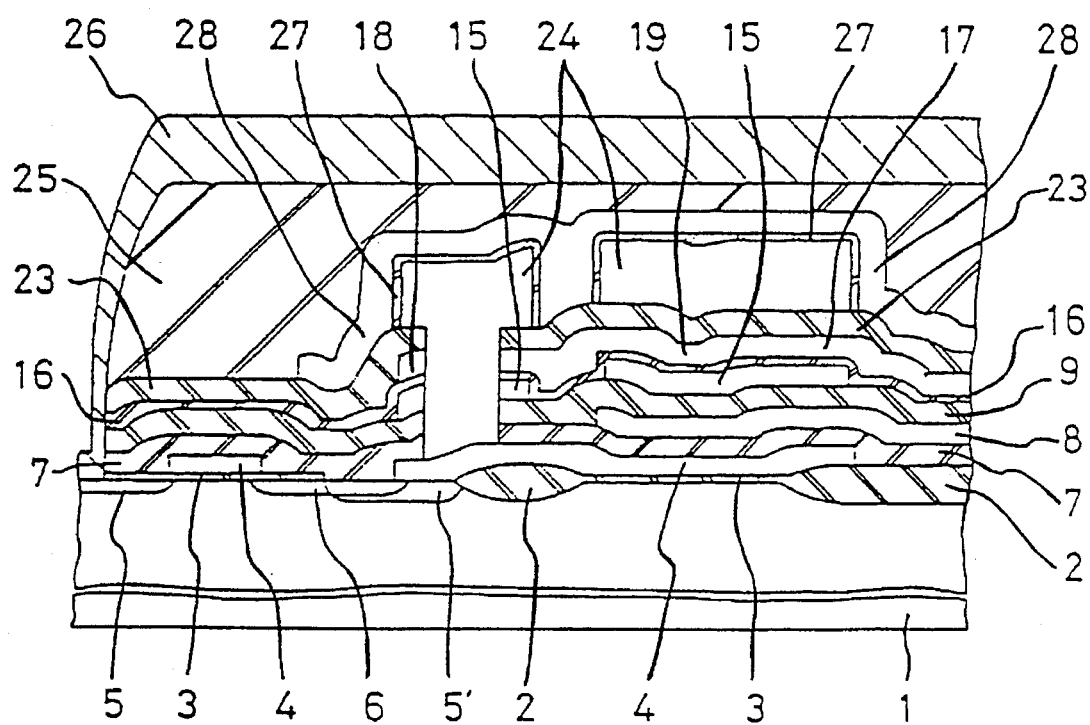

In FIG. 8F, A CVD is carried out to form an insulator layer which is made of $SiO_2$ and has a thickness of 1000 Å, for example, and an insulator layer which is made of PSG and has a thickness of 5000 Å, for example. In FIG. 8F, these two insulator layers are shown as an insulator layer 25.

Next, a thermal process is carried out to reflow and planarize the insulator layer 25.

A resist process of the photolithography technique and a RIE using $CHF_3/He$ as the etching gas are carried out to selectively etch the insulator layer 25 and the like and to form a bit line contact hole.

A sputtering is carried out to form an Al layer having a thickness of 1 μm, for example, and this Al layer is patterned into a bit line 26 using the normal photolithography technique.

Figure 7A:
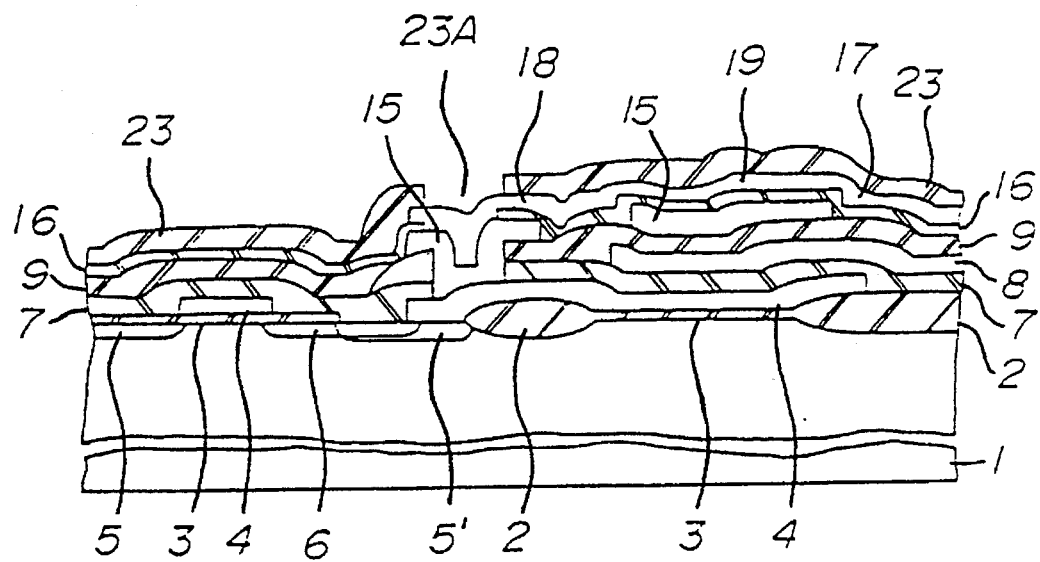
FIGS. 7A through 7C are side views in cross section showing essential parts of a double gate structure TFT load type SRAM at essential stages of a conventional method of producing the double gate structure TFT load type SRAM.
Figure 7B:
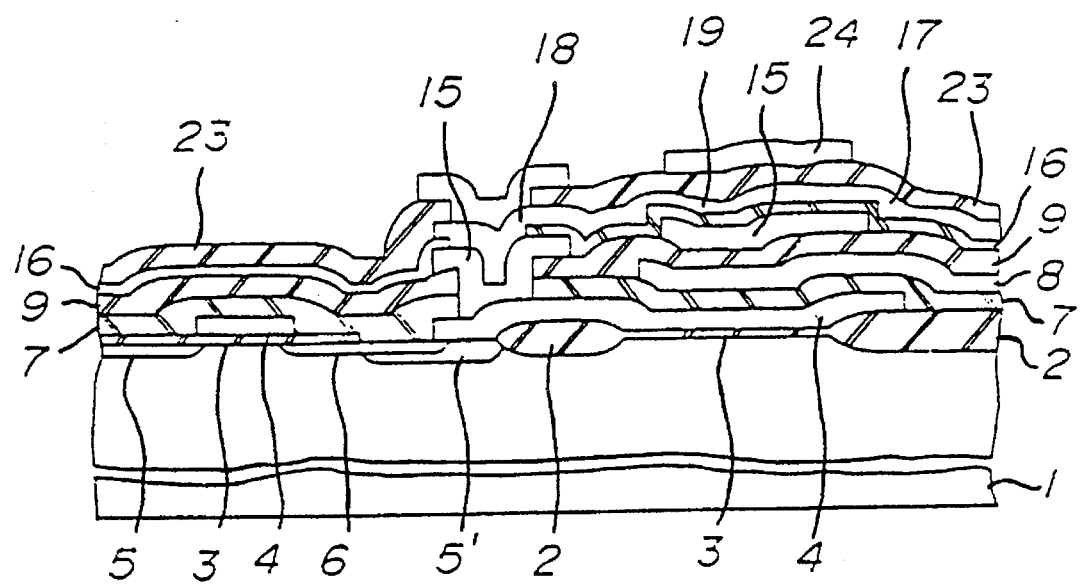
Figure 7C:
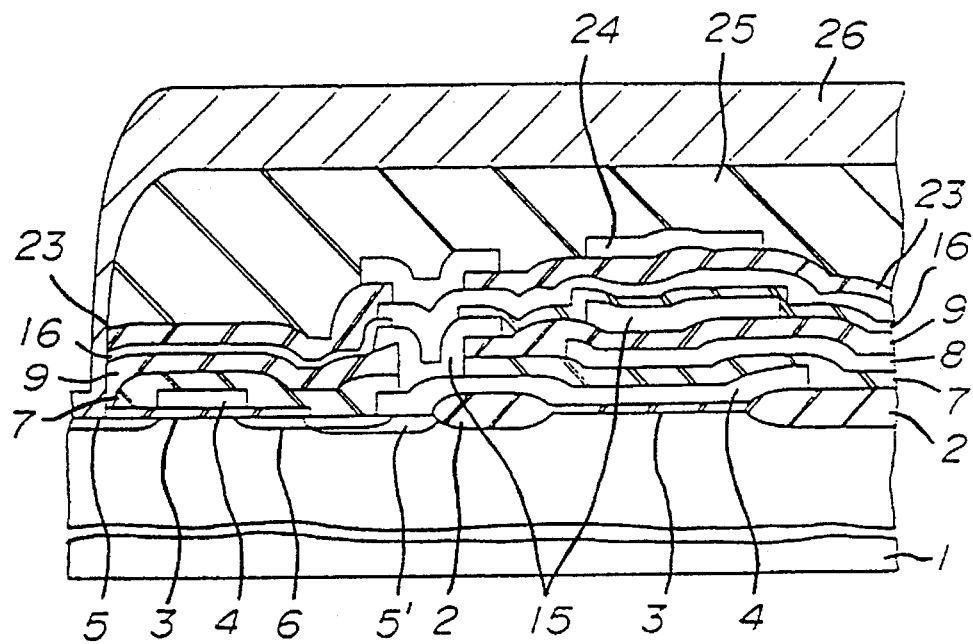

According to this embodiment, one additional mask process is necessary to form the opposing electrode 28. However, as described above in conjunction with the process related to FIG. 8C, the contact hole 23A for connecting the TFT load and the driver transistor is formed in one mask process, and the number of mask processes in this respect is reduced by two compared to the prior art described above in conjunction with FIGS. 7A through 7C. Therefore, when the entire production process of this embodiment is compared to that of the prior art of FIGS. 7A through 7C, the number of mask processes is reduced by one.

Next, a description will be given of a second embodiment of the semiconductor memory device according to the present invention which is produced by a second embodiment of the method of producing the semiconductor memory device according to the present invention. FIGS. 9A through 9E are side views in cross section showing an essential part of the second embodiment of the semiconductor memory device according to the present invention at essential stages of the second embodiment of the method of producing the semiconductor memory device according to the present invention. In FIGS. 9A through 9E, those parts which are the same as those corresponding parts in FIGS. 8A through 8F are designated by the same reference numerals, and a description thereof will be omitted.

In this embodiment of the method, the processes are the same as those of the first embodiment up to the processes shown in FIGS. 8A and 8B, that is, until the source region 17, the drain region 18 and the channel region 19 of the TFT load are formed from the fourth polysilicon layer. Hence, a description will only be given of the processes carried out thereafter.

Figure 9A:
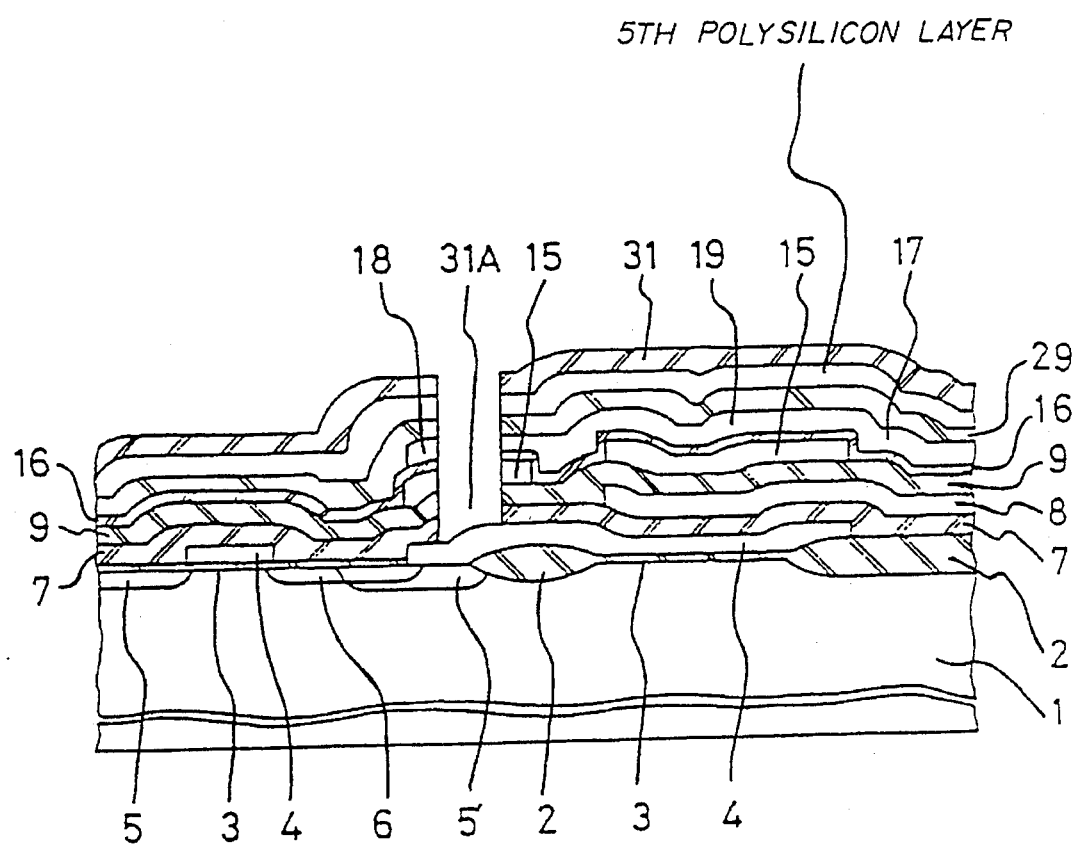
FIGS. 9A through 9E are side views in cross section showing an essential part of a second embodiment of the semiconductor memory device according to the present invention at essential stages of a second embodiment of the method of producing the semiconductor memory device according to the present invention.

In FIG. 9A, the double gate structure TFT load type SRAM already has on the Si semiconductor substrate 1 the field insulator layer 2, the gate insulator layer 3, the gate electrode 4 of the driver transistor formed from the first polysilicon layer, the n$^+$-type impurity region 5', the n$^+$-type source region 5, the n$^+$-type drain region 6, the insulator layer 7, the ground line 8 formed from the second polysilicon layer, the gate electrode 15 of the TFT load formed from the third polysilicon layer, the gate insulator layer 16 of the TFT load, the source region 17 of the TFT load formed from the fourth polysilicon layer, the drain region 18, and the channel region 19.

A CVD is carried out to form, on the entire surface, an insulator layer 19 which is made of $Si_3N_4$ and has a thickness of 500 Å, for example.

Then, a CVD is carried out to form a fifth polysilicon layer having a thickness of 500 Å, for example.

An ion implantation is carried out to inject P ions into the fifth polysilicon layer with a dosage of $1 \times 10^{15}$ cm$^{-2}$ and an acceleration energy of 10 keV.

A CVD is carried out to form on the entire surface an insulator layer 31 which is made of $SiO_2$ and has a thickness of 500 Å, for example. This insulator layer 31 acts as a spacer.

A resist process of the photolithography technique and RIEs using CHF$_3$/He and CCl$_4$/O$_2$ as etching gases for respectively etching SiO$_2$ and polysilicon are carried out to selectively etch the insulator layer 31, the fifth polysilicon layer, the insulator layer 29, the drain region 18 of the TFT load formed from the fourth polysilicon layer, the gate insulator layer 16, the gate electrode 15 formed from the third polysilicon layer, the insulator layer 9 and the insulator layer 7, and to form a contact hole 31A. This contact hole 31A extends from the top surface of the insulator layer 31 to the top surface of the gate electrode 4 of the driver transistor formed from the first polysilicon layer.

Figure 9B:
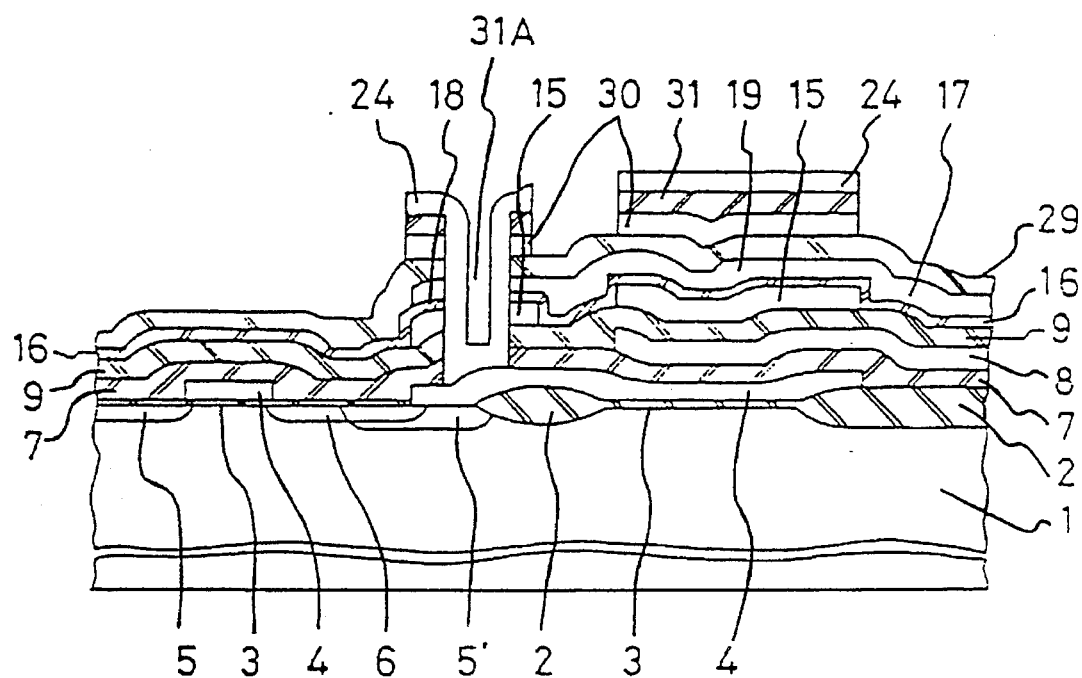

In FIG. 9B, a CVD is carried out to form a sixth polysilicon layer having a thickness of 500 Å, for example.

A thermal diffusion process is carried out to diffuse P in the sixth polysilicon layer with an impurity concentration of $1 \times 10^{21}$ cm$^{-3}$, for example.

A resist process of the photolithography technique and RIEs using CCl$_4$/O$_2$ and CHF$_3$/He as the etching gases for respectively etching polysilicon and SiO$_2$ are carried out to pattern the sixth polysilicon layer, the insulator layer 31 and the fifth polysilicon layer, and to form a storage capacitor 24 of the memory capacitor and a fin 30 of the memory capacitor. This fin 30 is used in common as an upper gate electrode of the TFT load.

Figure 9C:
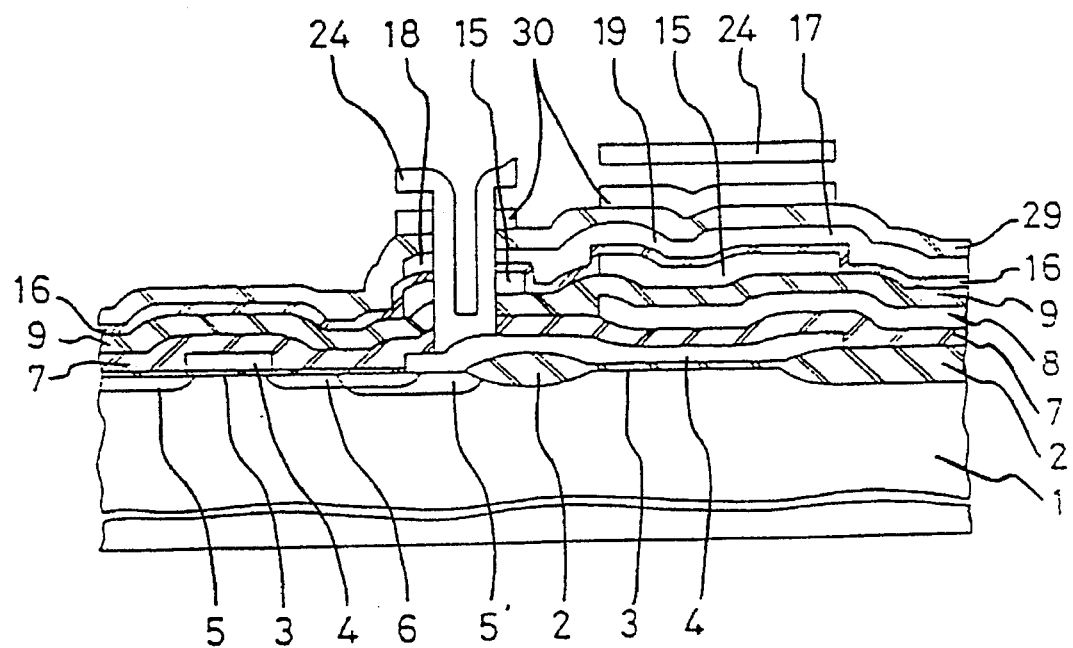

In FIG. 9C, the above described structure is submerged in a HF solution to remove the SiO$_2$ insulator layer 31.

Figure 9D:
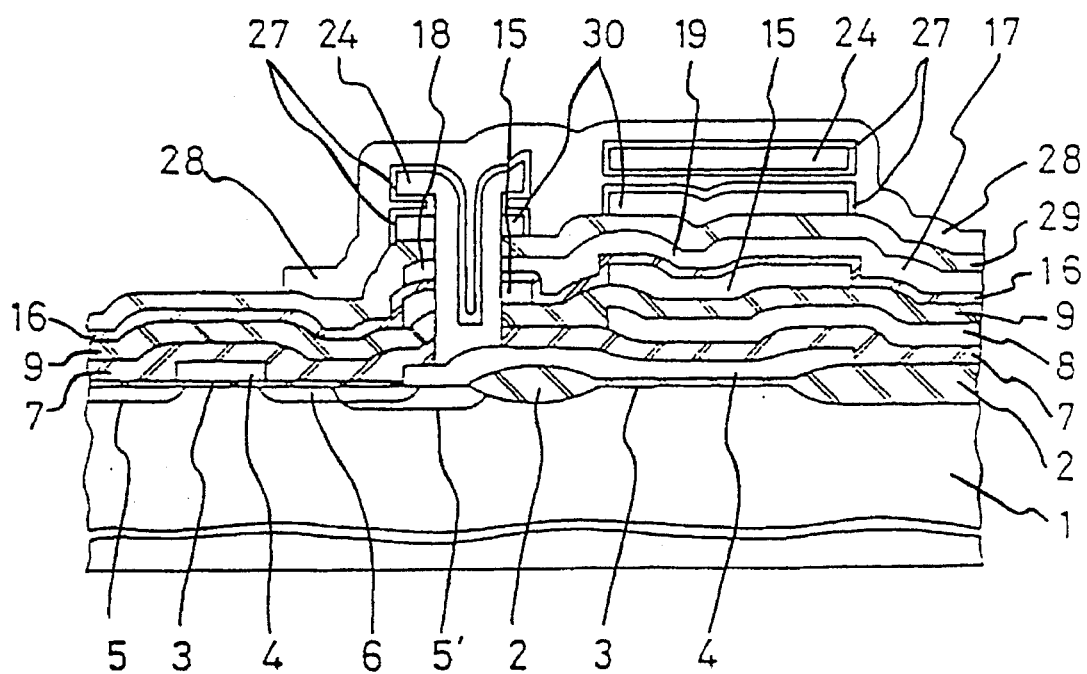

In FIG. 9D, a CVD is carried out to form a dielectric layer 27 on the storage electrode 24 of the memory capacitor and on the surface of the fin 30 of the memory capacitor. For example, this dielectric layer 27 is made of $Si_3N_4$ and has a thickness of 100 Å.

Then, a CVD is carried out to form a seventh polysilicon layer having a thickness of 500 Å, for example.

A thermal diffusion process is carried out to diffuse P in the seventh polysilicon layer with an impurity concentration of $1 \times 10^{21}$ cm$^{-3}$, for example.

A resist process of the photolithography technique and a RIE using CCl$_4$/O$_2$ as the etching gas are carried out to pattern the seventh polysilicon layer and to form an opposing electrode 28 of the memory capacitor.

Figure 9E:
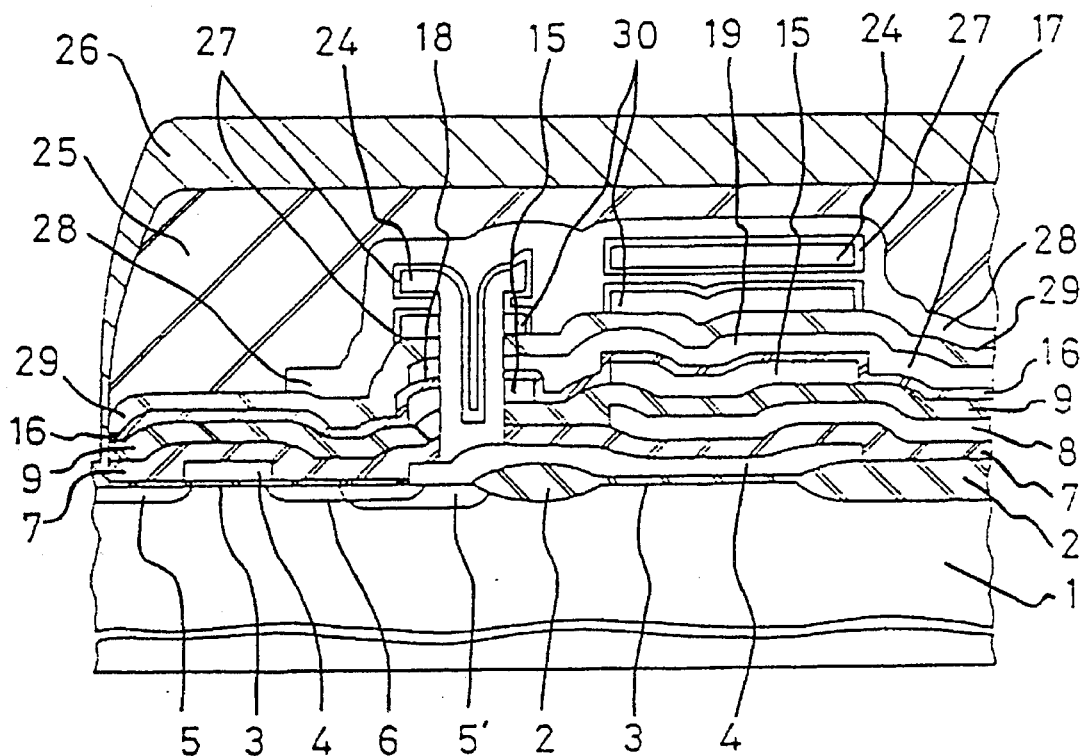

In FIG. 9E, a CVD is carried out to form an insulator layer which is made of SiO$_2$ and has a thickness of 1000 Å, for example, and an insulator layer which is made of PSG and has a thickness of 5000 Å, for example. In FIG. 9E, these two insulator layers are shown as an insulator layer 25.

Then, a thermal process is carried out to fellow and planarize the insulator layer 25.

A resist process of the photolithography technique and a RIE using CHF$_3$/He as the etching gas are carried out to selectively etch the insulator layer 25 and the like and to form a bit line contact hole.

A sputtering is carried out to form an Al layer having a thickness of 1 μm, for example, and this Al layer is patterned to form a bit line 26 using the normal photolithography technique.

This embodiment has two fins in total because the fin 30 which is also used as the upper gate electrode of the double gate structure TFT load is added to the storage electrode 24 of the memory capacitor. As a result, the capacitance of the memory capacitor is increased compared to that of the first embodiment. An arbitrary number of fins 30 may be added, and the mask process described in conjunction with FIGS. 8A through 8F may be used regardless of the number of fins 30. In addition, the voltage which is applied to the opposing electrode 28 of the memory capacitor may be any number of volts within the range of the positive power source voltage Vcc. But if the voltage applied to the opposing electrode 28 is set to Vcc/2, the voltage applied to the dielectric layer becomes small, the dielectric layer can be made thin, and a large capacitance can be obtained.

Figure 10:
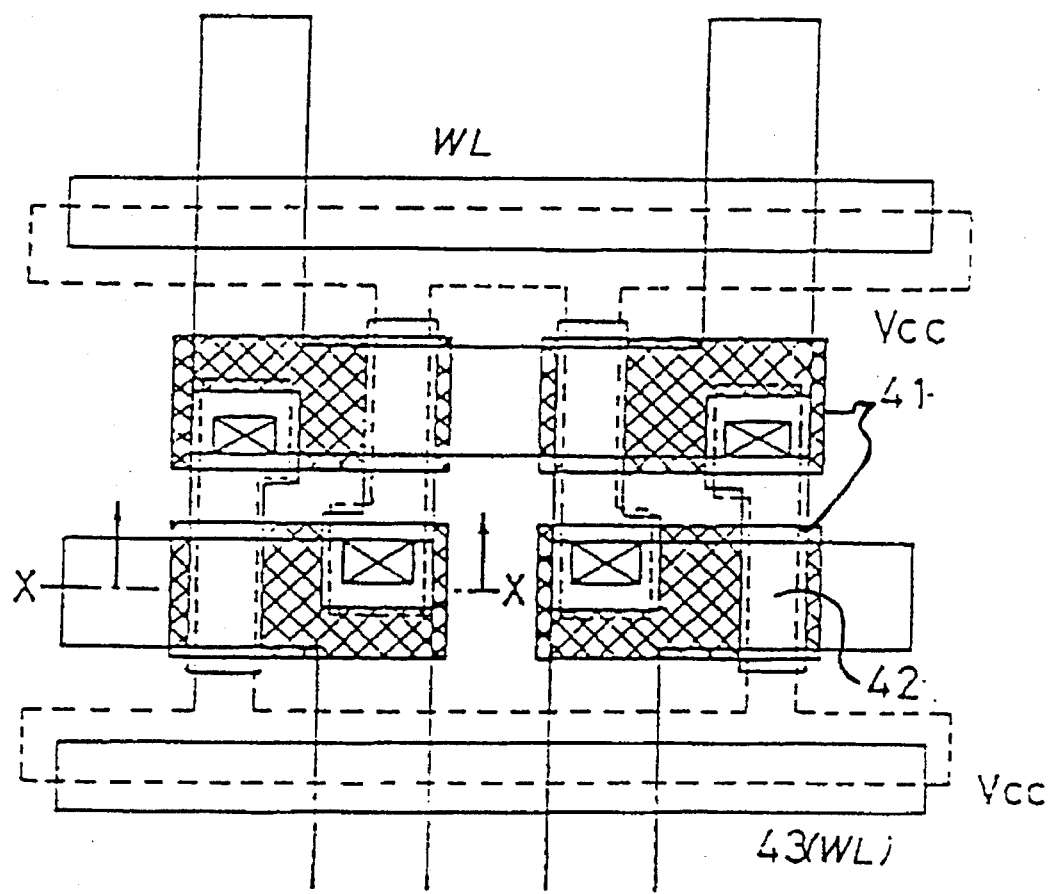
FIG. 10 is a plan view generally showing an essential part of a TFT load type SRAM.

FIG. 10 is a plan view generally showing an essential part of a TFT load type SRAM. FIG. 10 shows a gate 41 of the TFT load, a channel 42 of the TFT load, a word line 43 (WL), and a power source voltage supply line Vcc for supplying the positive power source voltage Vcc.

According to the SRAM shown in FIG. 10, the driver transistors and the TFT loads are arranged in a symmetrical manner, thereby making it possible to design the layout with ease. Hence, a description will hereunder be given of a third embodiment of the semiconductor memory device according to the present invention which is applied to the TFT load type SRAM shown in FIG. 10.

Next, a description will be given of a third embodiment of the semiconductor memory device according to the present invention which is produced by a third embodiment of the method of producing the semiconductor memory device according to the present invention. FIGS. 11A through 11J are side views in cross section showing an essential part of the third embodiment of the semiconductor memory device according to the present invention at essential stages of the third embodiment of the method of producing the semiconductor memory device according to the present invention. FIGS. 12A through 12G are plan views of the semiconductor memory device at essential stages of the third embodiment of the method shown in FIGS. 11A through 11J. FIGS. 11A through 11J respectively are cross sections taken along a line X—X in FIG. 10.

Figure 11:
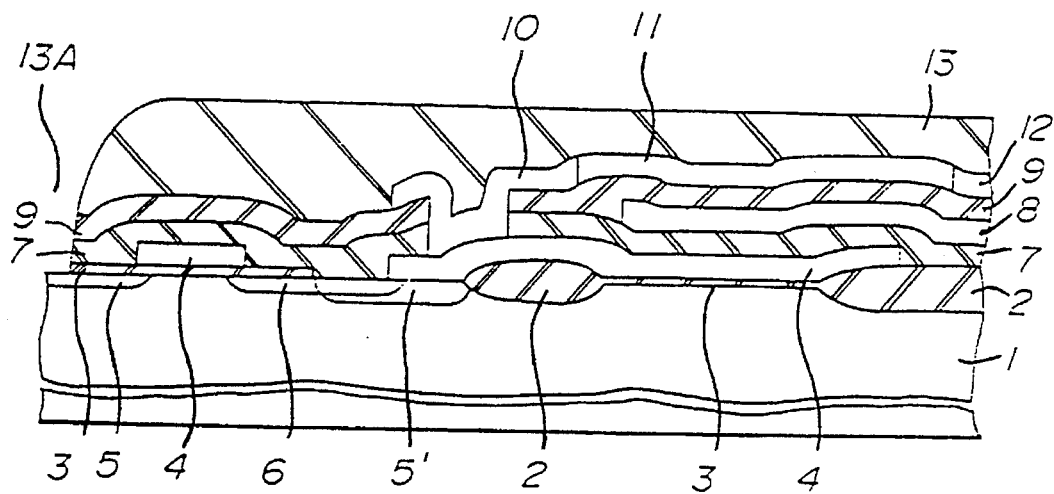
FIGS. 11A through 11J are side views in cross section showing an essential part of a third embodiment of the semiconductor memory device according to the present invention at essential stages of a third embodiment of the method of producing the semiconductor memory device according to the present invention.
Figure 1J:
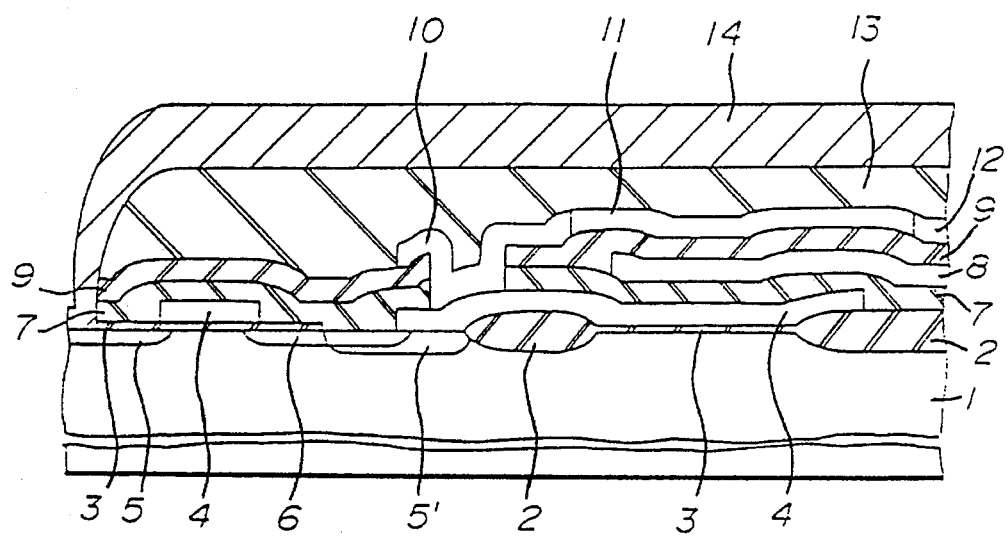
Figure 11A:
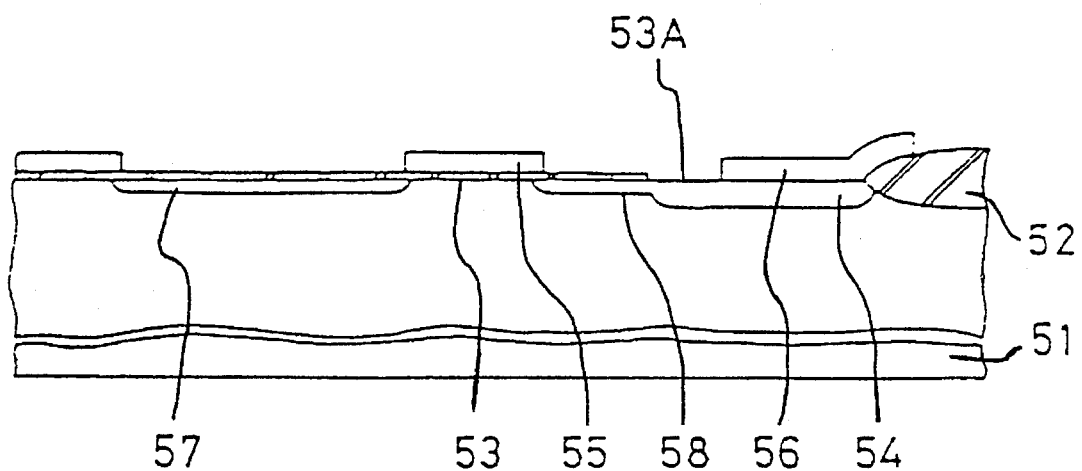
Figure 12A:
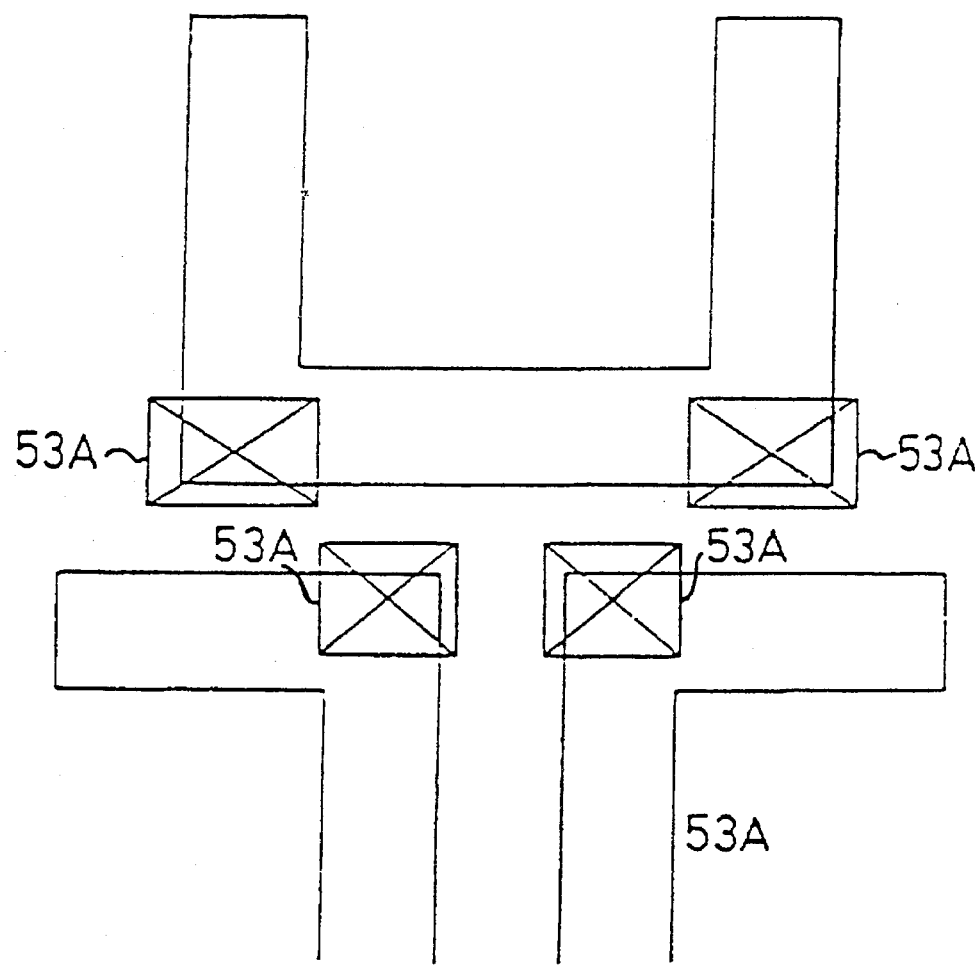
Figure 12B:
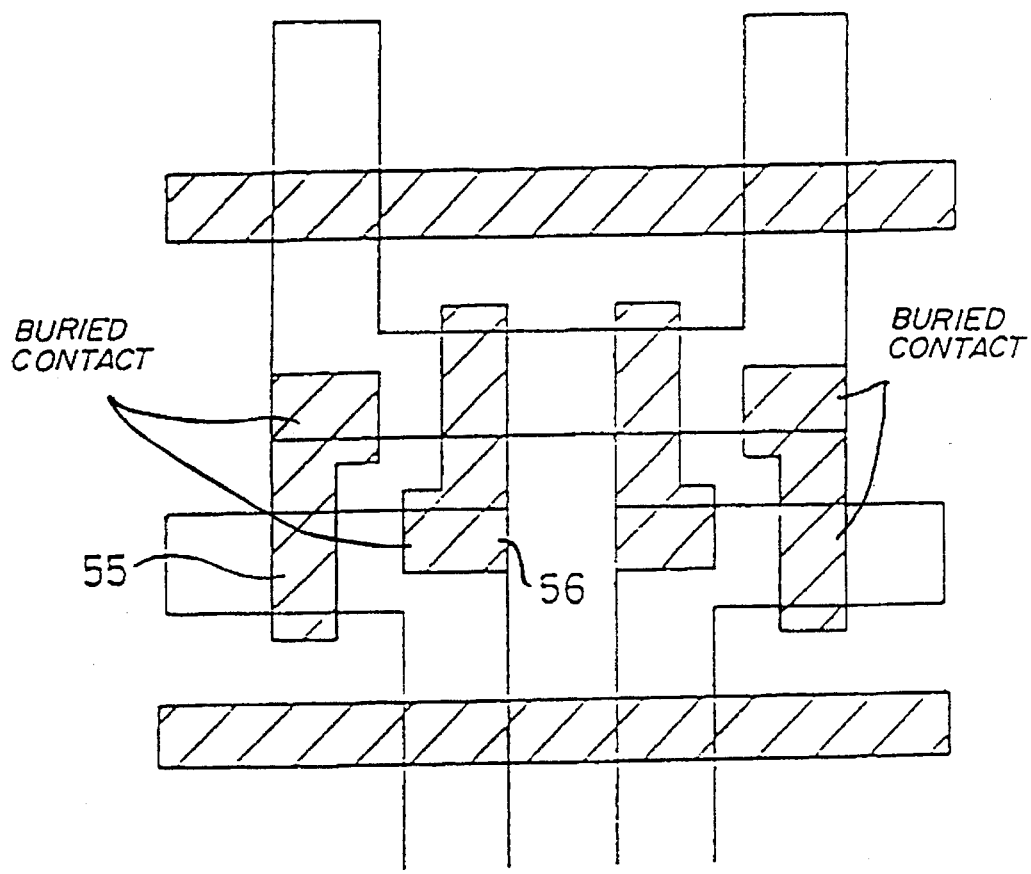

In FIGS. 11A, 12A and 12B, a pad layer made of SiO$_2$ covering an active region of a Si semiconductor substrate 51 and an oxidation resistant mask layer made of Si$_3$N$_4$ formed on the pad layer are used to carry out a selective thermal oxidation to form a field insulator layer 52 which is made of SiO$_2$ and has a thickness of 4000 Å, for example.

After exposing the active region by removing the oxidation resistant mask layer and the pad layer, a thermal oxidation is carried out to form a gate insulator layer 53 which is made of $SiO_2$ and has a thickness of 100 Å, for example.

A resist process of the photolithography technique and a wet etching using hydrofluoric acid as the etchant are carried out to selective etch the gate insulator layer 53 and to form a contact hole 53A which is also used when diffusing impurities.

A CVD is carried out to form a first polysilicon layer having a thickness of 1000 Å, for example.

Then, a vapor phase diffusion is carried out to introduce P with an impurity concentration of $1 \times 10^{20}$ $cm^{-3}$, for example, so as to form an $n^+$-type impurity region 54.

A resist process of the photolithography technique and a RIE using $CCl_4/O_2$ as the etching gas are carried out to pattern the first polysilicon layer and to form gate electrodes 55 and 56.

An ion implantation is carried out to inject As ions into the first polysilicon layer with a dosage of $1 \times 10^{15}$ $cm^{-2}$ and an acceleration energy of 30 keV, for example, so as to form an $n^+$-type source region 57 and an $n^+$-type drain region 58.

Figure 11B:
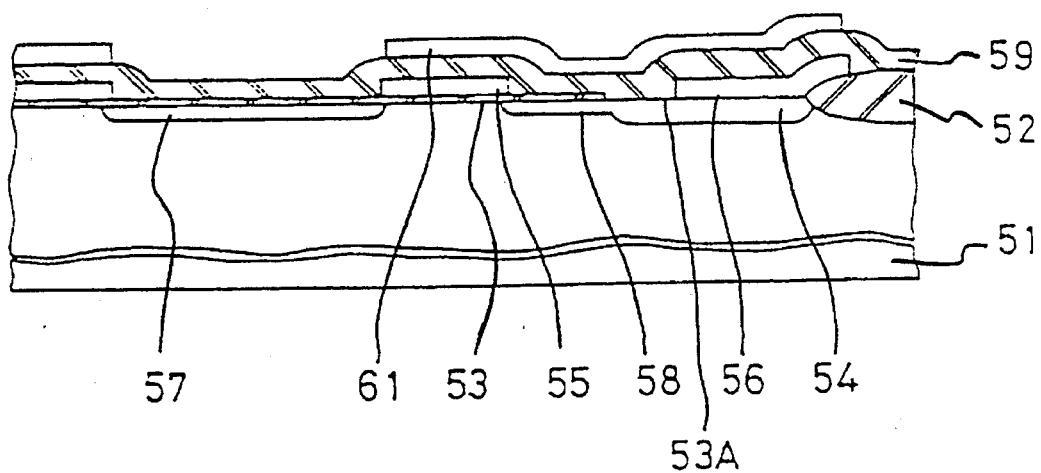

In FIGS. 11B and 12C, a CVD is carried out to form an insulator layer 59 which is made of $SiO_2$ and has a thickness of 1000 Å, for example.

Then, a CVD is carried out to form a second polysilicon layer having a thickness of 1000 Å, for example.

A vapor phase diffusion is carried out to introduce P into the second polysilicon layer with an impurity concentration of $1 \times 10^{20}$ $cm^{-3}$, for example.

Next, a resist process of the photolithography technique and a RIE using $CCl_4/O_2$ as the etching gas are carried out to pattern the second polysilicon layer and to form a lower gate electrode 61 of the TFT load and the like.

Figure 11C:
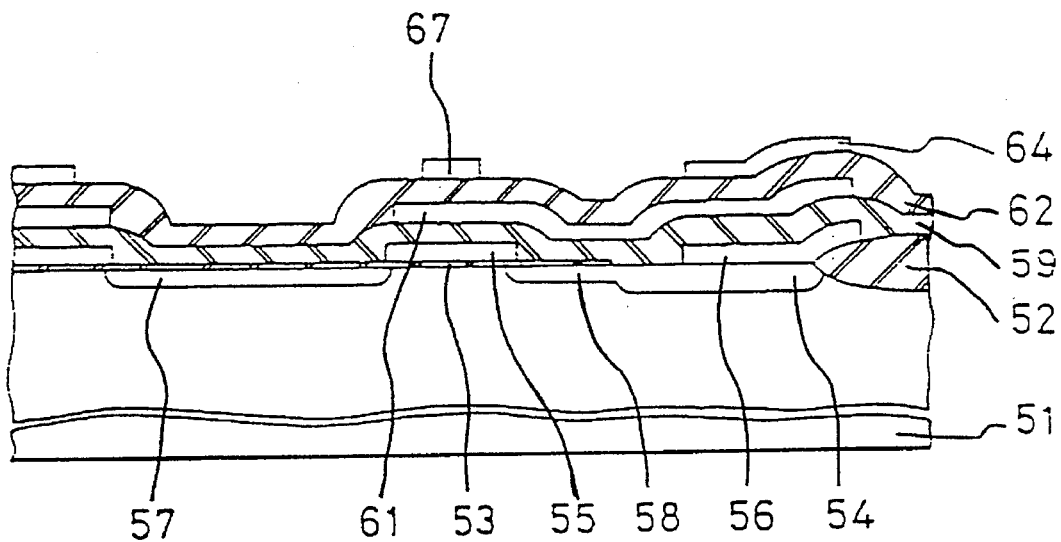
Figure 12D:
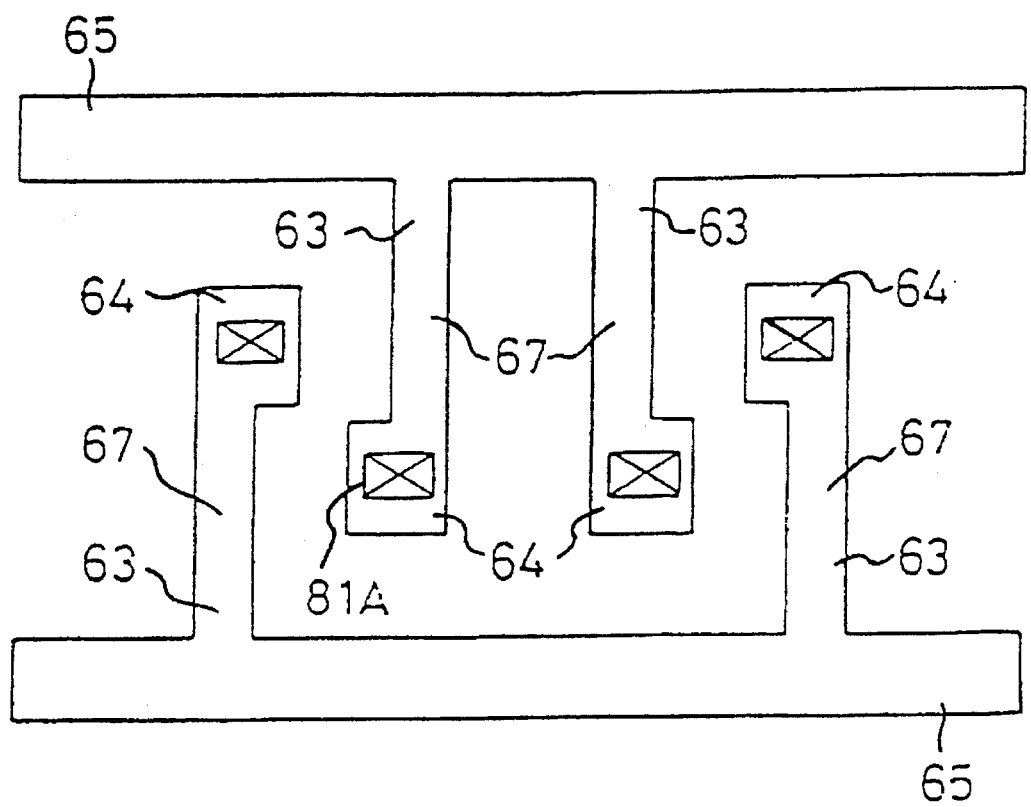

In FIGS. 11C and 12D, a CVD is carried out to form an insulator layer 62 which is made of $SiO_2$ and has a thickness of 200 Å, for example.

Then, a CVD is carried out to form a third polysilicon layer having a thickness of 200 Å, for example.

A resist process of the photolithography technique and an ion implantation are carried out to inject B ions with a dosage of $1 \times 10^{14}$ $cm^{-2}$ and an acceleration energy of 5 keV, for example, into parts of the third polysilicon layer where source and drain regions of the TFT load and a Vcc supply line are formed.

A resist process of the photolithography technique and a RIE using $CCl_4/O_2$ as the etching gas are carried out to pattern the third polysilicon layer and to form a contact part, a drain region, a source region and a channel region of each TFT load, and the Vcc supply line. In FIG. 11C, only a contact part 64 and a channel region 67 can be seen.

Figure 11D:
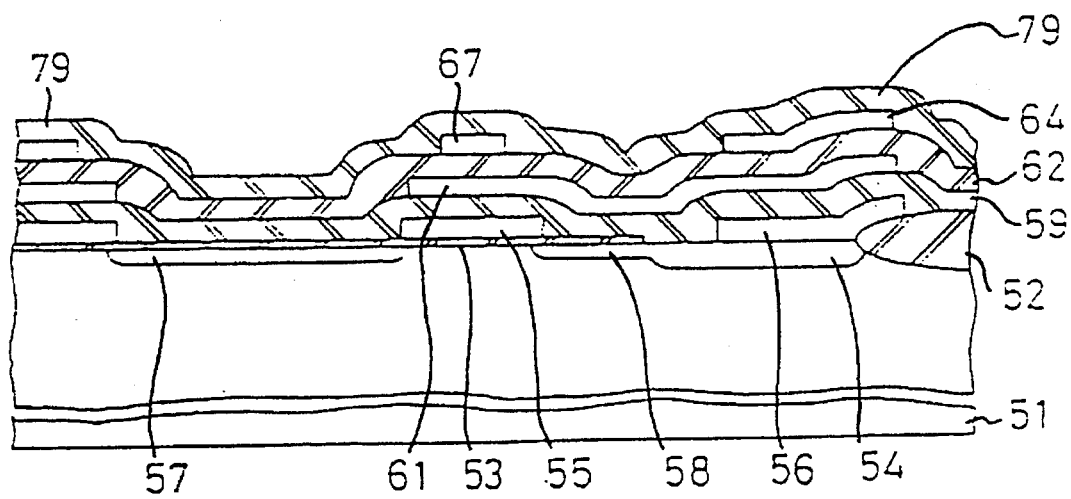

In FIGS. 11D and 12D, a CVD is carried out to form an insulator layer 79 which is made of $Si_3N_4$ and has a thickness of 500 Å, for example.

Figure 11E:
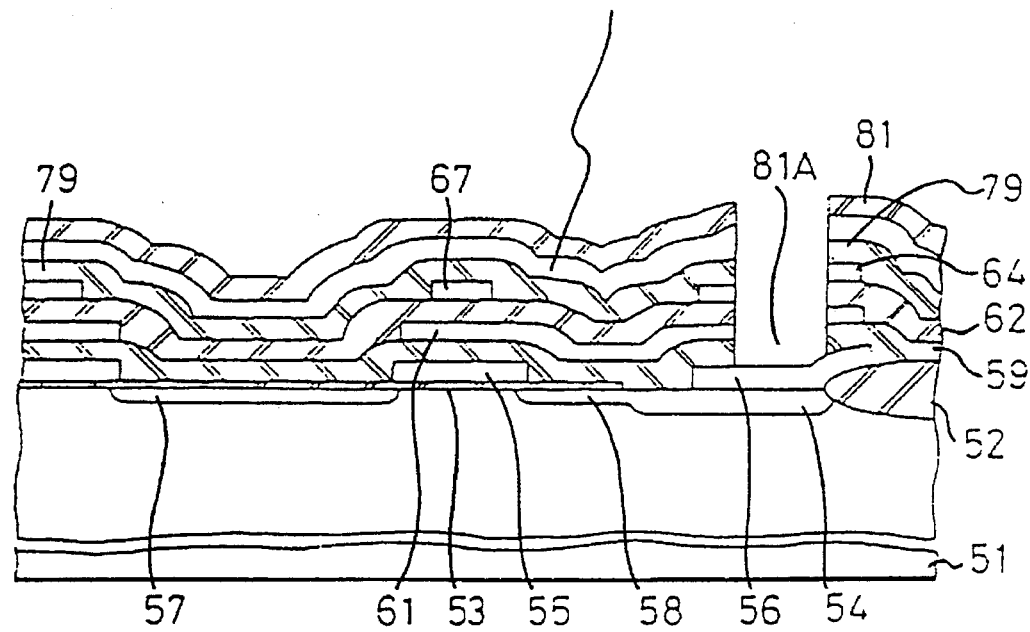

In FIGS. 11E and 12D, a CVD is carried out to form a fourth polysilicon layer having a thickness of 500 Å, for example.

Then, a vapor phase diffusion is carried out to introduce P into the fourth polysilicon layer with an impurity concentration of $1 \times 10^{20}$ $cm^{-3}$, for example.

A CVD is carried out to form an insulator layer 81 which is made of $SiO_2$ and has a thickness of 500 Å, for example.

A resist process of the photolithography technique and RIEs using $CHF_3/He$ and $CCl_4/O_2$ as the etching gases are carried out to selectively etch the insulator layer 81, the fourth polysilicon layer, the insulator layer 79, the third polysilicon layer, the insulator layer 62, the second polysilicon layer and the insulator layer 59, and to form a contact hole 81A. The $CHF_3/He$ etching gas is used to etch the $SiO_2$ and the $Si_3N_4$, while the $CCl_4/O_2$ etching gas is used to etch the polysilicon. The contact hole 81A extends from the top surface of the insulator layer 81 and reaches the top surface of the gate electrode 56 of the driver transistor formed from the first polysilicon layer.

Figure 11F:
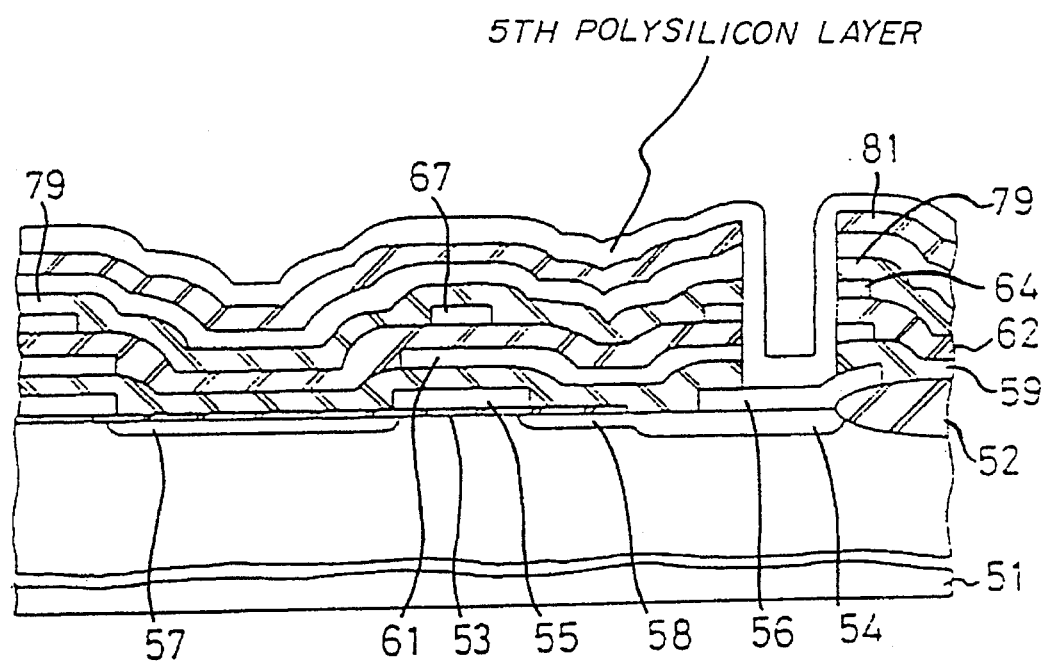

In FIG. 11F, a CVD is carried out to form a fifth polysilicon layer having a thickness of 500 Å, for example.

Then, a thermal diffusion process is carried out to diffuse P in the fifth polysilicon layer with an impurity concentration of $1 \times 10^{21}$ $cm^{-3}$.

Figure 11G:
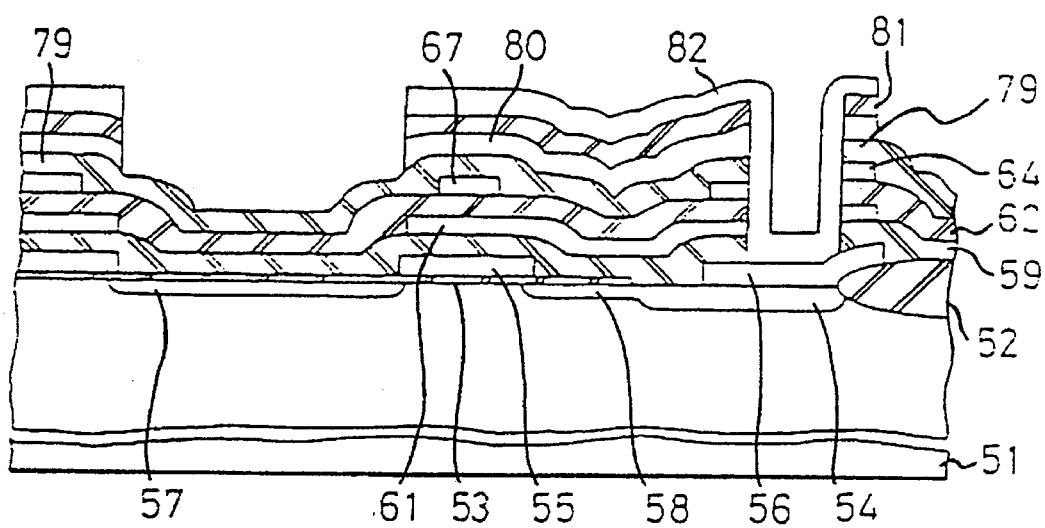
Figure 12E:
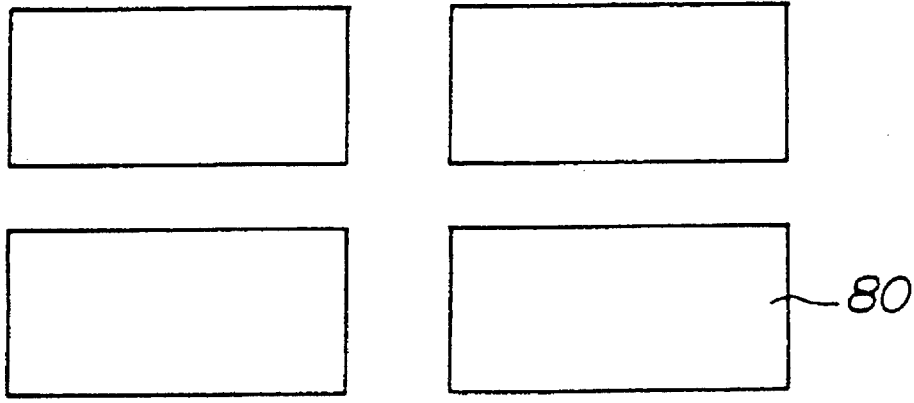

In FIGS. 11G and 12E, a resist process of the photolithography technique and RIEs using $CCl_4/O_2$ and $CHF_3/He$ as the etching gases are carried out to pattern the fifth polysilicon layer, the insulator layer 81 and the fourth polysilicon layer, and to form a storage electrode 82 of the memory capacitor and a fin 80 of the memory capacitor. The $CCl_4/O_2$ etching gas is used to etch the polysilicon, while the $CHF_3/He$ etching gas is used to etch the $SiO_2$. The fin 80 is used in common as an upper electrode of the double gate structure TFT load.

Figure 11H:
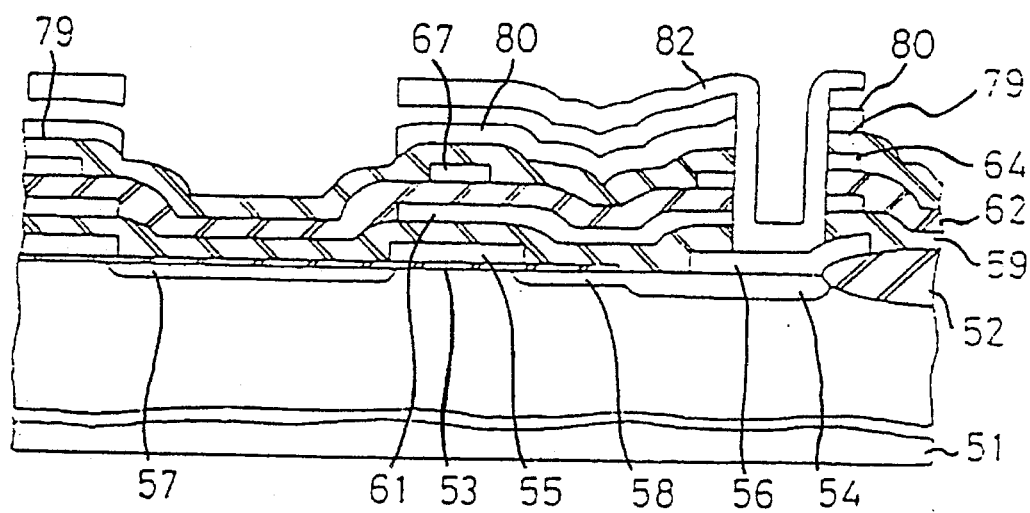
Figure 111:
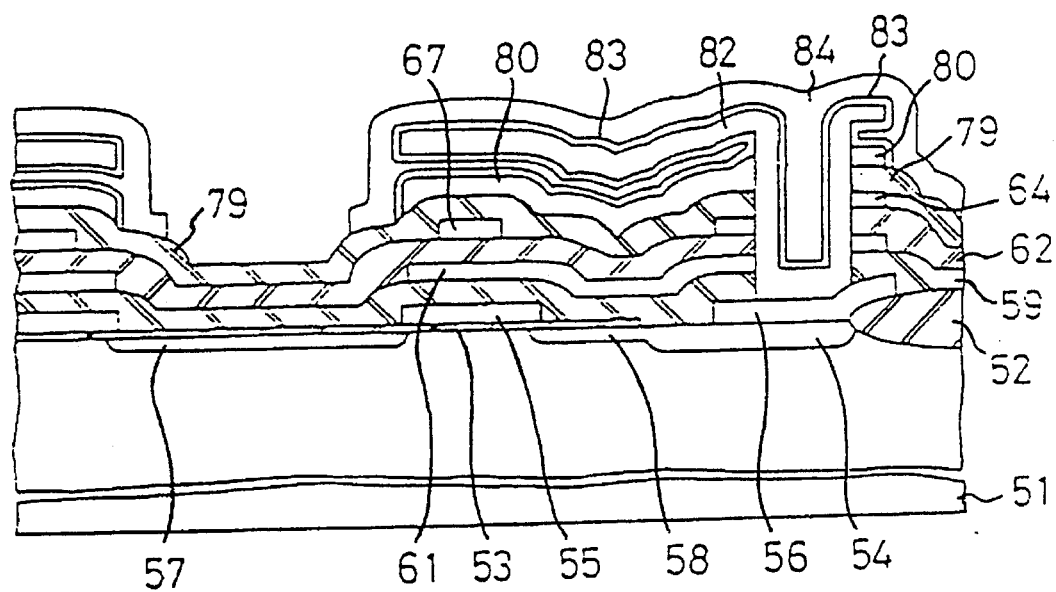

In FIG. 11H, the structure described above is submerged in a HF solution to remove the $SiO_2$ insulator layer 81.

Figure 12F:
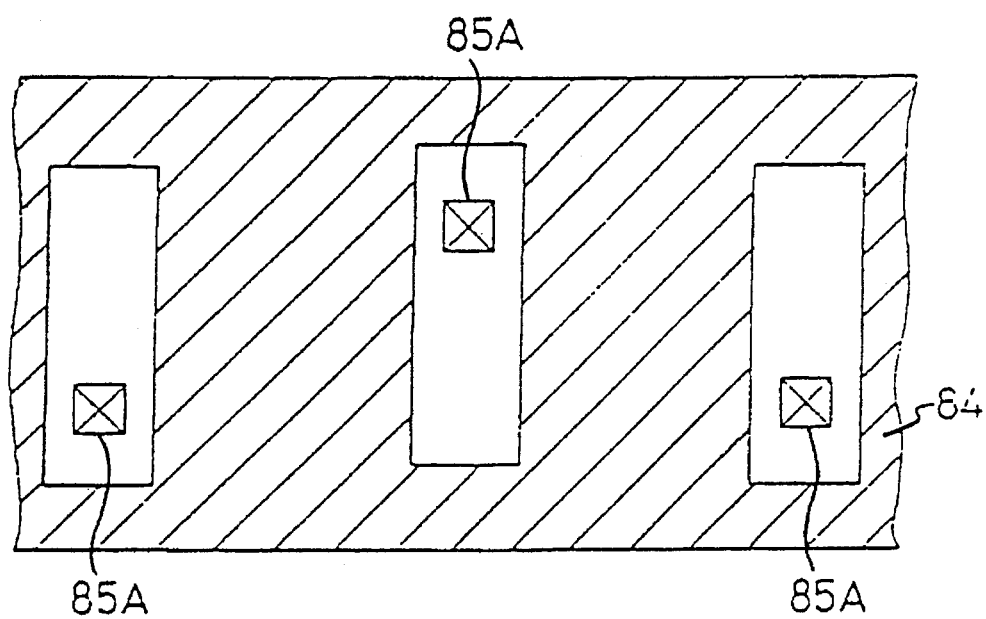

In FIGS. 11I and 12F, a CVD is carried out to form a dielectric layer 83 which is made of $Si_3N_4$ and has a thickness of 100 Å, for example, on the electrode 82 and the surface of the fin 80.

Then, a CVD is carried out to form a sixth polysilicon layer having a thickness of 1000 Å, for example.

A thermal diffusion process is carried out to diffuse P in the sixth polysilicon layer with an impurity concentration of $1 \times 10^{21}$ $cm^{-3}$, for example.

A resist process of the photolithography technique and a RIE using $CCl_4/O_2$ as the etching gas are carried out to pattern the sixth polysilicon layer and to form an opposing electrode 84 of the memory capacitor.

Figure 11J:
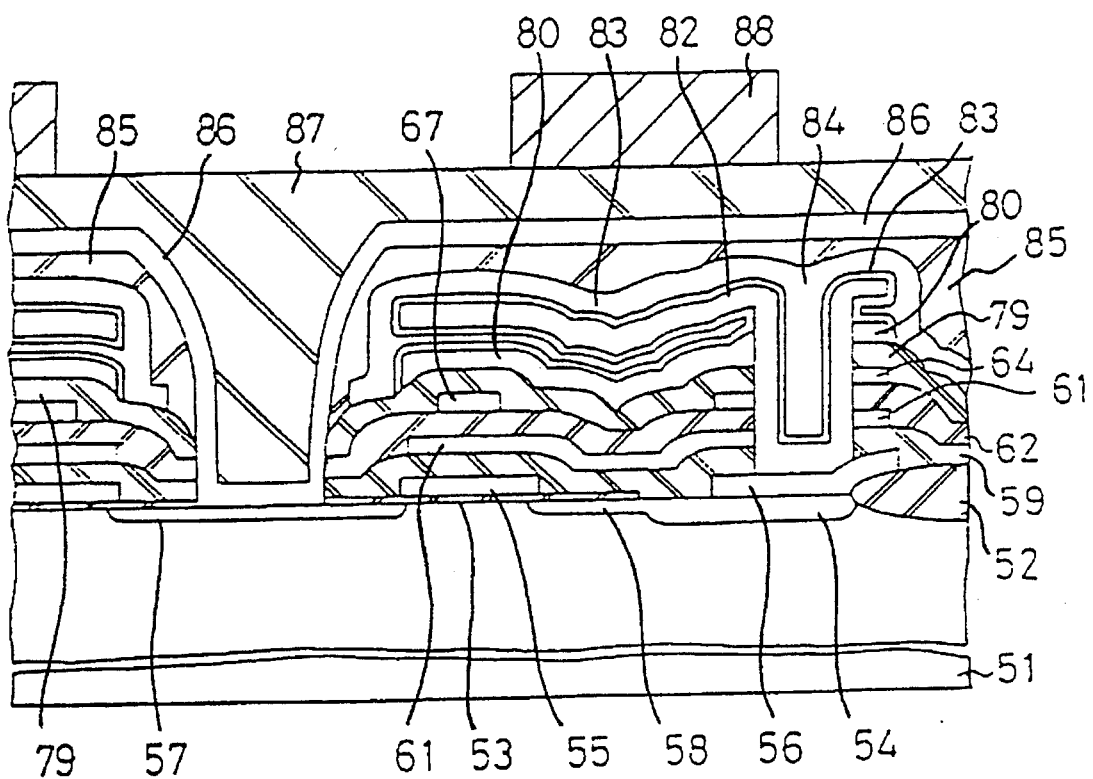
Figure 12G:
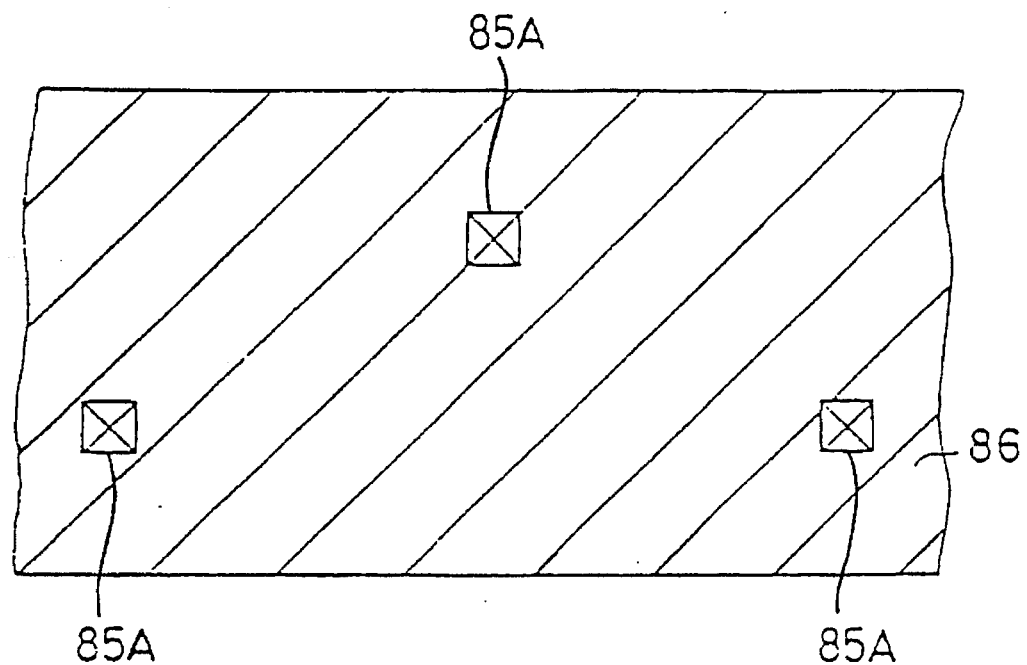

In FIGS. 11J, 12F and 12G, a CVD is carried out to form an insulator layer 85 which is made of $SiO_2$ and has a thickness of 1000 Å, for example.

Then, a resist process of the photolithography technique and a RIE using $CHF_3/He$ as the etching gas are carried out to selectively etch the insulator layer 85 and the like and to form a ground line contact hole 85A.

A CVD is carried out to form a seventh polysilicon layer having a thickness of 1000 Å, for example.

A thermal diffusion process is carried out to diffuse P in the seventh polysilicon layer with an impurity concentration of $1 \times 10^{21}$ $cm^{-3}$, for example.

Next, a resist process of the photolithography technique and a RIE using $CCl_4/O_2$ as the etching gas are carried out to pattern the seventh polysilicon layer and to form a Vss supply line 86.

A CVD is carried out to form an insulator layer which is made of $SiO_2$ and has a thickness of 1000 Å, for example, and an insulator layer which is made of PSG and has a thickness of 5000 Å, for example. In FIG. 11J, these two insulator layers are shown as an insulator layer 87.

A thermal process is carried out to reflow and planarize the insulator layer 87.

Thereafter, a resist process of the photolithography technique and a RIE using $CHF_3/He$ or the like as the etching gas are carried out to selectively etch the insulator layer 87 and the like, and to form a bit line contact hole which cannot be seen in FIG. 11J.

A sputtering is carried out to form an Al layer having a thickness of 1 µm, for example, and this Al layer is patterned using the normal photolithography technique to form a bit line 88.

Next, a description will be given of a fourth embodiment of the semiconductor memory device according to the present invention which is produced by a fourth embodiment of the method of producing the semiconductor memory device according to the present invention.

Figure 13A:
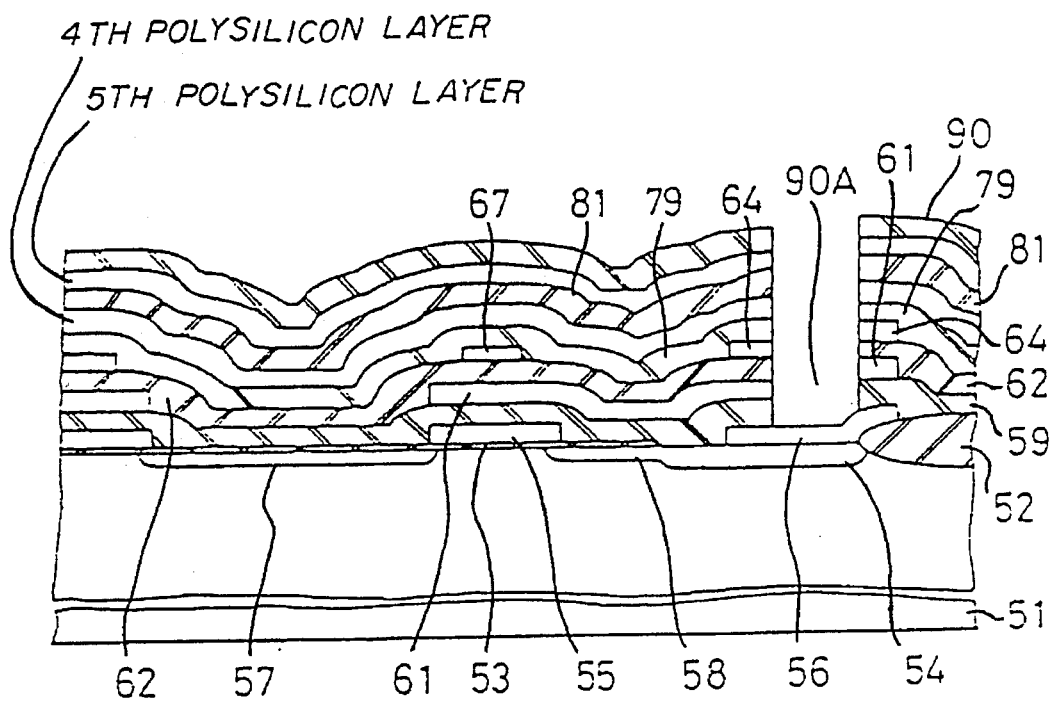
FIGS. 13A through 13C are side views in cross section showing an essential part of a fourth embodiment of the semiconductor memory device according to the present invention at essential stages of a fourth embodiment of the method of producing the semiconductor memory device according to the present invention.
Figure 13B:
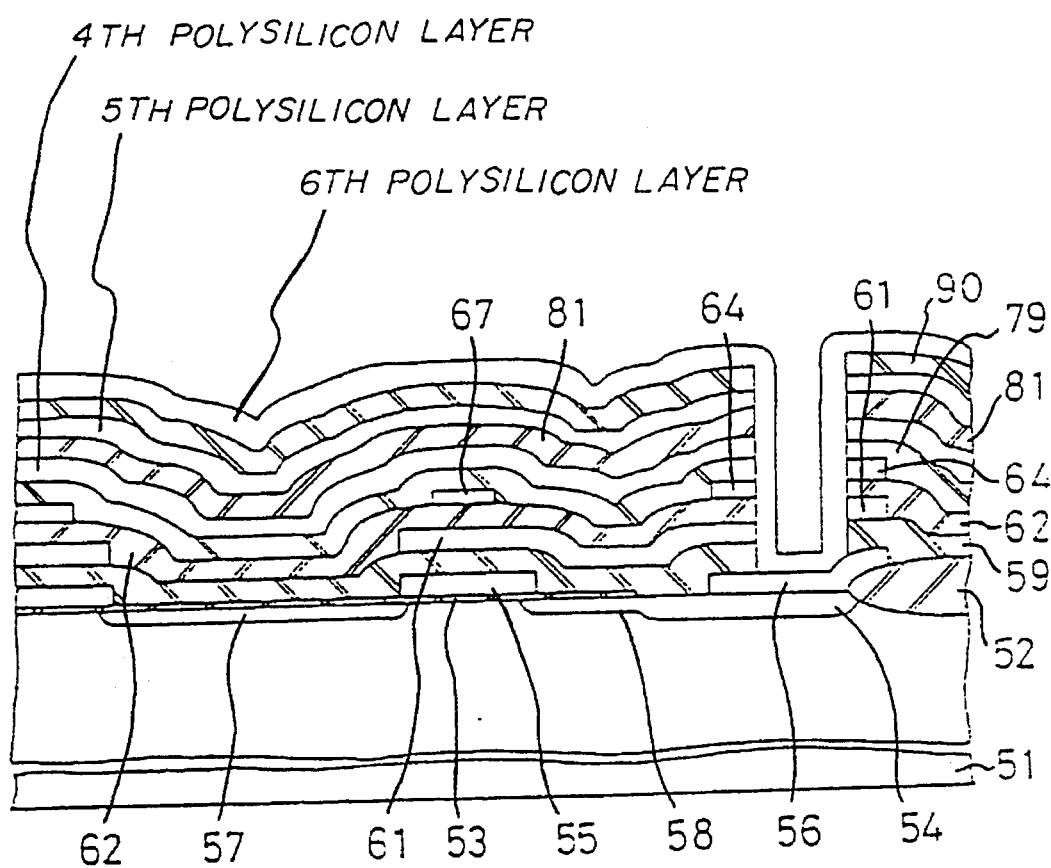
Figure 13C:
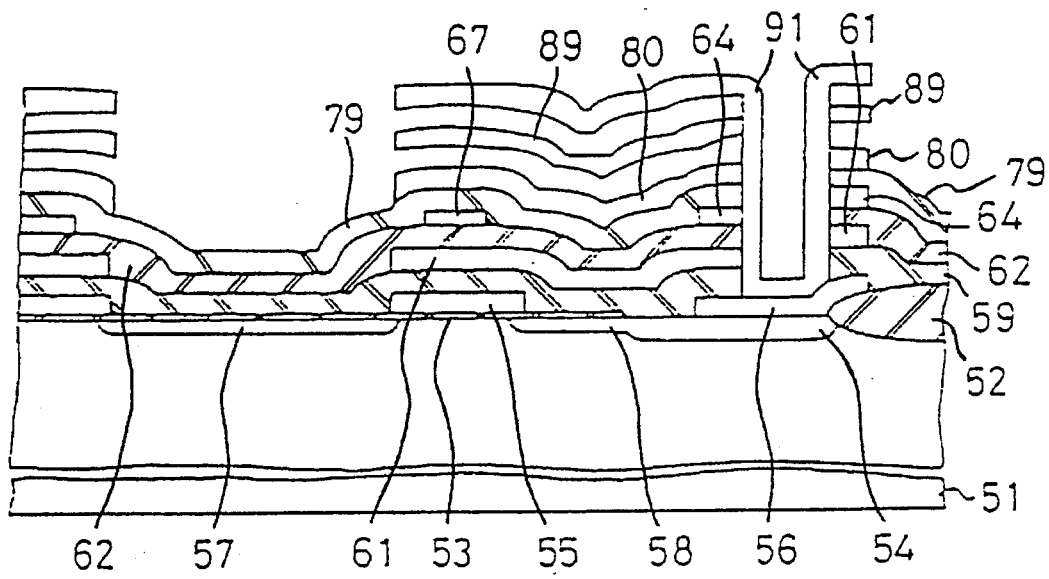

FIGS. 13A through 13C are side views in cross section showing an essential part of the fourth embodiment of the semiconductor memory device according to the present invention at essential stages of the fourth embodiment of the method of producing the semiconductor memory device according to the present invention. In FIGS. 13A through 13C, those parts which are the same as those corresponding parts in FIGS. 11A through 11J are designated by the same reference numerals, and a description thereof will be omitted.

In this embodiment of the method, the processes are the same as those of the third embodiment up to the processes shown in FIGS. 11A through 11D, that is, until the insulator layer 79 is formed from $Si_3N_4$. Hence, a description will only be given of the processes carried out thereafter.

In FIG. 13A, the double gate structure TFT load type SRAM already has on the Si semiconductor substrate 51 the field insulator layer 52, the gate insulator layer 53, the $n^+$-type impurity region 54, the gate electrode 55 of the driver transistor formed from the first polysilicon layer, the $n^+$-type source region 57, the $n^+$-type drain region 58, the insulator layer 59, the gate electrode 61 of the TFT load formed from the second polysilicon layer, the gate insulator layer 62 of the TFT load, the source region, the drain contact region 64 and the channel region 67 of the TFT load formed from the third polysilicon layer, and the insulator layer 79 which is made of $Si_3N_4$. In FIG. 13A, the source region of the TFT load cannot be seen.

A CVD is carried out to form a fourth polysilicon layer having a thickness of 500 Å, for example.

Then, a vapor phase diffusion is carried out to introduce P in the fourth polysilicon layer with an impurity concentration of $1 \times 10^{20}$ cm$^{-3}$, for example.

A CVD is carried out to form an insulator layer 81 which is made of $SiO_2$ and has a thickness of 500 Å, for example.

A CVD is carried out to form a fifth polysilicon layer having a thickness of 500 Å, for example.

Thereafter, a vapor phase diffusion is carried out to introduce P in the fifth polysilicon layer with an impurity concentration of $1 \times 10^{20}$ cm$^{-3}$, for example.

A CVD is carried out to form an insulator layer 90 which is made of $SiO_2$ and has a thickness of 500 Å, for example.

A resist process of the photolithography technique and RIEs using $CHF_3/He$ and $CCl_4/O_2$ as the etching gases are carried out to selectively etch the insulator layer 90, the fifth polysilicon layer, the insulator layer 81, the fourth polysilicon layer, the insulator layer 79, the third polysilicon layer, the insulator layer 62, the second polysilicon layer and the insulator layer 59, and to form a contact hole 90A. The $CHF_3/He$ etching gas is used to etch the $SiO_2$ and the $Si_3N_4$, while the $CCl_4/O_2$ etching gas is used to etch the polysilicon. The contact hole 90A extends from the top surface of the insulator layer 90 and reaches the top surface of the gate electrode 56 of the driver transistor formed from the first polysilicon layer.

In FIG. 13B, a CVD is carried out to form a sixth polysilicon layer having a thickness of 500 Å, for example.

Then, a thermal diffusion process is carried out to diffuse P in the sixth polysilicon layer with an impurity concentration of $1 \times 10^{21}$ cm$^{-3}$, for example.

In FIG. 13C, a resist process of the photolithography technique and RIEs using $CCl_4/O_2$ and $CHF_3/He$ as the etching gases are carried out pattern the sixth polysilicon layer, the insulator layer 90, the fifth polysilicon layer, the insulator layer 81 and the fourth polysilicon layer, and to form a fin 91 of the memory capacitor, a fin 89 of the memory capacitor, and a fin 80 of the memory capacitor. The fin 80 of the memory capacitor is used in common as an upper gate electrode of the double gate structure TFT load, and the fin 91 of the memory capacitor is used as the storage electrode of the memory capacitor.

The above described structure is submerged in a HF solution to remove the $SiO_2$ insulator layers 90 and 81.

Thereafter, processes similar to those described above in conjunction with FIGS. 11I and 11J of the third embodiment are carried out to form a dielectric layer of the memory capacitor and the like.

According to this embodiment, substantially three fins can be integrally formed on the storage electrode of the memory capacitor, without increasing the number of mask processes. Hence, the capacitance of the memory capacitor can be increased considerably compared to that of the third embodiment. The number of fins which directly affects the capacitance of the memory capacitor can be increased arbitrarily without increasing the number of mask processes.

Next, a description will be given of a fifth embodiment of the semiconductor memory device according to the present invention which is produced by a fifth embodiment of the method of producing the semiconductor memory device according to the present invention. FIGS. 14A through 14D are side views in cross section showing an essential part of the fifth embodiment of the semiconductor memory device according to the present invention at essential stages of the fifth embodiment of the method of producing the semiconductor memory device according to the present invention. In FIGS. 14A through 14D, those parts which are the same as those corresponding parts in FIGS. 11A through 11J are designated by the same reference numerals, and a description thereof will be omitted.

In this embodiment of the method, the processes are the same as those of the third embodiment up to the processes shown in FIGS. 11A through 11C, that is, until the third polysilicon layer is patterned to form the contact part, the drain, source and channel regions of the TFT load and the Vcc line. Hence, a description will only be given of the processes carried out thereafter.

Figure 14A:
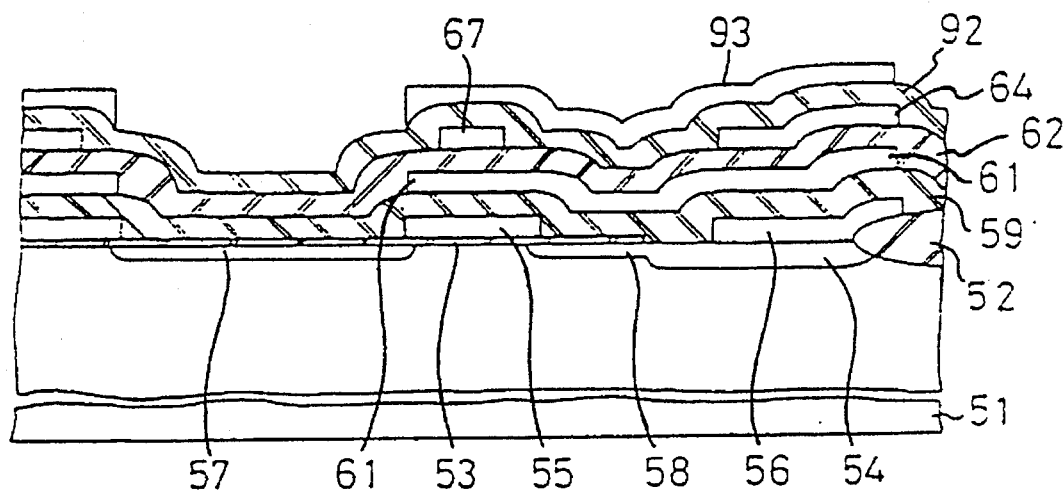
FIGS. 14A through 14D are side views in cross section showing an essential part of a fifth embodiment of the semiconductor memory device according to the present invention at essential stages of a fifth embodiment of the method of producing the semiconductor memory device according to the present invention.

In FIG. 14A, the double gate structure TFT load type SRAM already has on the Si semiconductor substrate 51 the field insulator layer 52, the gate insulator layer 53, the $n^+$-type impurity region 54, the gate electrode 55 of the driver transistor formed from the first polysilicon layer, the $n^+$-type source region 57 the $n^+$-type drain region 58, the insulator layer 59, the gate electrode 61 of the TFT load formed from the second polysilicon layer, the gate insulator layer 62 of the TFT load, the source, drain and channel regions of the TFT load formed from the third polysilicon layer, and the Vcc supply line.

A CVD is carried out to form an insulator layer 92 which is made of $SiO_2$ and has a thickness of 500 Å.

Then, a CVD is carried out to form a fourth polysilicon layer having a thickness of 500 Å, for example.

A vapor phase diffusion is carried out to introduce P in the fourth polysilicon layer with an impurity concentration of $1\times10^{20}$ cm$^{-3}$, for example.

A resist process of the photolithography technique and a RIE using CCl$_4$/O$_2$ as the etching gas are carried out to pattern the fourth polysilicon layer and to form a fin 93. This fin 93 is used in common as an upper gate electrode of the double gate structure TFT load.

Figure 14B:
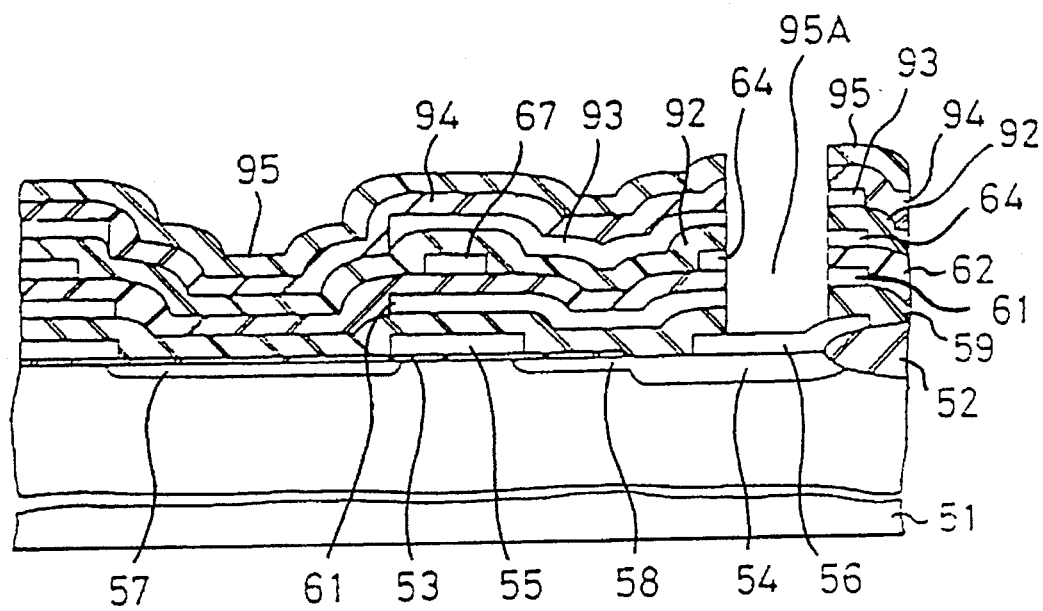

In FIG. 14B, a CVD is carried out to form an insulator layer 94 which is made of Si$_3$N$_4$ and has a thickness of 500 Å, for example, and an insulator layer 95 which is made of SiO$_2$ and has a thickness of 500 Å, for example.

Then, a resist process of the photolithography technique and RIEs using CHF$_3$/He and CCl$_4$/O$_2$ as the etching gases are carried out to selectively etch the insulator layers 95 and 94, the fourth polysilicon layer, the insulator layer 92, the third polysilicon layer, the insulator layer 62, the second polysilicon layer and the insulator layer 59, and to form a contact hole 95A. The CHF$_3$/He etching gas is used to etch the SiO$_2$ and the Si$_3$N$_4$, while the CCl$_4$/O$_2$ etching gas is used to etch the polysilicon. The contact hole 95A extends from the top surface of the insulator layer 95 and reaches the top surface of the gate electrode 56 of the driver transistor formed from the first polysilicon.

Figure 14C:
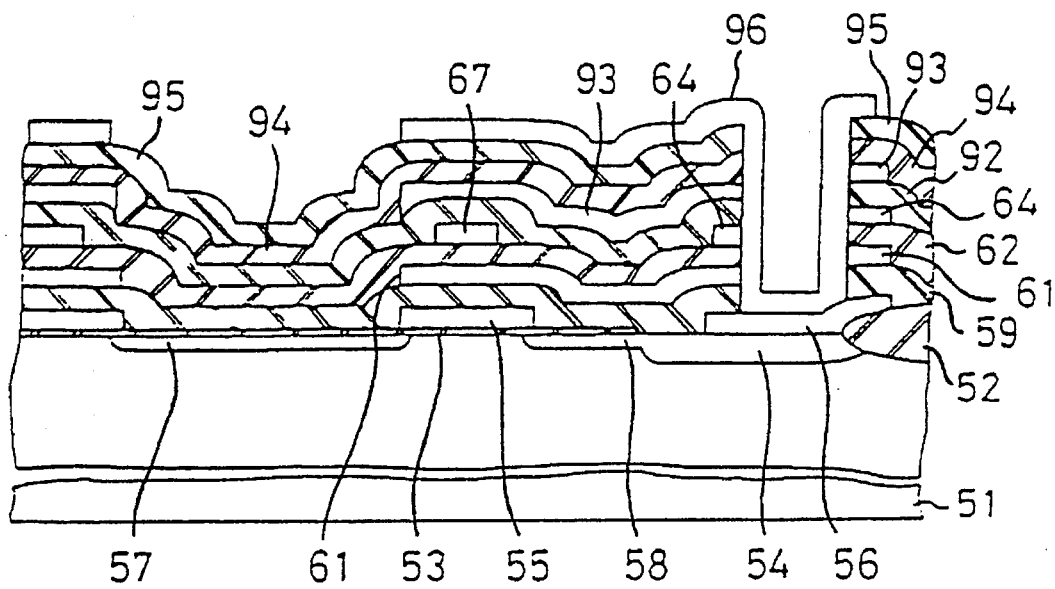

In FIG. 14C, a CVD is carried out to form a fifth polysilicon layer having a thickness of 500 Å, for example.

Then, a thermal diffusion process is carried out to diffuse P in the fifth polysilicon layer with an impurity concentration of $1\times10^{21}$ cm$^{-3}$, for example.

A resist process of the photolithography technique and a RIE using CCl$_4$/O$_2$ as the etching gas are carried out to pattern the fifth polysilicon layer and to form a storage electrode 96 of the memory capacitor.

Figure 14D:
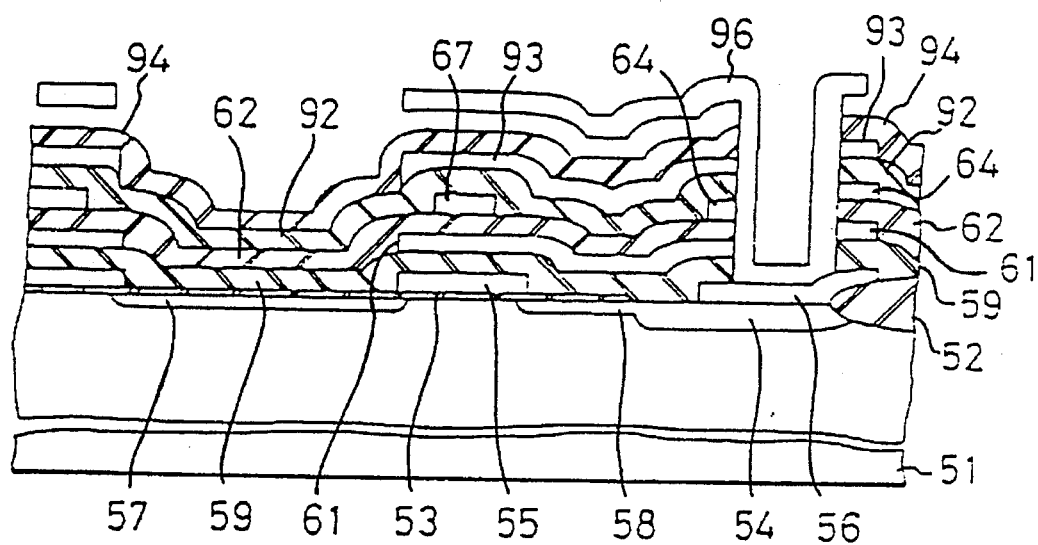

In FIG. 14D, the structure described above is submerged into a HF solution to remove the SiO$_2$ insulator layer 95.

Thereafter, processes similar to those described above in conjunction with FIGS. 11I and 11J of the third embodiment are carried out to form a dielectric layer of the memory capacitor and the like.

According to this embodiment, the fin of the memory capacitor, which is also used in common as the upper gate electrode of the double gate structure TFT load and the storage electrode of the memory capacitor, has a modified construction compared to the third embodiment.

Normally, when etching the polysilicon, the underlying layer is suited as an etching stopper if this underlying layer is made of SiO$_2$ rather than Si$_3$N$_4$. Hence, this embodiment has an advantage in that the formation of the storage electrode of the memory capacitor is facilitated compared to the third embodiment. On the other hand, the number of mask processes increases by one when the the upper gate electrode of the double gate structure TFT load and the storage electrode of the memory capacitor are patterned independently, but since the mutual connection can be realized in one process, the number of mask processes as a whole does not change compared to that of the prior art shown in FIGS. 7A through 7C.

Figure 15A:
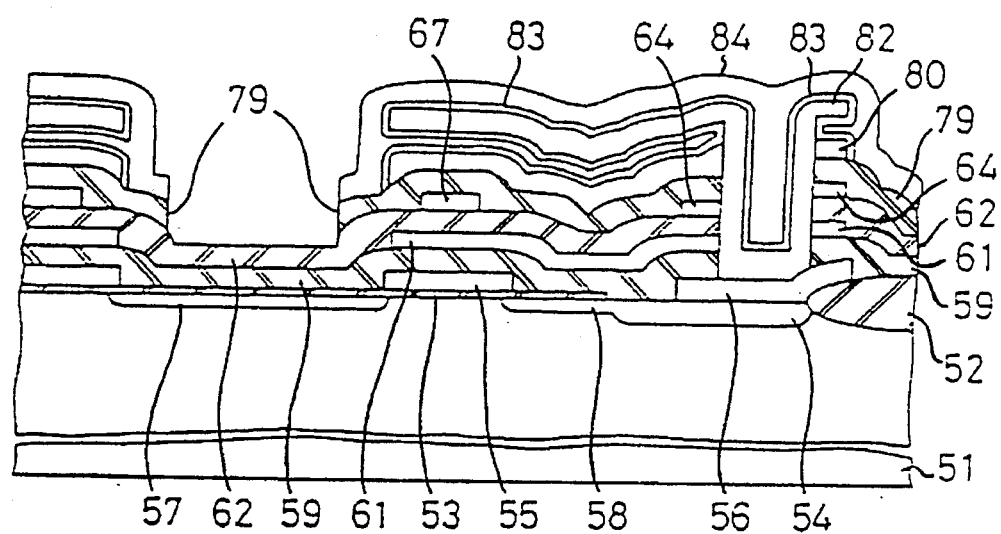
FIGS. 15A and 15B are side views in cross section showing an essential part of a sixth embodiment of the semiconductor memory device according to the present invention at essential stages of a sixth embodiment of the method of producing the semiconductor memory device according to the present invention.
Figure 15B:
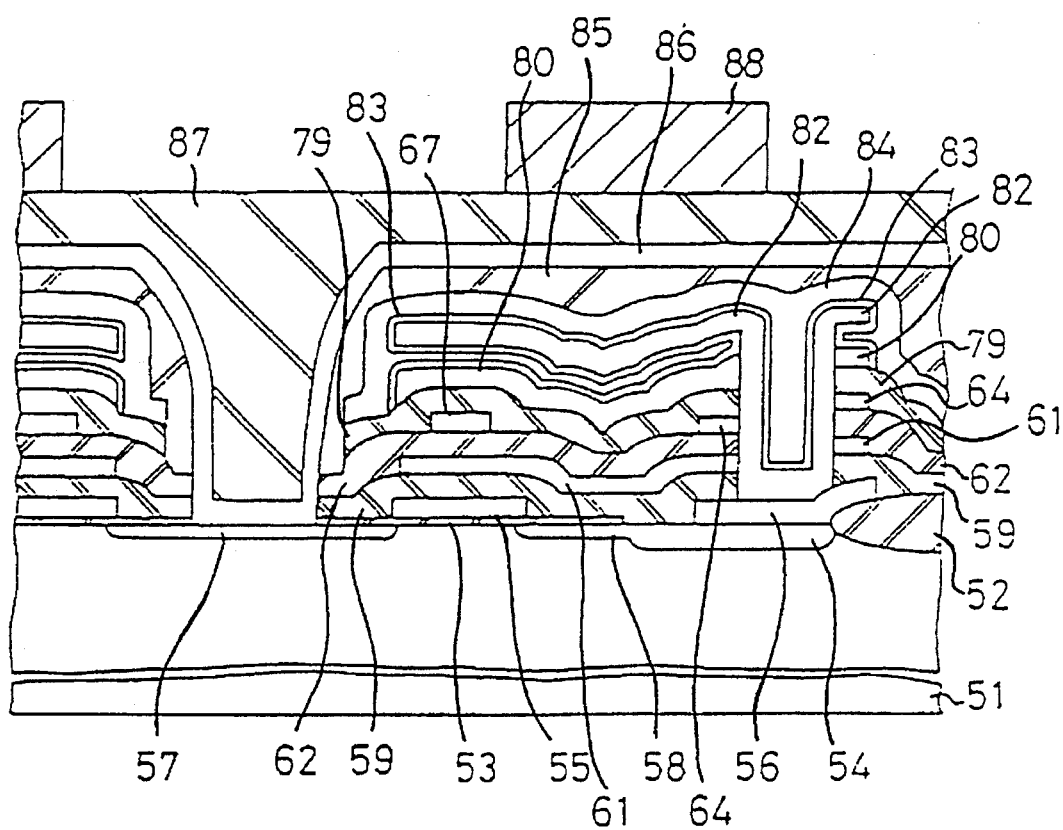

Next, a description will be given of a sixth embodiment of the semiconductor memory device according to the present invention which is produced by a sixth embodiment of the method of producing the semiconductor memory device according to the present invention. FIGS. 15A and 15B are side views in cross section showing an essential part of the sixth embodiment of the semiconductor memory device according to the present invention at essential stages of the sixth embodiment of the method of producing the semiconductor memory device according to the present invention. In FIGS. 15A and 15B, those parts which are the same as those corresponding parts in FIGS. 11A through 11J are designated by the same reference numerals, and a description thereof will be omitted.

In this embodiment of the method, the processes are the same as those of the third embodiment up to the processes shown in FIGS. 11A through 11H, that is, until the insulator layer 81 is removed Hence, a description will only be given of the processes carried out thereafter.

In FIG. 15A, the double gate structure TFT load type SRAM already has on the Si semiconductor substrate 51 the field insulator layer 52, the gate insulator layer 53, the n$^+$-type impurity region 54, the gate electrode 55 of the driver transistor formed from the first polysilicon layer, the n$^+$-type source region 57, the n$^+$-type drain region 58 the insulator layer 59, the gate electrode 61 of the TFT load formed from the second polysilicon layer, the gate insulator layer 62 of the TFT load, the source, drain and channel regions of the TFT load formed from the third polysilicon layer, the Vcc supply line, the insulator layer 79 which is made of Si$_3$N$_4$ and acts as an etching stopper, the fin 80 of the memory capacitor also used in common as the upper gate electrode of the TFT load, and the storage electrode 82 of the memory capacitor. The insulator layer 81 is already removed.

A CVD is carried out to form a dielectric layer 83 which is made of Si$_3$N$_4$ and has a thickness of 100 Å, for example, on the storage electrode 82 of the memory capacitor and the surface of the fin 80 of the memory capacitor. This fin 80 is used in common as the upper gate electrode of the double gate structure TFT load.

Then, a CVD is carried out to form a sixth polysilicon layer having a thickness of 1000 Å, for example.

A thermal diffusion process is carried out to diffuse P in the sixth polysilicon layer with an impurity concentration of $1\times10^{21}$ cm$^{-3}$, for example.

A resist process of the photolithography technique and RIEs using CCl$_4$/O$_2$ and CHF$_3$/He as the etching gases to pattern the sixth polysilicon layer, form an opposing electrode 84 of the memory capacitor, and selectively remove the Si$_3$N$_4$ insulator layer 79 which acts as the etching stopper at the stage of FIG. 11H, by use of the same mask. The CCl$_4$/O$_2$ etching gas is used to etch the polysilicon, while the CHF$_3$/He etching gas is used to remove the Si$_3$N$_4$.

In FIG. 15B, a CVD is carried out to form an insulator layer which is made of SiO$_2$ and has a thickness of 1000 Å, for example, and an insulator layer which is made of PSG and has a thickness of 5000 Å, for example. In FIG. 15B, these two insulator layers are shown as an insulator layer 85.

Then, a thermal process is carried out to fellow and planarize the insulator layer 85.

A resist process of the photolithography technique and a RIE using CHF$_3$/He as the etching gas are carried out to selectively etch the insulator layer 85 and the like and to form a ground line contact hole.

A CVD is carried out to form a seventh polysilicon layer having a thickness of 1000 Å, for example.

A thermal diffusion process is carried out to diffuse P in the seventh polysilicon layer with an impurity concentration of $1\times10^{21}$ cm$^{-3}$, for example.

A resist process of the photolithography technique and a RIE using CCl$_4$/O$_2$ as the etching gas are carried out to pattern the seventh polysilicon layer and to form a Vss supply line 86.

A CVD is carried out to form an insulator layer 87 which is made of borophosphosilicate glass (BPSG) and has a thickness of 5000 Å, for example.

A thermal process is carried out to reflow and planarize the insulator layer 87.

A resist process of the photolithography technique and a RIE using $CCl_4/O_2$ or the like as the etching gas are carried out to selectively etch the insulator layer 87 and the like, and to form a bit line contact hole. This bit line contact hole cannot be seen in FIG. 15B.

Thereafter, a sputtering is carried out to form an Al layer having a thickness of 1 μm, for example, and this Al layer is patterned to form a bit line 88 by use of the normal photolithography technique.

According to this embodiment, it is possible to obtain a very good result when contacting the Al bit line 88 to the source region (not shown) of the transfer transistor.

In other words, as described in conjunction with FIG. 15B, the bit line contact hole is formed at a part which cannot be seen in FIG. 15B, but in this case, the stacked part which is etched has the PSG layer on top of the $Si_3N_4$ insulator layer 79 and the $SiO_2$ layer on the bottom of the $Si_3N_4$ insulator layer 79. Hence, the resist mask must be removed by oxygen plasma or the like. However, a natural oxide layer is formed at the bottom of the bit line contact hole, and this natural oxide layer must be removed by a hydrofluoric acid process before forming the Al bit line 88. The $Si_3N_4$ insulator layer 79 is virtually unaffected by such a hydrofluoric acid process, but the PSG layer and the $SiO_2$ layer are etched and the hole diameter increases at these parts. Accordingly, only the $Si_3N_4$ insulator layer 79 projects within the bit line contact hole, and a disconnection easily occurs when the Al layer is formed thereon.

But according to the sixth embodiment, the $Si_3N_4$ insulator layer 79 is patterned at the stage where the opposing electrode 84 of the memory capacitor is formed, and the above described problems will not occur. In addition, since the $Si_3N_4$ insulator layer 79 is removed using the same mask as the opposing electrode 84, and the number of mask processes will not increase.

Next, a description will be given of a seventh embodiment of the semiconductor memory device according to the present invention which is produced by a seventh embodiment of the method of producing the semiconductor memory device according to the present invention. FIGS. 16A through 16H are side views in cross section and FIGS. 17A through 17F are plan views respectively showing an essential part of the seventh embodiment of the semiconductor memory device according to the present invention at essential stages of the seventh embodiment of the method of producing the semiconductor memory device according to the present invention. In FIGS. 16A through 16H and FIGS. 17A through 17F, those parts which are the same as those corresponding parts in FIGS. 1A through 1J are designated by the same reference numerals, and a description thereof will be omitted. FIGS. 16A through 16H respectively are cross sections taken along a line which corresponds to a line Y—Y in the plan view of FIG. 17F.

Figure 1D:
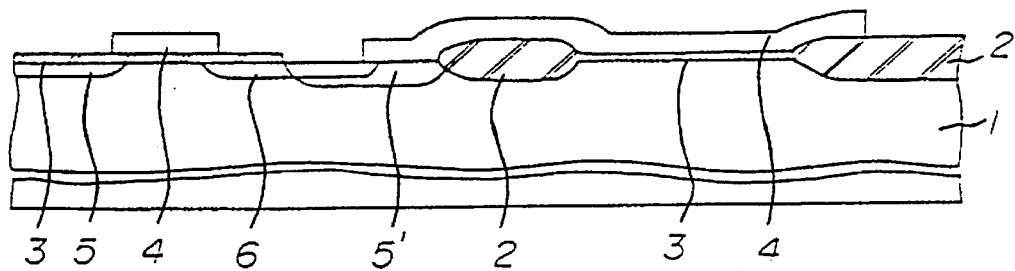
Figure 1E:
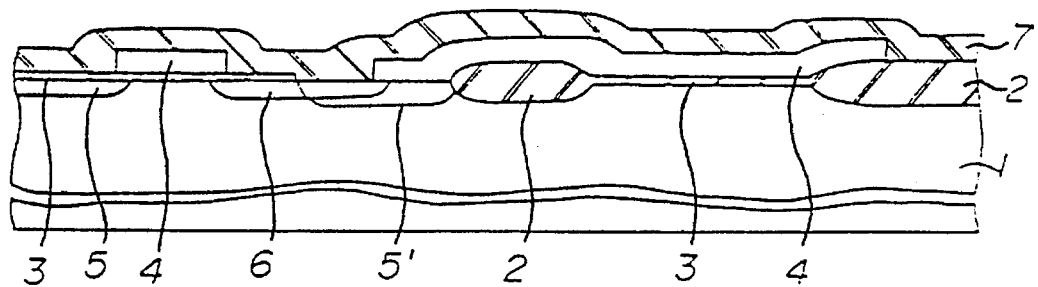
Figure 1F:
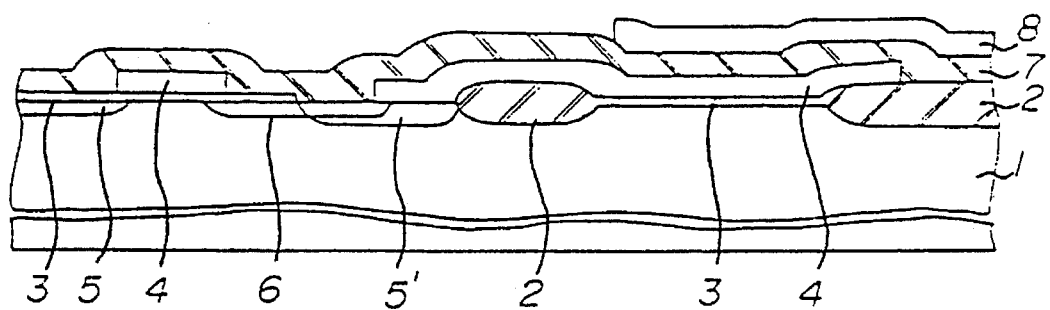
Figure 1G:
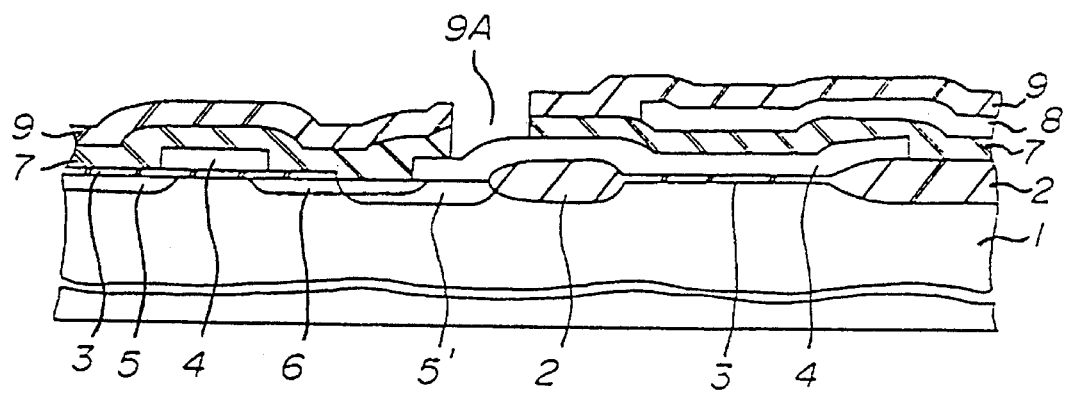
Figure 1H:
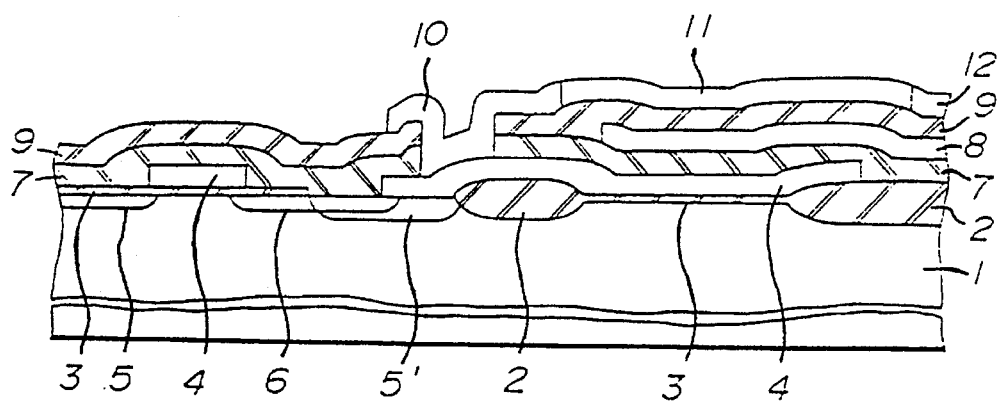

In this embodiment of the method, the processes are the same as those of the prior art up to the processes shown in FIGS. 1A and 1D, that is, until the source region 5 and the drain region 6 are formed. Hence, a description will only be given of the processes carried out thereafter.

Figure 16A:
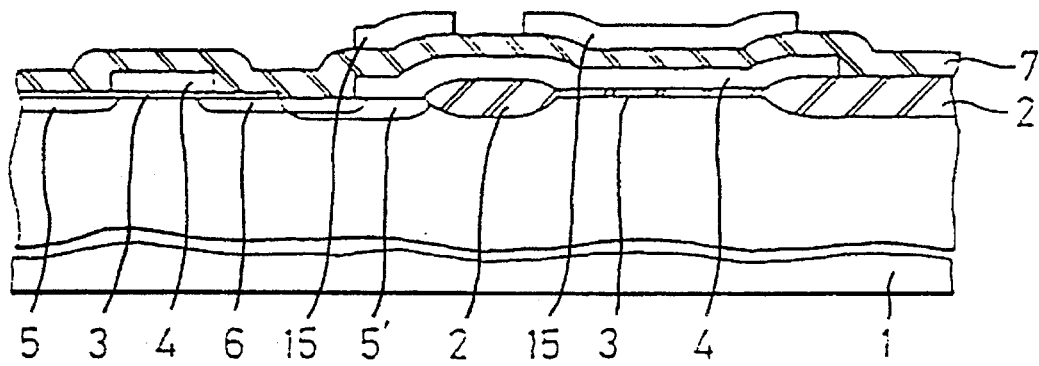
FIGS. 16A through 16H are side views in cross section showing an essential part of a seventh embodiment of the semiconductor memory device according to the present invention at essential stages of a seventh embodiment of the method of producing the semiconductor memory device according to the present invention.
Figure 17A:
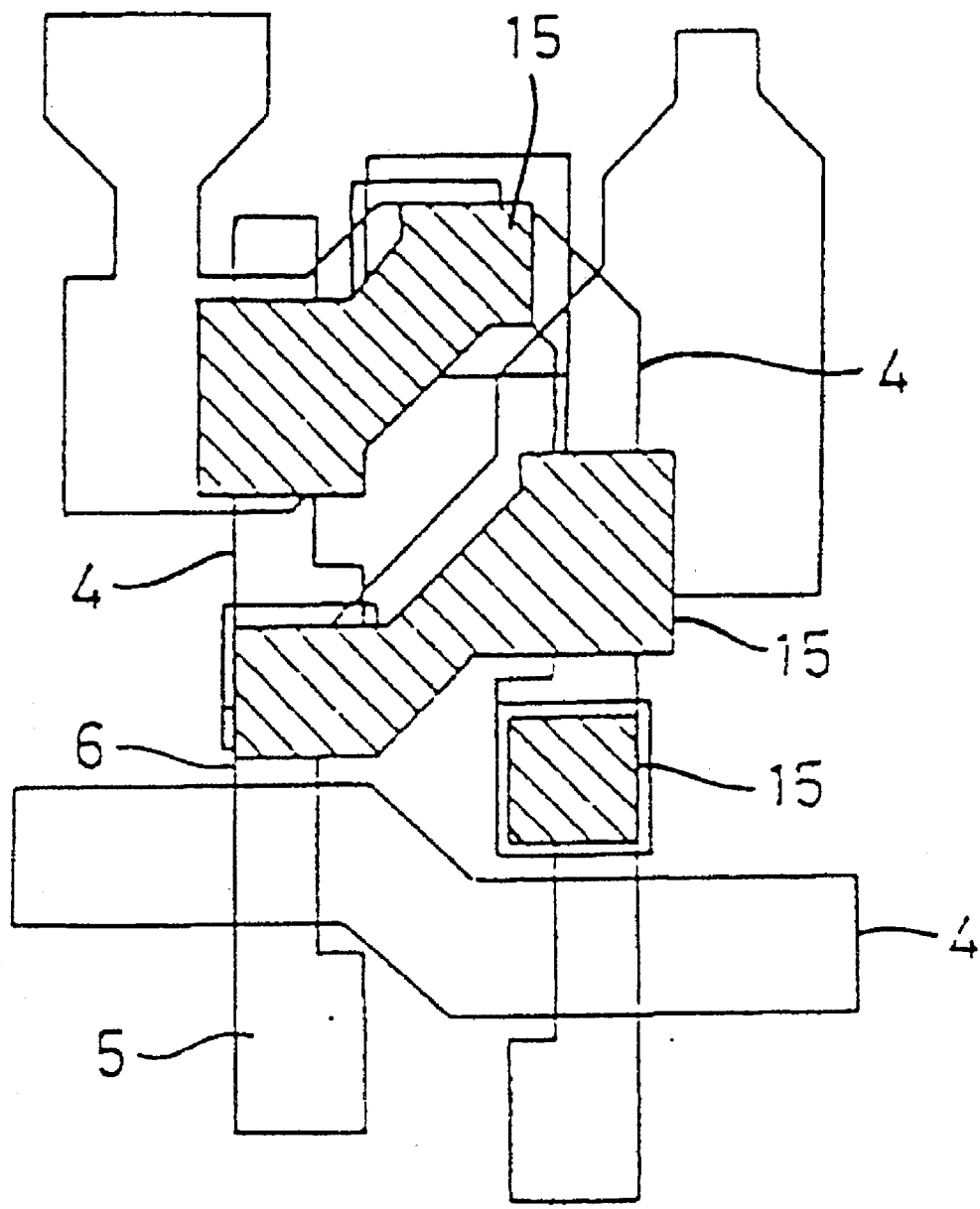
FIGS. 17A through 17F are plan views of the semiconductor memory device at essential stages of the seventh embodiment of the method shown in FIGS. 16A through 16H.

In FIGS. 16A and 17A, the double gate structure TFT load type SRAM already has on the Si semiconductor substrate 1 the field insulator layer 2, the gate insulator layer 3, the gate electrode 4 of the driver transistor formed from the first polysilicon layer, the $n^+$-type impurity region 5', the $n^+$-type source region 5, and the $n^+$-type drain region 6.

A CVD is carried out to form an insulator layer 7 which is made of $SiO_2$ and has a thickness of 1000 Å, for example.

Then, a CVD is carried out to form a second polysilicon layer having a thickness of 500 Å, for example.

An ion implantation is carried out to inject P ions into the second polysilicon layer with a dosage of $1\times10^{15}$ cm$^{-2}$ and an acceleration energy of 10 keV.

A resist process of the photolithography technique and a RIE using $CCl_4/O_2$ as the etching gas are carried out to pattern the second polysilicon layer and to form a lower gate electrode 15 of the TFT load.

Figure 16B:
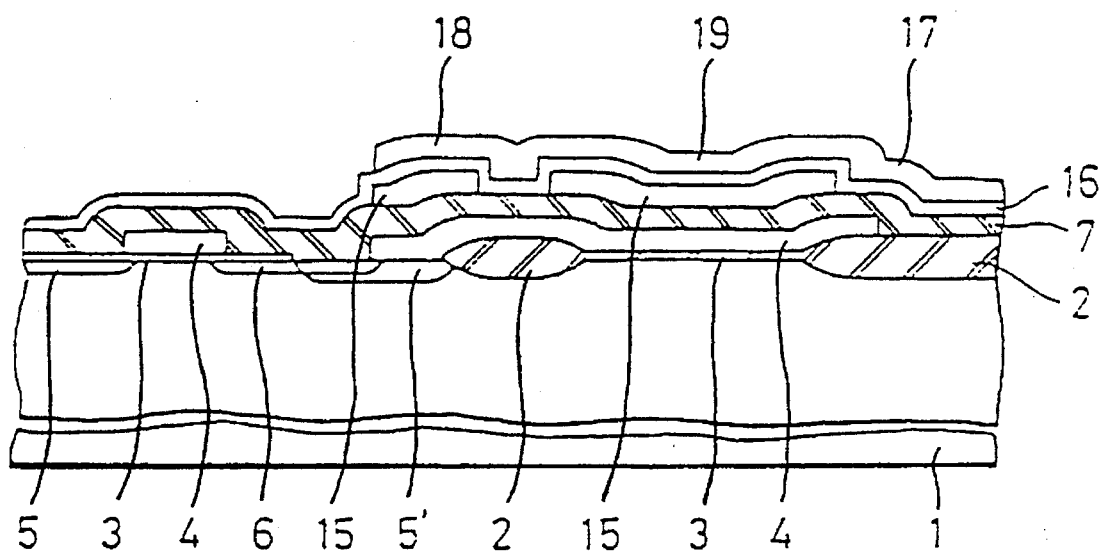
Figure 17B:
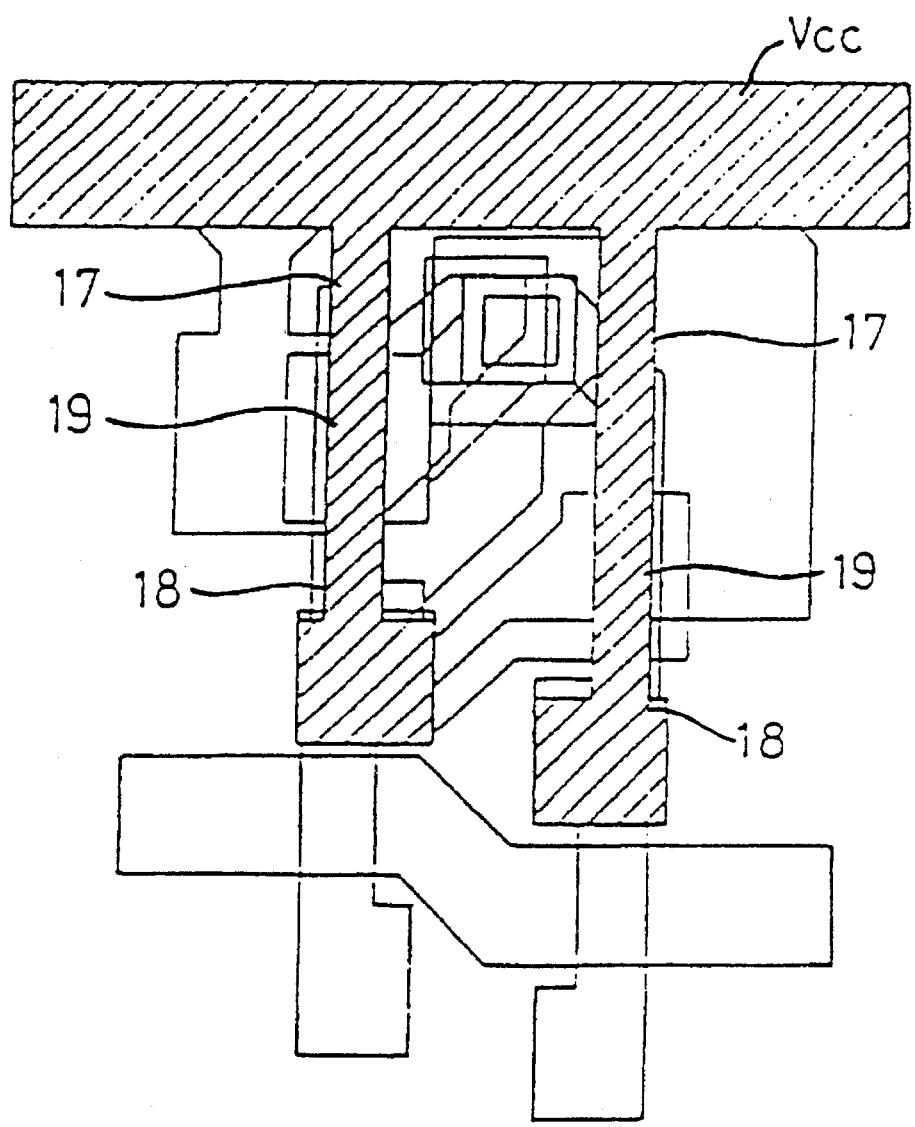

In FIGS. 16B and 17B, a CVD is carried out to form a lower gate insulator layer 16 of the TFT load, which is made of $SiO_2$ and has a thickness of 200 Å, for example.

Then, a CVD is carried out to form a third polysilicon layer having a thickness of 200 Å, for example.

A resist process of the photolithography technique and an ion implantation are carried out to inject B ions with a dosage of $1\times10^{14}$ cm$^{-2}$ and an acceleration energy of 5 keV, for example, into parts of the third polysilicon layer where the source and drain regions of the TFT load are formed.

A resist process of the photolithography technique and a RIE using $CCl_4/O_2$ as the etching gas are carried out to pattern the third polysilicon layer and to form a source region 17, a drain region 18 and a channel region 19 of the TFT load, a Vcc supply line and the like. The Vcc supply line cannot be seen in FIG. 16B but is shown in FIG. 17B.

Figure 16C:
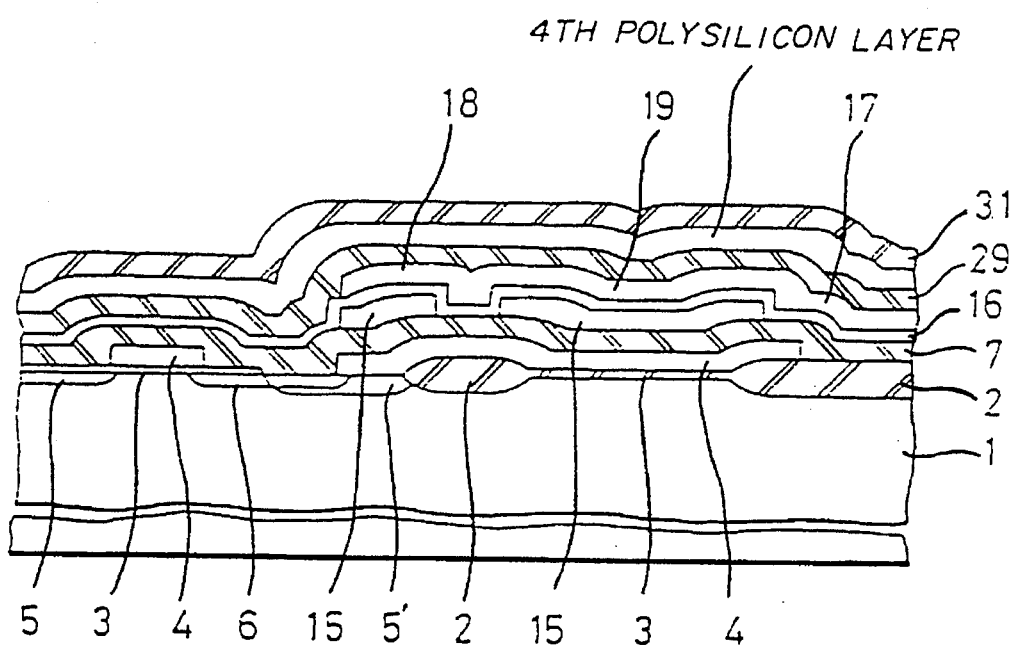

In FIG. 16C, a CVD is carried out to form on the entire surface an upper gate insulator layer 29 of the TFT load, which also acts as an etching stopper. The upper gate insulator layer 29 is made of $Si_3N_4$ and has a thickness of 500 Å, for example.

Then, a CVD is carried out to form a fourth polysilicon layer having a thickness of 500 Å, for example.

An ion implantation is carried out to inject P ions into the fourth polysilicon layer with a dosage of $1\times10^{15}$ cm$^{-2}$ and an acceleration energy of 10 keV, for example.

A CVD is carried out to form on the entire surface an insulator layer 31 which acts as a spacer. This insulator layer 31 is made of $SiO_2$ and has a thickness of 500 Å, for example.

Figure 16D:
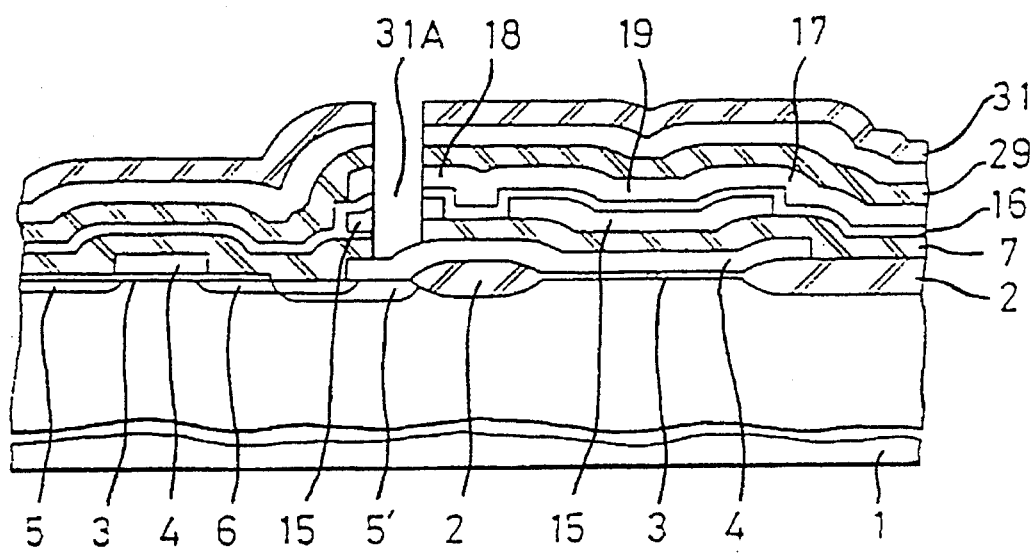
Figure 17C:
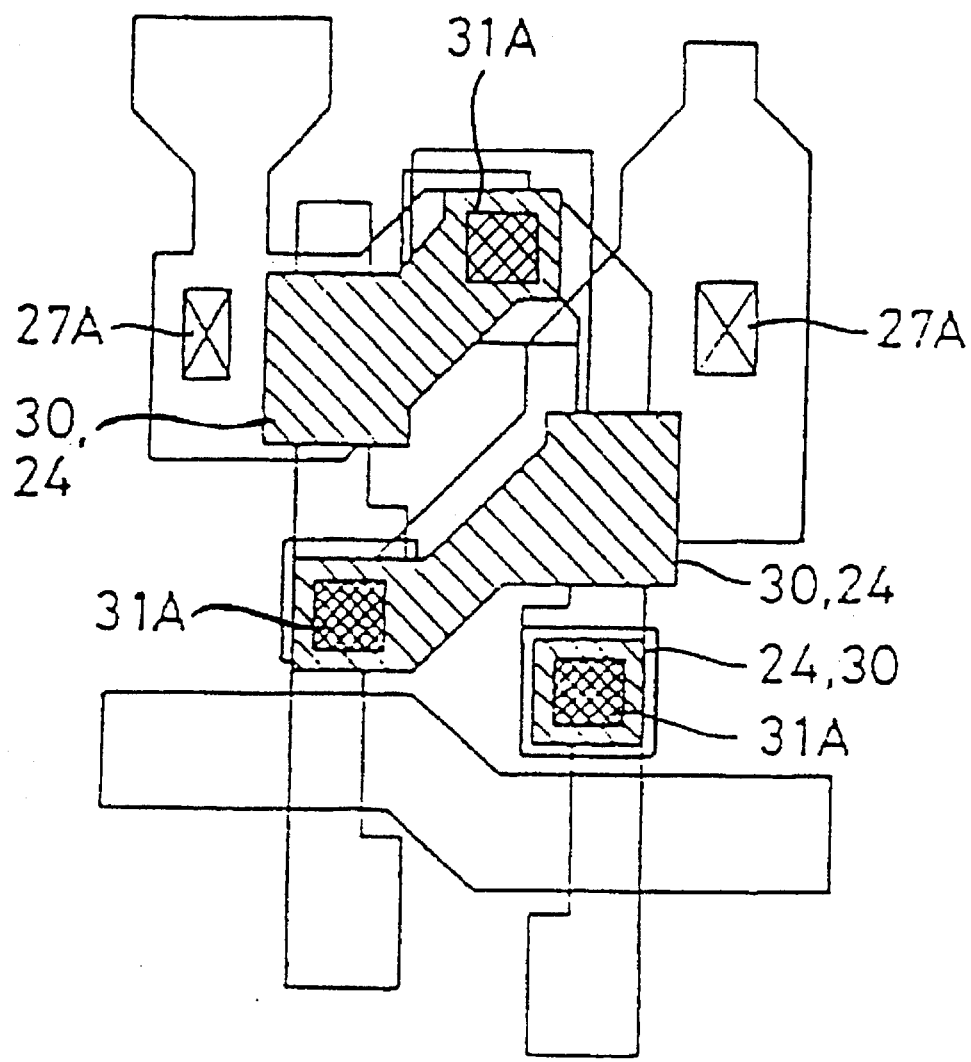

In FIGS. 16D and 17C, a resist process of the photolithography technique and RIEs using $CHF_3/He$ and $CCl_4/O_2$ as etching gases are carried out to selectively etch the insulator layer 31, the fourth polysilicon layer, the upper gate insulator layer 29 of the TFT load, the drain region 18 of the TFT load formed from the third polysilicon layer, the lower gate insulator layer 16, the lower gate electrode 15 formed from the second polysilicon layer, and the insulator layer 7, and to form a contact hole 31A. The $CHF_3/He$ etching gas is used to etch the $SiO_2$ and the $Si_3N_4$, while the $CCl_4/O_2$ etching gas is used to etch the polysilicon. The contact hole 31A extends from the top surface of the insulator layer 31 and reaches the top surface of the gate electrode 4 of the driver transistor formed from the first polysilicon.

Figure 16E:
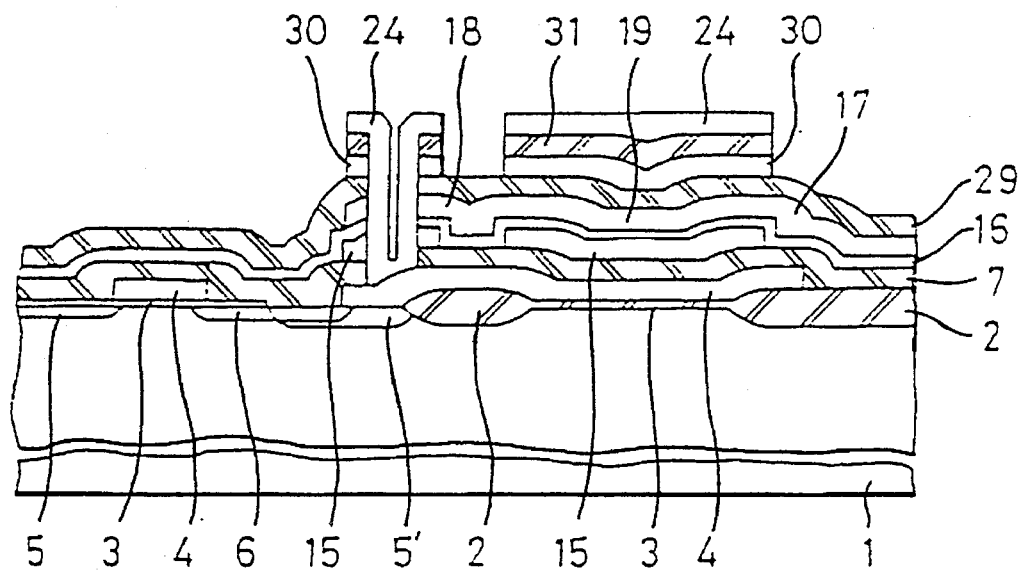

In FIGS. 16E and 17C, a CVD is carried out to form a fifth polysilicon layer having a thickness of 500 Å, for example.

Then, a thermal diffusion process is carried out to diffuse P in the fifth polysilicon layer with an impurity concentration of $1\times10^{21}$ cm$^{-3}$, for example.

A resist process of the photolithography technique and RIEs using $CCl_4/O_2$ and $CHF_3/He$ as the etching gases are carried out to pattern the fifth polysilicon layer, the insulator layer 31 and the fourth polysilicon layer, and to form a storage electrode 24 of the memory capacitor and an upper gate electrode 30 of the TFT load. The $CCl_4/O_2$ etching gas is used to etch the polysilicon, while the $CHF_3/He$ etching gas is used to etch the $SiO_2$. The upper gate electrode 30 is used in common as a fin of the memory capacitor.

Figure 16F:
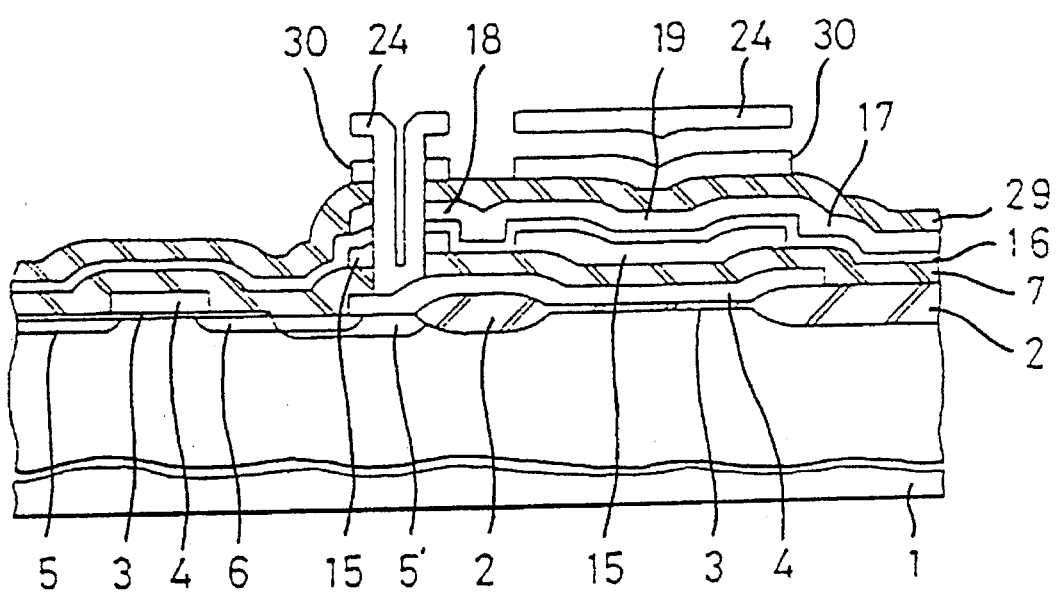

In FIG. 16F, the structure described above is submerged in a HF solution to remove the $SiO_2$ insulator layer 31.

Figure 16G:
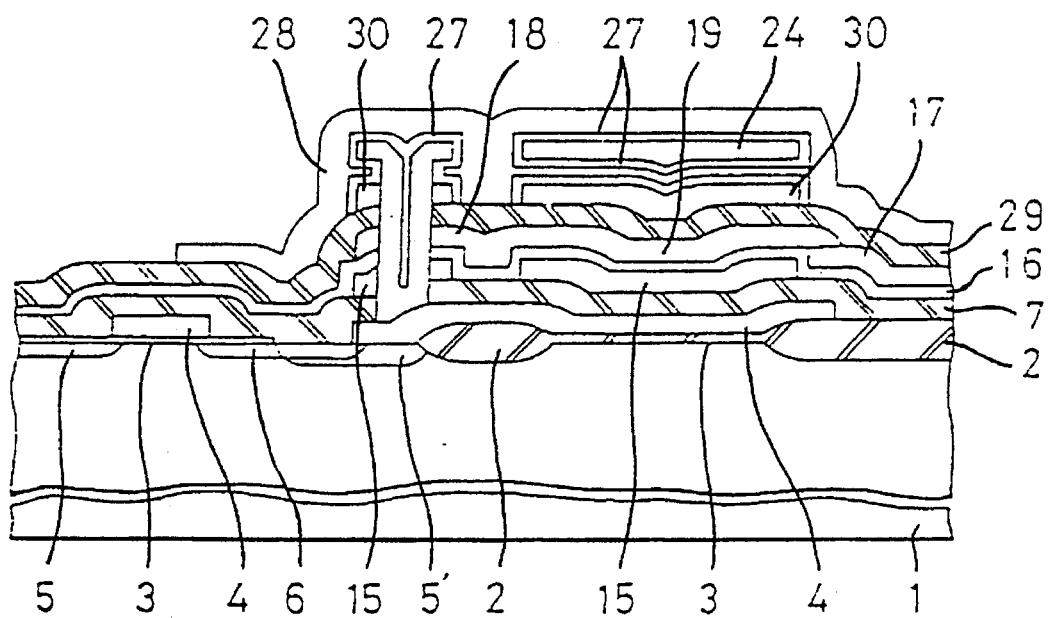
Figure 17D:
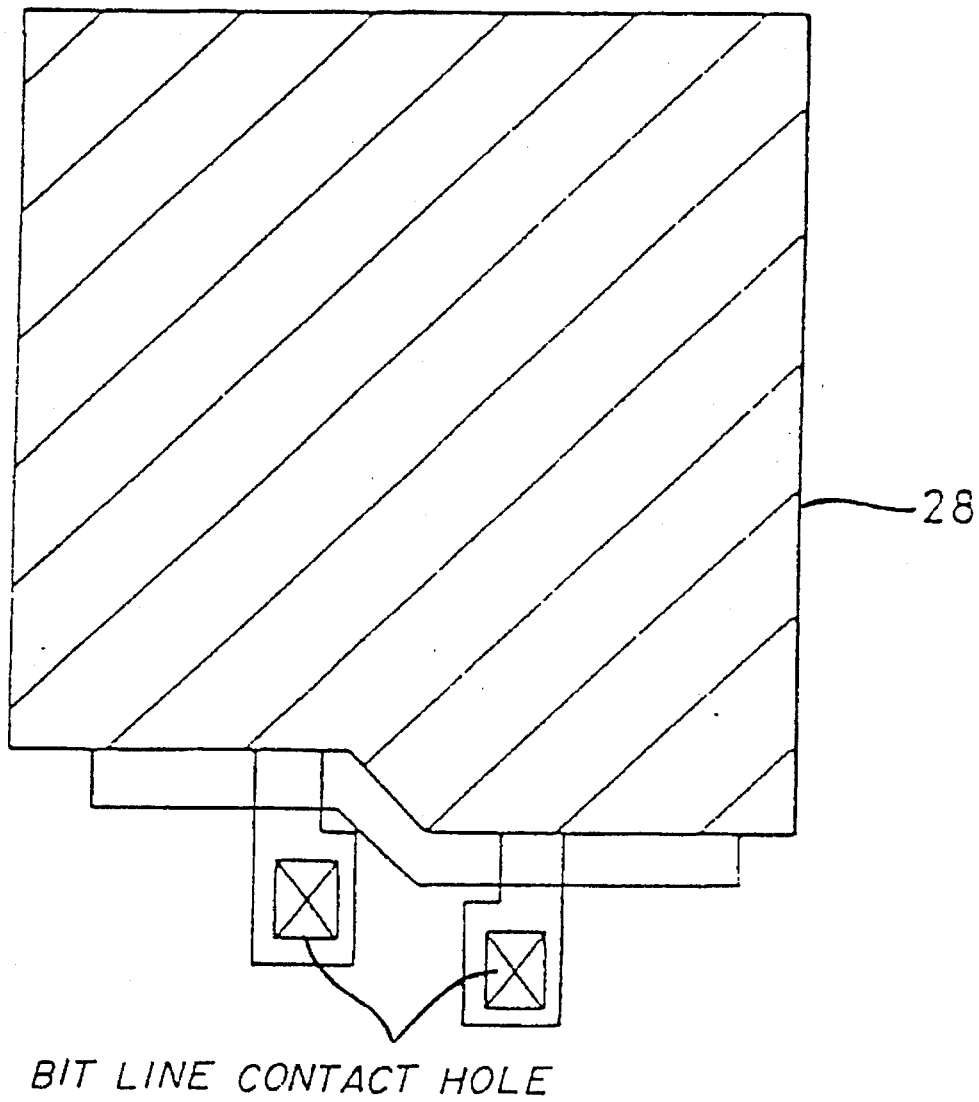

In FIGS. 16G, 17C and 17D, a CVD is carried out to form a dielectric layer 27 which is made of $Si_3N_4$ and has a thickness of 200 Å, for example, on the storage electrode 24 of the memory capacitor and on the surface of the upper gate electrode 30.

A resist process of the photolithography technique and a RIE using $CHF_3/He$ as the etching gas are carried out to selectively etch the upper gate insulator layer 29, the lower gate insulator layer 16, the insulator layer 7 and the gate insulator layer 3, and to form a ground line contact hole 27A shown in FIG. 17C.

Then, a CVD is carried out to form a sixth polysilicon layer having a thickness of 1000 Å, for example.

A thermal diffusion process is carried out to diffuse P in the sixth polysilicon layer with an impurity concentration of $1\times10^{21}$ cm$^{-3}$, for example.

A resist process of the photolithography technique and a RIE using $CCl_4/O_2$ as the etching gas are carried out to pattern the sixth polysilicon layer and to form an opposing electrode 28 of the memory capacitor. This opposing electrode 28 is used in common as a ground line.

Figure 16H:
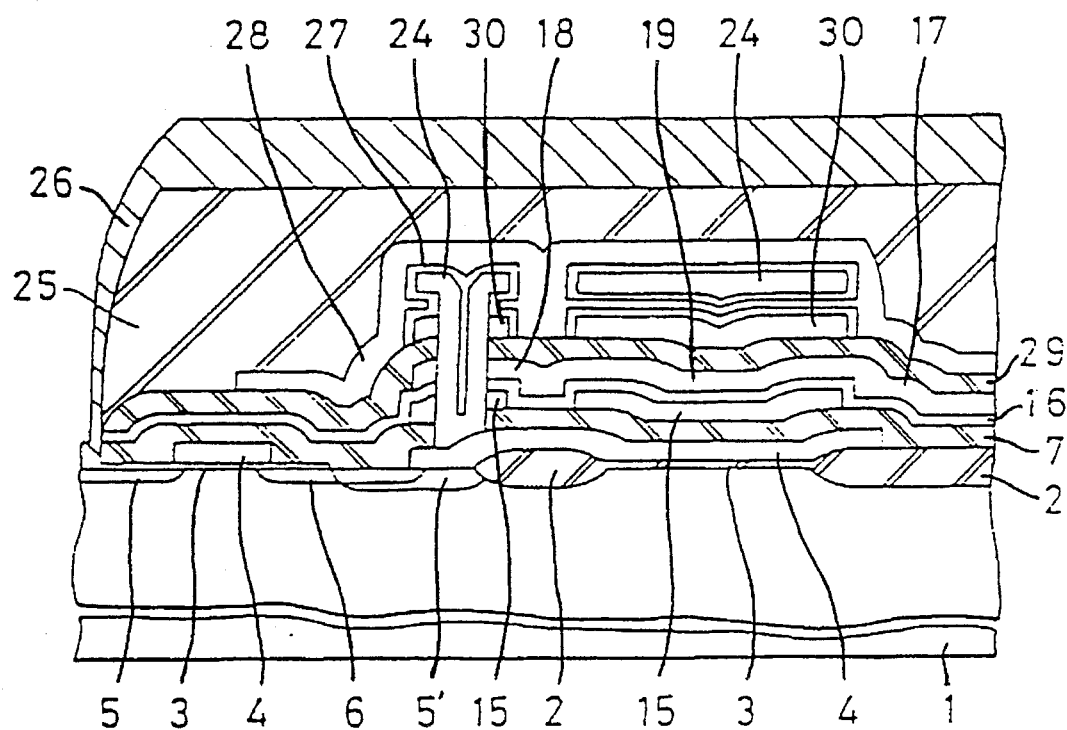
Figure 17E:
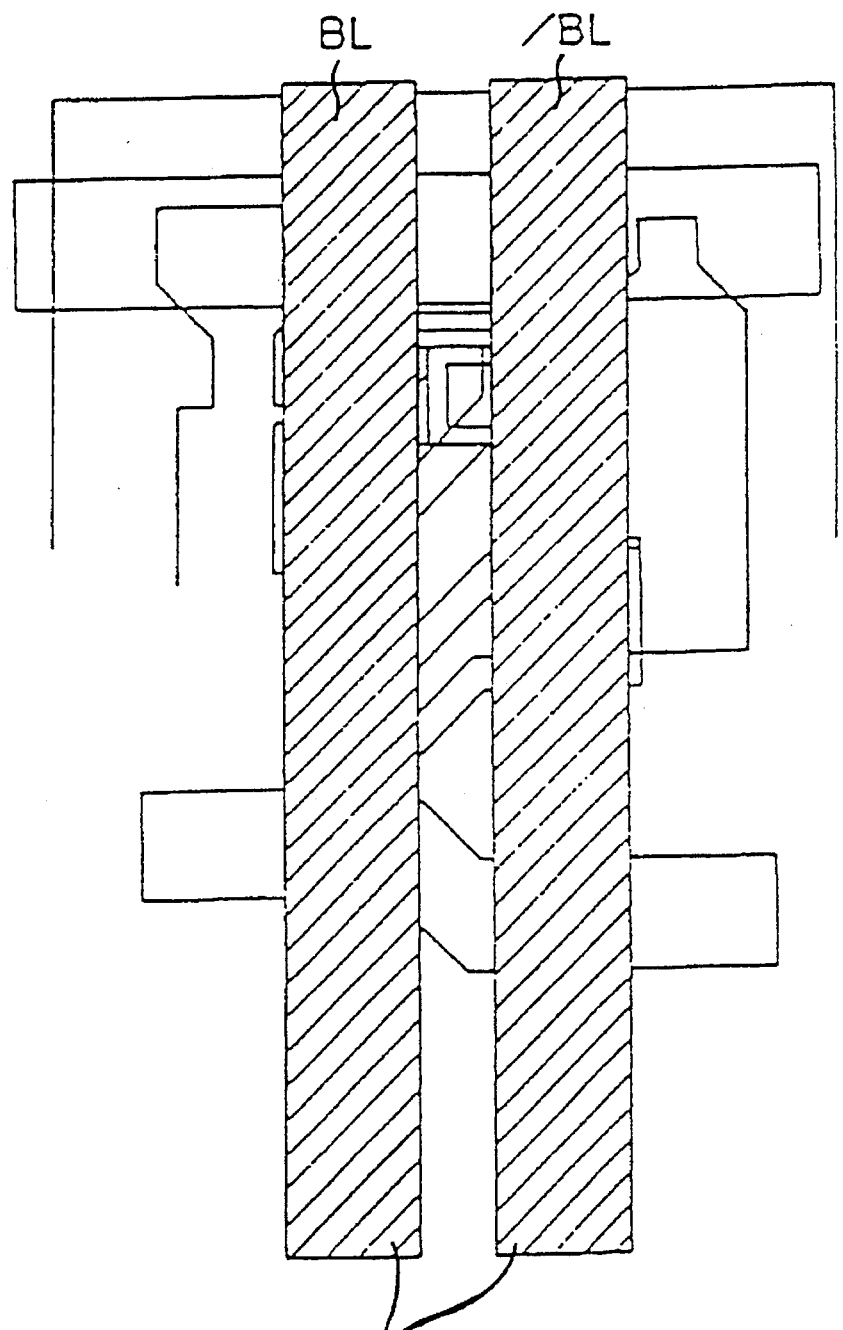

In FIGS. 16H and 17E, a CVD is carried out to form an insulator layer which is made of $SiO_2$ and has a thickness of 1000 Å, for example, and an insulator layer which is made of PSG and has a thickness of 5000 Å, for example. These two insulator layers are shown as an insulator layer 25 in FIG. 16H.

Then, a thermal process is carried out to reflow and planarize the insulator layer 25.

A resist process of the photolithography technique and a RIE using $CHF_3/He$ as the etching gas are carried out to selectively etch the insulator layer 25 and the like, and to form a bit line contact hole.

Thereafter, a sputtering is carried out to form an Al layer having a thickness of 1 μm, for example, and this Al layer is patterned into a bit line 26 by using the normal photolithography technique.

Figure 17F:
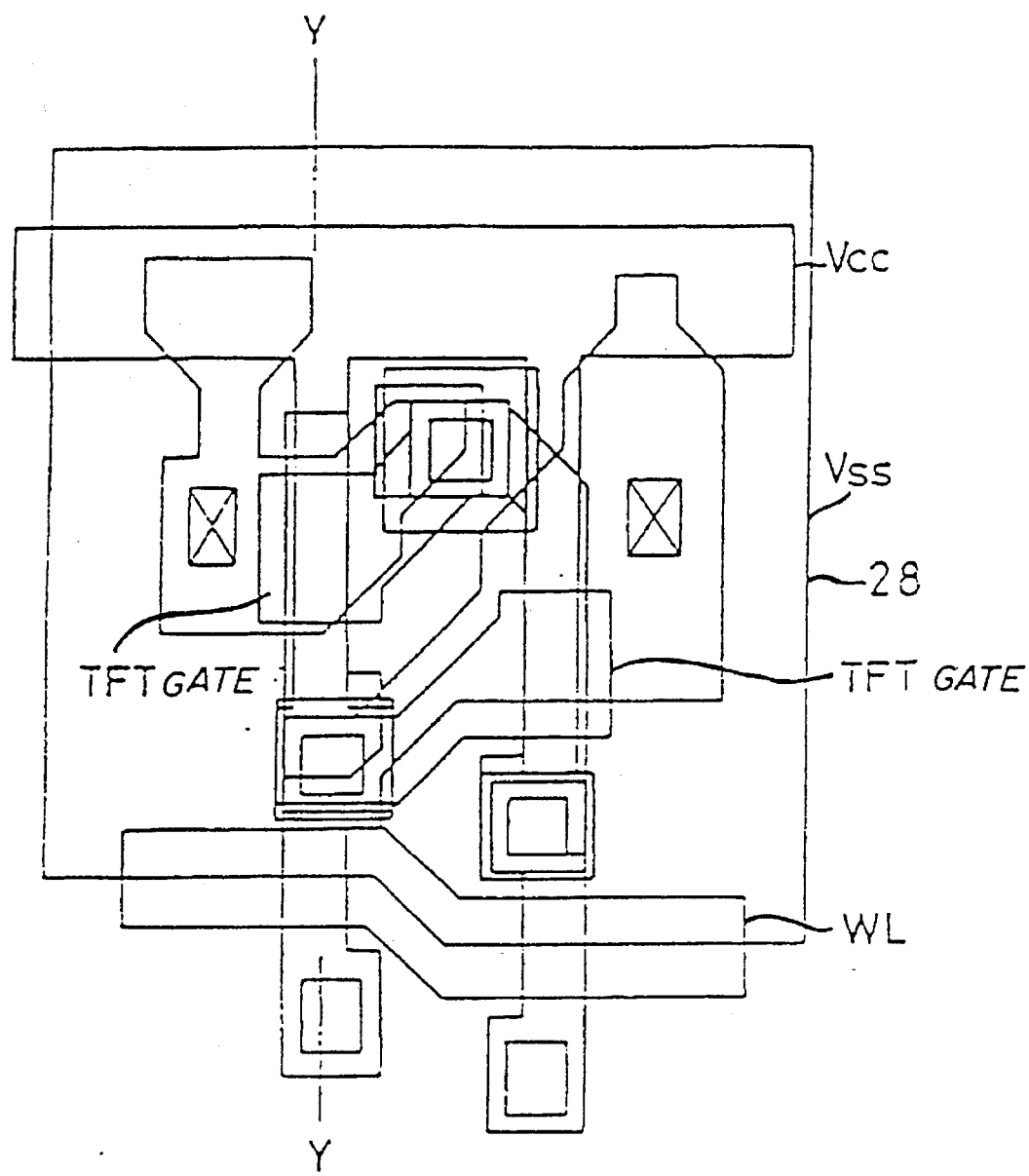

FIG. 17F is a plan view showing the essential part of the double gate structure TFT load type SRAM which is completed by the above described processes. In FIG. 17F, the illustration of the Al bit line 26 shown in FIGS. 16H and 17E is omitted for the sake of convenience, so as to simplify the drawing. From FIG. 17F, it is possible to clearly see the mutual relationship of the pattern of the opposing electrode 28 of the memory capacitor, which also functions as the ground line, and the patterns at other regions of the SRAM.

Generally, if a memory capacitor is independently provided in the double gate structure TFT load type SRAM, one mask process is additionally required to form the opposing electrode. However, according to the seventh embodiment, the opposing electrode and the ground line are used in common. As a result, there is no increase in the number of mask processes as a whole. On the other hand, because the contact hole 31A for connecting the TFT load and the driver transistor is formed in one mask process as described in conjunction with FIG. 16D, the number of mask processes decreases by two when compared to the prior art described in conjunction with FIGS. 7A through 7C.

Figure 18:
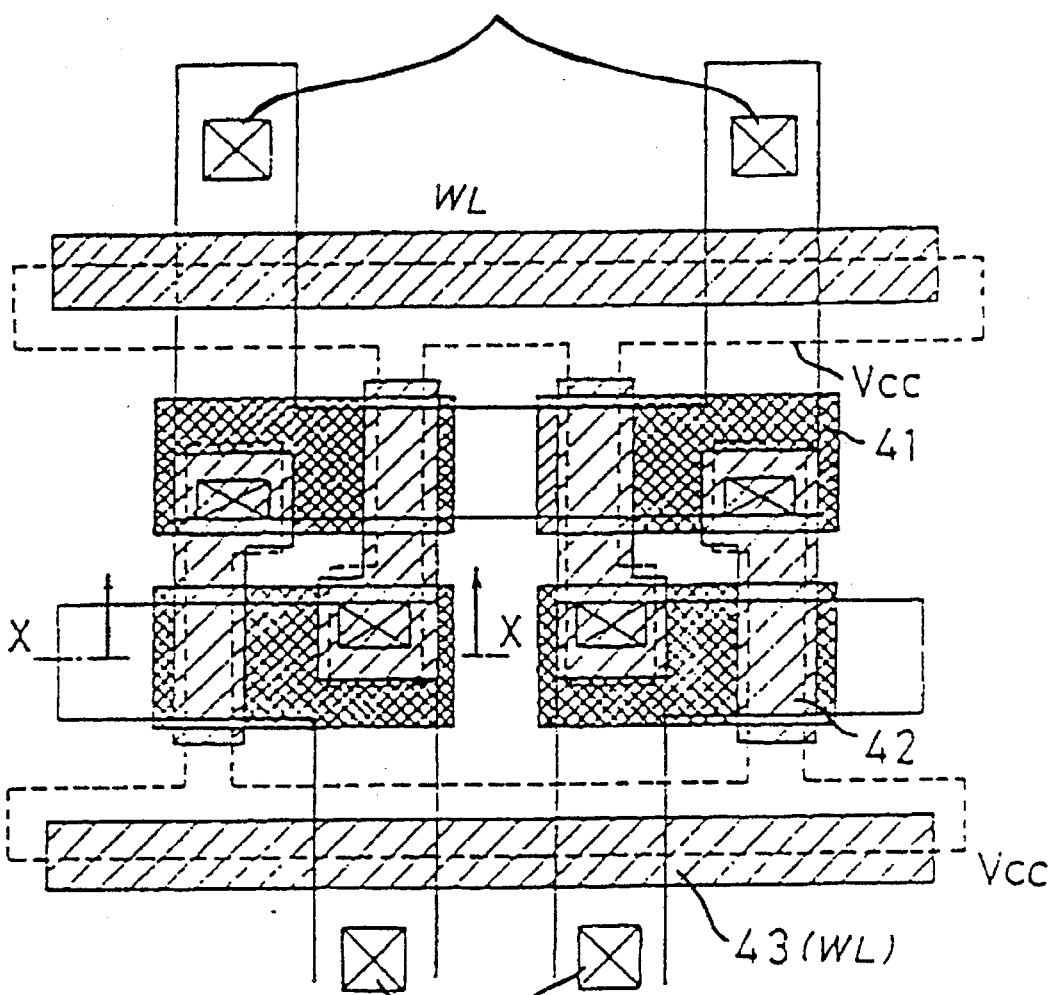
FIG. 18 is a plan view generally showing an essential part of a TFT load type SRAM.

FIG. 18 is a plan view generally showing an essential part of a TFT load type SRAM. FIG. 18 shows a gate 41 of the TFT load, a channel 42 of the TFT load, a word line 43 (WL) and a supply line Vcc for supplying the positive power source voltage Vcc.

According to the SRAM shown in FIG. 18, the driver transistors and the TFT loads are arranged in a symmetrical manner, thereby making it possible to design the layout with ease. Hence, a description will hereunder be given of an eighth embodiment of the semiconductor memory device according to the present invention which is applied to the TFT load type SRAM shown in FIG. 18.

Next, a description will be given of an eighth embodiment of the semiconductor memory device according to the present invention which is produced by an eighth embodiment of the method of producing the semiconductor memory device according to the present invention. FIGS. 19A through 19J are side views in cross section showing an essential part of the eighth embodiment of the semiconductor memory device according to the present invention at essential stages of the eighth embodiment of the method of producing the semiconductor memory device according to the present invention. FIGS. 19A through 19J respectively are cross sections taken along a line X—X in FIG. 18.

Figure 19A:
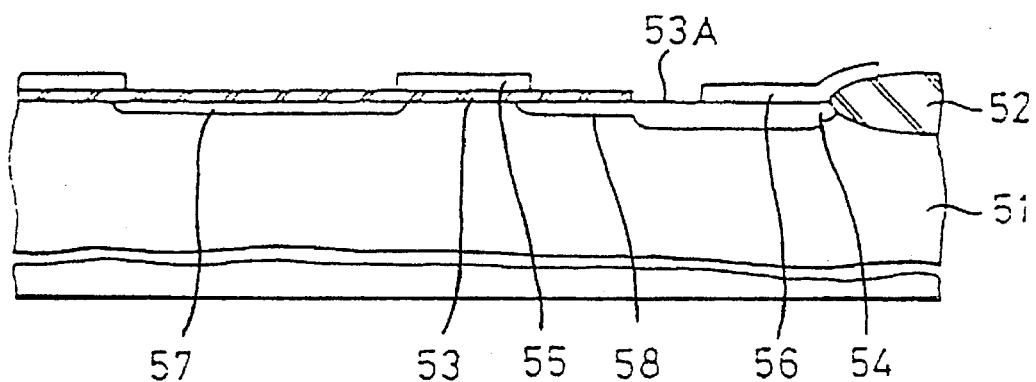
FIGS. 19A through 19J are side views in cross section showing an essential part of an eighth embodiment of the semiconductor memory device according to the present invention at essential stages of an eighth embodiment of the method of producing the semiconductor memory device according to the present invention.

In FIG. 19A, a pad layer made of $SiO_2$ covering an active region of a Si semiconductor substrate 51 and an oxidation resistant mask layer made of $Si_3N_4$ formed on the pad layer are used to carry out a selective thermal oxidation to form a field insulator layer 52 which is made of $SiO_2$ and has a thickness of 4000 Å, for example.

After exposing the active region by removing the oxidation resistant mask layer and the pad layer, a thermal oxidation is carried out to form a gate insulator layer 53 which is made of $SiO_2$ and has a thickness of 100 Å, for example.

A resist process of the photolithography technique and a wet etching using hydrofluoric acid as the etchant are carried out to selective etch the gate insulator layer 53 and to form a contact hole 53A which is also used when diffusing impurities.

A CVD is carried out to form a first polysilicon layer having a thickness of 1000 Å, for example.

Then, a vapor phase diffusion is carried out to introduce P with an impurity concentration of $1\times 10^{20}$ cm$^{-3}$, for example, so as to form an $n^+$-type impurity region 54.

A resist process of the photolithography technique and a RIE using $CCl_4/O_2$ as the etching gas are carried out to pattern the first polysilicon layer and to form gate electrodes 55 and 56.

An ion implantation is carried out to inject As ions into the first polysilicon layer with a dosage of $1\times10^{15}$ cm$^{-2}$ and an acceleration energy of 30 keV, for example, so as to form an $n^+$-type source region 57 and an $n^+$-type drain region 58.

Figure 19B:
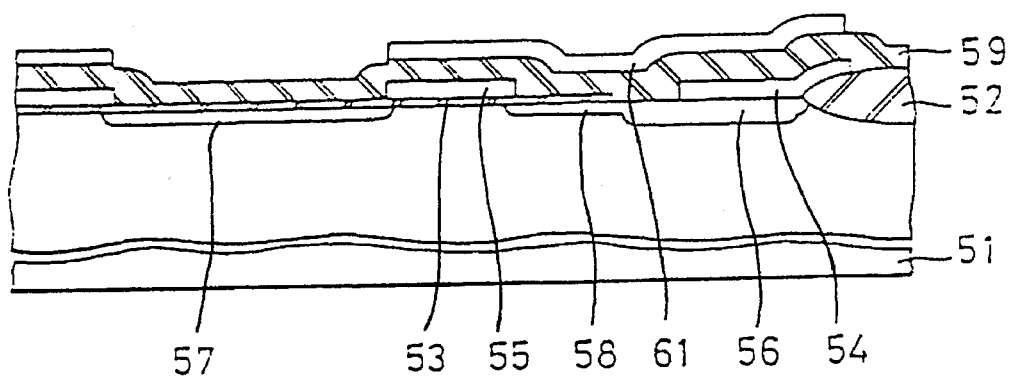

In FIG. 19B, a CVD is carried out to form an insulator layer 59 which is made of $SiO_2$ and has a thickness of 1000 Å, for example.

Then, a CVD is carried out to form a second polysilicon layer having a thickness of 1000 Å, for example.

A vapor phase diffusion is carried out to introduce P into the second polysilicon layer with an impurity concentration of $1\times10^{20}$ cm$^{-3}$, for example.

Next, a resist process of the photolithography technique and a RIE using $CCl_4/O_2$ as the etching gas are carried out to pattern the second polysilicon layer and to form a lower gate electrode 61 of the TFT load and the like.

Figure 19C:
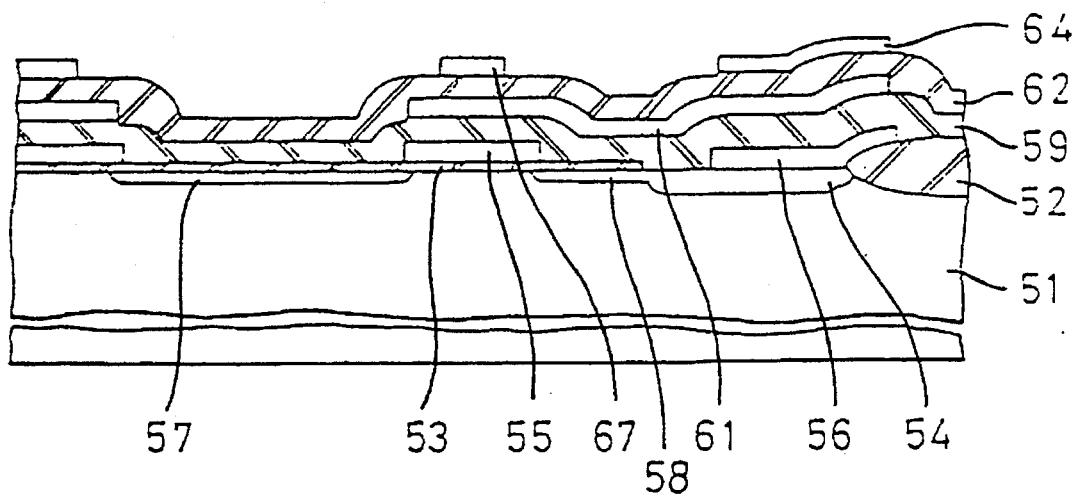

In FIG. 19C, a CVD is carried out to form a lower gate insulator layer 62 of the TFT load, which is made of $SiO_2$ and has a thickness of 200 Å, for example.

Then, a CVD is carried out to form a third polysilicon layer having a thickness of 200 Å, for example.

A resist process of the photolithography technique and an ion implantation are carried out to inject B ions with a dosage of $1 \times 10^{14}$ cm$^{-2}$ and an acceleration energy of 5 keV, for example, into parts of the third polysilicon layer where source and drain regions of the TFT load and a Vcc supply line are formed.

A resist process of the photolithography technique and a RIE using $CCl_4/O_2$ as the etching gas are carried out to pattern the third polysilicon layer and to form a contact part, a drain region, a source region and a channel region of each TFT load, and the Vcc supply line. In FIG. 19C, only a contact part 64 which connects to a source region of a TFT load and a channel region 67 of an adjacent TFT load can be seen.

Figure 19D:
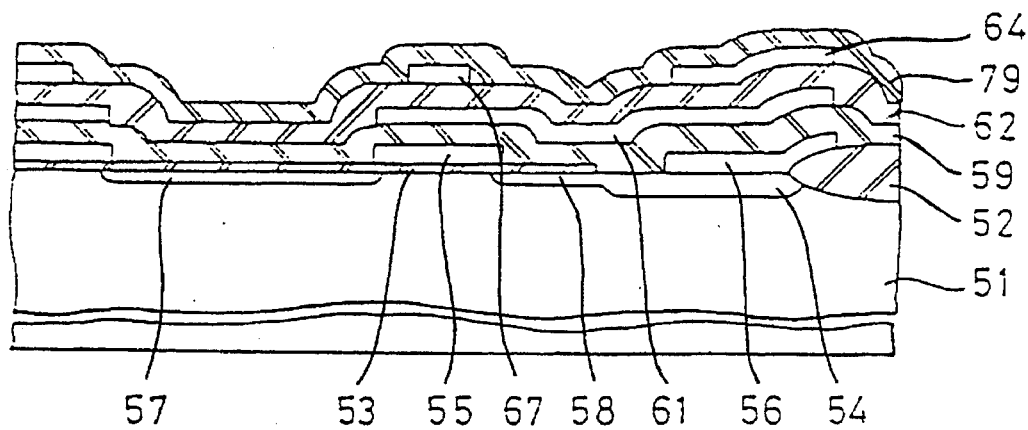

In FIG. 19D, a CVD is carried out to form an upper gate insulator layer 79 which is made of $Si_3N_4$ and has a thickness of 500 Å, for example.

Figure 19E:
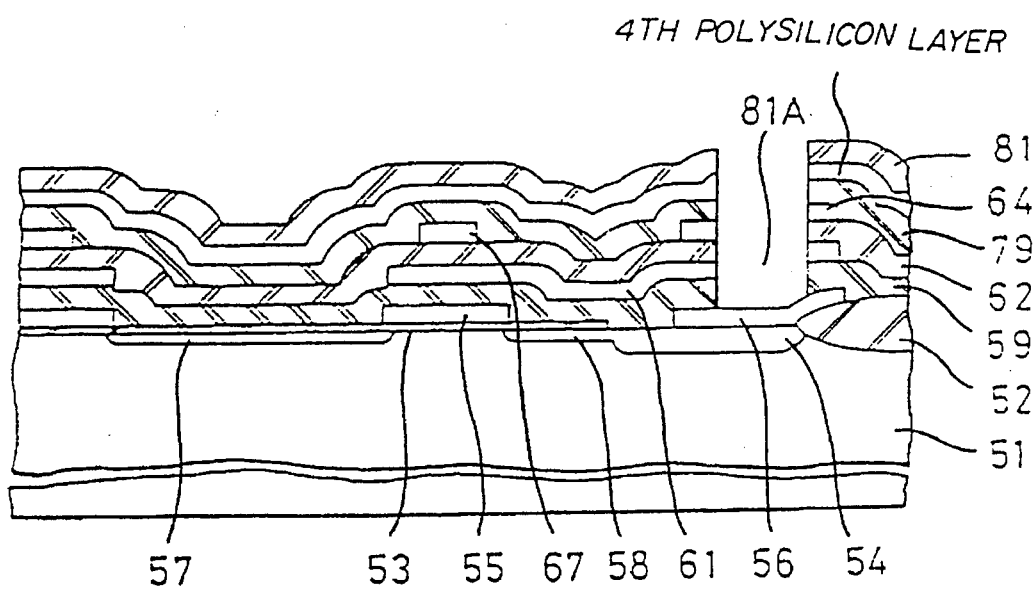

In FIG. 19E, a CVD is carried out to form a fourth polysilicon layer having a thickness of 500 Å, for example.

Then, a vapor phase diffusion is carried out to introduce P into the fourth polysilicon layer with an impurity concentration of $1 \times 10^{20}$ cm$^{-3}$, for example.

A CVD is carried out to form an insulator layer 81 which is made of $SiO_2$ and has a thickness of 500 Å, for example. This insulator layer 81 functions as a spacer.

A resist process of the photolithography technique and RIEs using $CHF_3$/He and $CCl_4/O_2$ as the etching gases are carried out to selectively etch the insulator layer 81, the fourth polysilicon layer, the upper gate insulator layer 79 of the TFT load, the contact part 64 formed from the third polysilicon layer, the lower gate insulator layer 62 of the TFT load, the lower gate electrode 61 of the TFT load formed from the second polysilicon layer and the insulator layer 59, and to form a contact hole 81A. The $CHF_3$/He etching gas is used to etch the $SiO_2$ and the $Si_3N_4$, while the $CCl_4/O_2$ etching gas is used to etch the polysilicon. The contact hole 81A extends from the top surface of the insulator layer 81 and reaches the top surface of the gate electrode 56 (or 55) of the driver transistor formed from the first polysilicon layer.

Figure 19F:
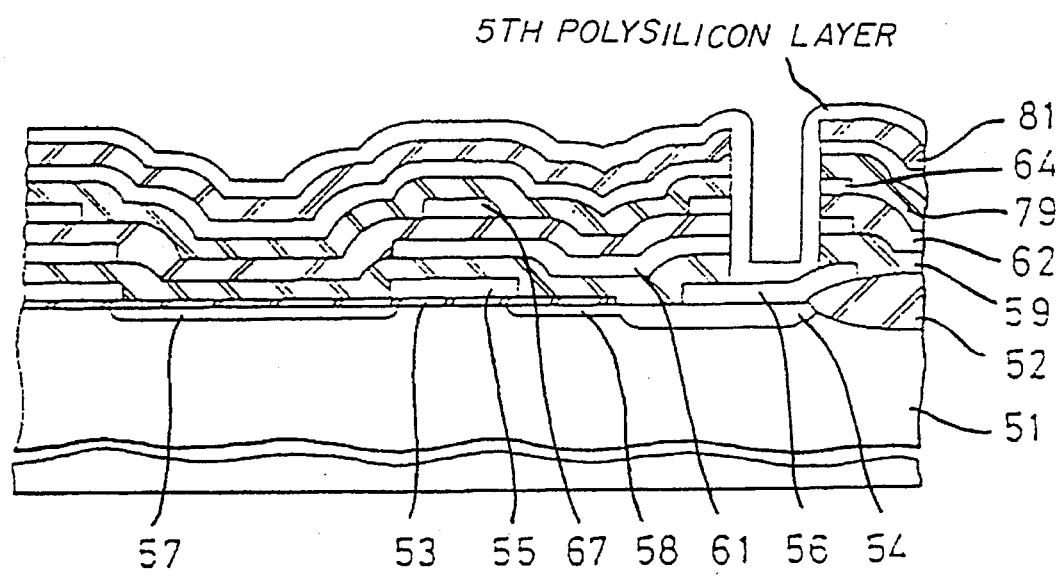

In FIG. 19F, a CVD is carried out to form a fifth polysilicon layer having a thickness of 500 Å, for example.

Then, a thermal diffusion process is carried out to diffuse P in the fifth polysilicon layer with an impurity concentration of $1 \times 10^{21}$ cm$^{-3}$.

Figure 19G:
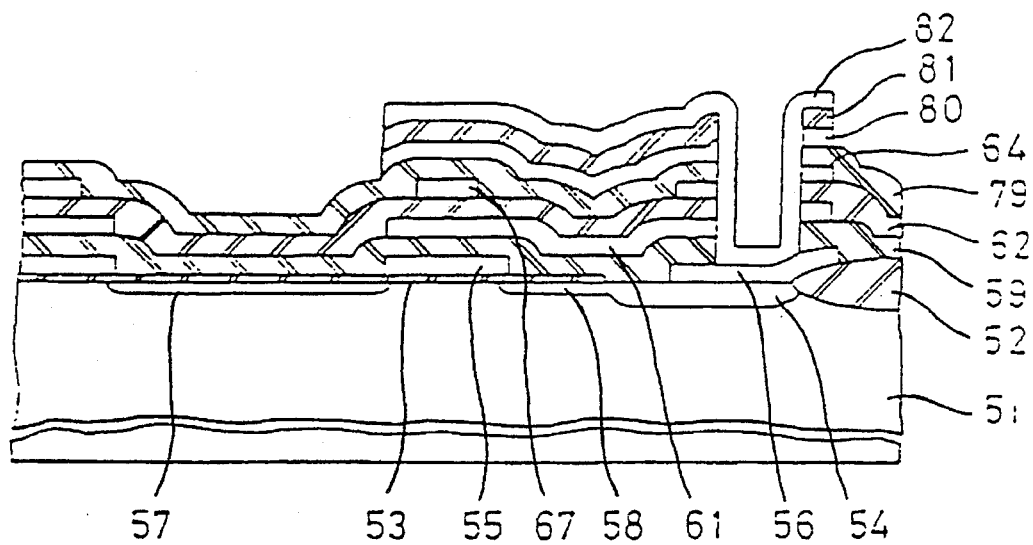

In FIG. 19G, a resist process of the photolithography technique and RIEs using $CCl_4/O_2$ and $CHF_3$/He as the etching gases are carried out to pattern the fifth polysilicon layer, the insulator layer 81 and the fourth polysilicon layer, and to form a storage electrode 82 of the memory capacitor and an upper gate electrode 80 of the TFT load. The $CCl_4/O_2$ etching gas is used to etch the polysilicon, while the $CHF_3$/He etching gas is used to etch the $SiO_2$. The upper gate electrode 80 is used in common as a fin of the memory capacitor.

Figure 19H:
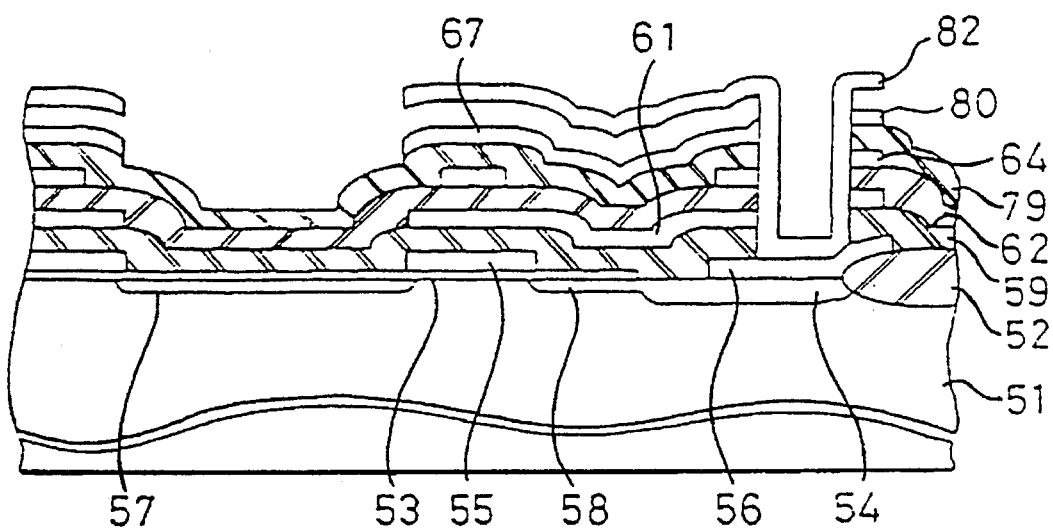

In FIG. 19H, the structure described above is submerged in a HF solution to remove the $SiO_2$ insulator layer 81.

Figure 19I:
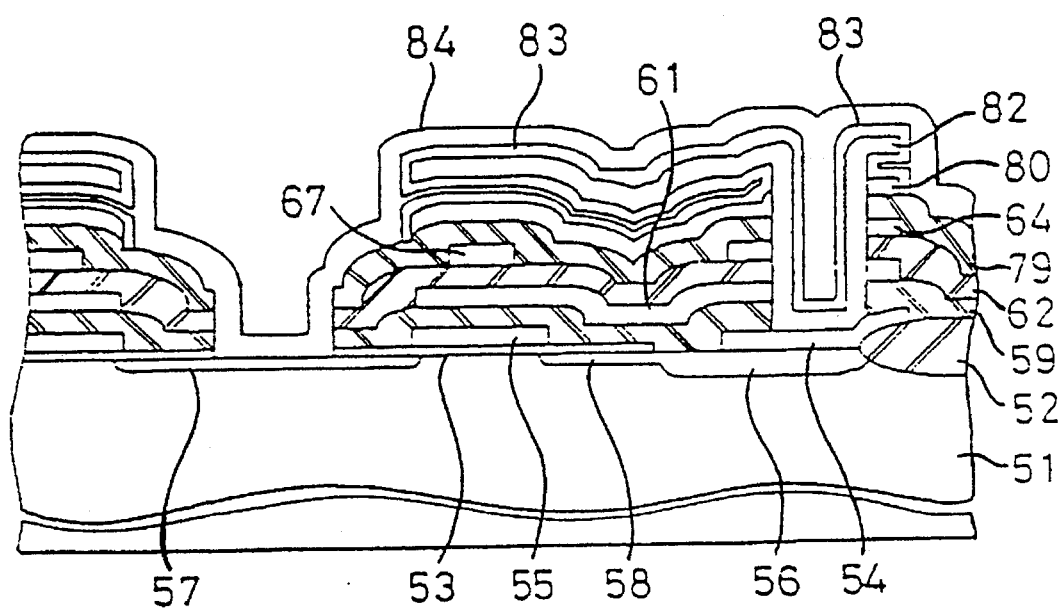

In FIGS. 19I, a CVD is carried out to form a dielectric layer 83 which is made of $Si_3N_4$ and has a thickness of 200 Å, for example, on the storage electrode 82 and the surface of the upper gate electrode 80 of the TFT load.

Next, a resist process of the photolithography technique and a RIE using $CHF_3$/He as the etching gas are carried out to selectively etch the dielectric layer 83, the upper gate insulator layer 79 of the TFT load, the lower gate insulator layer 62 of the TFT load, the insulator layer 59 and the gate insulator layer 53 of the driver transistor, and to form a ground line contact hole.

Then, a CVD is carried out to form a sixth polysilicon layer having a thickness of 1000 Å, for example.

A thermal diffusion process is carried out to diffuse P in the sixth polysilicon layer with an impurity concentration of $1 \times 10^{21}$ cm$^{-3}$, for example.

A resist process of the photolithography technique and a RIE using $CCl_4/O_2$ as the etching gas are carried out to pattern the sixth polysilicon layer and to form an opposing electrode 84 of the memory capacitor. This opposing electrode 84 is used in common as a ground line.

Figure 19J:
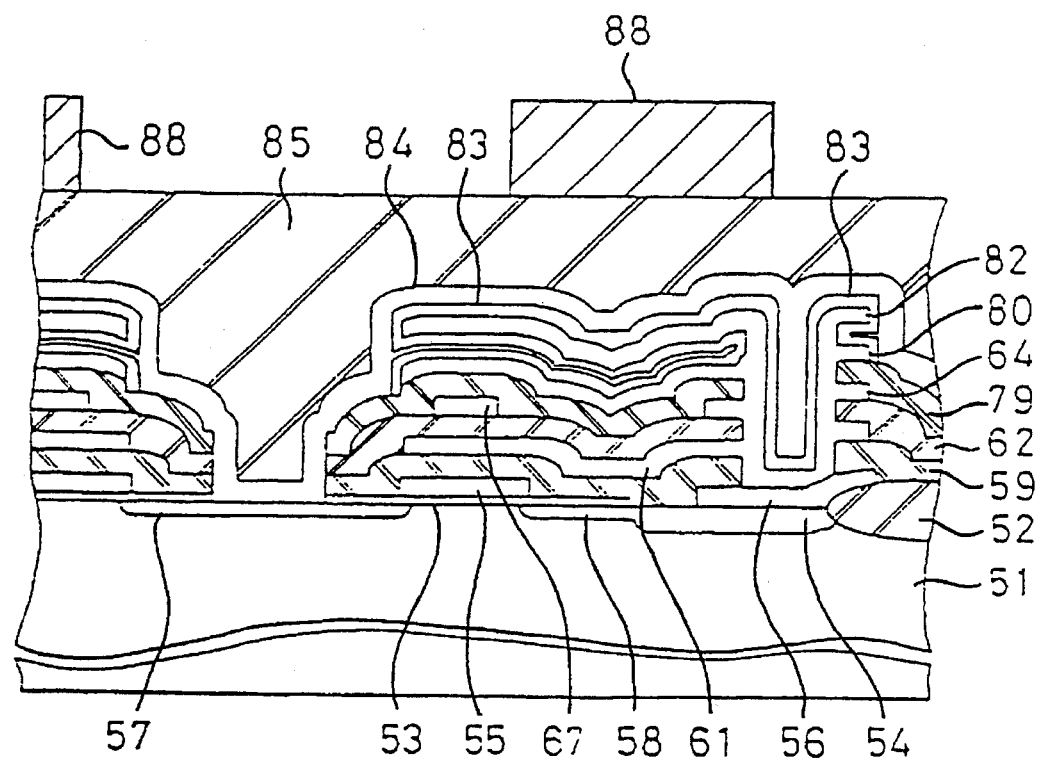

In FIG. 19J, a CVD is carried out to form an insulator layer which is made of $SiO_2$ and has a thickness of 1000 Å, for example, and an insulator layer which is made of PSG and has a thickness of 5000 Å, for example. In FIG. 19J, these two insulator layers are shown as an insulator layer 85.

Then, a thermal process is carried out to reflow and planarize the insulator layer 85.

A resist process of the photolithography technique and a RIE using $CHF_3$/He as the etching gas are carried out to selectively etch the insulator layer 85 and the like, and to form a bit line contact hole which is shown in FIG. 18.

A sputtering is carried out to form an Al layer having a thickness of 1 μm, for example, and this Al layer is patterned into a bit line 88 by using the normal photolithography technique.

According to this embodiment, the number of mask processes is reduced compared to that of the prior art, similarly as in the case of the seventh embodiment described with reference to FIGS. 16A through 16H. In addition to those advantageous features of the seventh embodiment, this eighth embodiment has an additional advantage in that the driver transistor and the TFT load are arranged in a symmetrical manner, and the layout thereof is extremely easy to design.

In FIG. 19I, the ground line contact hole is formed after forming the dielectric layer 83. However, it is possible to form a polysilicon layer after forming the dielectric layer 83 so as to protect the dielectric layer, and thereafter etch this polysilicon layer and the insulator layers 53, 59, 62 and 79 before forming the sixth polysilicon layer (84). According to this method, the dielectric layer 83 will not be subjected directly to the resist process or the like, and the insulator withstand voltage is improved.

Figure 20A:
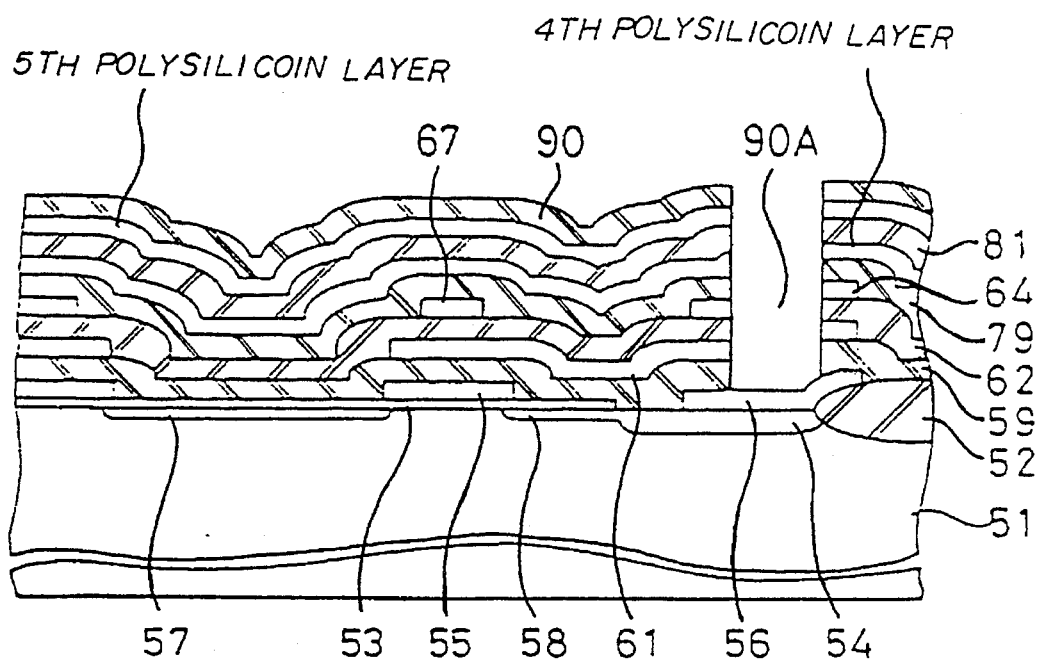
FIGS. 20A through 20C are side views in cross section showing an essential part of a ninth embodiment of the semiconductor memory device according to the present invention at essential stages of a ninth embodiment of the method of producing the semiconductor memory device according to the present invention.
Figure 20B:
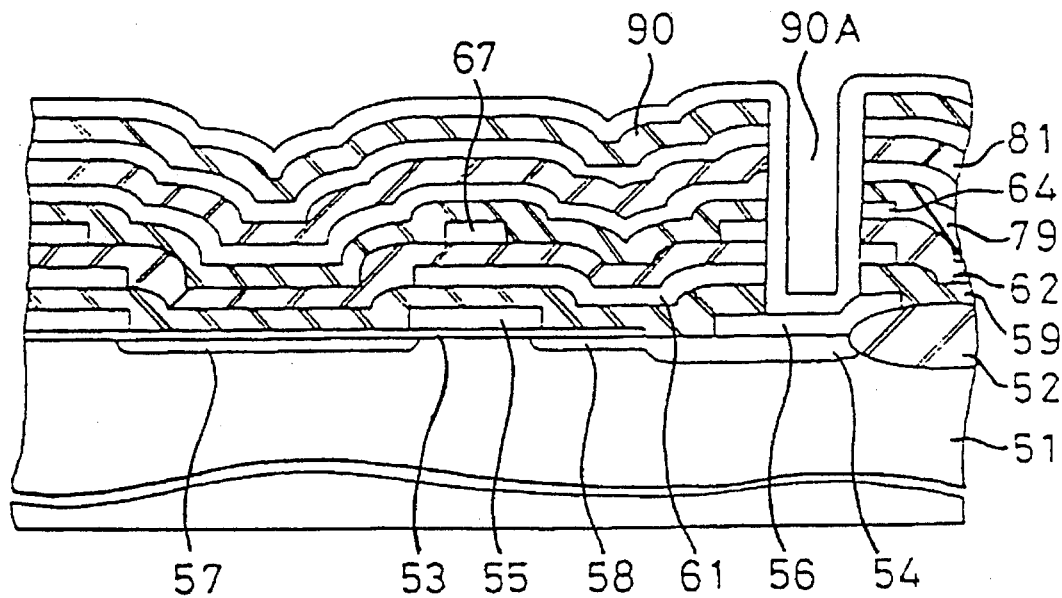
Figure 20C:
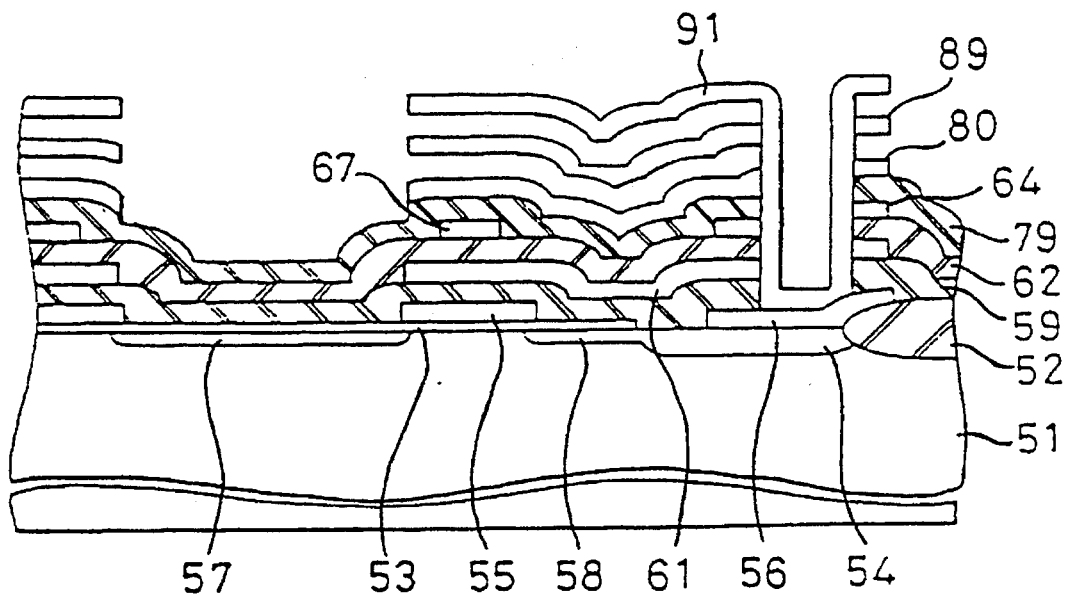

Next, a description will be given of a ninth embodiment of the semiconductor memory device according to the present invention which is produced by a ninth embodiment of the method of producing the semiconductor memory device according to the present invention. FIGS. 20A through 20C are side views in cross section showing an essential part of the ninth embodiment of the semiconductor memory device according to the present invention at essential stages of the ninth embodiment of the method of producing the semiconductor memory device according to the present invention. In FIGS. 20A through 20C, those parts which are the same as those corresponding parts in FIGS. 19A through 19J are designated by the same reference numerals, and a description thereof will be omitted.

In this embodiment of the method, the processes are the same as those of the eighth embodiment up to the processes shown in FIGS. 19A through 19D, that is, until the insulator layer 79 is formed from $Si_3N_4$. Hence, a description will only be given of the processes carried out thereafter.

In FIG. 20A, the double gate structure TFT load type SRAM already has on the Si semiconductor substrate 51 the field insulator layer 52, the gate insulator layer 53, the $n^+$-type impurity region 54, the gate electrodes 55 and 56 of the driver transistors formed from the first polysilicon layer, the $n^+$-type source region 57, the $n^+$-type drain region 58, the insulator layer 59, the lower gate electrode 61 of the TFT load formed from the second polysilicon layer, the lower gate insulator layer 62 of the TFT load, the source region, the drain region and the channel region of the TFT load formed from the third polysilicon layer, and the upper gate insulator layer 79 which is made of $Si_3N_4$ and functions as an etching stopper.

A CVD is carried out to form a fourth polysilicon layer having a thickness of 500 Å, for example.

Then, a vapor phase diffusion is carried out to introduce P in the fourth polysilicon layer with an impurity concentration of $1\times10^{20}$ cm$^{-3}$, for example.

A CVD is carried out to form an insulator layer 81 which is made of $SiO_2$ and has a thickness of 500 Å, for example. This insulator layer 81 functions as a spacer.

A CVD is carried out to form a fifth polysilicon layer having a thickness of 500 Å, for example.

Thereafter, a vapor phase diffusion is carried out to introduce P in the fifth polysilicon layer with an impurity concentration of $1\times10^{20}$ cm$^{-3}$, for example.

A CVD is carried out to form an insulator layer 90 which is made of $SiO_2$ and has a thickness of 500 Å, for example. This insulator layer 90 functions as a spacer.

A resist process of the photolithography technique and RIEs using $CHF_3$/He and $CCl_4/O_2$ as the etching gases are carried out to selectively etch the insulator layer 90, the fifth polysilicon layer, the insulator layer 81, the fourth polysilicon layer, the upper gate insulator layer 79 of the TFT load, the third polysilicon layer, the lower gate insulator layer 62 of the TFT load, the lower gate electrode 61 of the TFT load formed from the second polysilicon layer and the insulator layer 59, and to form a contact hole 90A. The $CHF_3$/He etching gas is used to etch the $SiO_2$ and the $Si_3N_4$, while the $CCl_4/O_2$ etching gas is used to etch the polysilicon. The contact hole 90A extends from the top surface of the insulator layer 90 and reaches the top surface of the gate electrode 56 of the driver transistor formed from the first polysilicon layer.

In FIG. 20B, a CVD is carried out to form a sixth polysilicon layer having a thickness of 500 Å, for example.

Then, a thermal diffusion process is carried out to diffuse P in the sixth polysilicon layer with an impurity concentration of $1\times10^{21}$ cm$^{-3}$, for example.

In FIG. 20C, a resist process of the photolithography technique and RIEs using $CCl_4/O_2$ and $CHF_3$/He as the etching gases are carried out pattern the sixth polysilicon layer, the insulator layer 90, the fifth polysilicon layer, the insulator layer 81 and the fourth polysilicon layer, and to form a storage electrode 91 of the memory capacitor, a fin 89 of the memory capacitor, and an upper gate electrode 80 of the TFT load. This upper gate electrode 80 of the TFT load is used in common as a fin of the memory capacitor.

The above described structure is submerged in a HF solution to remove the $SiO_2$ insulator layers 90 and 81.

Thereafter, processes similar to those described above in conjunction with FIGS. 19I and 19J of the eighth embodiment are carried out to form a dielectric layer of the memory capacitor and the like.

According to this embodiment, substantially three fins can be integrally formed on the storage electrode 91 of the memory capacitor, without increasing the number of mask processes. Hence, the capacitance of the memory capacitor can be increased considerably.

Next, a description will be given of a tenth embodiment of the semiconductor memory device according to the present invention which is produced by a tenth embodiment of the method of producing the semiconductor memory device according to the present invention. FIGS. 21A through 21D are side views in cross section showing an essential part of the tenth embodiment of the semiconductor memory device according to the present invention at essential stages of the tenth embodiment of the method of producing the semiconductor memory device according to the present invention. In FIGS. 21A through 21D, those parts which are the same as those corresponding parts in FIGS. 19A through 19J are designated by the same reference numerals, and a description thereof will be omitted.

In this embodiment of the method, the processes are the same as those of the eighth embodiment up to the processes shown in FIGS. 19A through 19C, that is, until the third polysilicon layer is patterned to form the contact part, the drain, source and channel regions of the TFT load and the Vcc line. Hence, a description will only be given of the processes carried out thereafter.

Figure 21A:
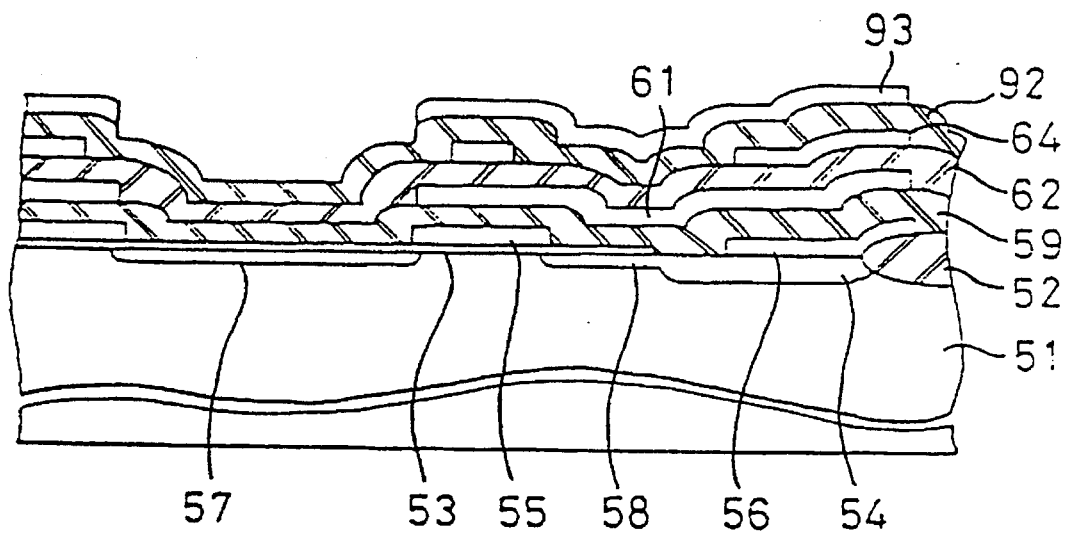
FIGS. 21A through 21D are side views in cross section showing an essential part of a tenth embodiment of the semiconductor memory device according to the present invention at essential stages of a tenth embodiment of the method of producing the semiconductor memory device according to the present invention.

In FIG. 21A, the double gate structure TFT load type SRAM already has on the Si semiconductor substrate 51 the field insulator layer 52, the gate insulator layer 53, the $n^+$-type impurity region 54, the gate electrodes 55 and 56 of the driver transistors formed from the first polysilicon layer, the $n^+$-type source region 57, the $n^+$-type drain region 58, the insulator layer 59, the lower gate electrode 61 of the TFT load formed from the second polysilicon layer, the lower gate insulator layer 62 of the TFT load, the source, drain and channel regions of the TFT load formed from the third polysilicon layer, and the Vcc supply line.

A CVD is carried out to form an upper gate insulator layer 92 of the TFT load. This upper gate insulator layer 92 is made of $SiO_2$ and has a thickness of 500 Å.

Then, a CVD is carried out to form a fourth polysilicon layer having a thickness of 500 Å, for example.

A vapor phase diffusion is carried out to introduce P in the fourth polysilicon layer with an impurity concentration of $1\times10^{20}$ cm$^{-3}$, for example.

A resist process of the photolithography technique and a RIE using $CCl_4/O_2$ as the etching gas are carried out to pattern the fourth polysilicon layer and to form an upper gate electrode 93 of the TFT load.

Figure 21B:
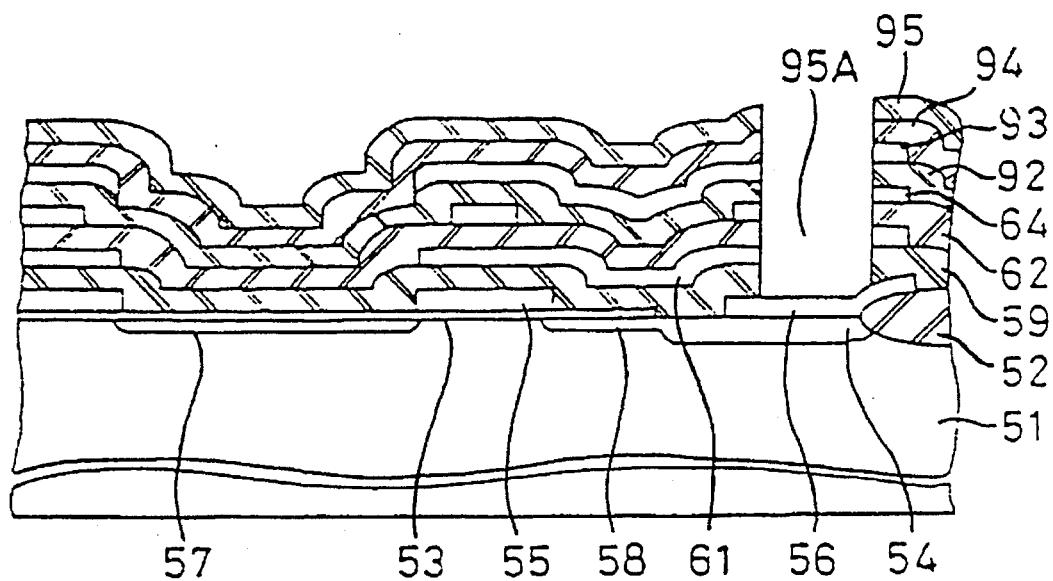

In FIG. 21B, a CVD is carried out to form an insulator layer 94 which is made of $Si_3N_4$ and has a thickness of 500 Å, for example, and an insulator layer 95 which is made of $SiO_2$ and has a thickness of 500 Å, for example. The insulator layer 94 functions as an etching stopper, and the insulator layer 95 functions as a spacer.

Then, a resist process of the photolithography technique and RIEs using $CHF_3$/He and $CCl_4/O_2$ as the etching gases are carried out to selectively etch the insulator layers 95 and 94, the upper gate electrode 93 of the TFT load, the upper gate insulator layer 92 of the TFT load, the third polysilicon layer in which the source and drain regions of the TFT load are formed, the lower gate insulator layer 62 of the TFT load, the lower gate electrode 61 of the TFT load and the insulator layer 59, and to form a contact hole 95A. The CHF$_3$/He etching gas is used to etch the SiO$_2$ and the Si$_3$N$_4$, while the CCl$_4$/O$_2$ etching gas is used to etch the polysilicon. The contact hole 95A extends from the top surface of the insulator layer 95 and reaches the top surface of the gate electrode 56 of the driver transistor formed from the first polysilicon.

Figure 21C:
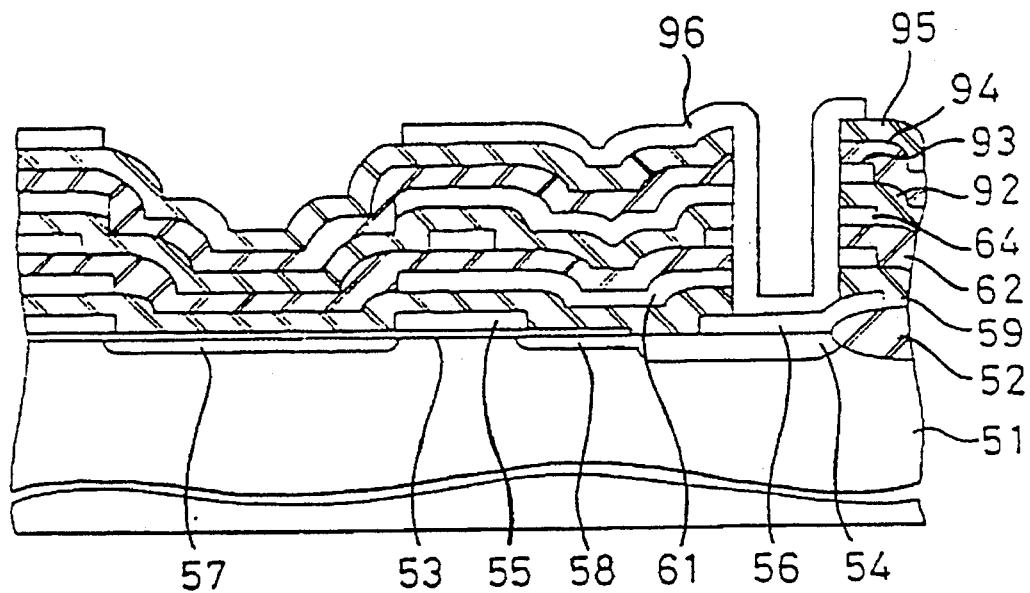

In FIG. 21C, a CVD is carried out to form a fifth polysilicon layer having a thickness of 500 Å, for example.

Then, a thermal diffusion process is carried out to diffuse P in the fifth polysilicon layer with an impurity concentration of $1 \times 10^{21}$ cm$^{-3}$, for example.

A resist process of the photolithography technique and a RIE using CCl$_4$/O$_2$ as the etching gas are carried out to pattern the fifth polysilicon layer and to form a storage electrode 96 of the memory capacitor.

Figure 21D:
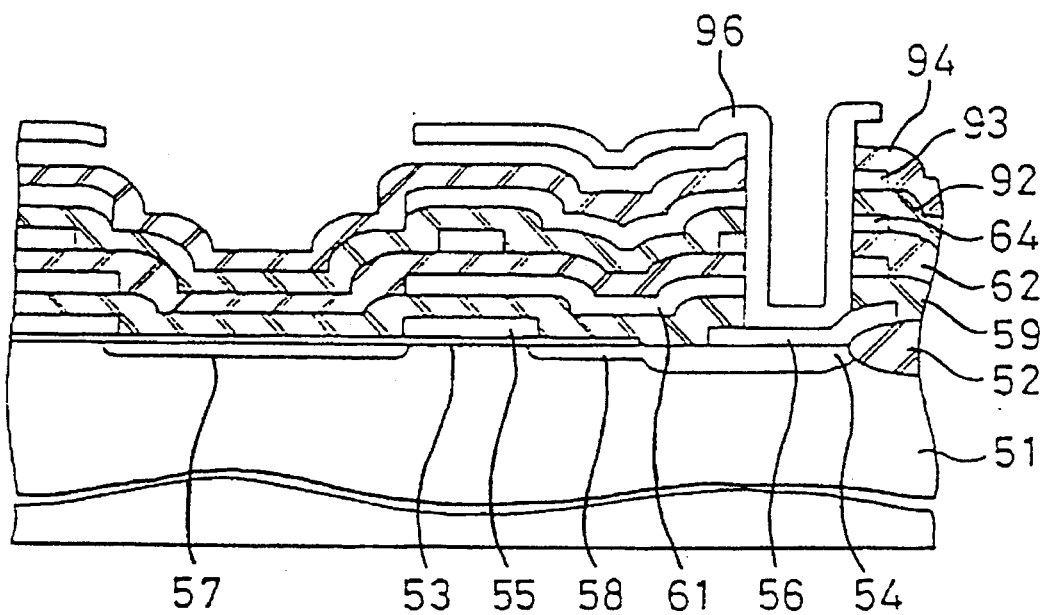

In FIG. 21D, the structure described above is submerged into a HF solution to remove the SiO$_2$ insulator layer 95.

Thereafter, processes similar to those described above in conjunction with FIGS. 19I and 19J of the eighth embodiment are carried out to form a dielectric layer of the memory capacitor and the like.

Normally, when etching the polysilicon, the underlying layer is suited as an etching stopper if this underlying layer is made of SiO$_2$ rather than Si$_3$N$_4$. In addition, the Si$_3$N$_4$ layer which functions as the etching stopper in the hydrofluoric acid is not damaged by the RIE is carried out to etch the polysilicon layer because the Si$_3$N$_4$ layer is not subjected to the RIE. Hence, this embodiment has an advantage in that the formation of the storage electrode of the memory capacitor is facilitated and is stably carried out compared to the eighth embodiment. On the other hand, the number of mask processes increases by one compared to the eighth embodiment, but the number of mask processes as a whole is still reduced by one compared to that of the prior art.

Next, a description will be given of an eleventh embodiment of the semiconductor memory device according to the present invention which is produced by an eleventh embodiment of the method of producing the semiconductor memory device according to the present invention. FIGS. 22A through 22E are side views in cross section showing an essential part of the eleventh embodiment of the semiconductor memory device according to the present invention at essential stages of the eleventh embodiment of the method of producing the semiconductor memory device according to the present invention. In FIGS. 22A through 22E, those parts which are the same as those corresponding parts in FIGS. 4A through 4D are designated by the same reference numerals, and a description thereof will be omitted. FIGS. 22A through 22E respectively correspond to cross sections similar to the cross sections taken along a line Y—Y in FIG. 5D.

Figure 4A:
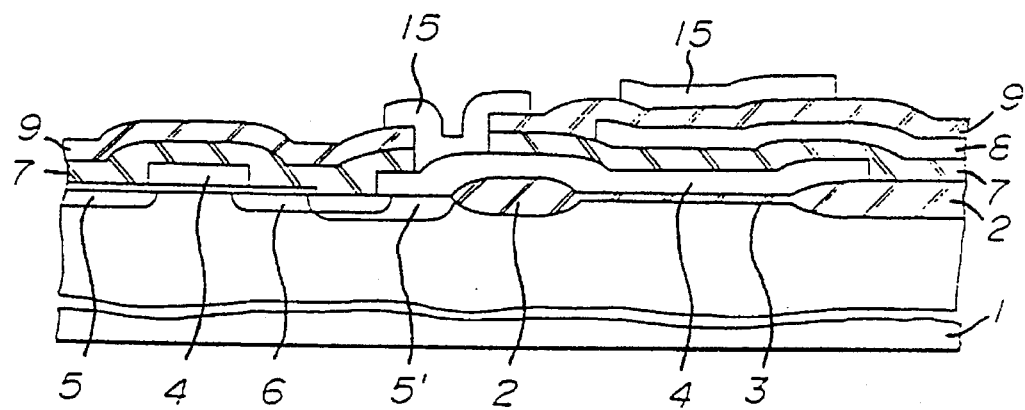
FIGS. 4A through 4D are side views in cross section showing essential parts of a TFT load type SRAM at essential stages of a conventional method of producing the high resistance load type SRAM.
Figure 4B:
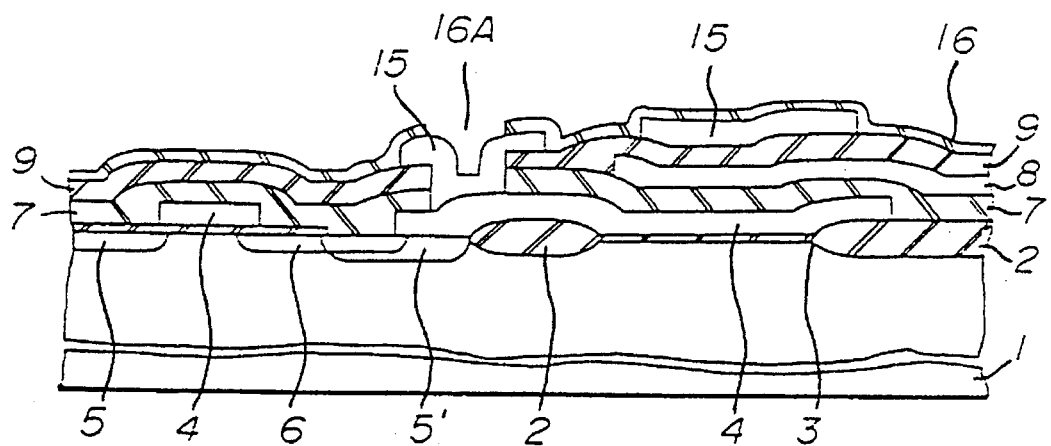
Figure 4C:
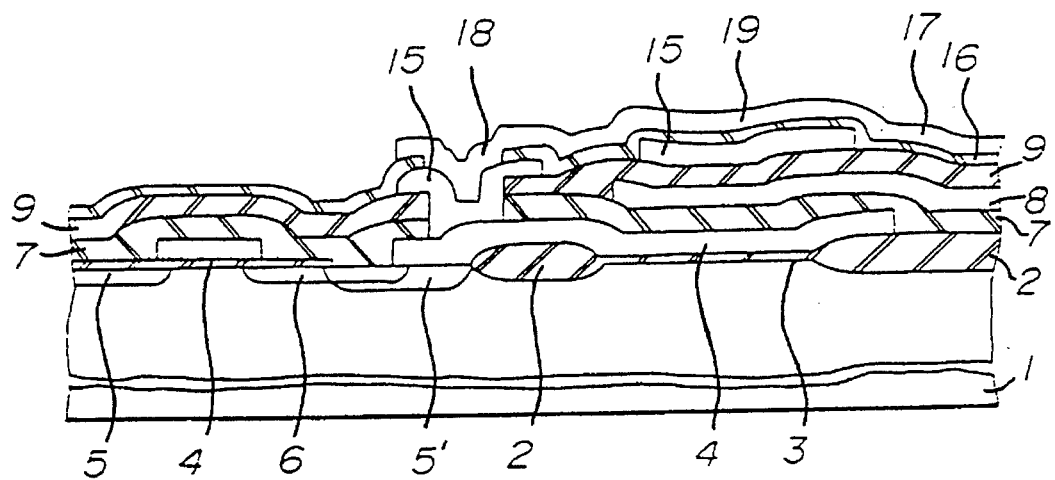
Figure 4D:
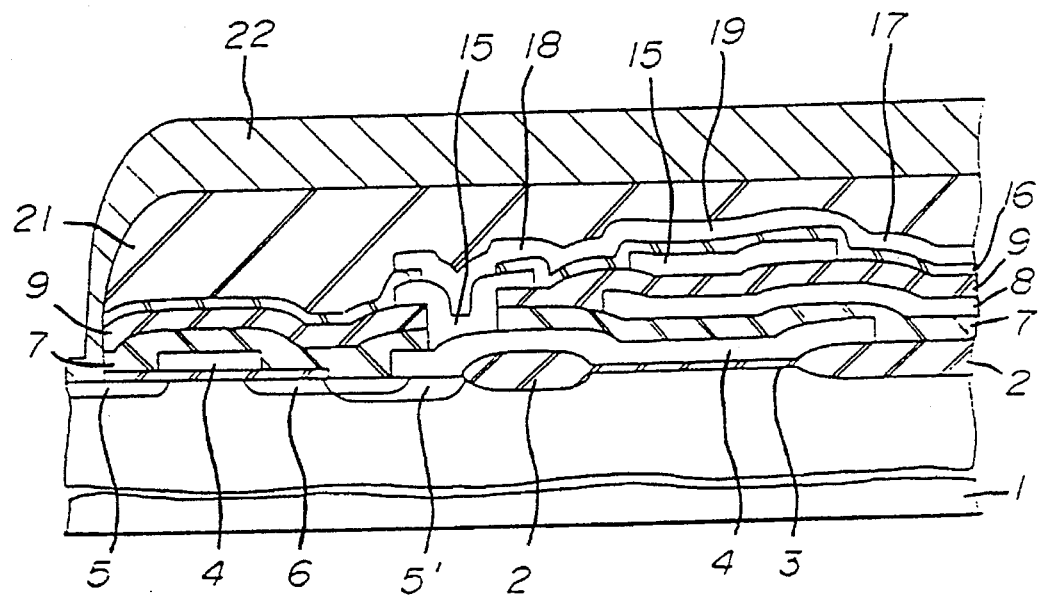
Figure 5A:
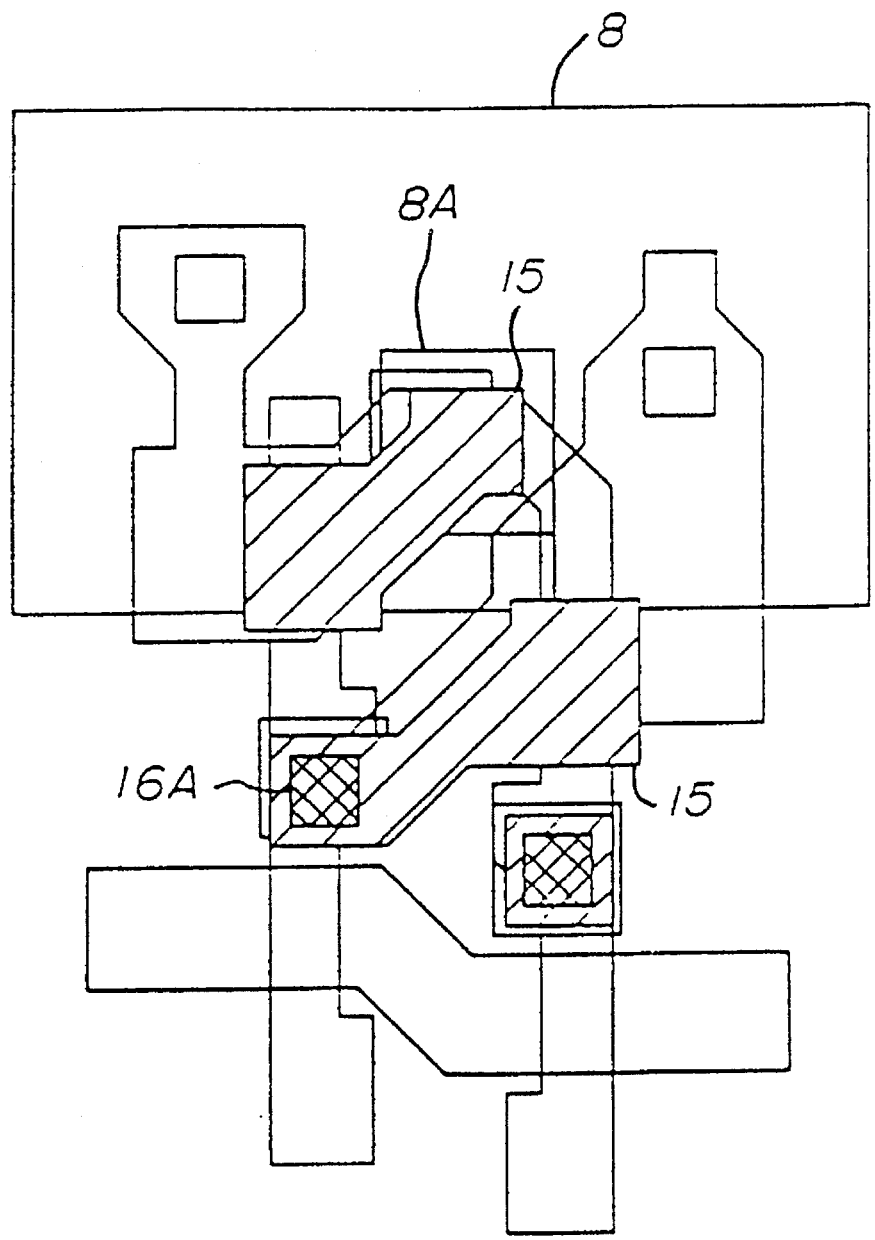
FIGS. 5A through 5D are plan views of the TFT load type SRAM at essential stages of the conventional method of producing the TFT load type SRAM.
Figure 5B:
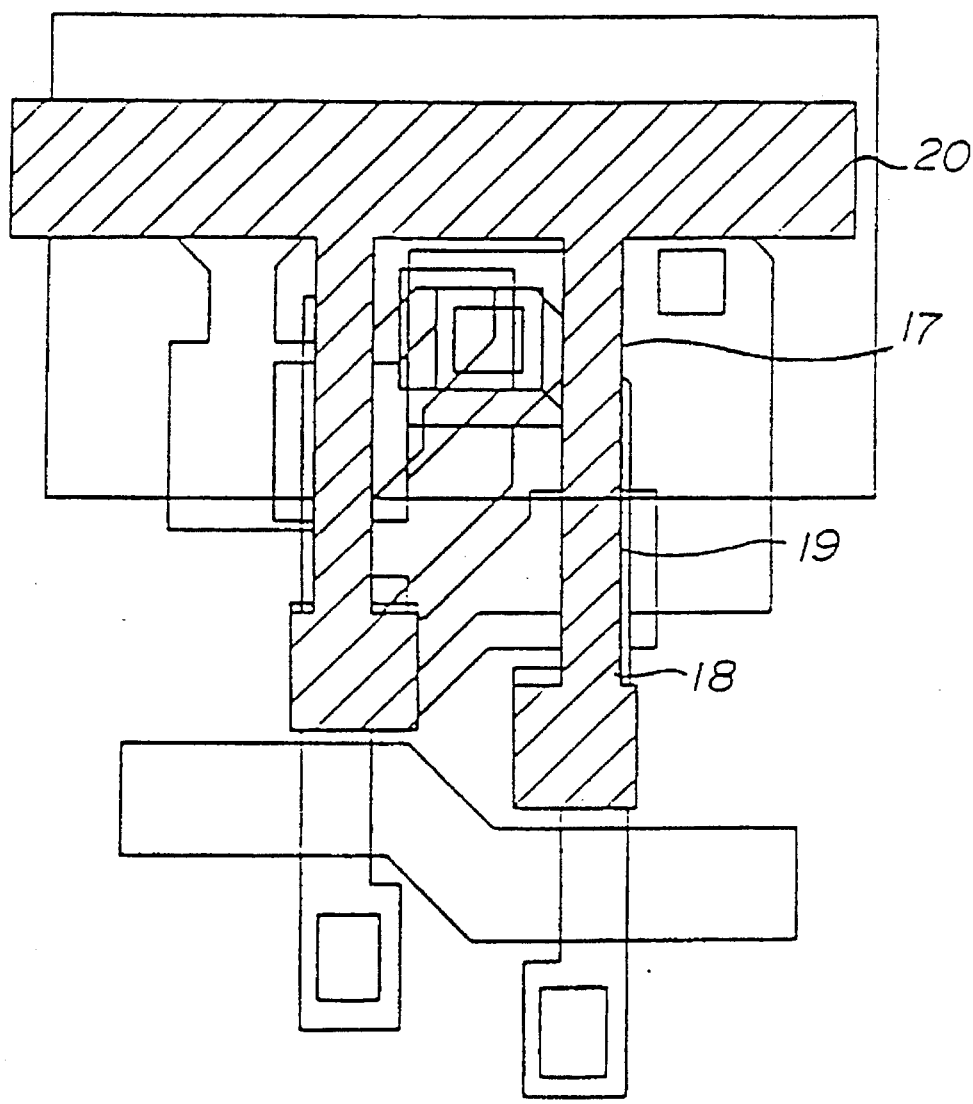
Figure 5C:
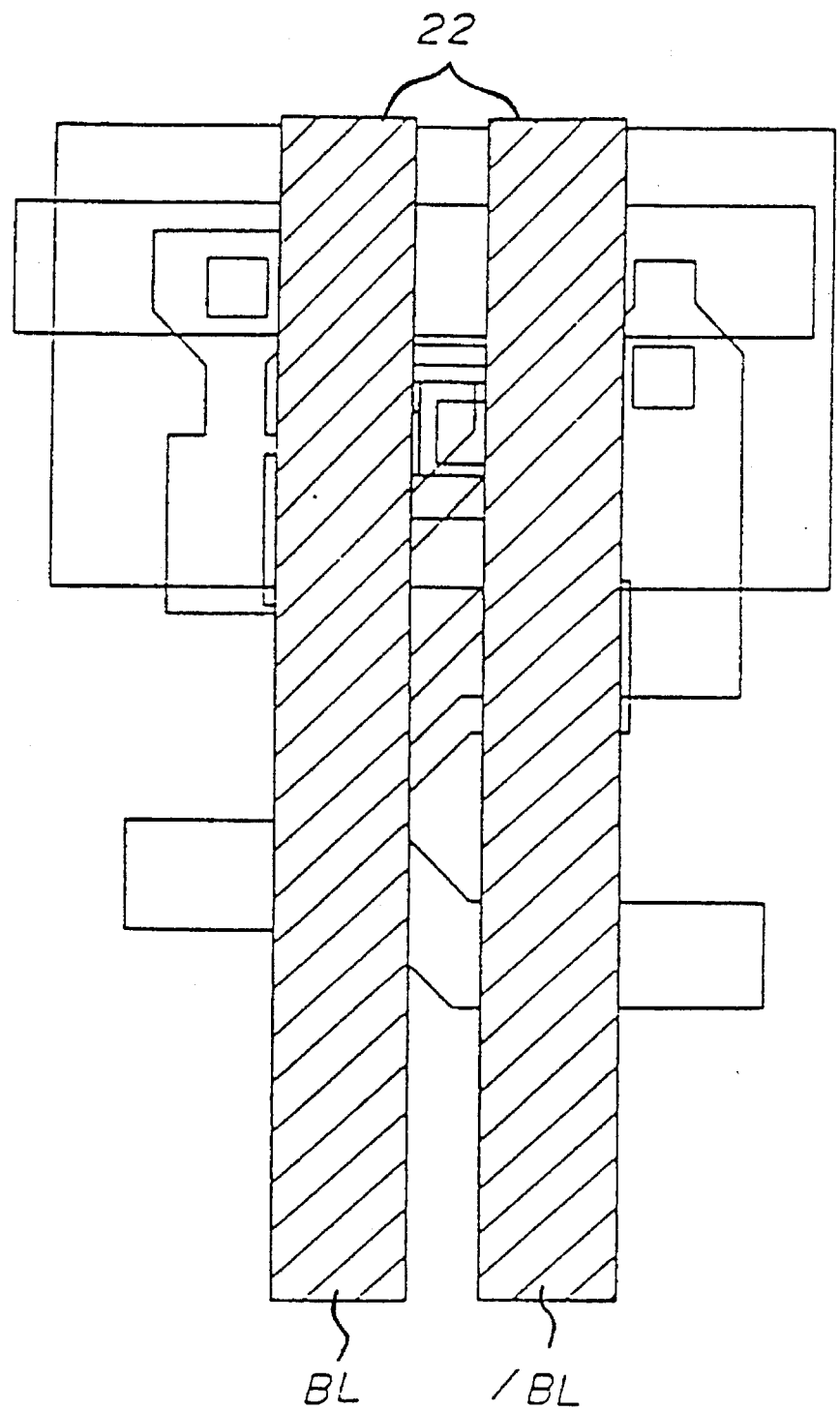
Figure 5D:
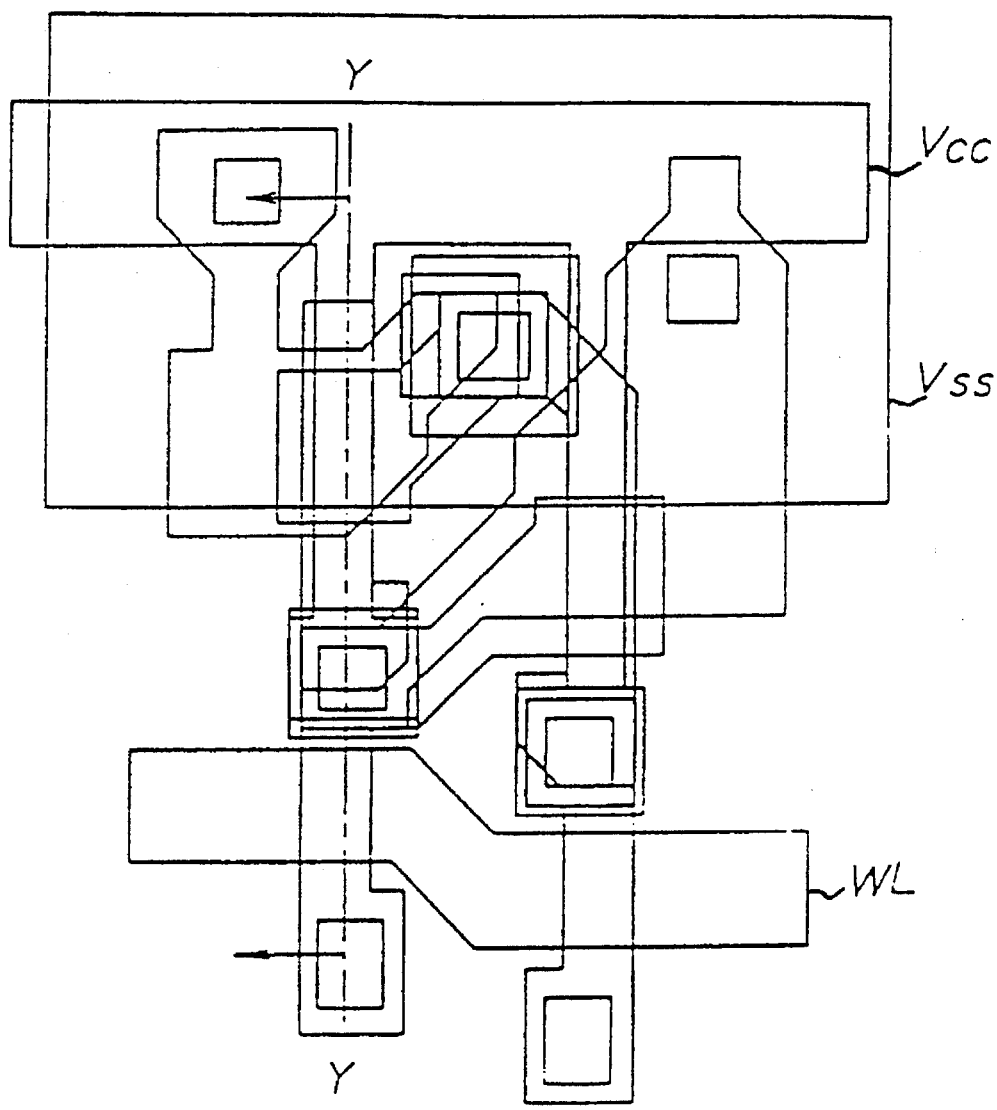
Figure 6:
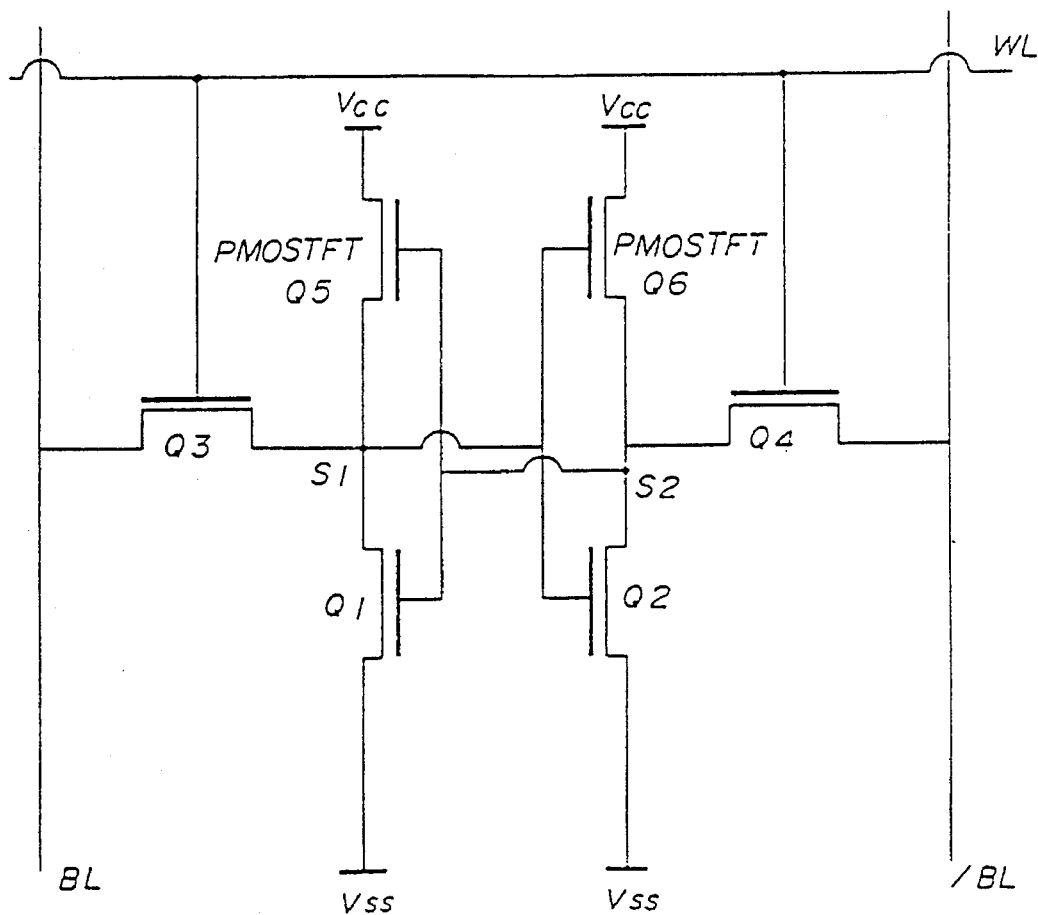
FIG. 6 shows an equivalent circuit diagram of an essential part of the TFT load type SRAM described in conjunction with FIGS. 4A through 4D and 5A through 5D.

In this embodiment of the method, the processes are the same as those of the prior art up to the processes shown in FIGS. 4A through 4C, that is, until the source region 17, drain region 18 and the channel region 19 of the TFT load and the Vcc line are formed. Hence, a description will only be given of the processes carried out thereafter.

Figure 22A:
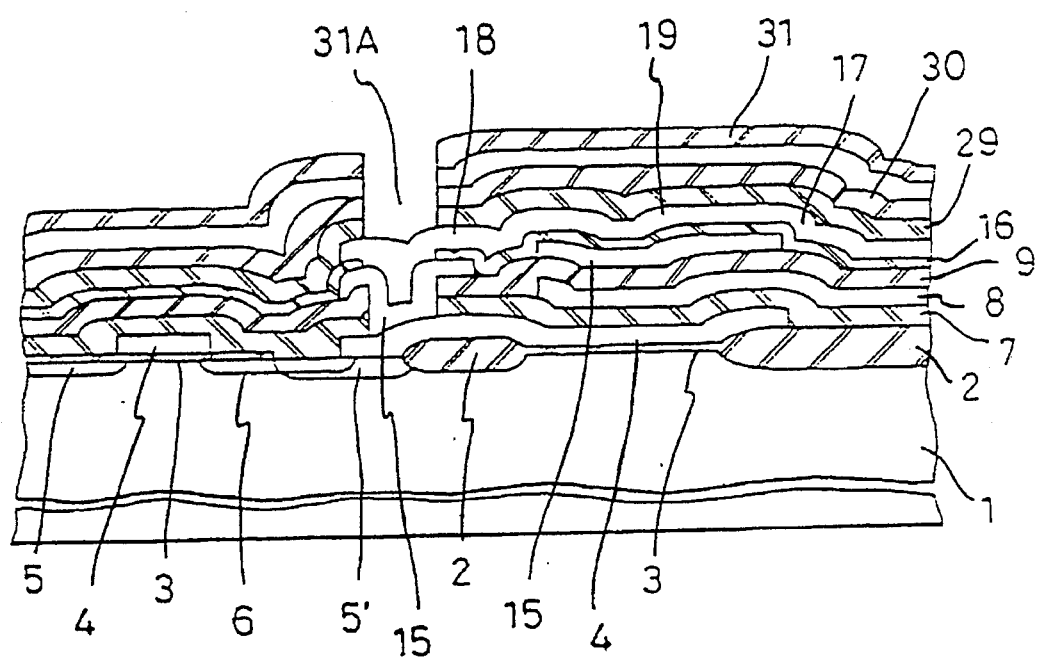
FIGS. 22A through 22E are side views in cross section showing an essential part of an eleventh embodiment of the semiconductor memory device according to the present invention at essential stages of an eleventh embodiment of the method of producing the semiconductor memory device according to the present invention.

In FIG. 22A, the TFT load type SRAM already has on the Si semiconductor substrate 1 the field insulator layer 2, the gate insulator layer 3, the gate electrode 4 of the driver transistor formed from the first polysilicon layer, the n$^+$-type impurity region 5', the n$^+$-type source region 5, the n$^+$-type drain region 6, the insulator layer 7 made of SiO$_2$, the ground line 8 formed from the second polysilicon layer, the insulator layer 9 made of SiO$_2$, the gate electrode 15 of the TFT load formed from the third polysilicon layer, the gate insulator layer 16 of the TFT load made of SiO$_2$, the source region 17, the drain region 18 and the channel region 19 of the TFT load formed from the fourth polysilicon layer, and the Vcc supply line. The Vcc supply line cannot be seen in FIG. 22A.

A CVD is carried out to form on the entire surface an insulator layer 29 which is made of Si$_3$N$_4$ and has a thickness of 500 Å, for example. This insulator layer 29 not only provides electrical insulation, but also functions as an etching stopper.

Then, a CVD is carried out to form on the entire surface an insulator layer 30 which is made of SiO$_2$ and has a thickness of 500 Å, for example.

A CVD is carried out to form on the entire surface a fifth polysilicon layer having a thickness of 500 Å, for example.

An ion implantation is carried out to inject P ions into the fifth polysilicon layer with a dosage of $1 \times 10^{15}$ cm$^{-2}$ and an acceleration energy of 10 keV, for example.

Next, a CVD is carried out to form on the entire surface an insulator layer 31 which functions as a spacer. For example, this insulator layer 31 is made of SiO$_2$ and has a thickness of 500 Å.

A resist process of the photolithography technique and RIEs using CHF$_3$/He and CCl$_4$ as the etching gases are carried out to selectively etch the insulator layer 31, the fifth polysilicon layer, the insulator layer 30 and the insulator layer 29, and to form a contact hole 31A. The CHF$_3$/He etching gas is used to etch the SiO$_2$ and the Si$_3$N$_4$, and the CCl$_4$/O$_2$ etching gas is used to etch the polysilicon. The contact hole 31A extends from the top surface of the insulator layer 31 and reaches the top surface of the drain region 18 of the TFT load formed from the third polysilicon layer.

Figure 22B:
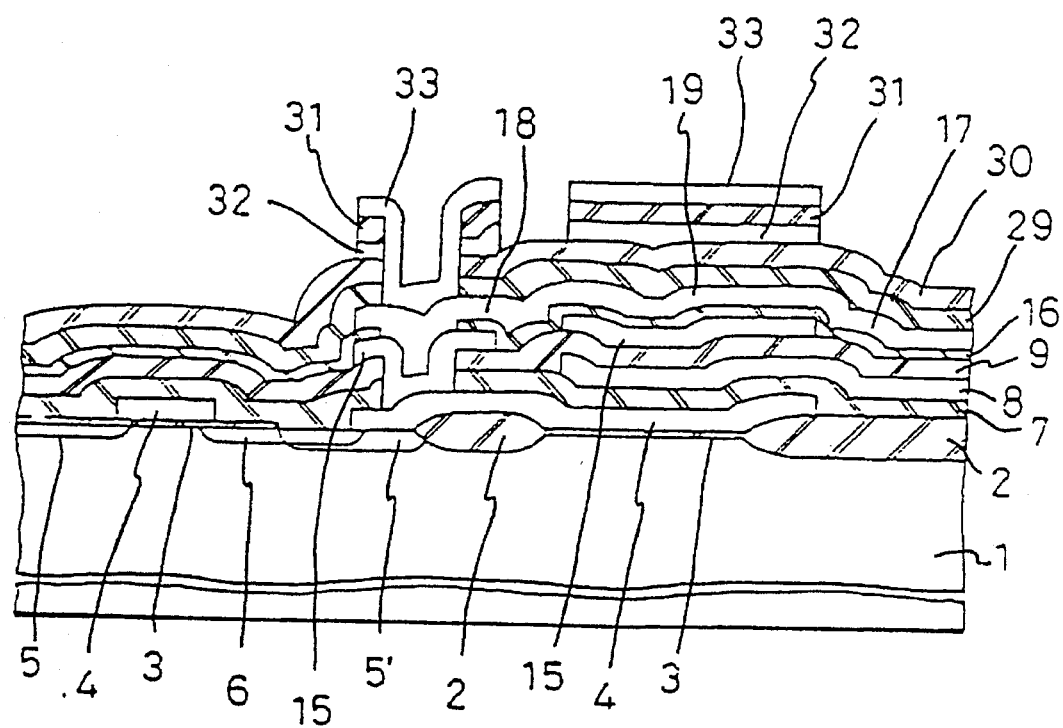

In FIG. 22B, a CVD is carried out to form a sixth polysilicon layer having a thickness of 500 Å, for example.

Then, a thermal diffusion process is carried out to diffuse P in the sixth polysilicon layer with an impurity concentration of $1 \times 10^{21}$ cm$^{-3}$, for example.

A resist process of the photolithography technique and RIEs using CCl$_4$/O$_2$ and CHF$_3$/He as the etching gases are carried out to pattern the the sixth polysilicon layer, the insulator layer 31 and the fifth polysilicon layer, and to form a storage electrode 33 of the memory capacitor and a fin 32 of the memory capacitor extending from the storage electrode 33. The CCl$_4$/O$_2$ etching gas is used to etch the polysilicon, and the CHF$_3$/He etching gas is used to etch the SiO$_2$.

In this case, the insulator layer 30 is used as the etching stopper for the fin 32. As will be described with reference to FIG. 22C, this insulator layer 30 is removed at a later stage. For this reason, it is unnecessary to worry about damage to the insulator layer 30 when carrying out the etching to form the fin 32, and an over-etching may be carried out to completely remove the etching residue. As will be described later, this over-etching is possible because the etching is made below the lowermost layer fin and the opposing electrode which also functions as a shield electrode extends above the channel region of the TFT load.

Figure 22C:
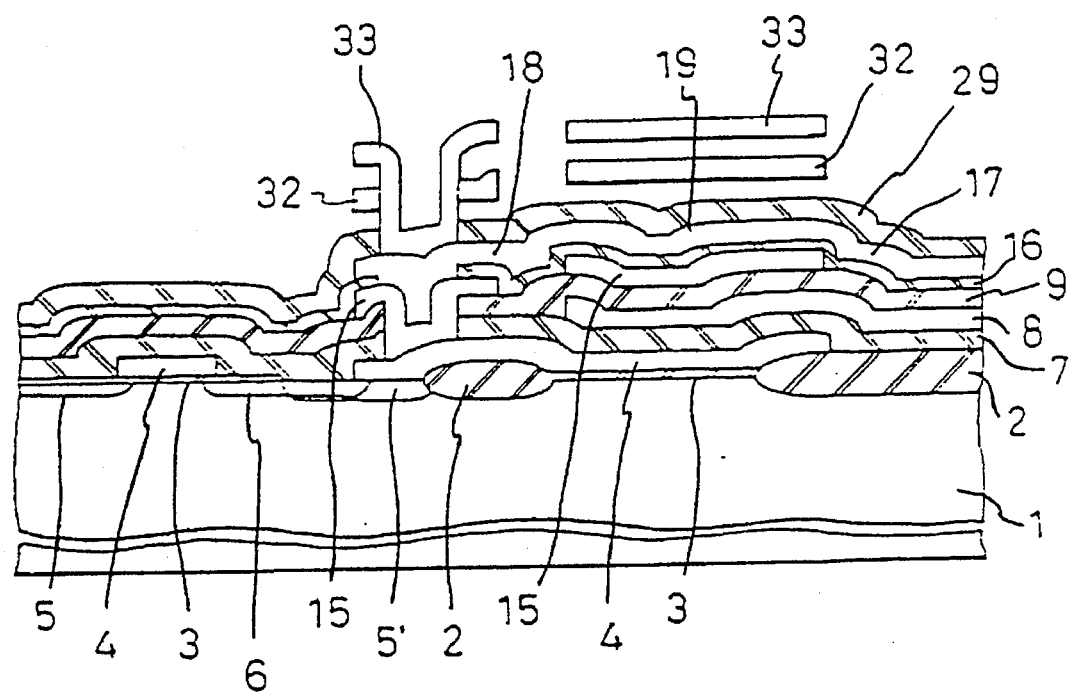

In FIG. 22C, the above described structure is submerged in a HF solution to remove the SiO$_2$ insulator layers 31 and 30.

Figure 22D:
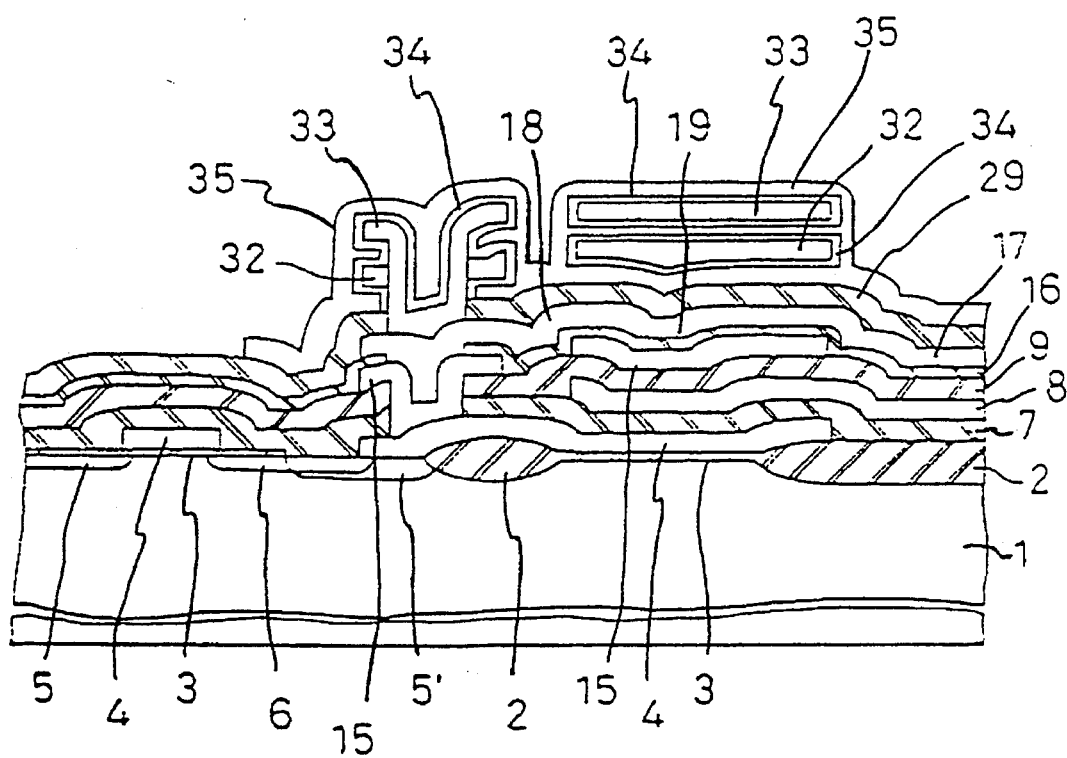

In FIG. 22D, a CVD is carried out to form a dielectric layer 34 which is made of $Si_3N_4$ and has a thickness of 200 Å, for example, on the storage electrode 33 of the memory capacitor and on the surface of the fin 32 of the memory capacitor.

Then, a CVD is carried out to form a seventh polysilicon layer having a thickness of 1000 Å, for example.

A thermal diffusion process is carried out to diffuse P in the seventh polysilicon layer with an impurity concentration of $1 \times 10^{21}$ cm$^{-3}$, for example.

A resist process of the photolithography technique and a RIE using $CCl_4/O_2$ as the etching gas are carried out to pattern the seventh polysilicon layer and to form an opposing electrode 35 of the memory capacitor. This opposing electrode 35 also functions as the shield electrode.

Normally, in the case of the p-channel type TFT load, the positive power source voltage Vcc, that is, 5 V, is applied to the opposing electrode 35 of the memory capacitor. On the other hand, in the case of the n-channel type TFT load, the power source voltage Vss, that is, 0 V, is applied to the opposing electrode 35. Hence, a shielding is provided to prevent a noise from entering the TFT load from other conductor layers within the memory cell.

As described above in conjunction with FIG. 22B, if a sufficient over-etching is carried out when forming the fins, the opposing electrode extends between the lowermost layer fin and the channel region of the TFT load. In this embodiment, this opposing electrode is used in common as the shield electrode of the TFT load, so that a stable formation of the fins is guaranteed and the parasitic effect of the TFT load is prevented.

Figure 22E:
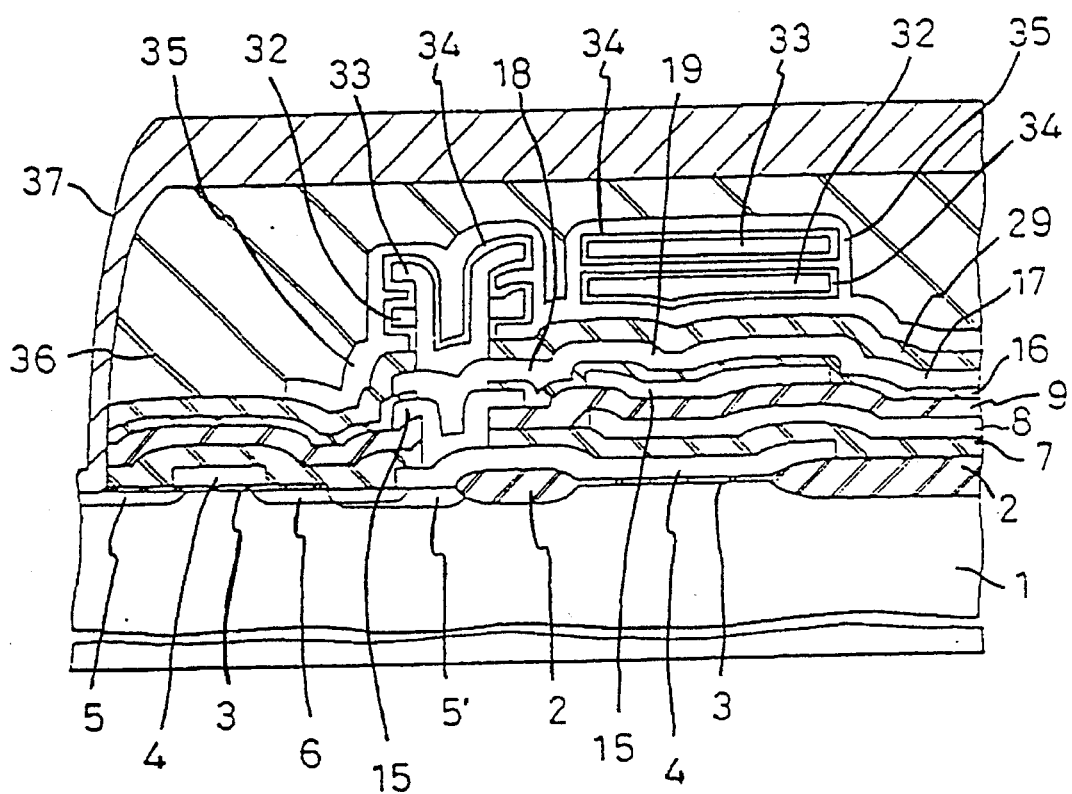

In FIG. 22E, a CVD is carried out to form an insulator layer which is made of $SiO_2$ and has a thickness of 1000 Å, for example, and an insulator layer which is made of PSG and has a thickness of 5000 Å, for example. In FIG. 22E, these two insulator layers are shown as an insulator layer 36.

Then, a thermal process is carried out to reflow and planarize the insulator layer 36.

A resist process of the photolithography technique and a RIE using $CHF_3/He$ as the etching gas are carried out to selectively etch the insulator layer 36 and the like, and to form a bit line contact hole.

A sputtering is carried out to form an Al layer having a thickness of 1 μm, for example, and this Al layer is patterned into a bit line 37 using the normal photolithography technique.

According to this embodiment, the capacitance of the memory capacitor is sufficiently large. In addition, since the TFT load is shielded by the opposing electrode 35, the TFT load is unaffected by the noise. Moreover, since the over-etching can be made when etching the memory capacitor, a stable production process is guaranteed. However, as a consequence, the number of mask processes increases by one when compared to the prior art method of producing the double gate structure TFT load type SRAM.

Next, a description will be given of a twelfth embodiment of the semiconductor memory device according to the present invention which is produced by a twelfth embodiment of the method of producing the semiconductor memory device according to the present invention. FIGS. 23A through 23G are side views in cross section showing an essential part of the twelfth embodiment of the semiconductor memory device according to the present invention at essential stages of the twelfth embodiment of the method of producing the semiconductor memory device according to the present invention. In FIGS. 23A through 23G, those parts which are the same as those corresponding parts in FIGS. 1A through 1J are designated by the same reference numerals, and a description thereof will be omitted. FIGS. 23A through 23G respectively correspond to cross sections similar to the cross sections taken along a line Y—Y in FIG. 5D.

In this embodiment of the method, the processes are the same as those of the prior art up to the processes shown in FIGS. 1A through 1F, that is, until the formation of the ground line 8 from the second polysilicon layer. Hence, a description will only be given of the processes carried out thereafter.

Figure 23A:
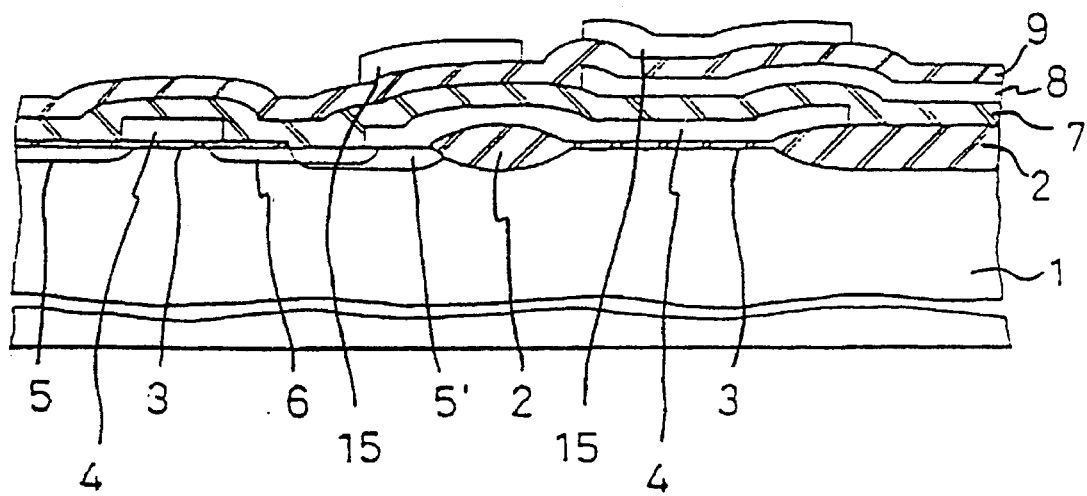
FIGS. 23A through 23G are side views in cross section showing an essential part of a twelfth embodiment of the semiconductor memory device according to the present invention at essential stages of a twelfth embodiment of the method of producing the semiconductor memory device according to the present invention.

In FIG. 23A, the TFT load type SRAM already has on the Si semiconductor substrate 1 the field insulator layer 2, the gate insulator layer 3, the gate electrode 4 of the driver transistor formed from the first polysilicon layer, the n$^+$-type impurity region 5', the n$^+$-type source region 5, the n$^+$-type drain region 6, the insulator layer 7 made of $SiO_2$, and the ground line 8 formed from the second polysilicon layer.

A CVD is carried out for form an insulator layer 9 which is made of $SiO_2$ and has a thickness of 1000 Å, for example.

Then, a CVD is carried out to form a third polysilicon layer having a thickness of 500 Å, for example.

An ion implantation is carried out to inject P ions into the third polysilicon layer with a dosage of $1 \times 10^{15}$ cm$^{-2}$ and an acceleration energy of 10 keV, for example.

A resist process of the photolithography technique and a RIE using $CCl_4/O_2$ as the etching gas are carried out to pattern the third polysilicon layer and to form a gate electrode 15 of the TFT load.

Figure 23B:
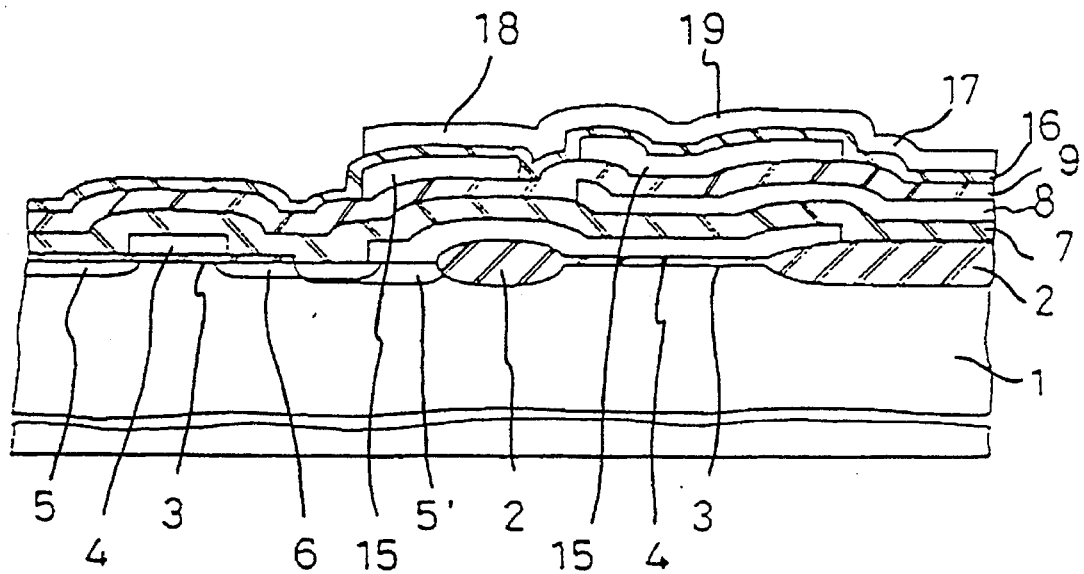

In FIG. 23B, a CVD is carried out to form a gate insulator layer 16 of the TFT load, which is made of $SiO_2$ and has a thickness of 200 Å, for example.

Then, a CVD is carried out to form a fourth polysilicon layer having a thickness of 200 Å, for example.

A resist process of the photolithography technique and an ion implantation are carried out to inject B ions with a dosage of $1 \times 10^{14}$ cm$^{-2}$ and an acceleration energy of 5 keV, into parts of the fourth polysilicon layer where source and drain regions of the TFT load are formed.

A resist process of the photolithography technique and a RIE using $CCl_4/O_2$ as the etching gas are carried out to pattern the fourth polysilicon layer and to form a source region 17, a drain region 18 and a channel region 19 of the TFT load, and a Vcc supply line. The Vcc supply line cannot be seen in FIG. 23B.

Figure 23C:
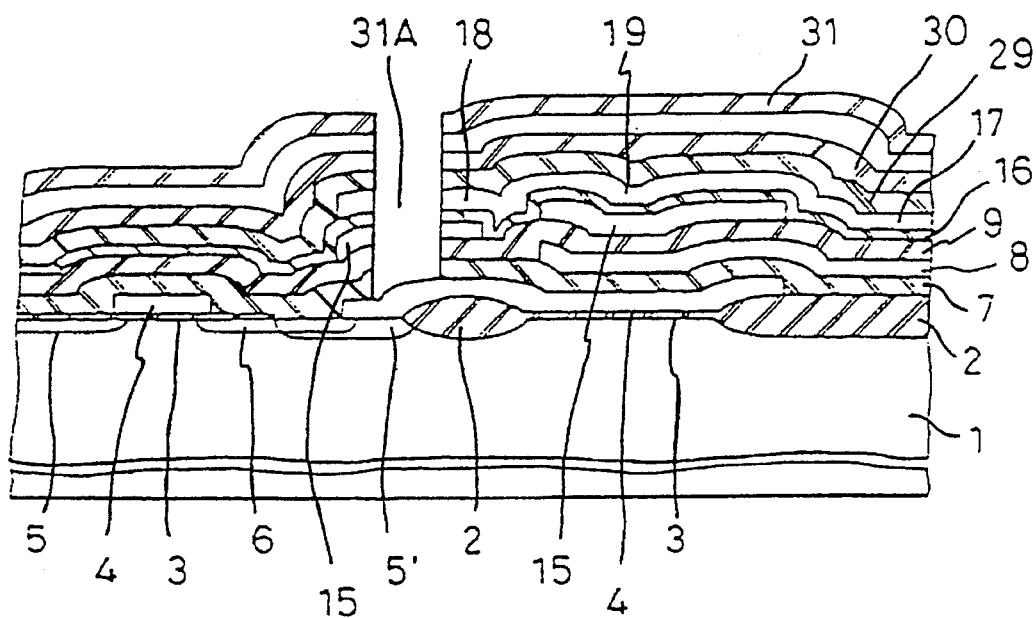

In FIG. 23C, a CVD is carried out to form on the entire surface an insulator layer 29 which is made of $Si_3N_4$ and has a thickness of 500 Å, for example. In addition, a CVD is carried out to form an insulator layer 30 which is made of $SiO_2$ and has a thickness of 500 Å, for example.

Then, a CVD is carried out to form a fifth polysilicon layer having a thickness of 500 Å, for example.

An ion implantation is carried out to inject P ions into the fifth polysilicon layer with a dosage of $1 \times 10^{15}$ cm$^{-2}$ and an acceleration energy of 10 keV.

A CVD is carried out to form on the entire surface an insulator layer 31 which is made of $SiO_2$ and has a thickness of 500 Å, for example.

A resist process of the photolithography technique and RIEs using $CHF_3/He$ and $CCl_4/O_2$ as the etching gases are carried out to selectively etch the insulator layer 31, the fifth polysilicon layer, the insulator layer 29, the drain region 18 of the TFT load formed from the fourth polysilicon layer, the gate insulator layer 16, the gate electrode 15 formed from the third polysilicon layer, the insulator layer 9 and the insulator layer 7, and to form a contact hole 31A. The $CHF_3/He$ etching gas is used to etch the $SiO_2$ and the $Si_3N_4$, and the $CCl_4/O_2$ etching gas is used to etch the polysilicon. The contact hole 31A extends from the top surface of the insulator layer 31 and reaches the top surface of the gate electrode 4 of the driver transistor formed from the first polysilicon layer.

This process forms an essential part of this twelfth embodiment. In other words, the number of mask processes related to the formation of the contact hole 31A is reduced by two compared to that of the eleventh embodiment.

Figure 23D:
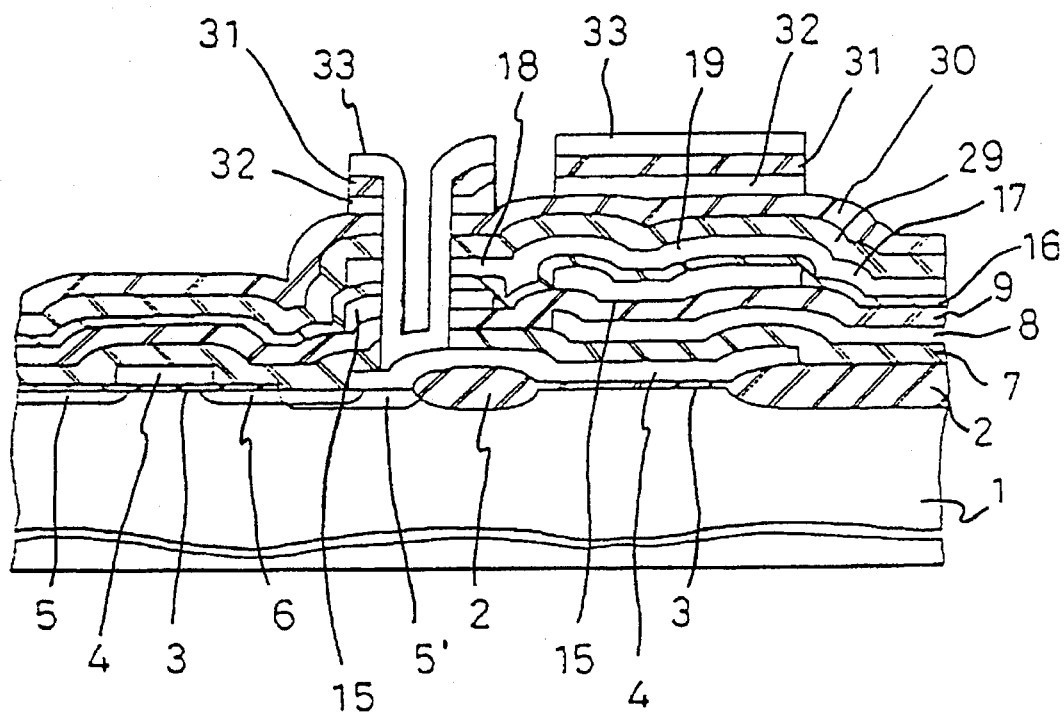

In FIG. 23D, a CVD is carried out to form a sixth polysilicon layer having a thickness of 500 Å, for example.

Then, a thermal diffusion process is carried out to diffuse P in the sixth polysilicon layer with an impurity concentration of $1 \times 10^{21}$ cm$^{-3}$, for example.

A resist process of the photolithography technique and RIEs using $CCl_4/O_2$ and $CHF_3/He$ as the etching gases are carried out to pattern the sixth polysilicon layer, the insulator layer 31 and the fifth polysilicon layer, and to form a storage electrode 33 of the memory capacitor and a fin 32 of the memory capacitor. The $CCl_4/O_2$ etching gas is used to etch the polysilicon, and the $CHF_3/He$ etching gas is used to etch the $SiO_2$.

When carrying out this etching, it is possible to make a sufficient over-etching, similarly as in the case of the eleventh embodiment. Hence, it is possible to stably form the fin 32.

Figure 23E:
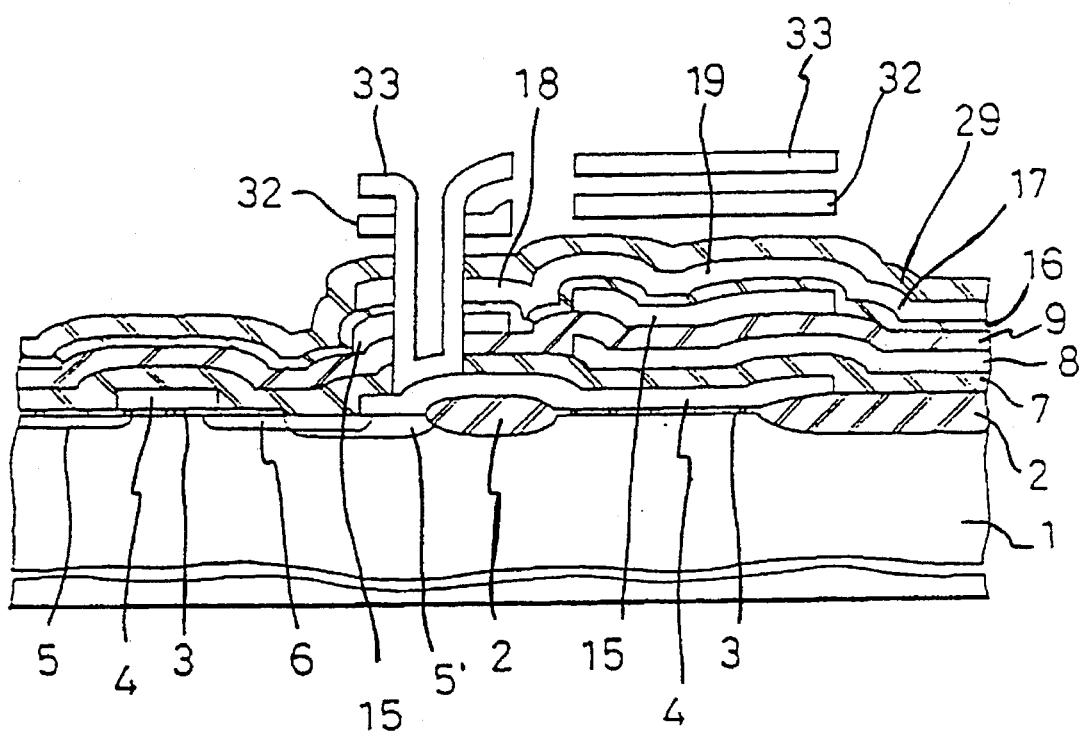

In FIG. 23E, the above described structure is submerged in a HF solution so as to remove the $SiO_2$ insulator layers 31 and 30.

Figure 23F:
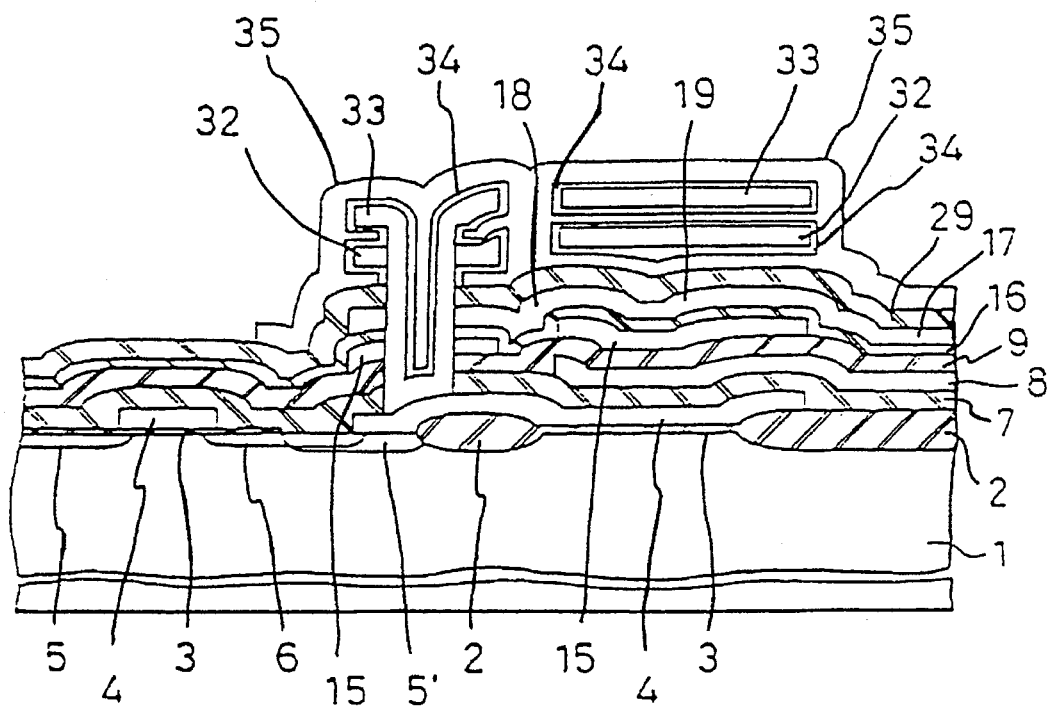

In FIG. 23F, a CVD is carried out to form a dielectric layer which is made of $Si_3N_4$ and has a thickness of 200 Å, for example, on the storage electrode 33 of the memory capacitor and on the surface of the fin 32 of the memory capacitor.

Then, a CVD is carried out to form a seventh polysilicon layer having a thickness of 1000 Å, for example.

A thermal diffusion process is carried out to diffuse P in the seventh polysilicon layer with an impurity concentration of $1 \times 10^{21}$ cm$^{-3}$, for example.

A resist process of the photolithography technique and a RIE using $CCl_4/O_2$ as the etching gas are carried out to pattern the seventh polysilicon layer and to form an opposing electrode 35 of the memory capacitor. This opposing electrode 35 is used in common as a shield electrode.

Figure 23G:
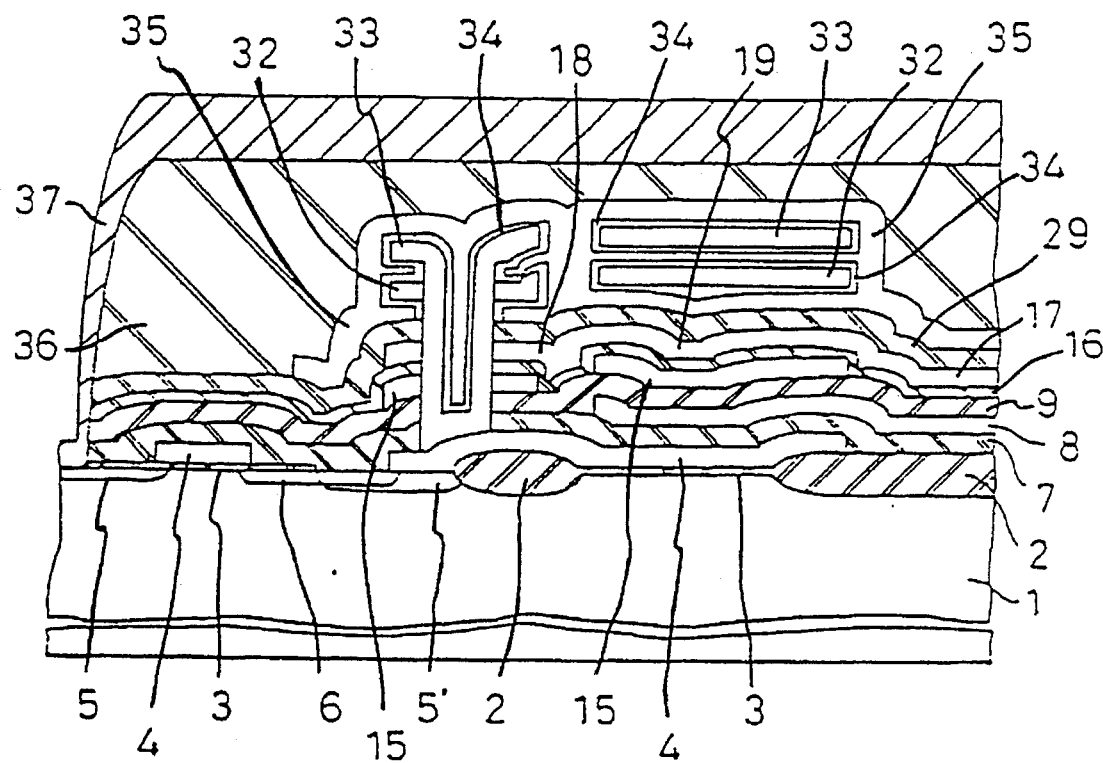

In FIG. 23G, a CVD is carried out to form an insulator layer which is made of $SiO_2$ and has a thickness of 500 Å, for example, and an insulator layer which is made of PSG and has a thickness of 5000 Å, for example. These two insulator layers are shown as an insulator layer 36 in FIG. 23G.

Then, a thermal process is carried out to reflow and planarize the insulator layer 36.

A resist process of the photolithography technique and a RIE using $CHF_3/He$ as the etching gas are carried out to selectively etch the insulator layer 36 and the like, and to form a bit line contact hole.

A sputtering is carried out to form an Al layer having a thickness of 1 μm, for example, and this Al layer is patterned into a bit line 37 using the normal photolithography technique.

This embodiment differs from the eleventh embodiment described above in that the contact hole 31A is formed so that the storage electrode 33 of the memory capacitor can make direct contact with the gate electrode 4 of the driver transistor. For this reason, the contact hole 31A can be formed in one mask process, and the number of mask processes can be reduced by two compared to that of the eleventh embodiment and by one compared to the prior art method of producing the double gate structure TFT load type SRAM. Hence, the production process can be simplified according to this twelfth embodiment. In addition, it is possible to stably form a memory capacitor having a sufficiently large capacitance while preventing the undesirable parasitic effect of the TFT load.

Figure 24A:
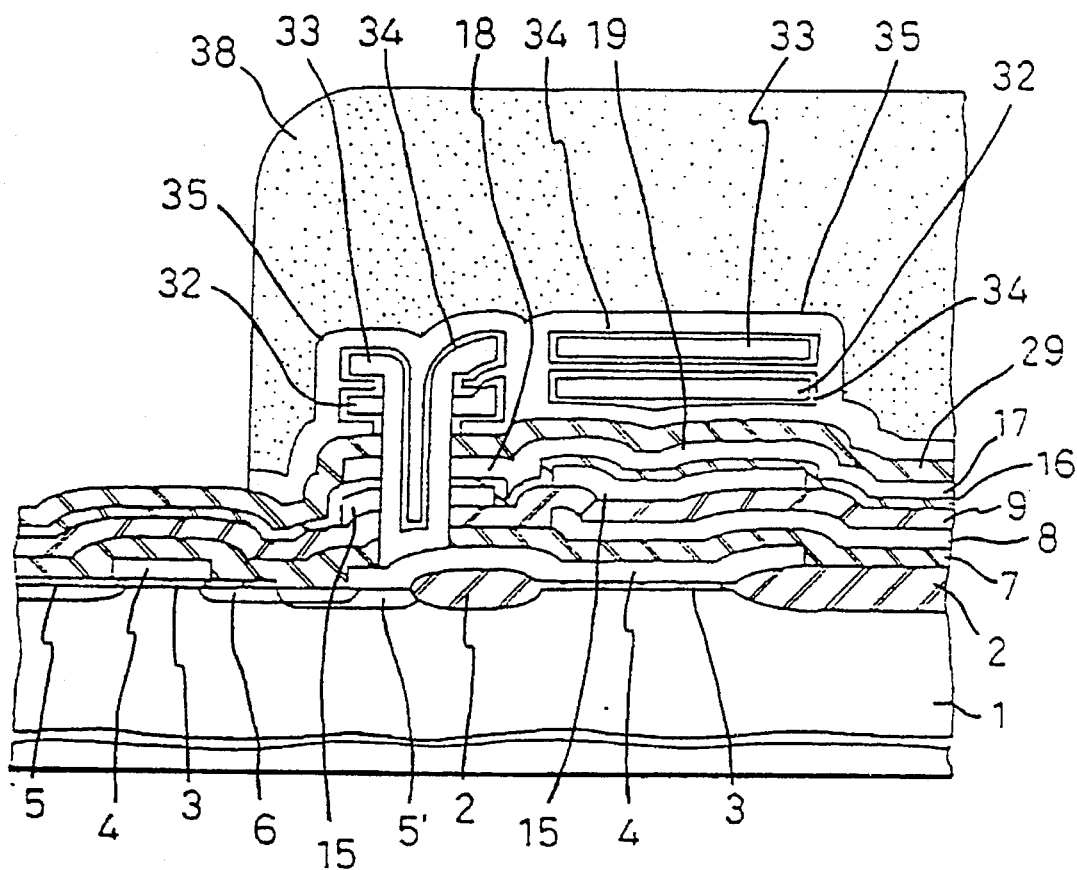
FIGS. 24A through 24C are side views in cross section showing an essential part of a thirteenth embodiment of the semiconductor memory device according to the present invention at essential stages of a thirteenth embodiment of the method of producing the semiconductor memory device according to the present invention.
Figure 24B:
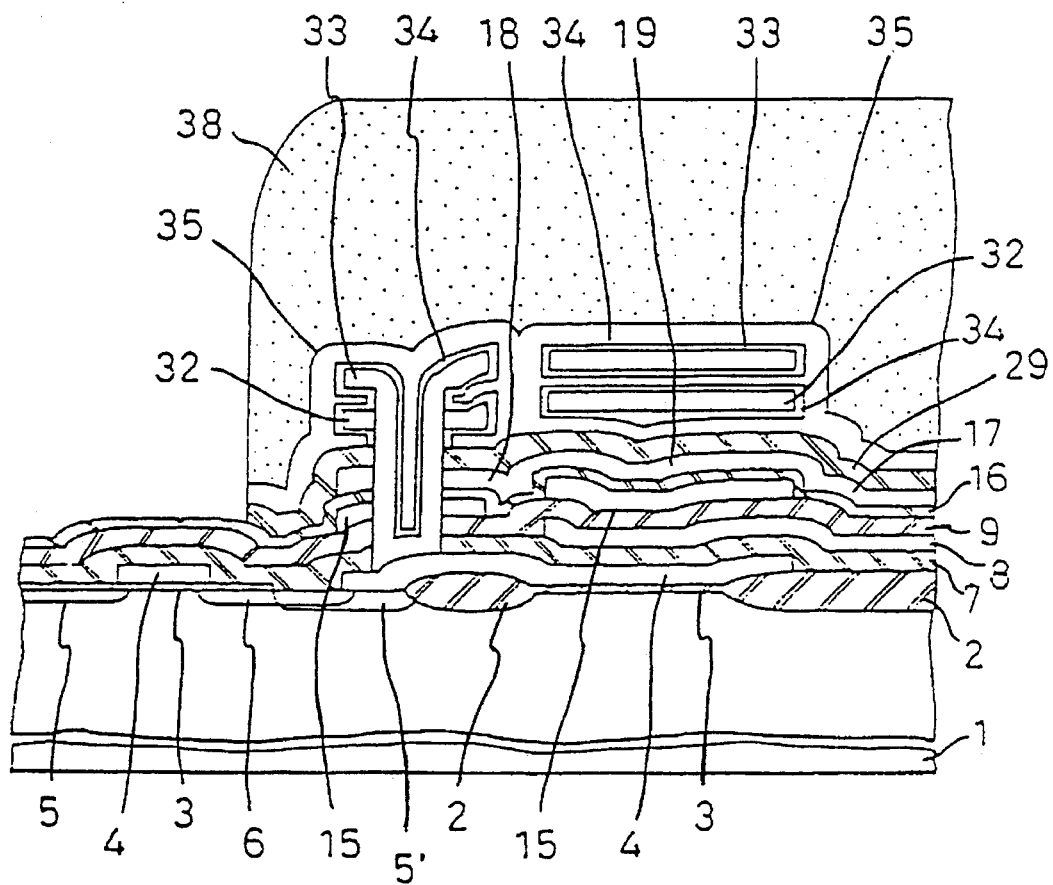
Figure 24C:
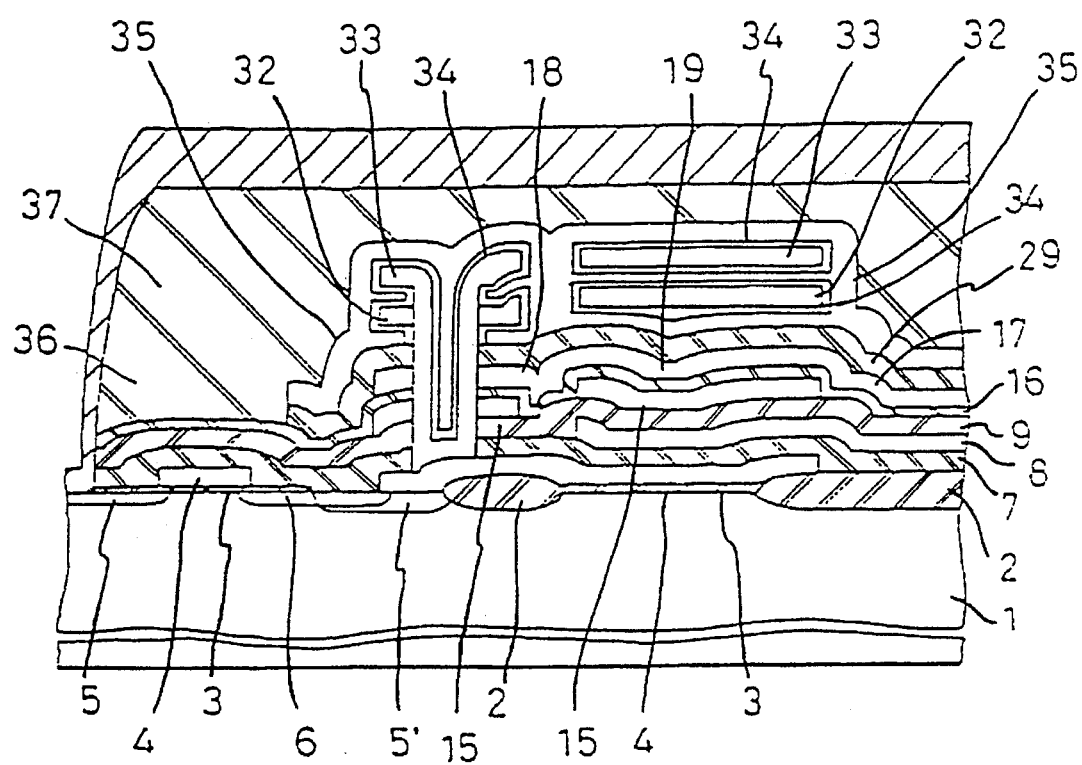

Next, a description will be given of a thirteenth embodiment of the semiconductor memory device according to the present invention which is produced by a thirteenth embodiment of the method of producing the semiconductor memory device according to the present invention. FIGS. 24A through 24C are side views in cross section showing an essential part of the thirteenth embodiment of the semiconductor memory device according to the present invention at essential stages of the thirteenth embodiment of the method of producing the semiconductor memory device according to the present invention. In FIGS. 24A through 24C, those parts which are the same as those corresponding parts in FIGS. 23A through 23G are designated by the same reference numerals, and a description thereof will be omitted. FIGS. 24A through 24C respectively correspond to cross sections similar to the cross sections taken along a line Y—Y in FIG. 5D.

In this embodiment of the method, the processes are the same as those of the twelfth embodiment up to the processes shown in FIGS. 23A through 23F, that is, until P is diffused in the seventh polysilicon layer to make is conductive. Hence, a description will only be given of the processes carried out thereafter.

In FIG. 24A, the TFT load type SRAM already has on the Si semiconductor substrate 1 the field insulator layer 2, the gate insulator layer 3, the gate electrode 4 of the driver transistor formed from the first polysilicon layer, the n$^+$-type impurity region 5', the n$^+$-type source region 5, the n$^+$-type drain region 6, the insulator layer 7 made of $SiO_2$, the ground line 8 formed from the second polysilicon layer, the insulator layer 9 made of $SiO_2$, the gate electrode 15 of the TFT load, the gate insulator layer 16 of the TFT load, the source region 17 of the TFT load, the drain region 18 of the TFT load, the fin 32 of the memory capacitor, the storage electrode 33 of the memory capacitor, the dielectric layer 34, and the seventh polysilicon layer which covers the entire surface.

A resist process of the photolithography technique is carried out to form a photoresist layer 38 which has a pattern for forming an opposing electrode of the memory capacitor, which opposing electrode is also to function as a shield electrode.

In FIG. 24B, a RIE using $CCl_4/O_2$ as the etching gas is carried out to pattern the seventh polysilicon layer using the photoresist layer 38 as a mask, and to form an opposing electrode 35 of the memory capacitor. This opposing electrode 35 also functions as the shield electrode.

Then, a RIE using $CF_4/O_2$ as the etching gas is carried out in a state where the photoresist layer 38 remains, so as to pattern the $Si_3N_4$ insulator layer 29. As a result, at the insulator layer 29 which covers a part where a bit line contact hole is to be formed is removed.

In FIG. 24C, a CVD is carried out to form an insulator layer which is made of $SiO_2$ and has a thickness of 500 Å, for example, and an insulator layer which is made of PSG and has a thickness of 5000 Å, for example. These two insulator layers are shown as an insulator layer 36 in FIG. 24C.

Then, a thermal process is carried out to reflow and planarize the insulator layer 36.

A resist process of the photolithography technique and a RIE using $CHF_3$/He as the etching gas are carried out to selectively etch the insulator layer 36 and the like, and to form the bit line contact hole.

A sputtering is carried out to form an Al layer having a thickness of 1 μm, for example, and this Al layer is patterned into a bit line 37 by using the normal photolithography technique.

According to this embodiment, the mask which is used to pattern the opposing electrode 35 is also used to pattern the $Si_3N_4$ insulator layer 29. Hence, the advantages which will be described hereunder are obtained when forming the bit line 37.

Next, a description will be given of the effects obtainable in the thirteenth embodiment, by referring to FIGS. 25A through 25D.

Figure 25A:
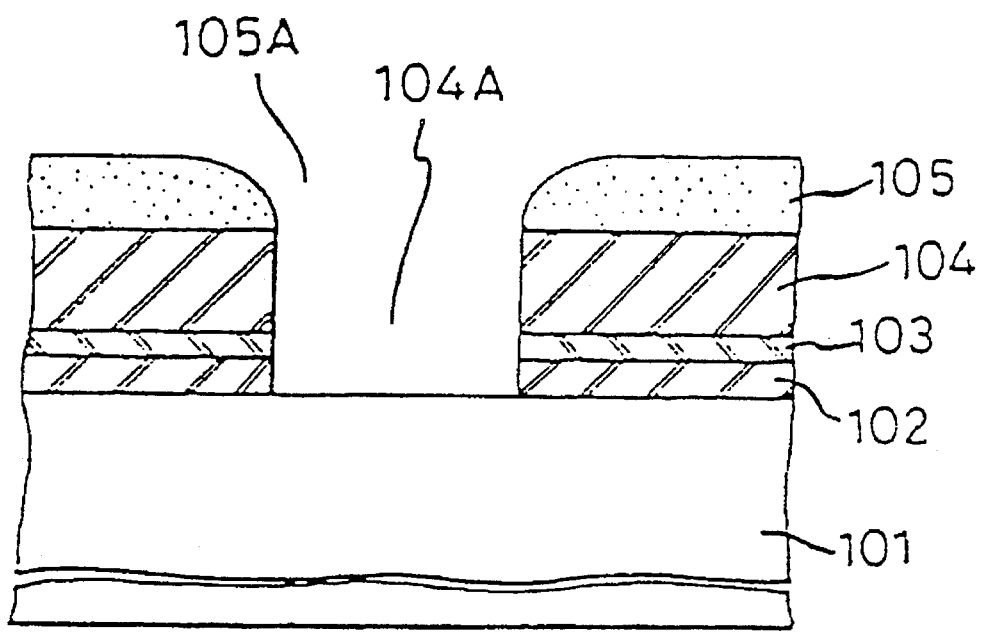
FIGS. 25A through 25D are side views in cross section showing an essential part of the thirteenth embodiment of the semiconductor memory device according to the present invention at essential stages of the production thereof, for explaining the effects of the thirteenth embodiment.

In FIG. 25A, a $SiO_2$ insulator layer 102, a $Si_3N_4$ insulator layer 103 and a PSG insulator layer 104 are successively stacked on a Si semiconductor substrate 101.

A resist process of the photolithography technique and a RIE using $CHF_3$/He as the etching gas are carried out to selectively etch the insulator layer 104 and the like using as a mask a photoresist layer 105 which has an opening 105A. By this selective etching, a contact hole 104A is formed. This contact hole 104A extends from the top surface of the insulator layer 104 and reaches the top surface of the Si semiconductor substrate 101.

Figure 25B:
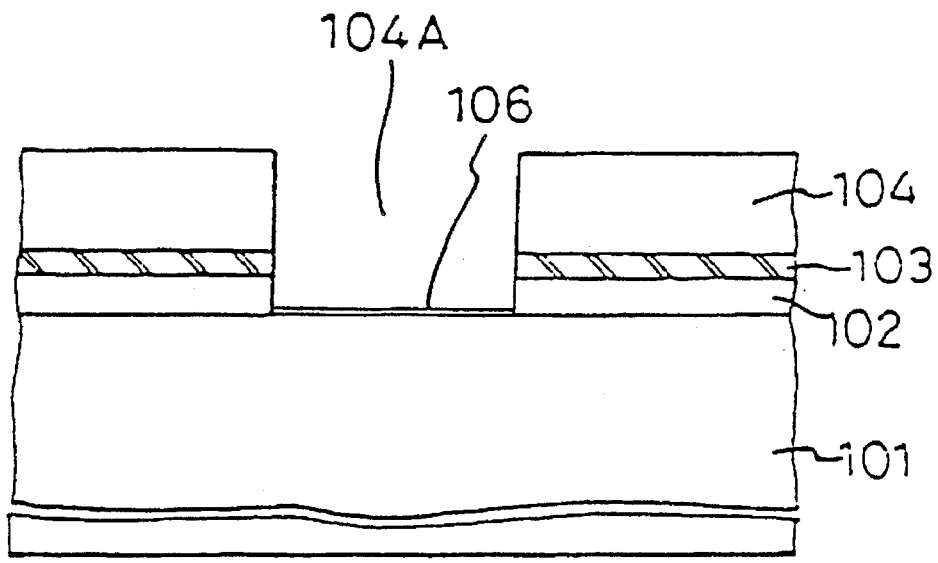

In FIG. 25B, a plasma ashing is carried out to remove the photoresist layer 105 in oxygen plasma by the ashing. During this process, a thin oxide layer 106 is generated at the surface of the Si semiconductor substrate 101 exposed at the bottom of the contact hole 104A.

Figure 25C:
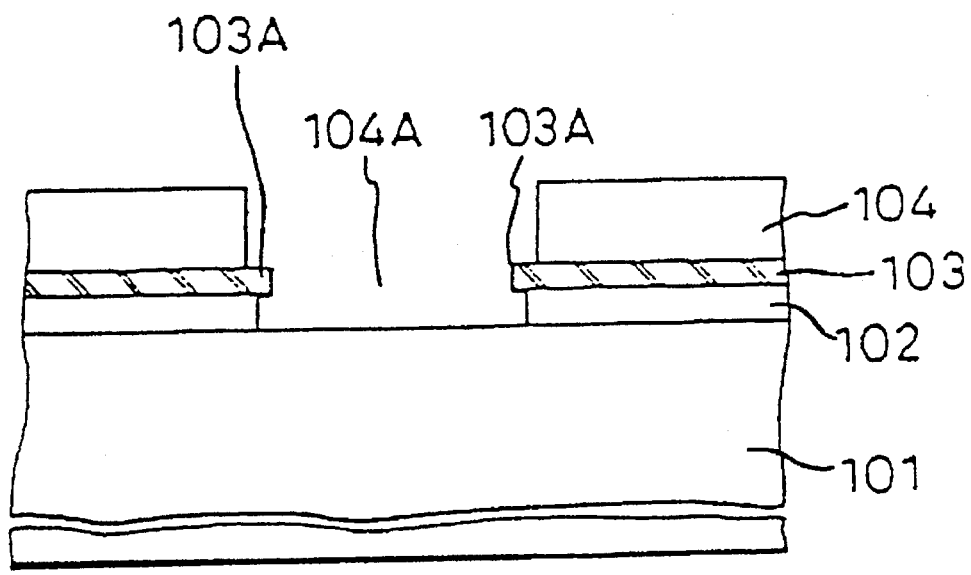

In FIG. 25C, the above described structure is submerged in a HF solution to remove the thin oxide layer 106. In this case, the PSG insulator layer 104 and the $SiO_2$ insulator layer 102 are etched, and the side wall within the contact hole 104A recedes at these insulator layers 104 and 102. However, the $Si_3N_4$ insulator layer 103 will not be etched and thus projects within the contact hole 104A.

Figure 25D:
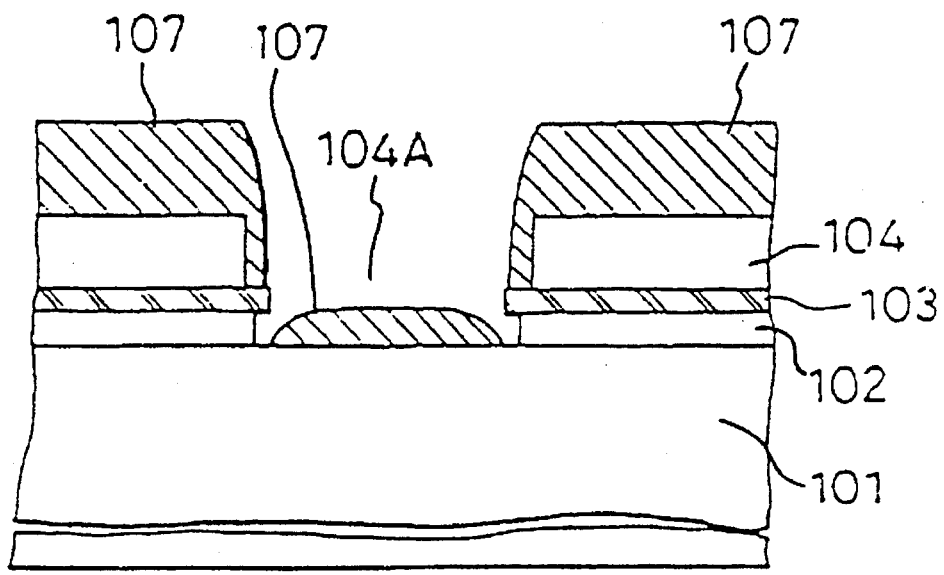

In FIG. 25D, a sputtering is carried out to form an Al electrode/interconnection layer 107. In this case, the Al layer 107 may be disconnected within the contact hole 104A due to the $Si_3N_4$ insulator layer 103 which projects within the contact hole 104A.

The above phenomenon described in conjunction with FIGS. 25A through 25D directly applies to the forming of the bit line contact hole of the TFT load type SRAM. However, according to the thirteenth embodiment, no $Si_3N_4$ insulator layer 29 exists at the part where the bit line contact hole is to be formed. In addition, the process of forming the opposing electrode 35 is used to remove the unwanted part of the $Si_3N_4$ insulator layer 29. Therefore, the number of production processes will not increase.

Figure 26:
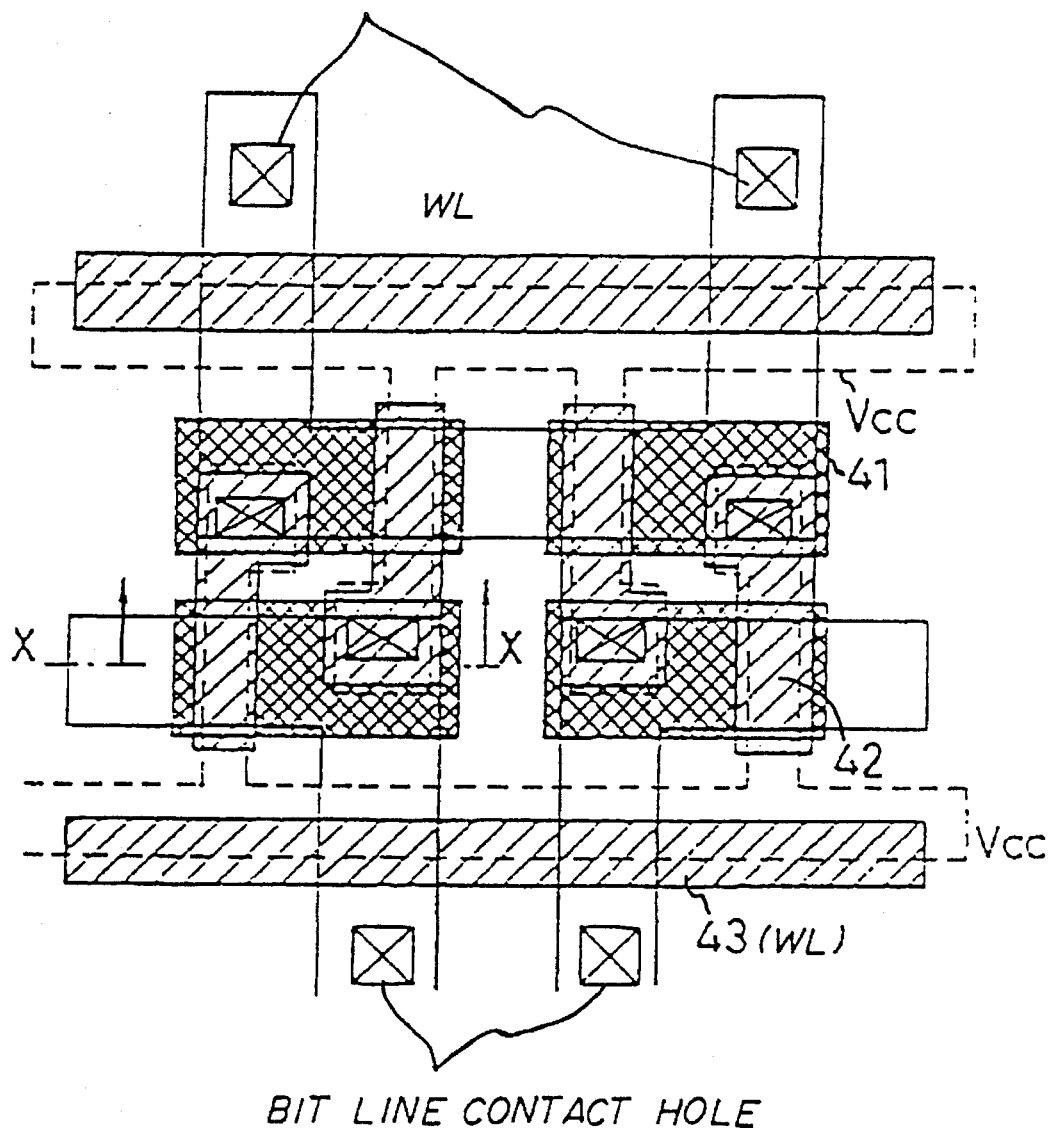
FIG. 26 is a plan view generally showing an essential part of a TFT load type SRAM.

FIG. 26 shows a plan view of a TFT load type SRAM which has a split word line structure. FIG. 26 shows a gate 41 of the TFT load, a channel 42 of the TFT load, a word line 43 (WL), and a positive power source voltage supply line Vcc for supplying the positive power source voltage Vcc.

According to this SRAM shown in FIG. 26, the driver transistors and the TFT loads are arranged in a symmetric manner. In addition, there are only two connection regions per memory cell, and the number of connection regions is reduced compared to that of the prior art. Accordingly, the layout of this SRAM can be designed with ease. Accordingly, a description will be given of a fourteenth embodiment of the semiconductor memory device according to the present invention which is applied to the SRAM shown in FIG. 26.

Next, a description will be given of a fourteenth embodiment of the semiconductor memory device according to the present invention which is produced by a fourteenth embodiment of the method of producing the semiconductor memory device according to the present invention. FIGS. 27A through 27J are side views in cross section showing an essential part of the fourteenth embodiment of the semiconductor memory device according to the present invention at essential stages of the fourteenth embodiment of the method of producing the semiconductor memory device according to the present invention. FIGS. 27A through 27J are cross sections taken along a line which corresponds to a line X—X shown in FIG. 26.

Figure 27A:
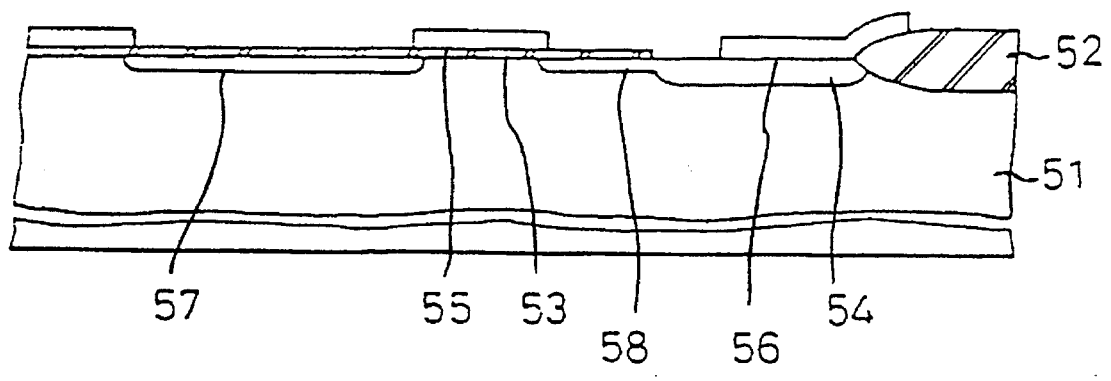
FIGS. 27A through 27J are side views in cross section showing an essential part of a fourteenth embodiment of the semiconductor memory device according to the present invention at essential stages of a fourteenth embodiment of the method of producing the semiconductor memory device according to the present invention.

In FIG. 27A, a pad layer made of $SiO_2$ covering an active region of a Si semiconductor substrate 51 and an oxidation resistant mask layer made of $Si_3N_4$ formed on the pad layer are used to carry out a selective thermal oxidation to form a field insulator layer 52 which is made of $SiO_2$ and has a thickness of 4000 Å, for example.

After exposing the active region by removing the oxidation resistant mask layer and the pad layer, a thermal oxidation is carried out to form a gate insulator layer 53 which is made of $SiO_2$ and has a thickness of 100 Å, for example.

A resist process of the photolithography technique and a wet etching using hydrofluoric acid as the etchant are carried out to selective etch the gate insulator layer 53 and to form a contact hole which is also used when diffusing impurities.

A CVD is carried out to form a first polysilicon layer having a thickness of 1000 Å, for example.

Then, a vapor phase diffusion is carried out to introduce P with an impurity concentration of $1\times 10^{20}$ cm$^{-3}$, for example, so as to form an n$^+$-type impurity region 54.

A resist process of the photolithography technique and a RIE using $CCl_4/O_2$ as the etching gas are carried out to pattern the first polysilicon layer and to form gate electrodes 55 and 56.

An ion implantation is carried out to inject As ions into the first polysilicon layer with a dosage of $1\times10^{15}$ cm$^{-2}$ and an acceleration energy of 30 keV, for example, so as to form an n$^+$-type source region 57 and an n$^+$-type drain region 58.

Figure 27B:
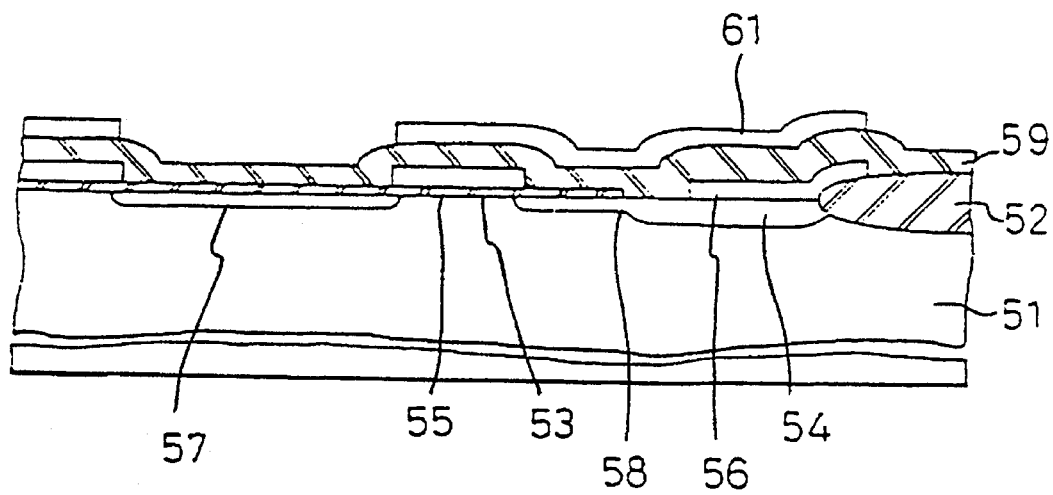

In FIGS. 27B, a CVD is carried out to form an insulator layer 59 which is made of $SiO_2$ and has a thickness of 1000 Å, for example.

Then, a CVD is carried out to form a second polysilicon layer having a thickness of 1000 Å, for example.

A vapor phase diffusion is carried out to introduce P into the second polysilicon layer with an impurity concentration of $1\times10^{20}$ cm$^{-3}$, for example Next, a resist process of the photolithography technique and a RIE using $CCl_4/O_2$ as the etching gas are carried out to pattern the second polysilicon layer and to form a lower gate electrode 61 of the TFT load and the like.

Figure 27C:
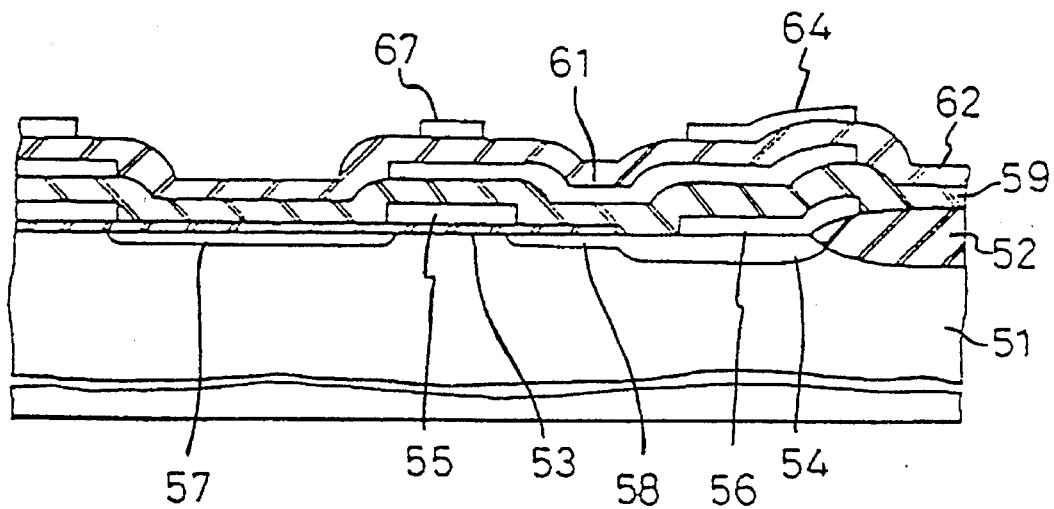

In FIG. 27C, a CVD is carried out to form an insulator layer 62 which is made of $SiO_2$ and has a thickness of 200 Å, for example.

Then, a CVD is carried out to form a third polysilicon layer having a thickness of 200 Å, for example.

A resist process of the photolithography technique and an ion implantation are carried out to inject B ions with a dosage of $1\times10^{14}$ cm$^{-2}$ and an acceleration energy of 5 keV, for example, into parts of the third polysilicon layer where source and drain regions of the TFT load and a Vcc supply line are formed.

A resist process of the photolithography technique and a RIE using CCl$_4$/O$_2$ as the etching gas are carried out to pattern the third polysilicon layer and to form a contact part, a drain region, a source region and a channel region of each TFT load, and the Vcc supply line. In FIG. 27C, only a contact part 64 which connects to a tip end of a drain region of a TFT load and a channel region 67 of an adjacent TFT load can be seen.

Figure 27D:
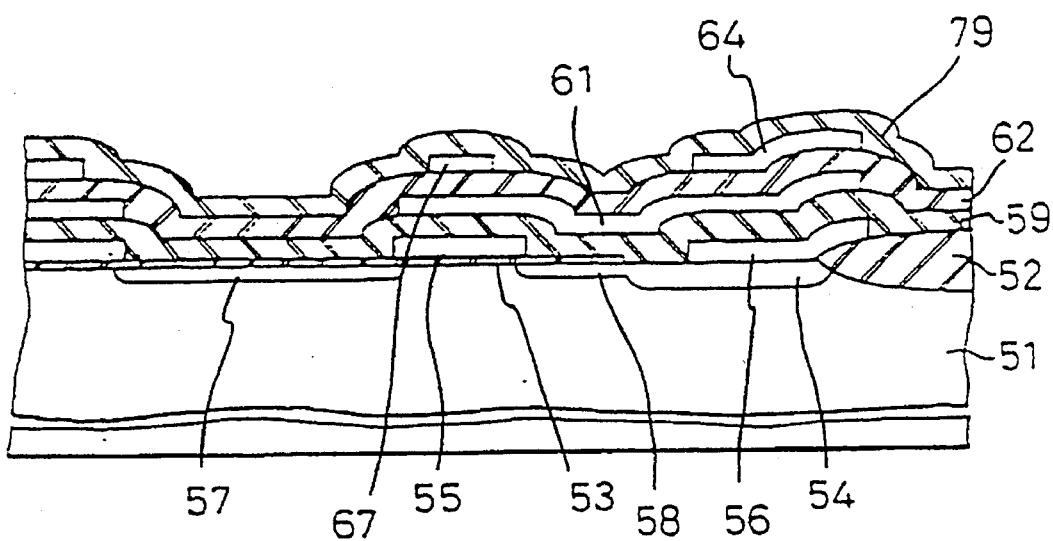

In FIG. 27D, a CVD is carried out to form an insulator layer 79 which is made of Si$_3$N$_4$ and has a thickness of 500 Å, for example. This insulator layer 79 also functions as an etching stopper.

Figure 27E:
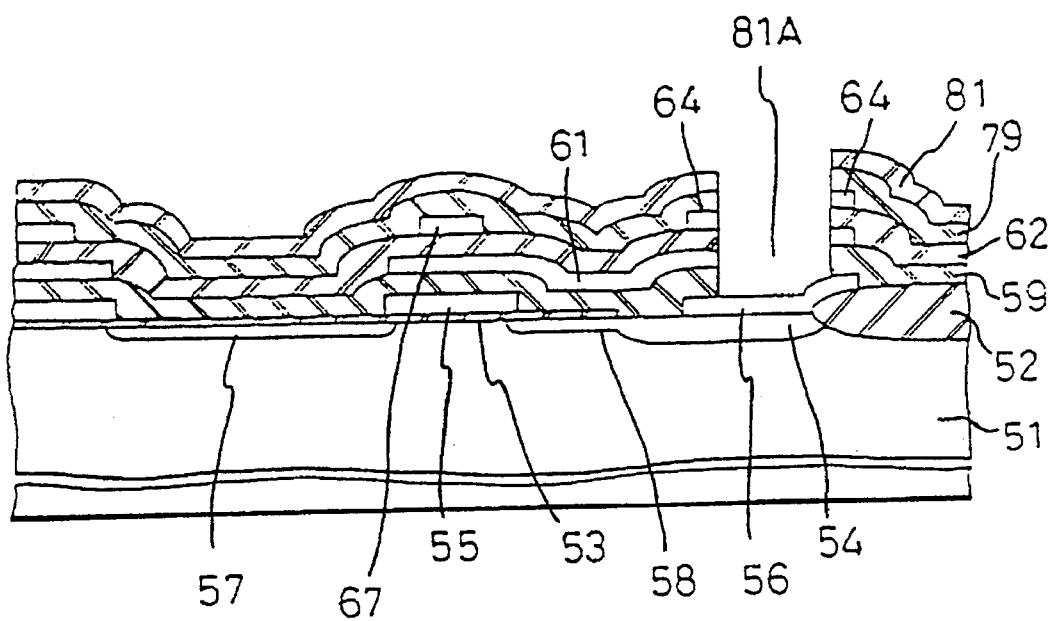

In FIG. 27E, a CVD is carried out to form an insulator layer 81 which is made of SiO$_2$ and has a thickness of 500 Å, for example.

A resist process of the photolithography technique and RIEs using CHF$_3$/He and CCl$_4$/O$_2$ as the etching gases are carried out to selectively etch the insulator layer 81, the insulator layer 79, the contact part 64 formed from the third polysilicon layer, the insulator layer 62, the gate electrode 61 of the TFT load formed from the second polysilicon layer and the insulator layer 59, and to form a contact hole 81A. The CHF$_3$/He etching gas is used to etch the SiO$_2$ and the Si$_3$N$_4$, while the CCl$_4$/O$_2$ etching gas is used to etch the polysilicon. The contact hole 81A extends from the top surface of the insulator layer 81 and reaches the top surface of the gate electrode 56 or 55 of the driver transistor formed from the first polysilicon layer.

Figure 27F:
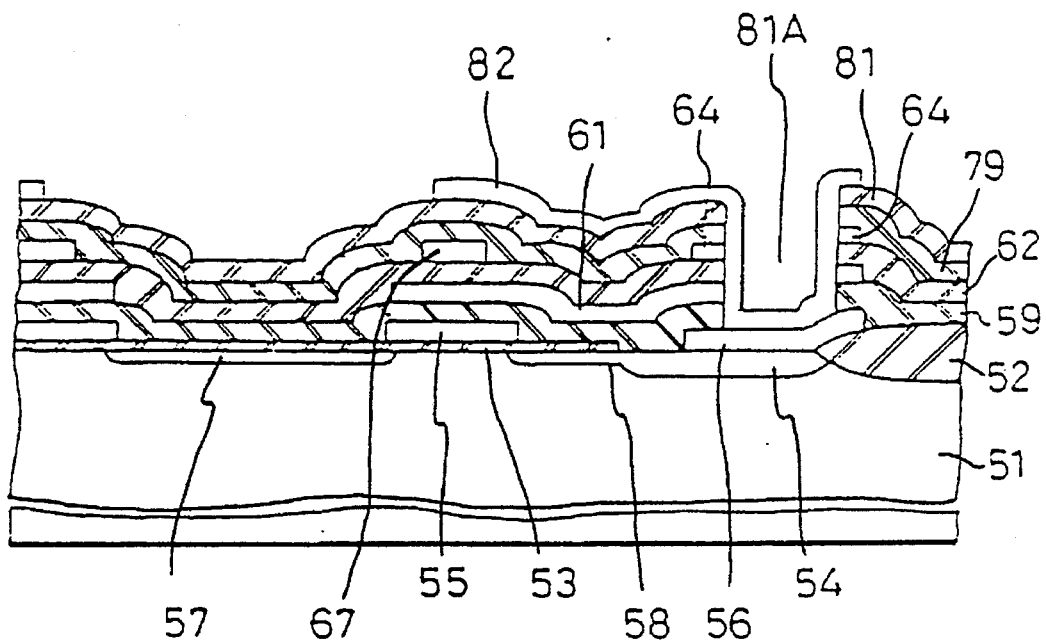

In FIG. 27F, a CVD is carried out to form a fourth polysilicon layer having a thickness of 500 Å, for example.

Then, a thermal diffusion process is carried out to diffuse P in the fourth polysilicon layer with an impurity concentration of $1\times10^{21}$ cm$^{-3}$.

A resist process of the photolithography technique and an RIE using CCl$_4$/O$_2$ as the etching gas are carried out to pattern the fourth polysilicon layer and to form a storage electrode 82 of the memory capacitor.

Figure 27G:
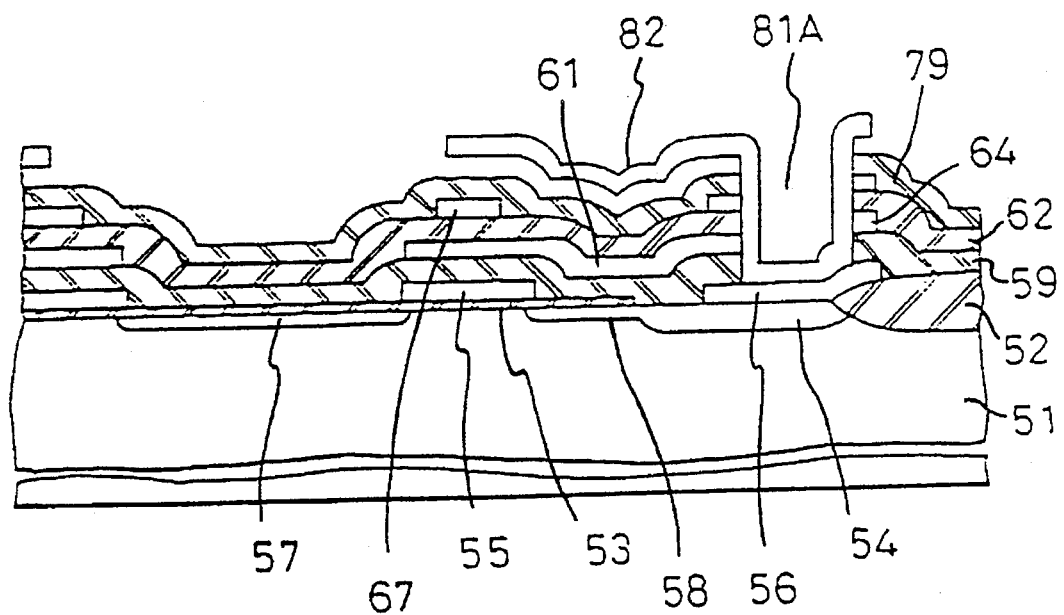

In FIG. 27G, the structure described above is submerged in a HF solution to remove the SiO$_2$ insulator layer 81.

Figure 27H:
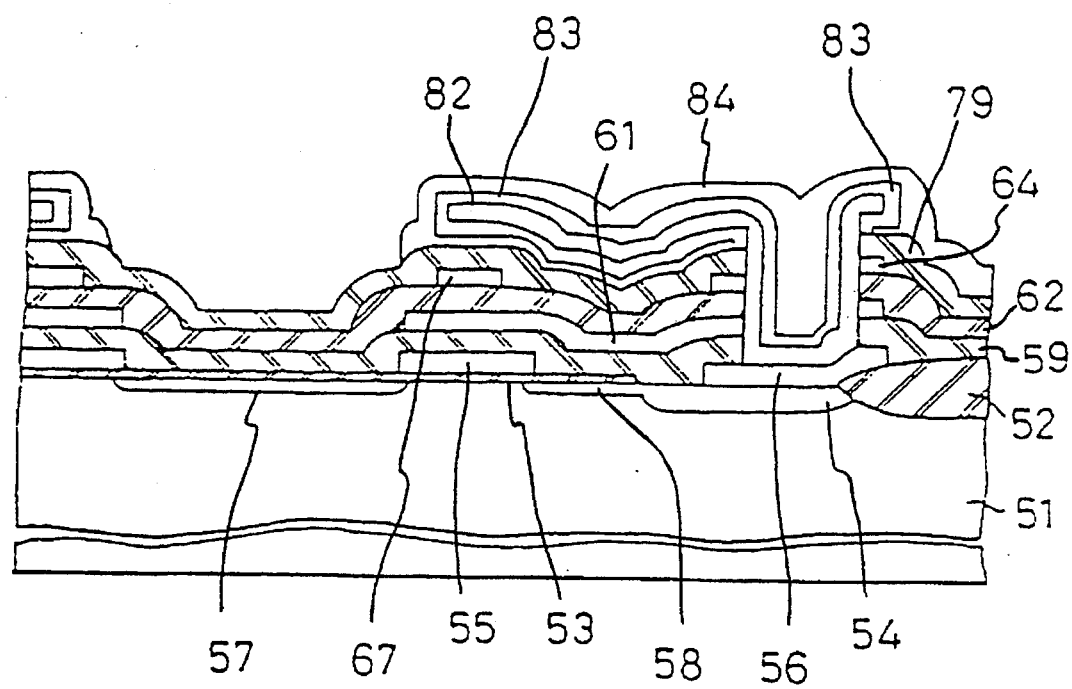

In FIG. 27H, a CVD is carried out to form a dielectric layer 83 which is made of Si$_3$N$_4$ and has a thickness of 200 Å, for example, on the surface of the storage electrode 82.

Then, a CVD is carried out to form a fifth polysilicon layer having a thickness of 1000 Å, for example.

A thermal diffusion process is carried out to diffuse P in the fifth polysilicon layer with an impurity concentration of $1\times10^{21}$ cm$^{-3}$, for example.

A resist process of the photolithography technique and a RIE using CCl$_4$/O$_2$ as the etching gas are carried out to pattern the fifth polysilicon layer and to form an opposing electrode 84 of the memory capacitor.

Figure 27I:
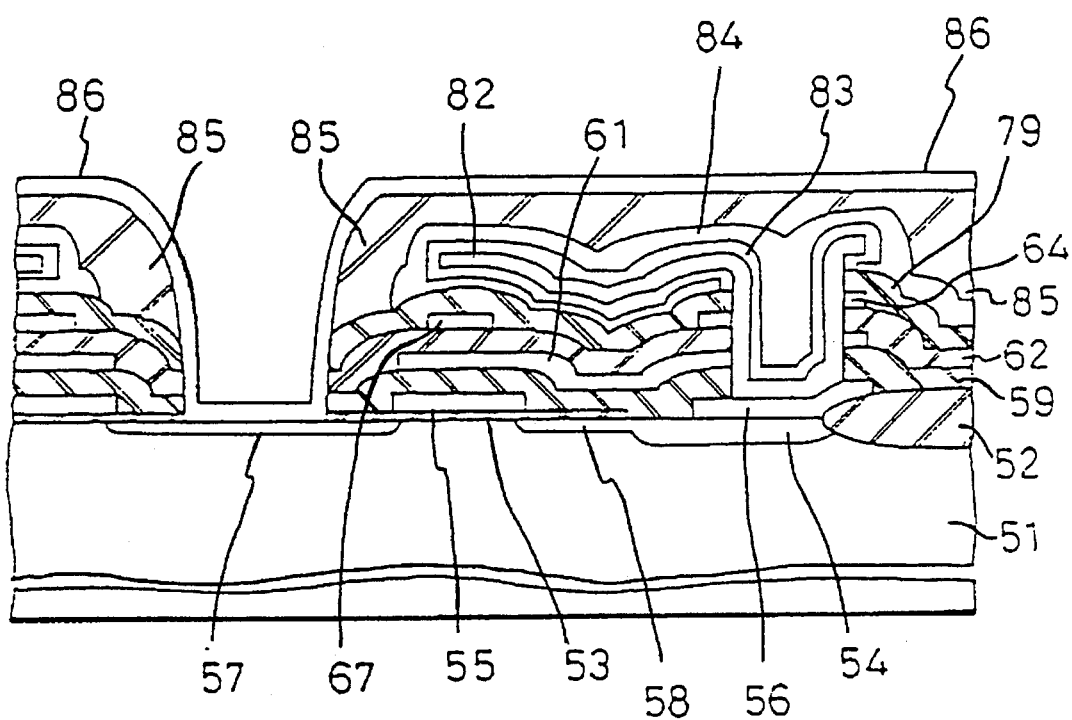

In FIGS. 27I, a CVD is carried out to form an insulator layer which is made of SiO$_2$ and has a thickness of 1000 Å, for example, and an insulator layer which is made of PSG and has a thickness of 5000 Å, for example. In FIG. 27I, these two insulator layers are shown as an insulator layer 85.

A thermal process is carried out to reflow and planarize the insulator layer 85.

Thereafter, a resist process of the photolithography technique and a RIE using CHF$_3$/He as the etching gas are carried out to selectively etch the insulator layer 85 and the like and to form a ground line contact hole which cannot be seen in FIG. 27I.

A CVD is carried out to form a sixth polysilicon layer having a thickness of 1000 Å, for example.

Next, a thermal diffusion process is carried out to diffuse P in the sixth polysilicon layer with an impurity concentration of $1\times10^{21}$ cm$^{-3}$, for example.

A resist process of the photolithography technique and a RIE using CCl$_4$/O$_2$ as the etching gas are carried out to pattern the sixth polysilicon layer and to form a Vss supply line 86.

Figure 27J:
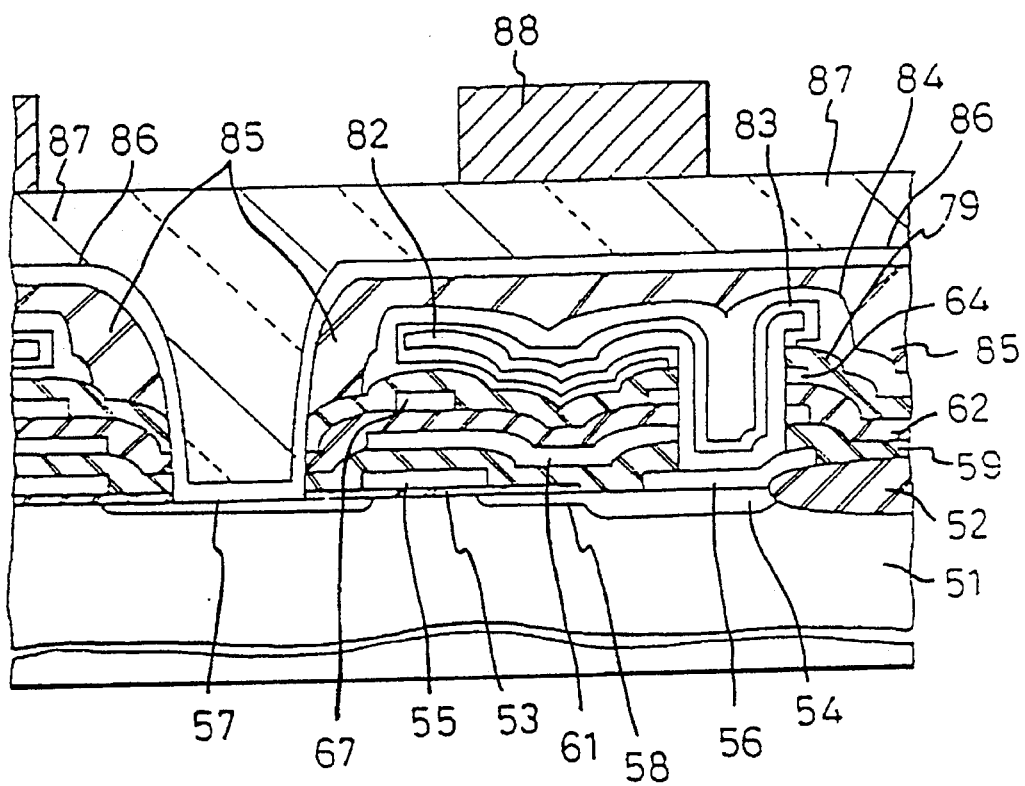

In FIG. 27J, a CVD is carried out to form an insulator layer 87 which is made of PSG and has a thickness of 5000 Å, for example.

Then, a thermal process is carried out to reflow and planarize the insulator layer 87.

A resist process of the photolithography technique and a RIE using CCl$_4$/O$_2$ or the like as the etching gas are carried out selectively etch the insulator layer 87 and the like, and to form a bit line contact hole which cannot be seen in FIG. 27J but can be seen in FIG. 26.

A sputtering is carried out to form an Al layer having a thickness of 1 μm, for example, and this Al layer is patterned into a bit line 88 by using the normal photolithography technique.

According to this embodiment, the TFT load is also shielded by the opposing electrode 84 and the TFT load is unaffected by the noise. In addition, similarly as in the case of the twelfth embodiment, the number of mask processes can be reduced by one compared to the prior art method of producing the double gate structure TFT load type SRAM, and the capacitance of the memory capacitor can be made large. Furthermore, the symmetrical character of the memory cells in this embodiment is superior compared to that of the twelfth embodiment, and only two connection regions are required per memory cell, thereby making it possible to produce the SrAM with a simple process.

In the embodiments described above, the insulator layers made of SiO$_2$ and the polysilicon layers are etched during the process of forming the contact holes, such as the contact hole 23A shown in FIG. 8C, the contact holes 31A shown in FIGS. 9A, 16D, 22A and 23C, the contact holes 81A shown in FIGS. 11E, 19E and 27E, the contact holes 90A shown in FIGS. 13A and 20A, the contact holes 95A shown in FIGS. 14B and 21B. However, the following problems may occur when penetrating the stacked structure which is made up of the insulator layers and polysilicon layers.

FIGS. 28A through 28F are side views in cross section showing essential parts of a semiconductor memory device at essential stages of the production, for explaining the process of forming a contact hole which penetrates a stacked structure. In each of FIGS. 28A through 28F, the left hand side shows the result of an expected process while the right hand side shows the result of an actual process, and the description will be given mainly with reference to the right hand side of FIGS. 28A through 28F which shows the actual process.

Figure 28A:
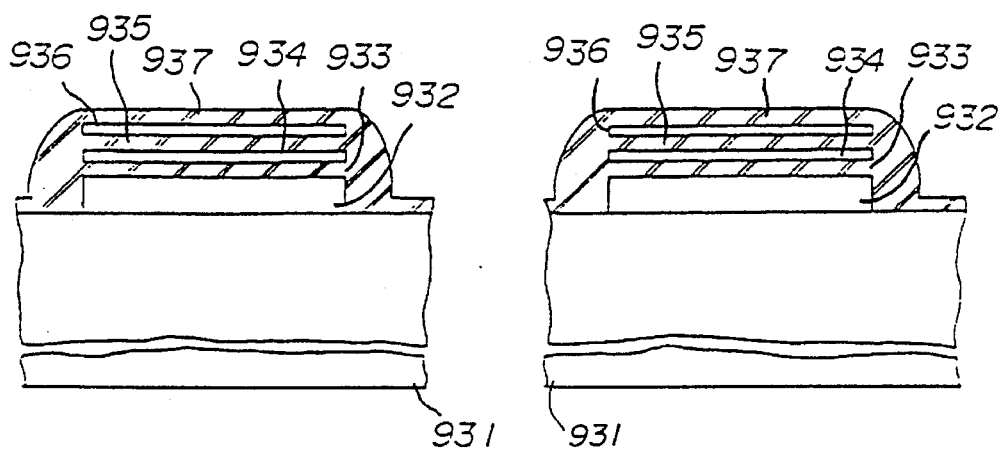
FIGS. 28A through 28F are side views in cross section showing essential parts of a semiconductor memory device at essential stages of the production, for explaining the process of forming a contact hole which penetrates a stacked structure.

In FIG. 28A, a first conductor layer 932 made of polysilicon, a first insulator layer 933 made of SiO$_2$, a second conductor layer 934 made of polysilicon, a second insulator layer 935 made of SiO$_2$, a third conductor layer 936 made of polysilicon and a third insulator layer 937 made of SiO$_2$ are successively formed and stacked on a Si semiconductor substrate 931.

Figure 28B:
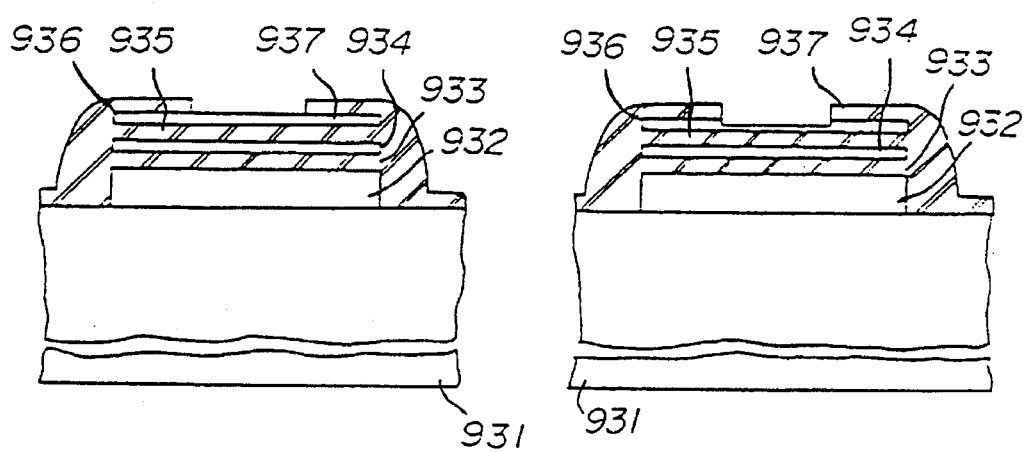

In FIG. 28B, a resist process of the normal photolithography technique and a RIE using $CHF_3$/He as the etching gas are carried out to etch the third insulator layer 937 and to form a part of a contact hole. In FIG. 28B, the illustration of a photoresist layer is omitted for the sake of convenience. The illustration of the photoresist layer will be omitted similarly in FIGS. 28C through 28F which follow.

When etching the third insulator layer 937, a part of the underlying third conductor layer 936 is also etched. As a result, the remaining third conductor layer 936 becomes extremely thin when the third conductor layer 936 is thin to start with.

Figure 28C:
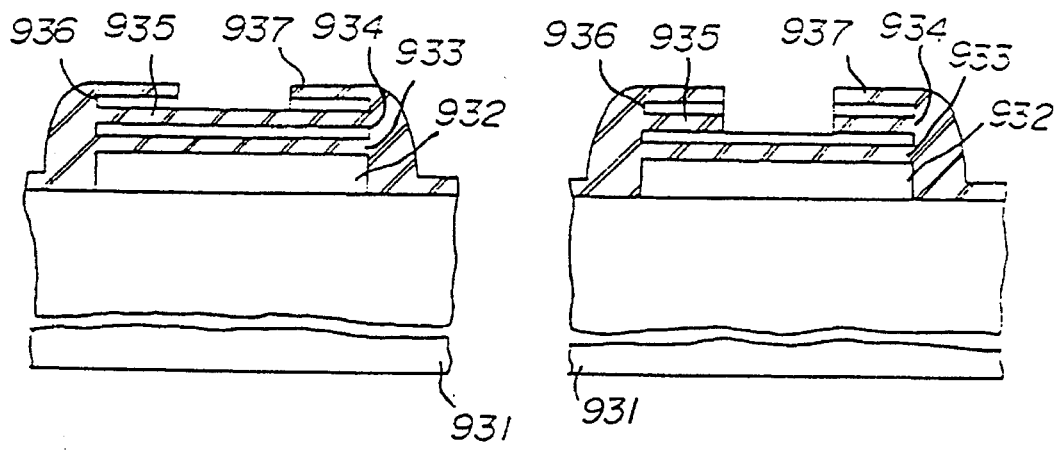

In FIG. 28C, a RIE using $CCl_4/O_2$ as the etching gas is carried out to etch the third conductor layer 936.

Although dependent on the thickness of the underlying second insulator layer 935, the thickness of the second insulator layer 935 becomes extremely thin when the third conductor layer 936 is etched. In an extreme case, not only the second insulator layer 935 but also a part of the second conductor layer 934 may be etched when etching the third conductor layer 936.

Figure 28D:
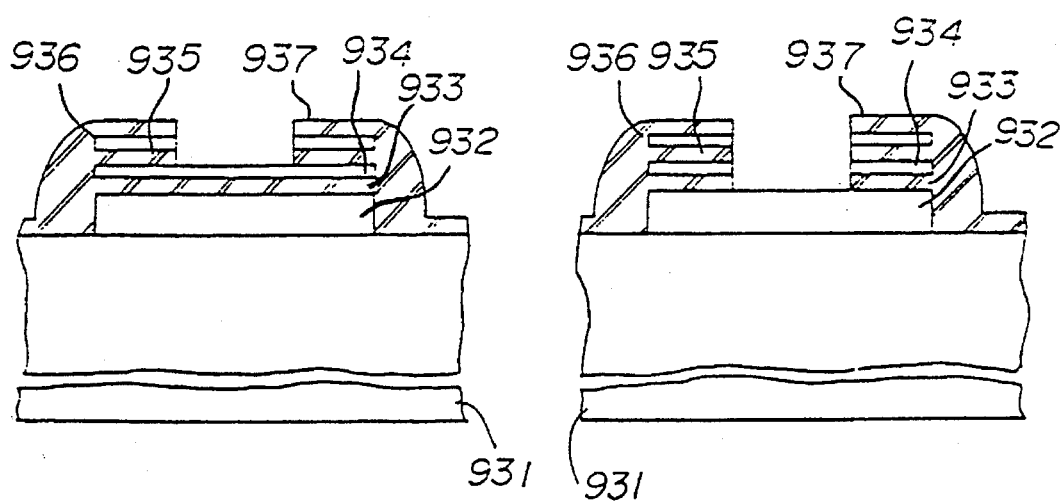

In FIG. 28D, a RIE using $CHF_3$/He as the etching gas is carried out to etch the second insulator layer 935. However, although this etching is originally intended to etch the second insulator layer 935, the second insulator layer 935 may not exist from the start of this etching, for the reasons described above.

If the second insulator layer 935 is extremely thin or does not even exist at the start of this etching, the second conductor layer 934 and the first insulator layer 933 are etched although this etching is originally intended to etch the second insulator layer 935. When the second conductor layer 934 and the first insulator layer 933 are etched, the surface of the first conductor layer 932 may become exposed by this etching which is originally intended to etch the second insulator layer 935.

Figure 28E:
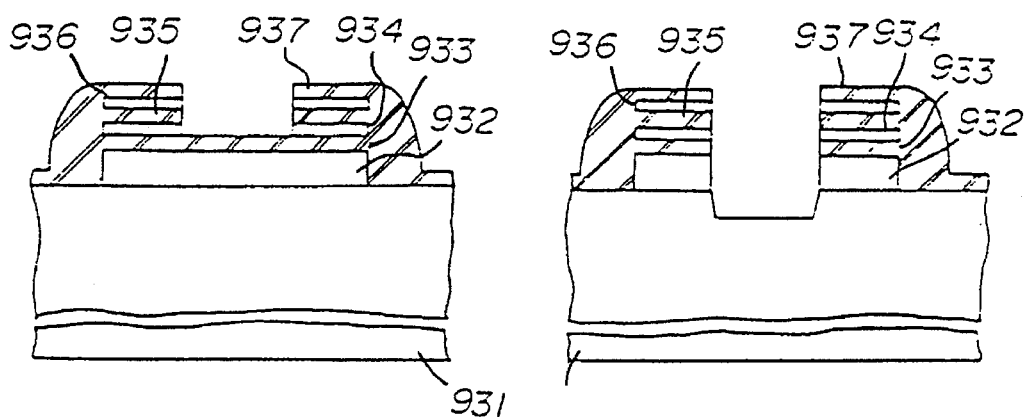

In FIG. 28E, a RIE using $CCl_4/O_2$ as the etching gas is carried out to etch the second conductor layer 934.

However, although this etching is originally intended to etch the second conductor layer 934, the surface of the first conductor layer 932 may already be exposed as described above. In this case, even a part of the Si semiconductor substrate 931 may be etched by this etching which is originally intended to etch the second conductor layer 934.

Figure 28F:
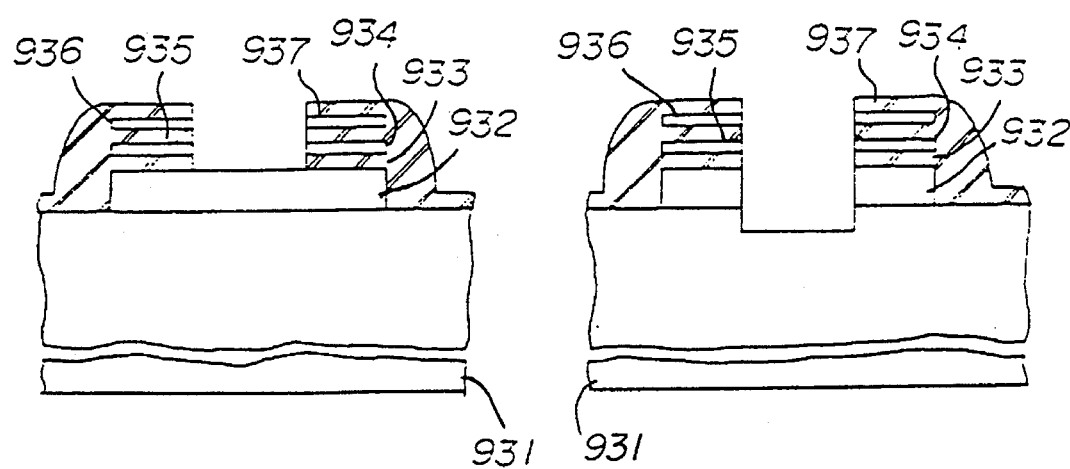

In FIG. 28F, a RIE using $CHF_3$/He as the etching gas is carried out to etch the first insulator layer 933.

But although this etching is originally intended to etch the first insulator layer 933, a part of the Si semiconductor substrate 931 may already be etched as described above. In this case, the contact hole completely extends into the Si semiconductor substrate 931 as shown in FIG. 28F and the Si semiconductor substrate 931 is extremely damaged.

If the contact hole extends into the Si semiconductor substrate 931 as shown in FIG. 28F, a leak is introduced at a node part between the driver transistor and the load transistor of the memory cell, and the operation of the memory cell becomes unstable. Hence, it is conceivable to carry out a moderate etching so as to etch only the originally intended layer, but such a moderate etching is difficult to control.

The etching of each layer cannot be controlled to etch only the originally intended layer by the moderate etching, because the contact hole is seldom formed at a flat part shown in FIGS. 28A through 28F. In actual practice, the contact hole is usually formed at a stepped part, and an etching residue tends to remain at the stepped part within the contact hole. However, a sufficient over-etching becomes necessary in order to remove such an etching residue.

Next, a description will be given of a fifteenth embodiment of the semiconductor memory device according to the present invention which is produced by a fifteenth embodiment of the method of producing the semiconductor memory device according to the present invention. FIGS. 29A through 29F are side views in cross section showing an essential part of the fifteenth embodiment of the semiconductor memory device according to the present invention at essential stages of the fifteenth embodiment of the method of producing the semiconductor memory device according to the present invention, for explaining the operating principle of the third embodiment. In each of FIGS. 29A through 29F, the left hand side shows the result of an expected process while the right hand side shows the result of an actual process, and the description will be given mainly with reference to the right hand side of FIGS. 29A through 29F which shows the actual process.

In this embodiment, measures are taken so that the contact hole will not extend into the substrate even when an over-etching is carried out to remove the etching residue within the contact hole.

Figure 29A:
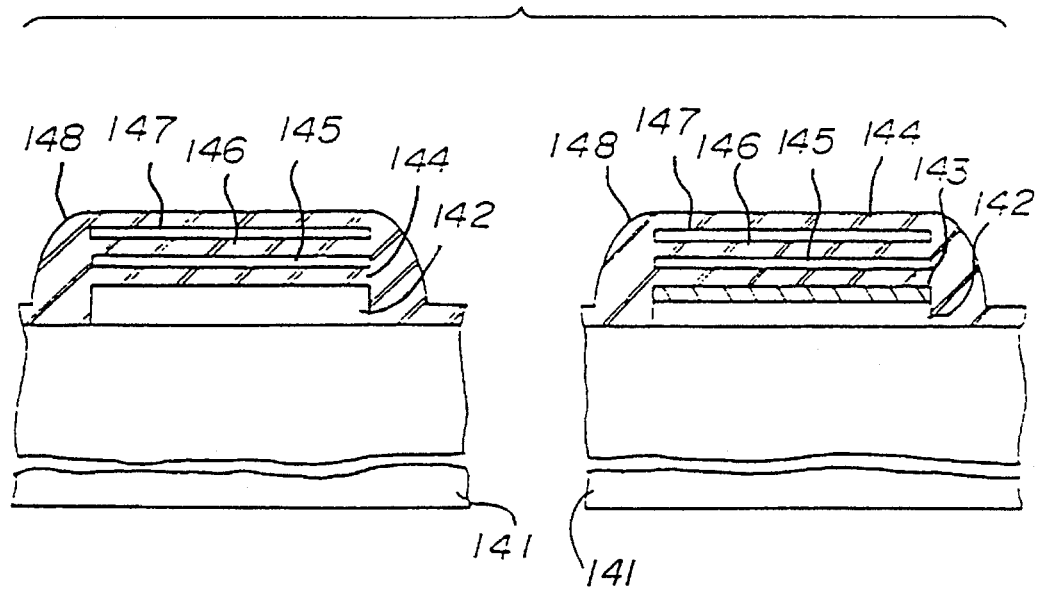
FIGS. 29A through 29F are side views in cross section showing an essential part of a fifteenth embodiment of the semiconductor memory device according to the present invention at essential stages of a fifteenth embodiment of the method of producing the semiconductor memory device according to the present invention, for explaining the operating principle of the fifteenth embodiment.

In FIG. 29A, a first conductor layer 142 made of polysilicon, a second conductor layer 143 made of a refractory metal such as W and Mo or a silicide thereof, a first insulator layer 144 made of $SiO_2$, a third conductor layer 145 made of polysilicon, a second insulator layer 146 made of $SiO_2$, a fourth conductor layer 147 made of polysilicon and a third insulator layer 148 made of $SiO_2$ are successively formed and stacked on a Si semiconductor substrate 141.

Figure 29B:
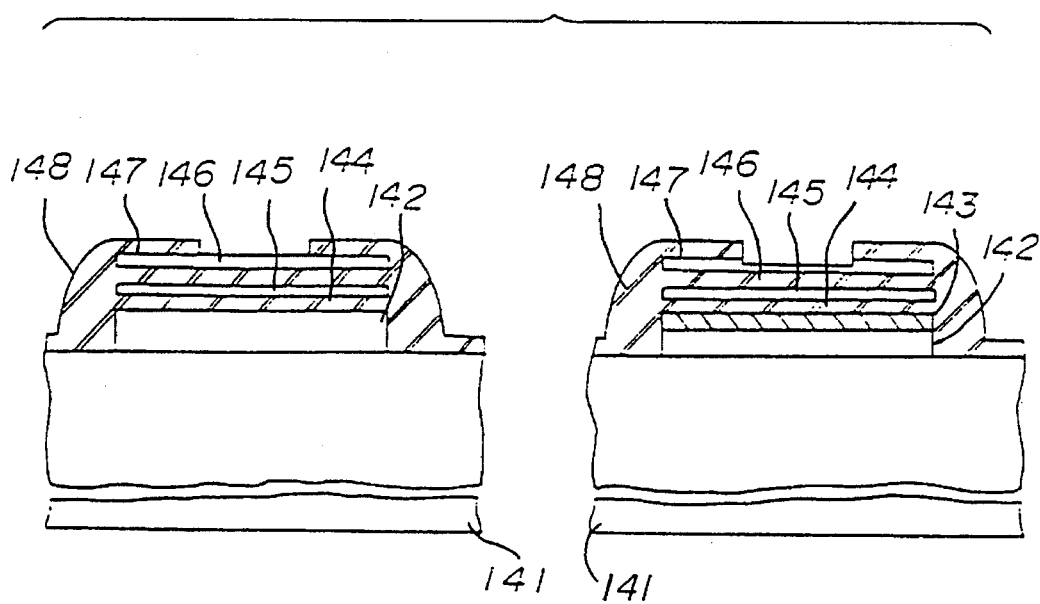

In FIG. 29B, a resist process of the normal photolithography technique and a RIE using $CHF_3$/He as the etching gas are carried out to etch the third insulator layer 148 and to form a part of a contact hole. In FIG. 29B, the illustration of a photoresist layer is omitted for the sake of convenience. The illustration of the photoresist layer will be omitted similarly in FIGS. 29C through 29F which follow.

During this process, a part of the fourth conductor layer 147 underlying the third insulator layer 148 is also etched. Accordingly, the thickness of the fourth conductor layer 147 remaining after this etching is also extremely small, similarly as in the case described above with reference to FIGS. 28A through 28F.

Figure 29C:
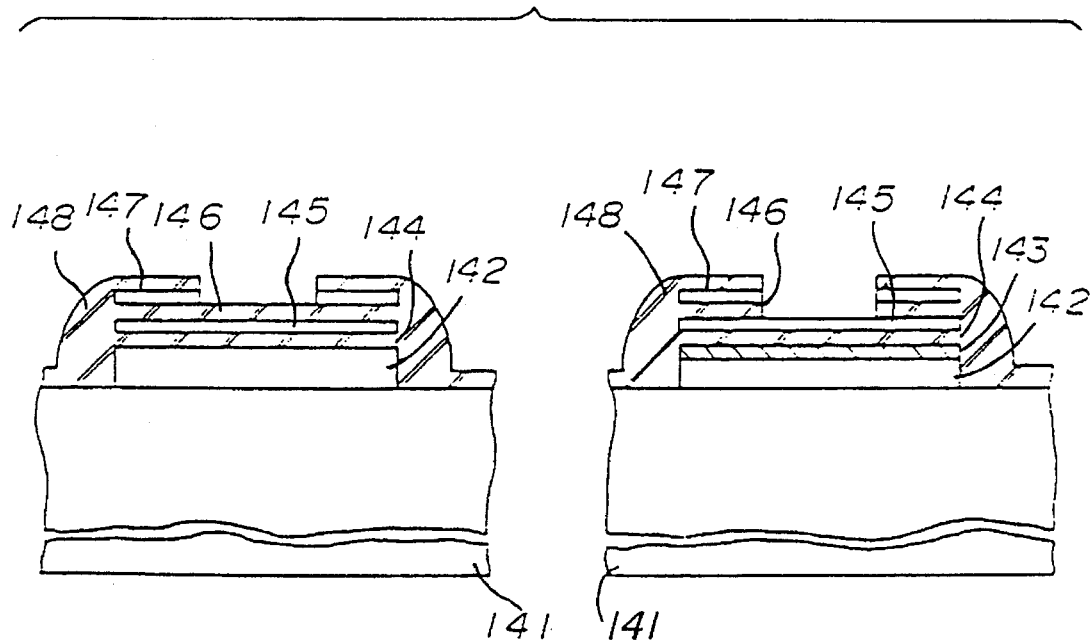

In FIG. 29C, a RIE using HBr/Ar as the etching gas is carried out to etch the fourth conductor layer 147.

In this case, although dependent on the thickness of the second insulator layer 146 underlying the fourth conductor layer 147, the thickness of the second insulator layer 146 would be reduced by this etching. In an extreme case, not only the second insulator layer 146 but also a part of the third conductor layer 145 becomes etched by this etching which is originally intended to etch the fourth conductor layer 147.

Figure 29D:
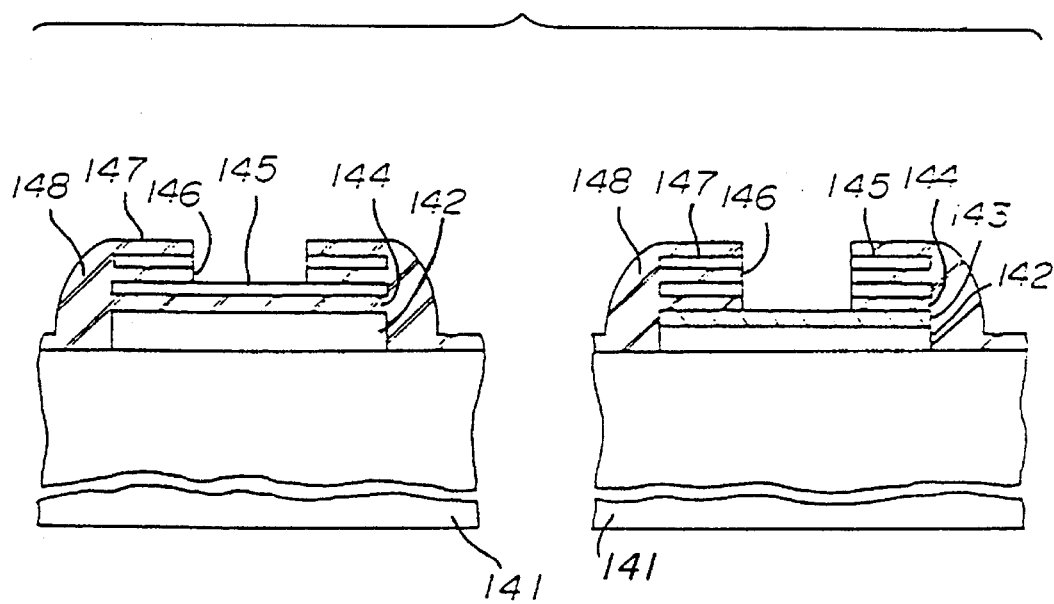

In FIG. 29D, a RIE using $CHF_3$/He as the etching gas is carried out to etch the second insulator layer 146.

However, the thickness of the second insulator layer 146 is already reduced to start with and may not even exist in an extreme case, as described above. Hence, although this etching is originally intended to etch the second insulator layer 146, the third conductor layer 145 and the first insulator layer 144 may be etched to expose the surface of the second conductor layer 143.

Figure 29E:
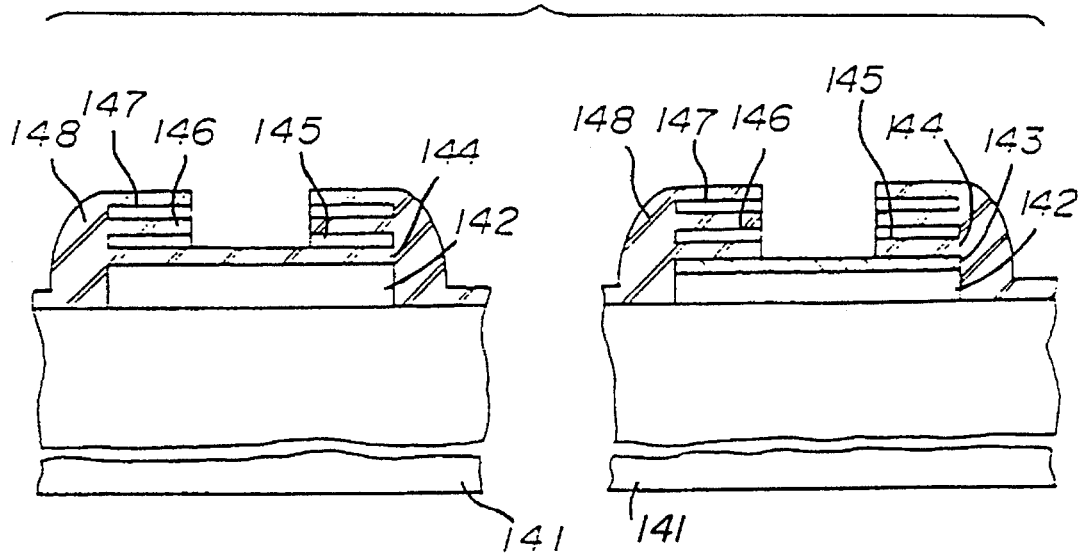

In FIG. 29E, a RIE using HBr/Ar as the etching gas is carried out to etch the third conductor layer 145.

Even though the surface of the second conductor layer 143 may already be exposed as described above when this etching is carried out, the second conductor layer 143 is made of the refractory metal or refractory metal silicide. For this reason, the second conductor layer 143 is hardly etched by this RIE which uses HBr, and no problems will be introduced by this RIE.

Figure 29F:
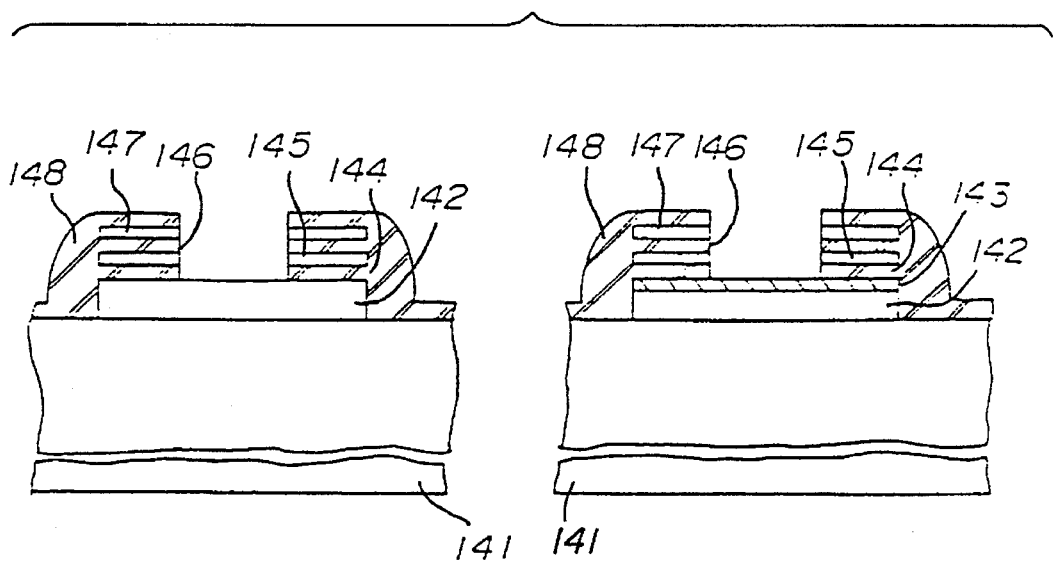

In FIG. 29F, a RIE using $CHF_3$/He as the etching gas is carried out to etch the first insulator layer 144.

The first insulator layer 144 may already be etched when this etching is started, but no adverse effects are introduced because the second conductor layer 143 is made of the refractory metal or refractory metal silicide and is hardly etched by the $CHF_3$/He etching gas.

Therefore, the contact hole is formed to an ideal shape. The only difference of the resulting contact hole shown in FIG. 29F with that shown in FIG. 28F is that the lowermost conductor layer in FIG. 29F is made up of the first conductor layer 142 and the second conductor layer 143.

Next, a more detailed description will be given of the fifteenth embodiment of the semiconductor memory device according to the present invention and the fifteenth embodiment of the method of producing the semiconductor memory device according to the present invention, by referring to FIGS. 30A through 30H. FIGS. 30A through 30H are side views in cross section showing an essential part of the fifteenth embodiment of the semiconductor memory device according to the present invention at essential stages of the fifteenth embodiment of the method of producing the semiconductor memory device according to the present invention. In this embodiment, the present invention is applied to the TFT load type SRAM.

In FIGS. 30A through 30H, those parts which are the same as those corresponding parts in FIGS. 1A through 1F and FIGS. 4A through 4D are designated by the same reference numerals, and a description thereof will be omitted. In this embodiment of the method, the processes are the same as those of the prior art method up to the processes shown in FIGS. 1A through 1F, that is, until the gate insulator layer 3 is selectively etched to form the contact hole 3A. Hence, a description will only be given of the processes carried out thereafter. In the following description, the prior art processes descried with reference to FIGS. 4A through 4D will help the understanding of this embodiment.

Figure 30A:
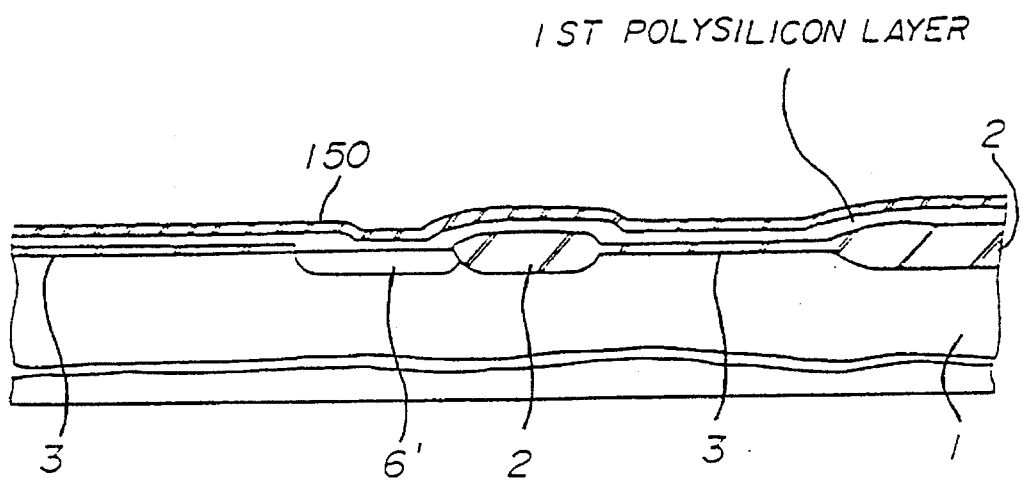
FIGS. 30A through 30H are side views in cross section showing an essential part of the fifteenth embodiment of the semiconductor memory device according to the present invention at essential stages of the fifteenth embodiment of the method of producing the semiconductor memory device according to the present invention.

In FIG. 30A, it is assumed that the field insulator layer 2, the gate insulator layer 3 and the contact hole 3A are already formed on the Si semiconductor substrate 1.

A CVD is carried out to form a first polysilicon layer having a thickness of 1000 Å, for example. This first polysilicon layer corresponds to the first conductor layer.

By carrying out a vapor phase diffusion, P is introduced with an impurity concentration of $1\times10^{21}$ $cm^{-3}$ to form an n$^+$-type impurity region 5'.

A CVD is carried out to form a WSi layer 150 having a thickness of 1000 Å, for example. This WSi layer 150 corresponds to the second conductor layer. The material used for the layer 150 is not limited to WSi, but other refractory metals such as W or refractory metal silicides may be used in place of WSi.

Figure 30B:
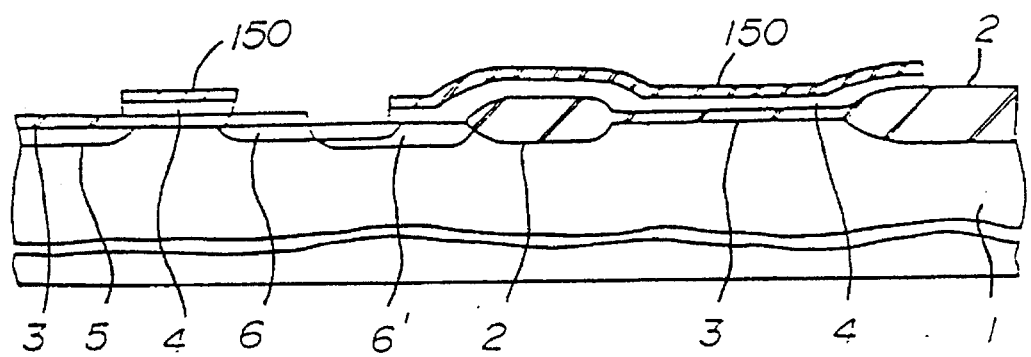

In FIG. 30B, a resist process of the photolithography technique and a RIE using $CCl_4/O_2$ as the etching gas for etching WSi and polysilicon are carried out to pattern the WSi layer 150 and the first polysilicon layer and to form a gate electrode 4. This gate electrode 4 is the gate electrode of the driver transistor and the word line.

An ion implantation is carried out to inject As ions with a dosage of $3\times10^{15}$ $cm^{-2}$ and an acceleration energy of 40 keV, so as to form a source region 5 and a drain region 6.

Figure 30C:
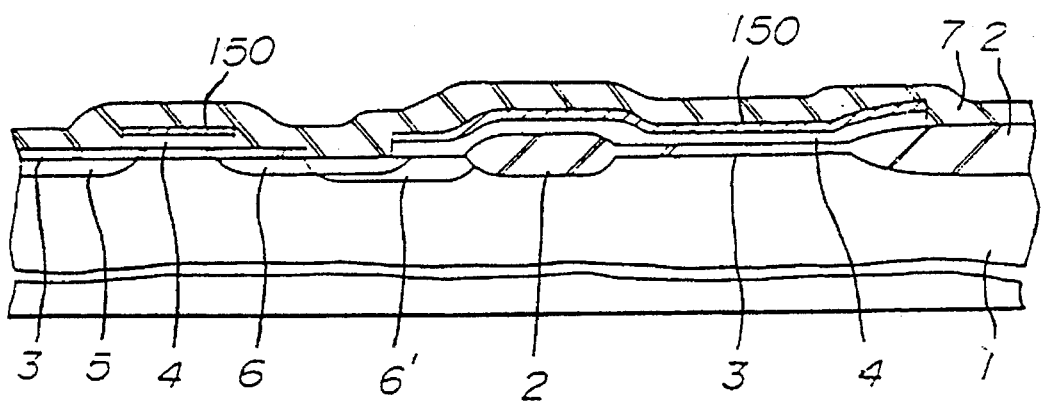

In FIG. 30C, a CVD is carried out to form an insulator layer 7 which is made of $SiO_2$ and has a thickness of 1000 Å, for example.

Figure 2A:
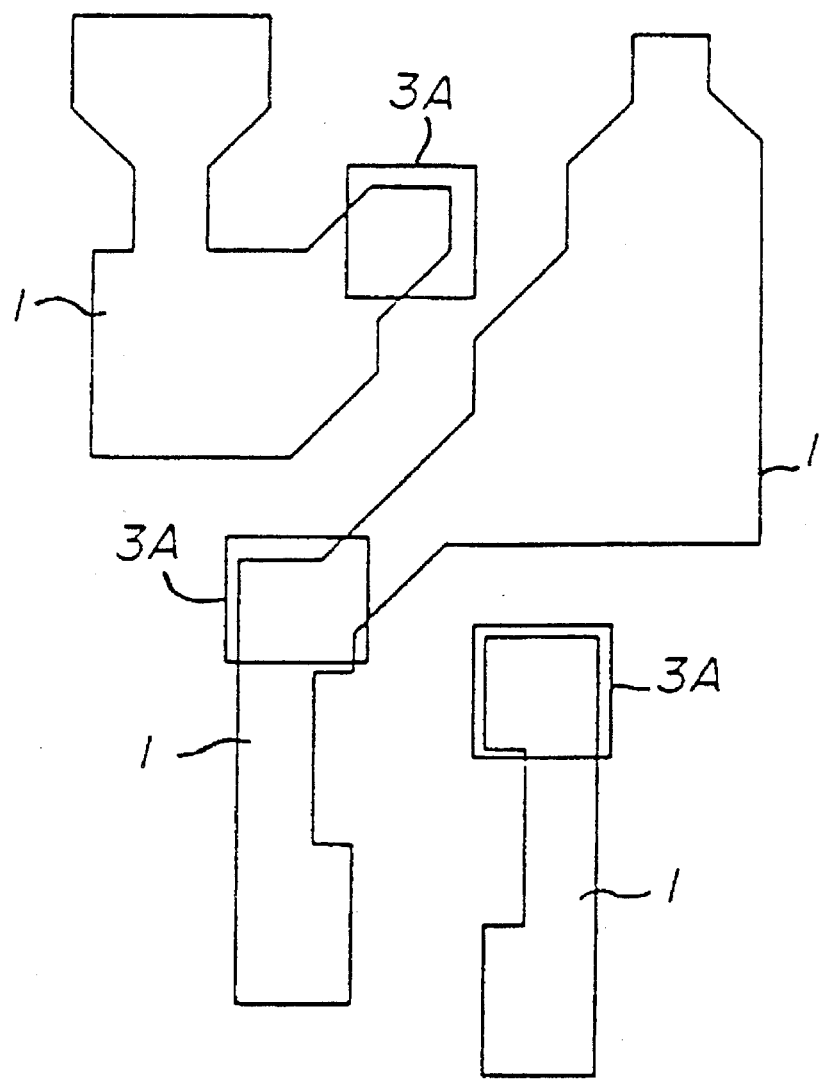
FIGS. 2A through 2F are plan views of the high resistance load type SRAM at essential stages of the conventional method of producing the high resistance load type SRAM.
Figure 2B:
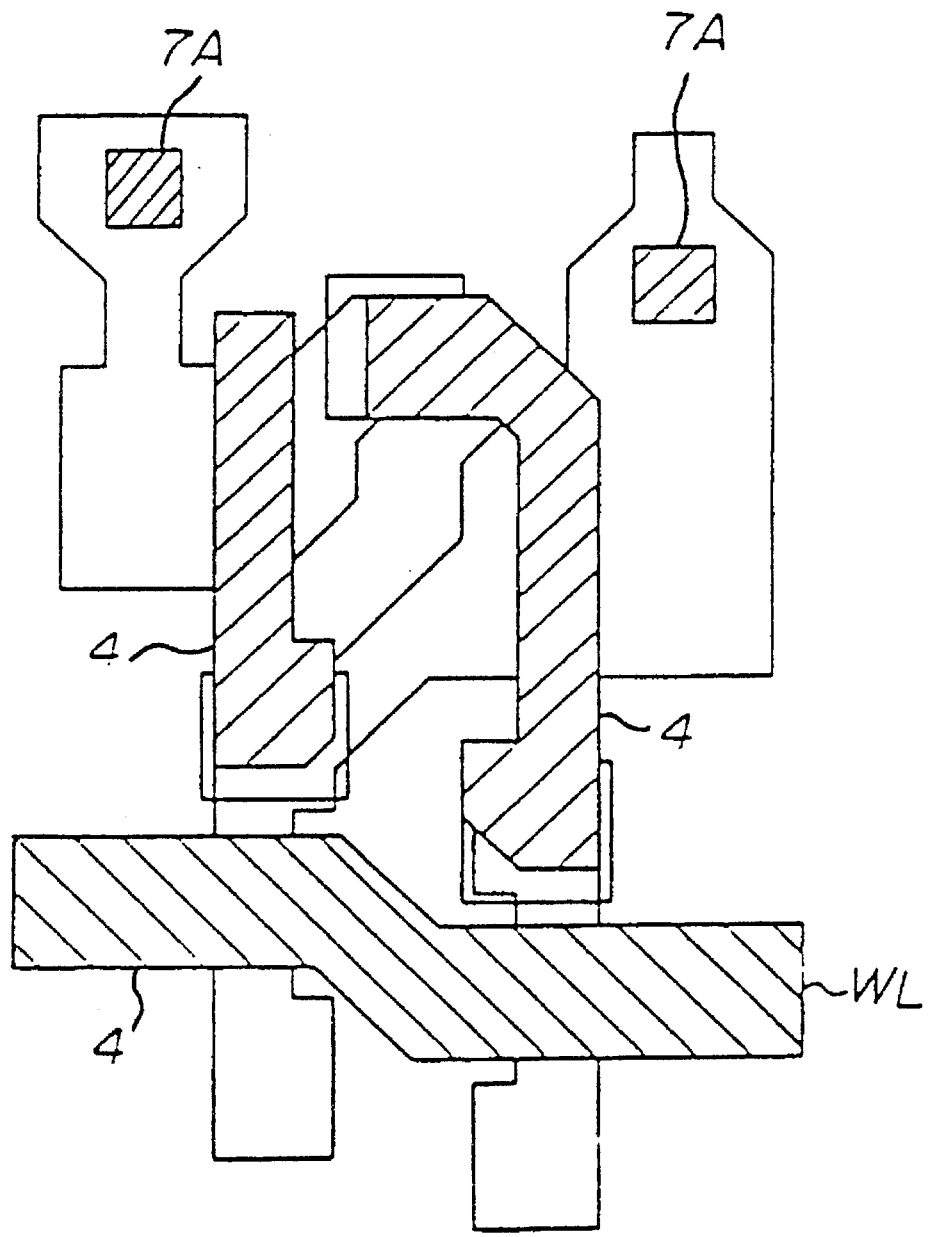
Figure 2C:
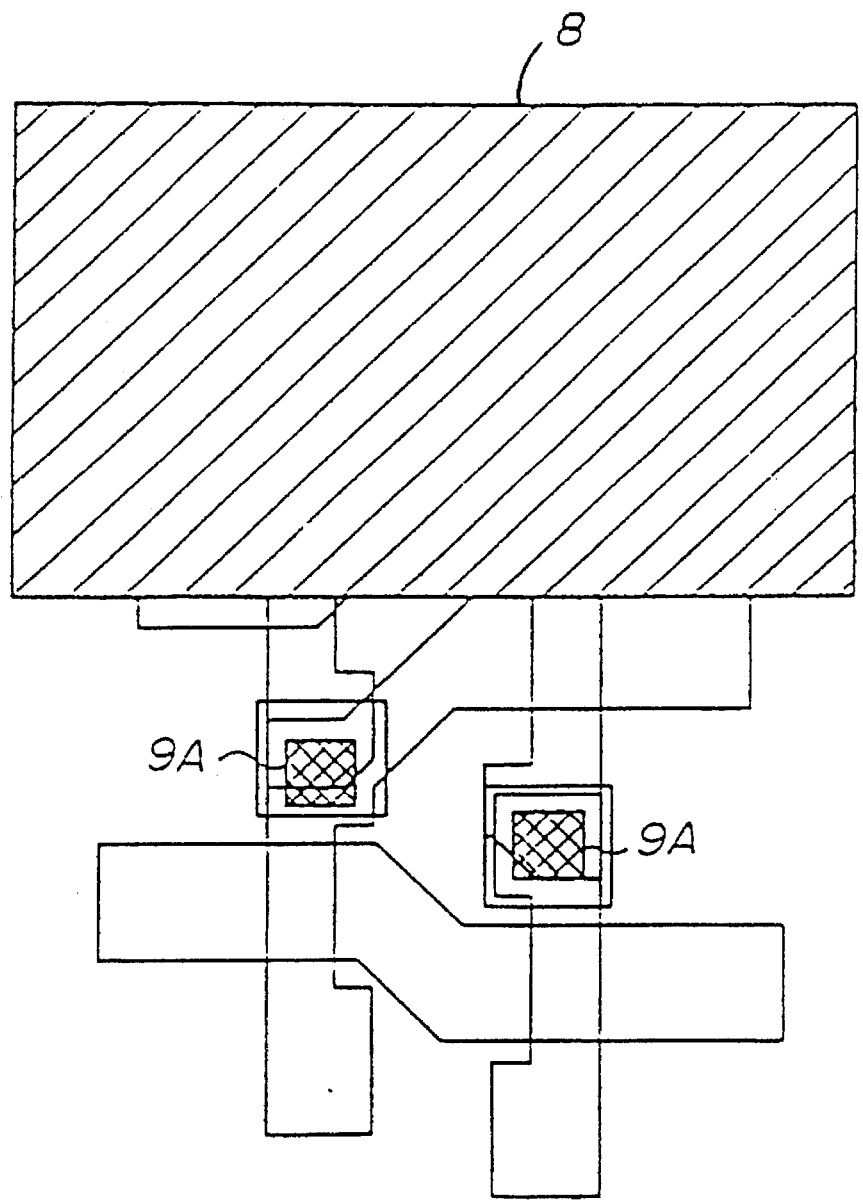
Figure 2D:
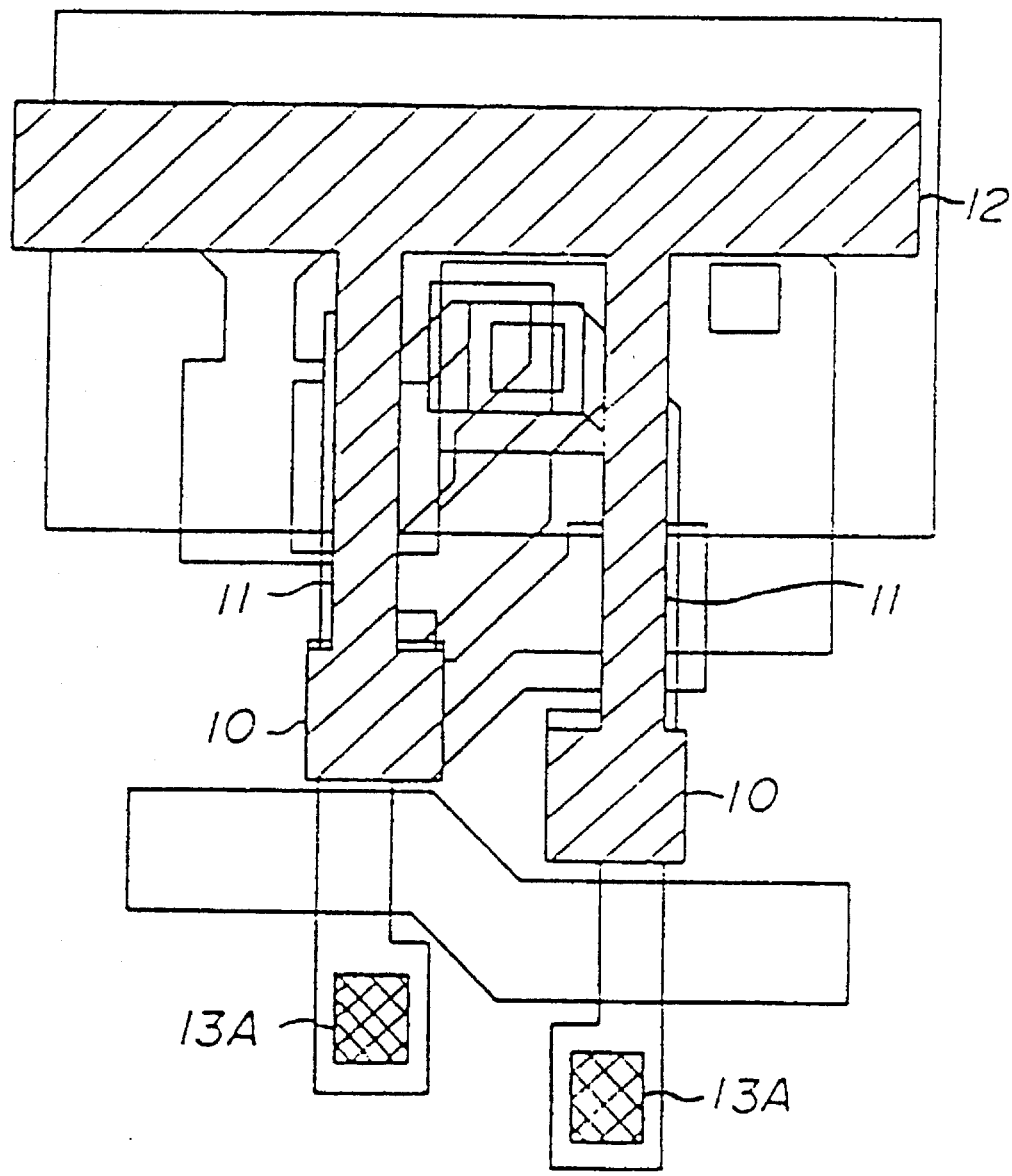
Figure 2E:
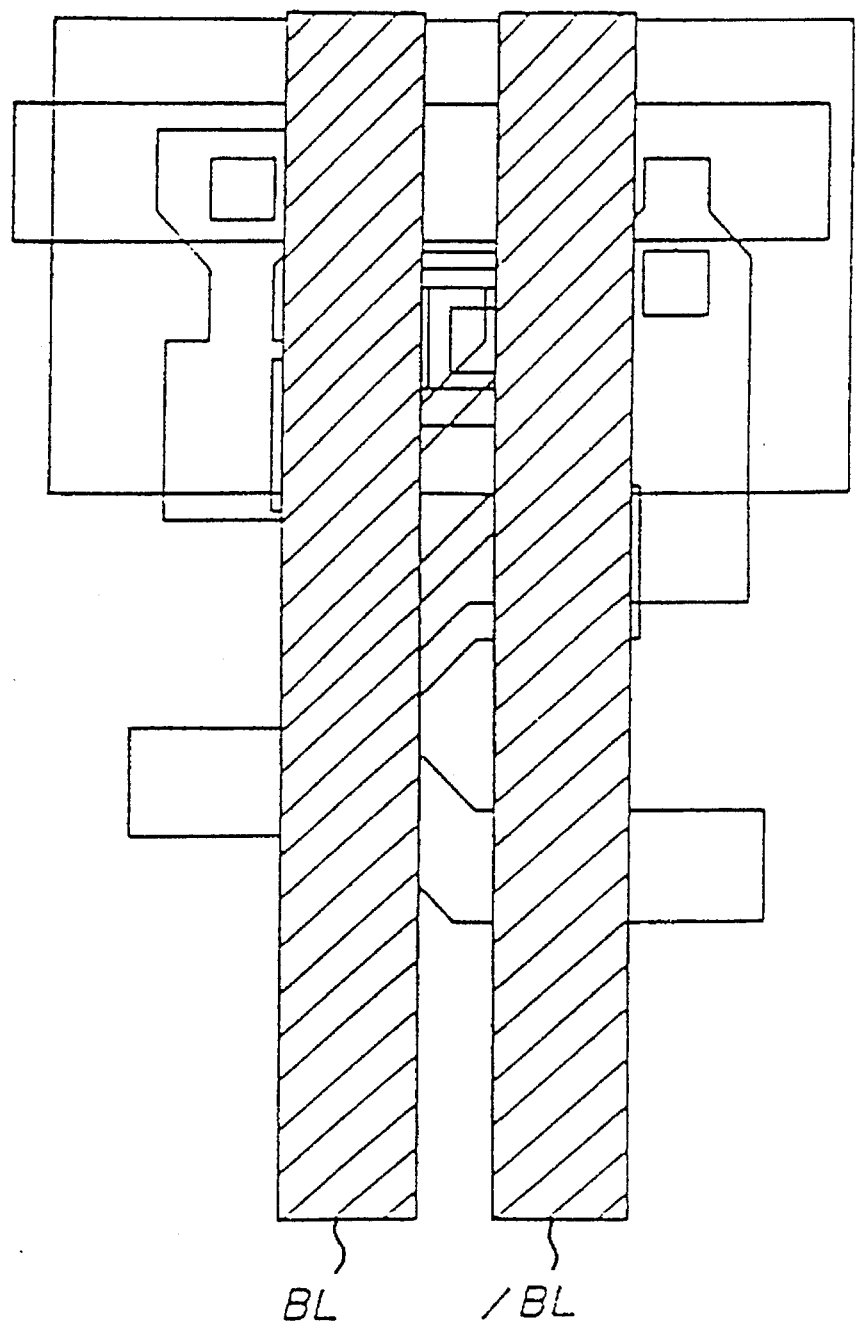

A resist process of the photolithography technique and a RIE using $CHF_3$/He as the etching gas are carried out to form a ground line contact hole. This ground line contact hole cannot be shown in FIG. 30C, but this ground line contact hole may be understood from FIG. 2B, for example.

Figure 30D:
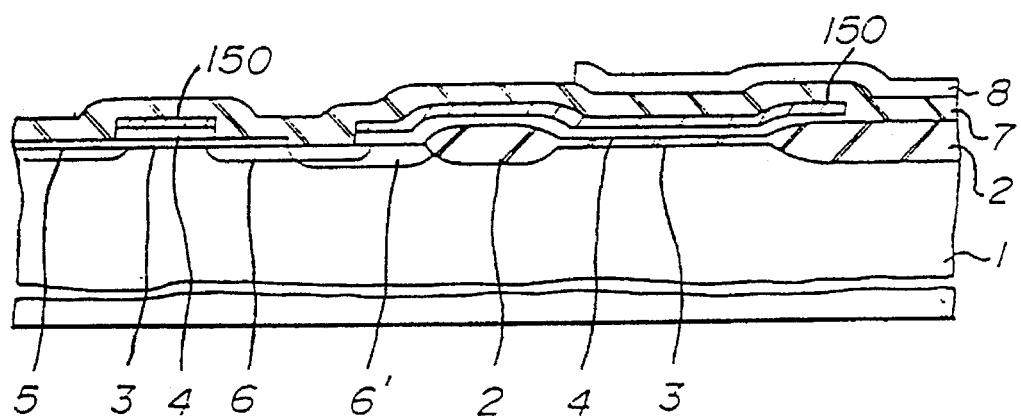

In FIG. 30D, a CVD is carried out to form a second polysilicon layer which has a thickness of 1500 Å, for example.

In addition, an ion implantation is carried out to inject P ions into the second polysilicon layer.

A resist process of the photolithography technique and a RIE using $CCl_4/O_2$ as the etching gas are carried out to pattern the second polysilicon layer and to form a ground line 8.

Figure 30E:
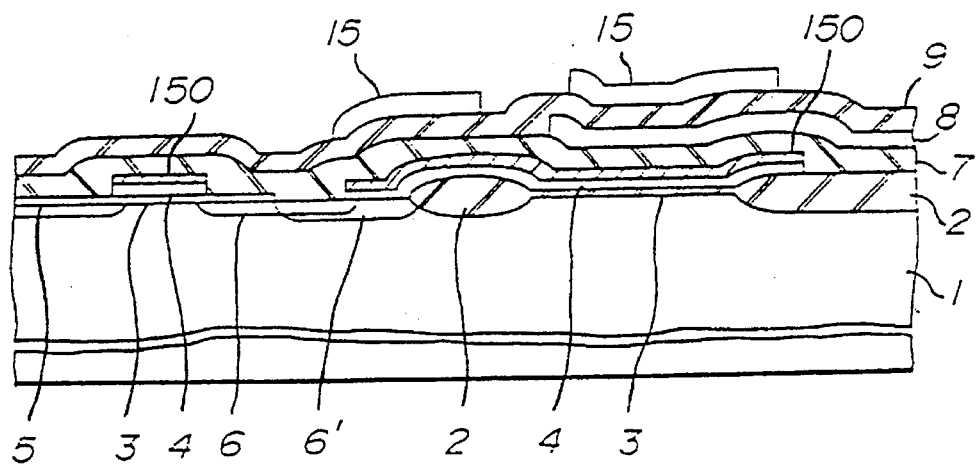

In FIG. 30E, a CVD is carried out to form an insulator layer 9 which is made of $SiO_2$ and has a thickness of 1000 Å, for example, on the entire top surface of the stacked structure shown in FIG. 30D.

A CVD is carried out to form a third polysilicon layer which has a thickness of 500 Å, for example.

An ion implantation is carried out to inject P ions with a dosage of $1\times10^{15}$ $cm^{-2}$ and an acceleration energy of 10 keV.

A resist process of the photolithography technique and a RIE using $CCl_4/O_2$ as the etching gas are carried out to pattern the third polysilicon layer and to form a gate electrode 15 of the TFT.

Figure 30F:
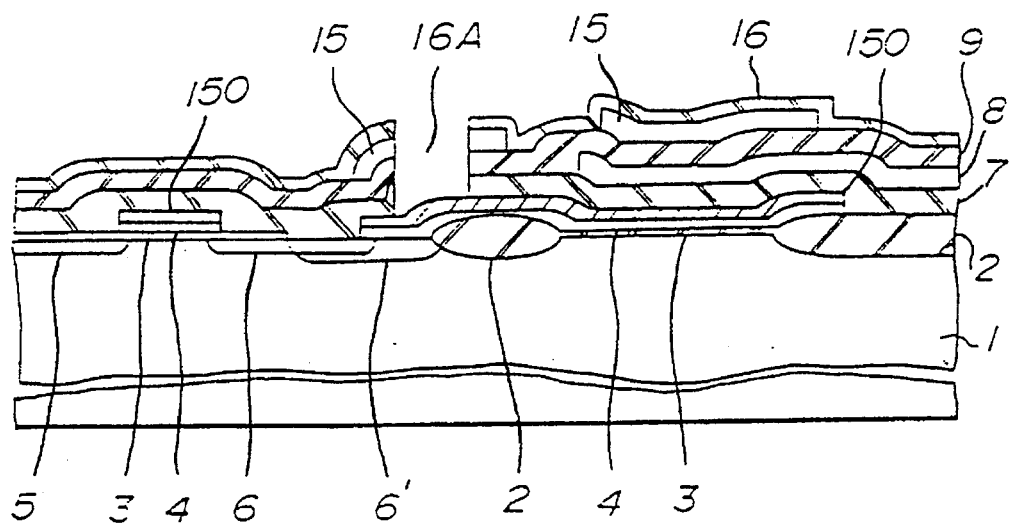

In FIG. 30F, a CVD is carried out to form a gate insulator layer 16 which is made of $SiO_2$ and has a thickness of 200 Å, for example.

A resist process of the photolithography technique and RIEs using $CHF_3$/He and HBr/Ar as the etching gases for respectively etching $SiO_2$ and polysilicon are carried out, to selectively etch the gate insulator layer 16, the gate electrode 15 which is made of the third polysilicon layer, the insulator layer 9 and the insulator layer 7, and to form a contact hole 16A. This contact hole 16A extends from the surface of the gate insulator layer 16 and reaches the gate electrode 4 of the driver transistor. This process forms an essential part of this embodiment. Even if a sufficient over-etching is carried out so that no etching residue remains within the contact hole 16A after the etching, no adverse damage is made to the surface of the underlying WSi layer 150 which forms the surface of the gate electrode 4. Hence, no damage is made to the first polysilicon layer and the surface of the Si semiconductor substrate 1 by this over-etching.

Figure 30G:
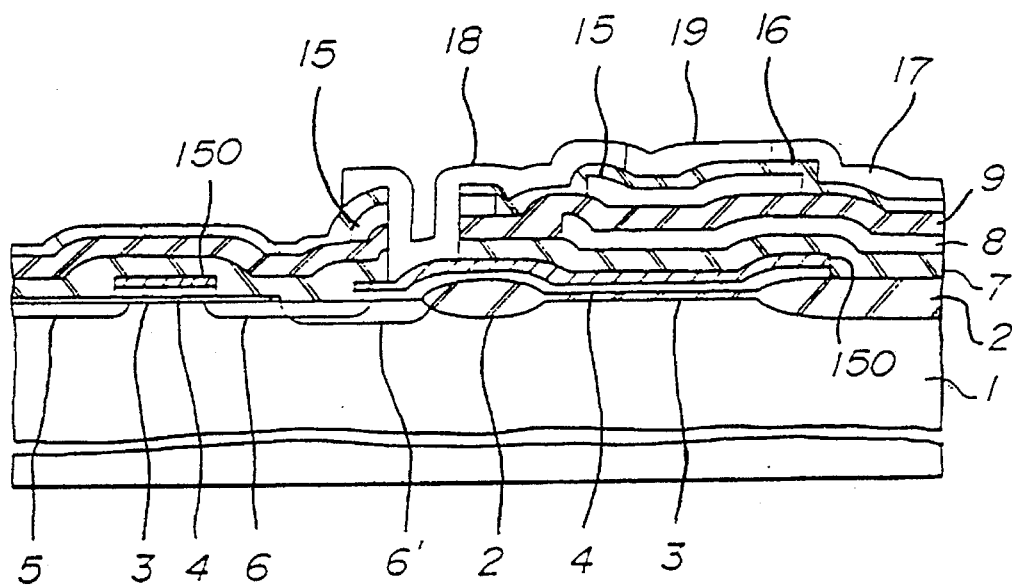

In FIG. 30G, a CVD is carried out to form a fourth polysilicon layer having a thickness of 200 Å, for example.

A resist process of the photolithography technique and an ion implantation are carried out to inject B ions with a dosage of $1\times10^{14}$ $cm^{-2}$ and an acceleration energy of 5 keV into parts where source and drain regions of the TFT are formed.

Figure 2F:
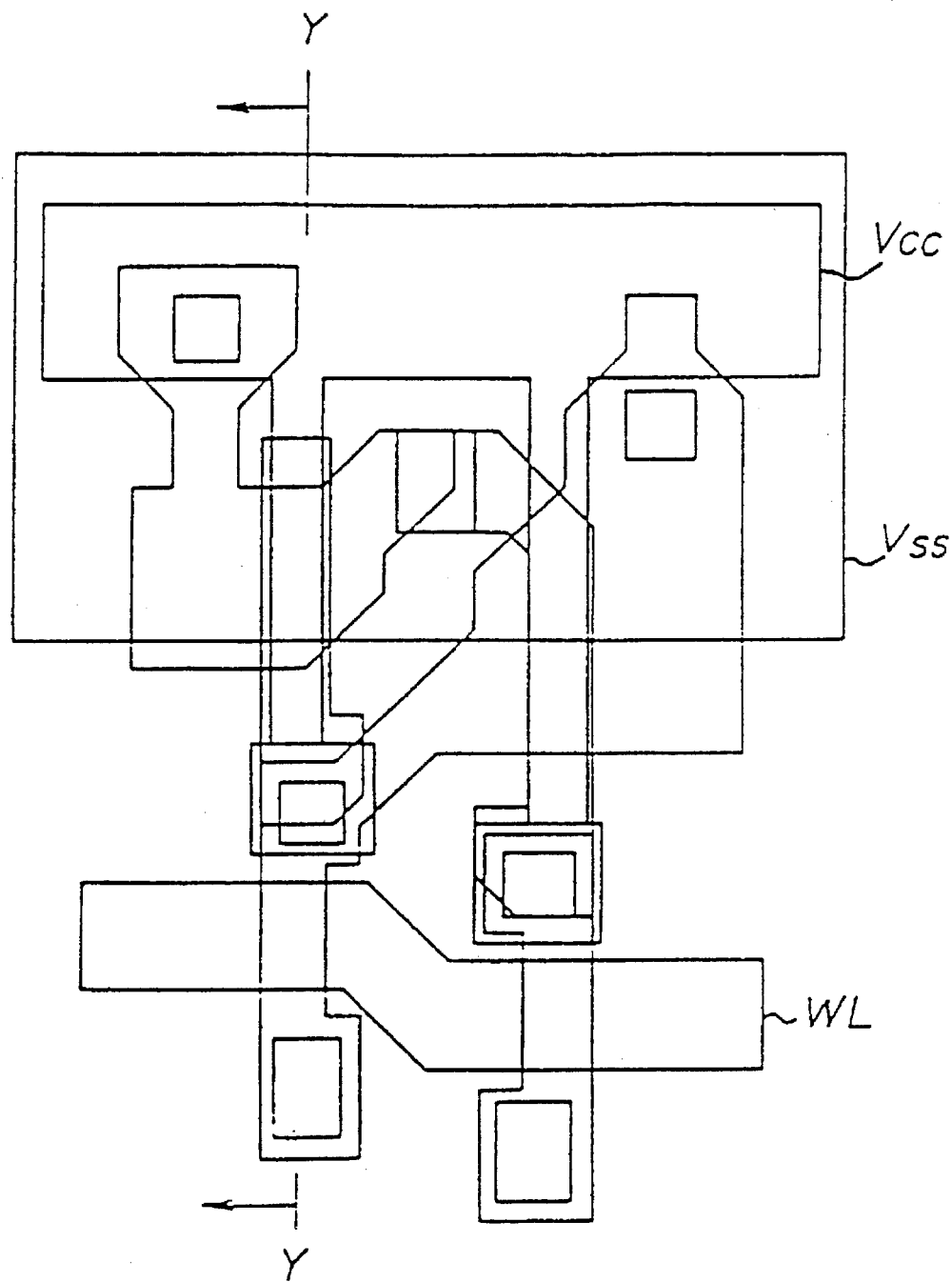
Figure 3:
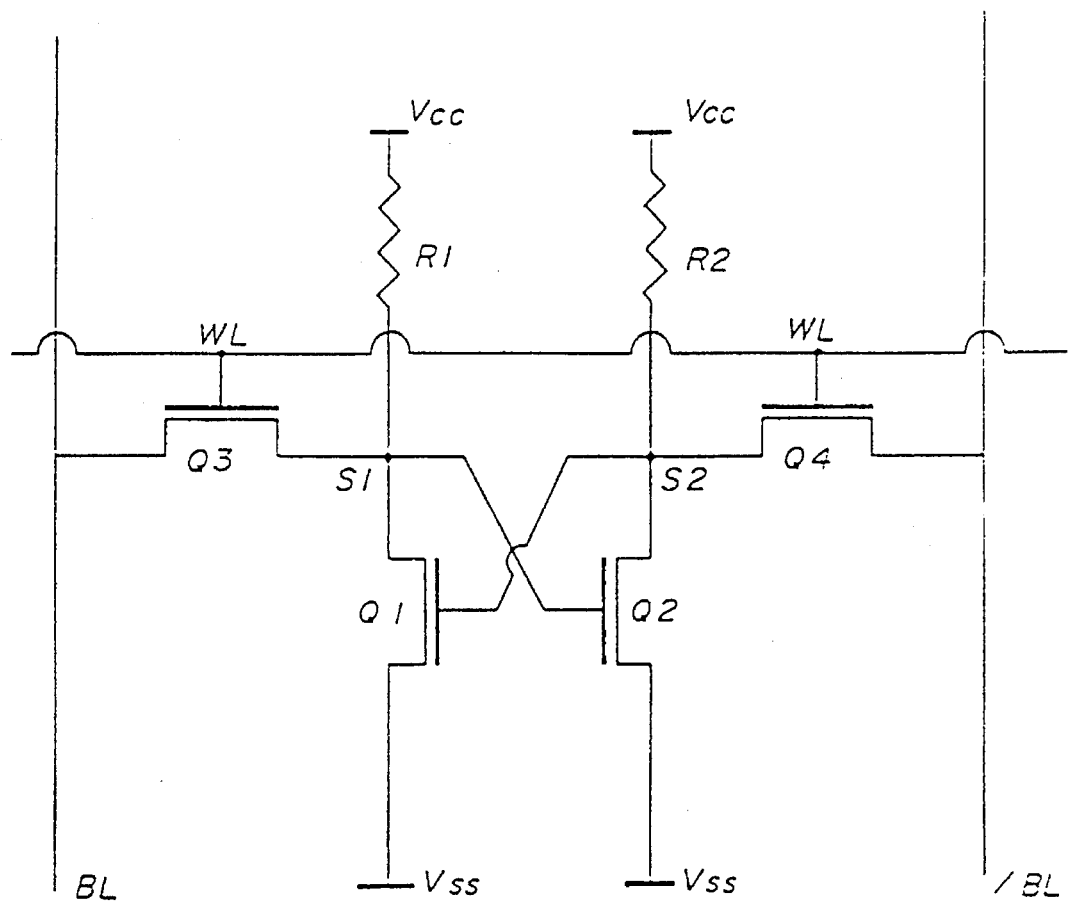
FIG. 3 shows an equivalent circuit diagram of the essential part of the high resistance load type SRAM described in conjunction with FIGS. 1A through 1J and 2A through 2F.

A resist process of the photolithography technique and a RIE using $CCl_4/O_2$ as the etching gas are carried out to pattern the fourth polysilicon layer and to form a source region 17, a drain region 18 and a channel region 19 of the TFT, a Vcc supply line and the like. The Vcc supply line cannot be shown in FIG. 30G, but the Vcc supply line may be understood from FIG. 2F or 5D.

Figure 30H:
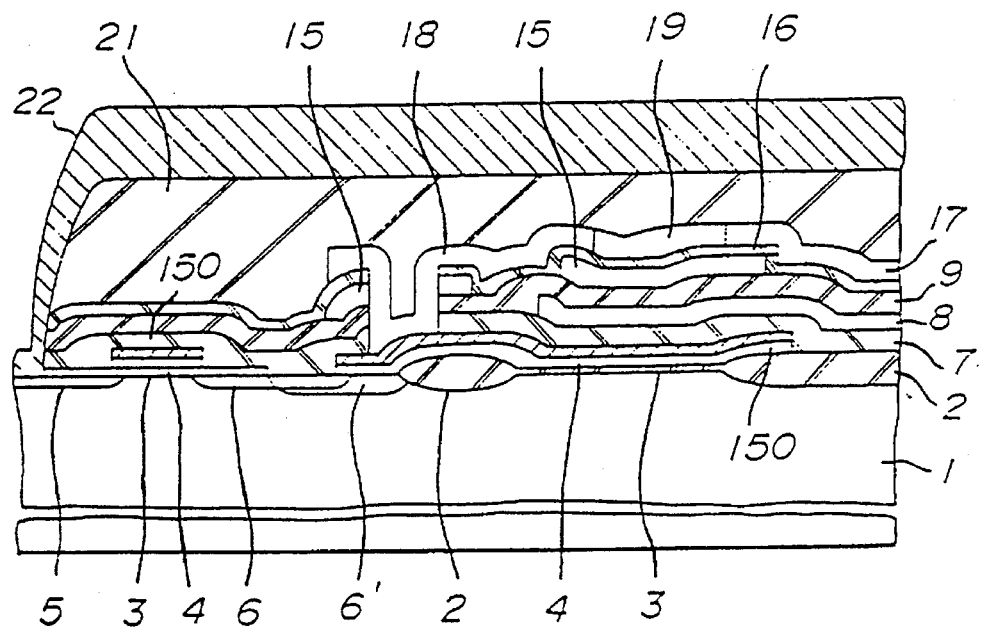

In FIG. 30H, a CVD is carried out to form an insulator layer which is made of SiO$_2$ and has a thickness of 1000 Å, for example, and an insulator layer which is made of PSG and has a thickness of 5000 Å. In FIG. 30H, these two insulator layers are shown as one insulator layer 21 in FIG. 30H, similarly as in the case of FIG. 4D.

Then, a thermal process is carried out to reflow and planarize the insulator layer 21.

A resist process of the photolithography technique and a RIE using CHF$_3$/He as the etching gas are carried out to selectively etch the insulator layer 21 and to form a bit line contact hole.

A sputtering is carried out thereafter to form an Al layer having a thickness of 1 μm, for example, and this Al layer is patterned using the normal photolithography technique so as to form a bit line 22.

According to this embodiment described with reference to FIGS. 30A through 30H in particular, only one mask process is required to achieve contact of the gate electrode of the driver transistor, the gate electrode of the TFT load and the drain of the TFT load. In addition, when forming the contact hole for achieving this contact, there is no possibility of the underlayer and the substrate from becoming damaged and the characteristic of the memory cell from deteriorating even when the over-etching is carried out to generate no etching residue within the contact hole. On the other hand, in the prior art shown in FIGS. 4 and 5, two mask processes are required to achieve the above described contact.

Next, a description will be given of a sixteenth embodiment of the semiconductor memory device according to the present invention and a sixteenth embodiment of the method of producing the semiconductor memory device according to the present invention, by referring to FIGS. 31A through 31D. FIGS. 31A through 31D are side views in cross section showing an essential part of the sixteenth embodiment of the semiconductor memory device according to the present invention at essential stages of the sixteenth embodiment of the method of producing the semiconductor memory device according to the present invention. In this embodiment, the present invention is applied to the double gate structure TFT load type SRAM.

In FIGS. 31A through 31D, those parts which are the same as those corresponding parts in FIGS. 30A through 30H are designated by the same reference numerals, and a description thereof will be omitted. In this embodiment of the method, the processes are the same as those of the fifteenth embodiment of the method up to the processes shown in FIGS. 30A through 30E, that is, until the gate electrode 15 of the TFT is formed from the third polysilicon layer. Hence, a description will only be given of the processes carried out thereafter. In the following description, the prior art processes descried with reference to FIGS. 7A through 7C will help the understanding of this embodiment.

Figure 31A:
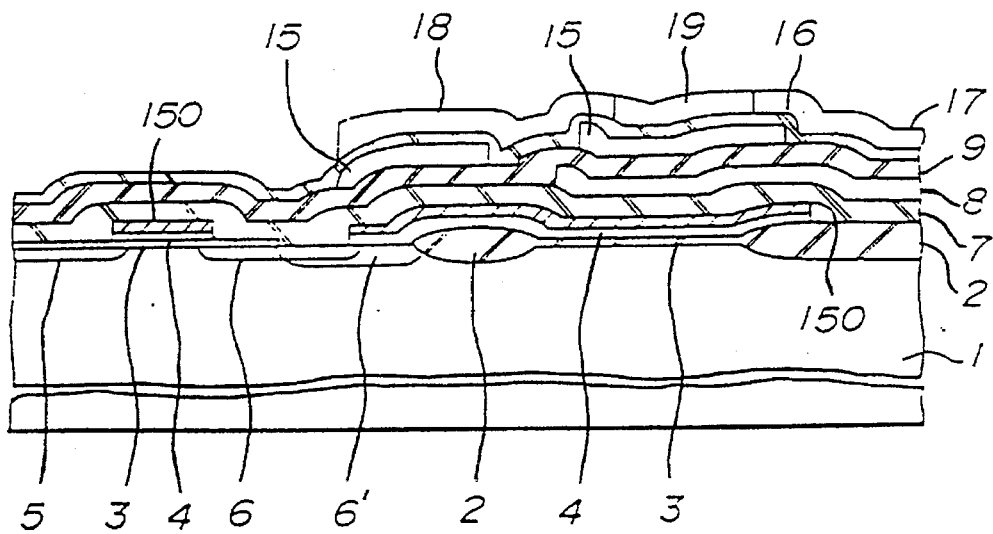
FIGS. 31A through 31D are side views in cross section showing an essential part of a sixteenth embodiment of the semiconductor memory device according to the present invention at essential stages of a sixteenth embodiment of the method of producing the semiconductor memory device according to the present invention.

In FIG. 31A, a double gate structure TFT load type SRAM includes a Si semiconductor substrate 1, a field insulator layer 2 formed on the Si semiconductor substrate 1, a gate insulator layer 3, a gate electrode 4 of the driver transistor which is made up of the first polysilicon layer and a WSi layer 150 (second conductor layer), an n$^+$-type source region 5, an n$^+$-type drain region 6, an n$^+$-type diffusion region 6', an insulator layer 7, a ground line 8 which is made up of the second polysilicon layer, a lower gate electrode 15 of the TFT, and a gate insulator layer 16 of the TFT.

A CVD is carried out to form a fourth polysilicon layer which has a thickness of 200 Å, for example.

A resist process of the photolithography technique and an ion implantation are carried out to inject B ions with a dosage of 1×10$^{14}$ cm$^{-2}$ and an acceleration energy of 5 keV into parts where source and drain regions of the TFT are formed.

A resist process of the photolithography technique and a RIE using CCl$_4$/O$_2$ as the etching gas are carried out to pattern the fourth polysilicon layer and to form a source region 17, a drain region 18 and a channel region 19 of the TFT and a Vcc supply line. The Vcc supply cannot be seen in FIG. 13A.

Figure 31B:
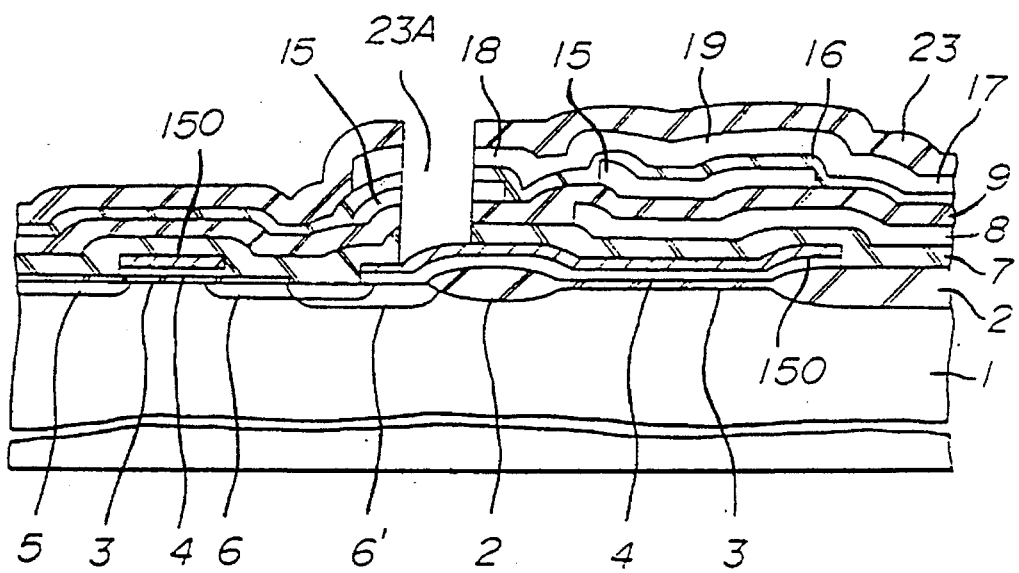

In FIG. 31B, a CVD is carried out to form an insulator layer 23 which is made of SiO$_2$ and has a thickness of 500 Å, for example.

A resist process of the photolithography technique and RIEs using CHF$_3$/He and HBr/Ar as the etching gases for respectively etching SiO$_2$ and polysilicon are carried out to selectively etch the insulator layer 23, the drain region 18 of the TFT formed from the fourth polysilicon layer, the gate insulator layer 16, the gate electrode 15 which is formed from the third polysilicon layer, the insulator layer 9 and the insulator layer 7, and to form a contact hole 23A. This contact hole 23A extends from the surface of the insulator layer 23 and reaches the gate electrode 4 of the driver transistor. The gate electrode 4 is made up of the WSi layer 150 and the first polysilicon layer. This process forms an essential part of this embodiment.

Figure 31C:
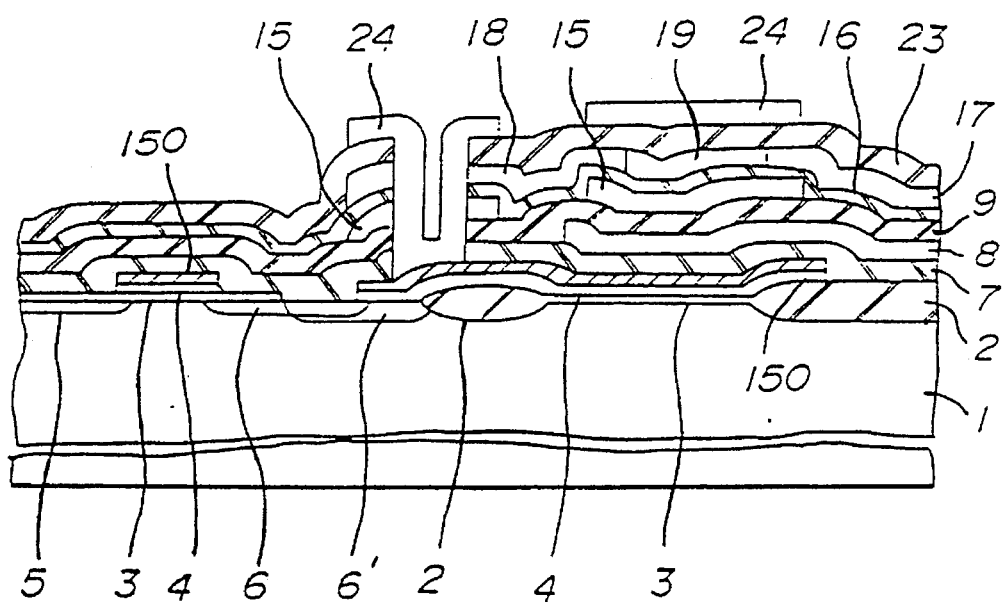

In FIG. 31C, a CVD is carried out to form a fifth polysilicon layer which has a thickness of 500 Å, for example.

Then, a thermal diffusion is carried out to diffuse P into the fifth polysilicon layer with an impurity concentration of 1×10$^{21}$ cm$^{-3}$, for example.

A resist process of the photolithography technique and a RIE using CCl$_4$/O$_2$ as the etching gas are carried out to pattern the fifth polysilicon layer and to form an upper gate electrode 24 of the TFT.

Figure 31D:
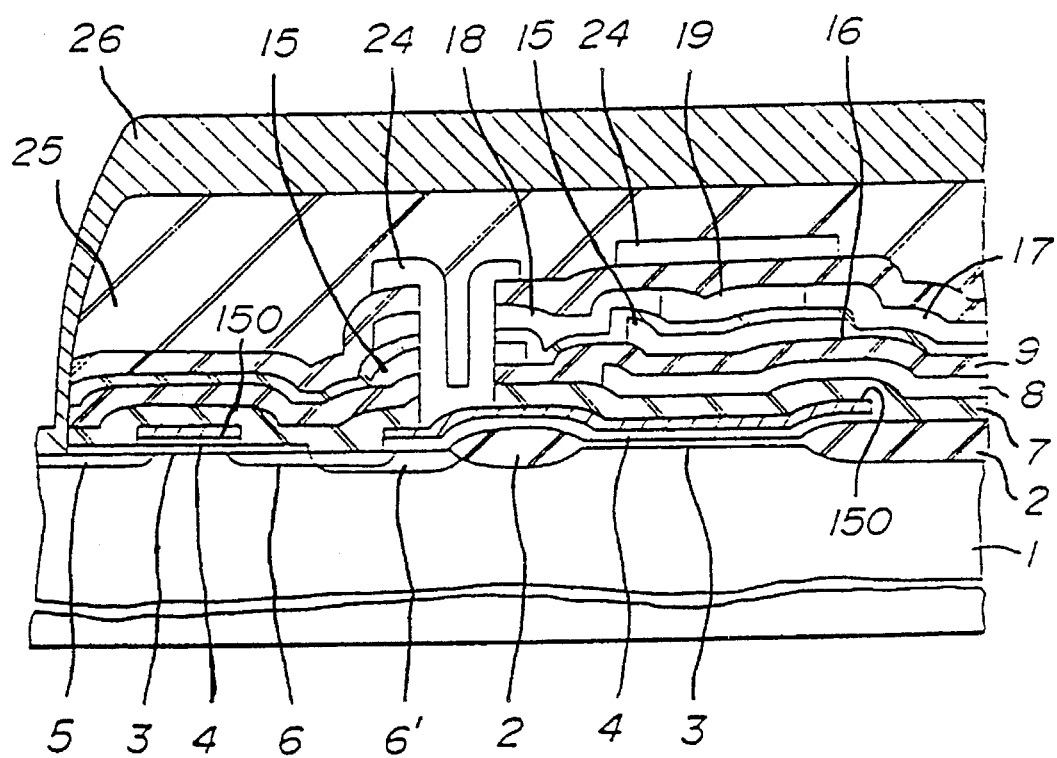

In FIG. 31D, a CVD is carried out to form an insulator layer which is made of SiO$_2$ and has a thickness of 1000 Å, for example, and an insulator layer which is made of PSG and has a thickness of 5000 Å, for example. In FIG. 31D, these two insulator layers are shown as one insulator layer 25.

Thereafter, a thermal process is carried out to reflow and planarize the insulator layer 25.

A resist process of the photolithography technique and a RIE using CHF$_3$/He as the etching gas are carried out to selectively etch the insulator layer 25 and the like and to form a bit line contact hole.

Next, a sputtering is carried out to form an Al layer having a thickness of 1 μm, for example, and this Al layer is patterned using the normal photolithography technique so as to form a bit line 26.

In this embodiment, the concept shown in FIGS. 29A through 29F is applied to the double gate structure TFT load type SRAM. When forming the contact hole for achieving the necessary contact, there is no possibility of the underlayer and the substrate from becoming damaged and the characteristic of the memory cell from deteriorating even when the over-etching is carried out to generate no etching residue within the contact hole. Compared to the prior art method described with reference to FIGS. 7A through 7C, the number of mask processes which are required to achieve the above described contact in this embodiment is reduced by two.

From the fifteenth and sixteenth embodiments described above, it is apparent to those skilled in the art that the concept of the fifteenth embodiment may be applied to each of the first through thirteenth embodiments described above. In other words, the ideal shape of the contact hole can be guaranteed by providing the conductor layer which is made of the refractory metal or refractory metal silicide.

Moreover, the present invention may be applied to a lightly doped drain (LDD) transistor, a polycide interconnection (polysilicon and metal silicide stacked layer) and the like.

Further, the present invention is not limited to these embodiments, but various variations and modifications may be made without departing from the scope of the present invention.

What is claimed is:

1. A method of producing a a memory cell on a semiconductor substrate, the memory cell including two transfer transistors, two driver transistors, two thin film transistor loads, and two memory capacitors, said method comprising:

forming a field insulator layer substrate;

forming a gate insulator layer above the field insulator layer;

forming a gate electrode of a respective driver transistor by forming and patterning a first conductor layer above the gate insulator layer;

forming impurity regions in the semiconductor substrate using the field insulator layer and the first conductor layer as masks;

forming a first insulator layer after forming the impurity regions;

forming source, drain and channel regions of a respective thin film transistor load by forming a second conductor layer and selectively injecting impurities into the second conductor layer;

patterning the second conductor layer;

forming a second insulator layer above the second conductor layer;

forming a contact hole which extends from the second insulator layer, through the second conductor layer, and to the first conductor layer;

forming a storage electrode of a respective memory capacitor by forming and patterning a third conductor layer which makes contact with the first conductor layer and the second conductor layer through the contact hole; and successively forming a dielectric layer covering the storage electrode of the memory capacitor and a fourth conductor layer forming an opposing electrode of the memory capacitor.

2. The method of producing the semiconductor memory device as claimed in claim 1, wherein said step of forming the second insulator layer comprises successively stacking a spacer insulator layer and at least one conductive fin on the second conductor layer, said step of forming the contact hole comprises forming the contact hole to penetrate the spacer insulator layer and the conductive fin, and said step of forming the storage electrode comprises removing the spacer insulator layer using the second insulator layer as an etching stopper.

3. The method of producing the semiconductor memory device as claimed in claim 2, wherein said step of forming the second insulator layer comprises successively and alternately forming spacer insulator layers and conductive fins, and said step of forming a storage electrode comprises simultaneously patterning the spacer insulator layers and the conductive fins to form the storage electrode.

4. The method of producing the semiconductor memory device as claimed in claim 2, wherein said step of successively forming the dielectric layer comprises simultaneously patterning the second insulator layer to form the opposing electrode.

5. The method of producing the semiconductor memory device as claimed in claim 1, wherein said step of forming the storage electrode comprises forming conductive fins sequentially stacked above each other to allow a lowermost one of the conductive fins to function as the storage electrode of the memory capacitor and as an upper gate electrode of a respective thin film transistor load.

6. The method of producing the semiconductor memory device as claimed in claim 1, wherein said step of forming the storage electrode comprises forming the storage electrode to allow the storage electrode to function as an upper gate electrode of a respective thin film transistor load.

7. The method of producing the semiconductor memory device as claimed in claim 1, wherein said step of forming the gate electrode of the driver transistor comprises forming the first conductor layer by forming a first layer made of a conductive material; and forming a second layer made of a conductive material on the first layer, said second layer being made of a material selected from a group consisting of refractory metals and refractory metal silicides.

8. A method of producing a memory cell on a semiconductor substrate, the memory cell including two transfer transistors, two driver transistors, two thin film transistor loads, and two memory capacitors, said method comprising:

forming a field insulator layer on the semiconductor substrate;

forming a gate insulator layer above the field insulator layer;

forming a gate electrode of a respective driver transistor by forming and patterning a first conductor layer above the gate insulator layer;

forming impurity regions in the semiconductor substrate using the field insulator layer and the first conductor layer as masks;

forming a first insulator layer after forming the impurity regions;

forming source, drain and channel regions of a respective thin film transistor load by forming a second conductor layer and selectively injecting impurities into the second conductor layer;

patterning the second conductor layer.;

forming an upper gate insulator layer of the respective thin film transistor load above the second conductor layer by forming a second insulator layer after patterning the second conductor layer;

forming a third conductor layer above the upper gate insulator layer;

forming a third insulator layer above the third conductor layer;

forming a contact hole which extends from the third insulator layer, through the third conductor layer and the second conductor layer, and reaches the first conductor layer;

(h) forming a storage electrode of the memory capacitor by forming a fourth conductor layer which makes contact with the first conductor layer, the second conductor layer and the third conductor layer through the contact hole;

patterning the fourth conductor layer, the third insulator layer and the third conductor layer, the patterned fourth conductor layer forming a fin of the memory capacitor and an upper gate electrode of a respective thin film transistor load, the patterned third insulator layer forming a spacer of the memory capacitor between the storage electrode of the memory capacitor and the upper gate electrode;

removing the third insulator layer; and successively forming a dielectric layer covering the storage electrode of the memory capacitor and a fifth conductor layer forming an opposing electrode of the memory capacitor, said opposing electrode also functioning as a ground line.

9. The method of producing the semiconductor memory device as claimed in claim 8, wherein said step of forming the storage electrode comprises simultaneously patterning the fourth conductor layer, the third insulator layer and the third conductor layer to form the storage electrode of the memory capacitor.

10. The method of producing the semiconductor memory device as claimed in claim 8, wherein said step of removing the third insulator layer comprises using the second insulator layer as an etching stopper when removing the third insulator layer.

11. The method of producing the semiconductor memory device as claimed in claim 10, wherein said step of removing the third insulator layer further comprises using a silicon nitride ($Si_3N_4$) layer as the second insulator layer.

12. The method of producing the semiconductor memory device as claimed in claim 8, wherein said step of forming the third insulator layer comprises successively forming a silicon nitride ($Si_3N_4$) layer and a spacer insulator layer as the third insulator layer, said silicon nitride ($Si_3N_4$) layer functioning as an etching stopper when forming the storage electrode of the memory capacitor.

13. The method of producing the semiconductor memory device as claimed in claim 8, wherein said step of forming a gate electrode of the driver transistor comprises forming the first conductor layer by forming a first layer made of a conductive material; and forming a second layer made of a conductive material on the first layer, said second layer being made of a material selected from a group consisting of refractory metals and refractory metal silicides.

14. A method of producing a a memory cell on a semiconductor substrate, the memory cell including two transfer transistors, two driver transistors, two thin film transistor loads, and two memory capacitors, said method comprising:

forming a field insulator layer on the semiconductor substrate;

forming a gate insulator layer above the field insulator layer;

forming a gate electrode of a respective driver transistor by forming and patterning a first conductor layer above the gate insulator layer;

forming impurity regions in the semiconductor substrate using the field insulator layer and the first conductor layer as masks;

forming a first insulator layer after forming the impurity regions;

forming a lower gate electrode of a respective thin film transistor load by forming and patterning a second conductor layer above the first insulator layer;

forming a lower gate insulator layer of the respective thin film transistor load by forming a second insulator layer above the second conductor layer;

forming source, drain and channel regions of the respective thin film transistor load by forming a third conductor layer above the lower gate insulator layer and selectively injecting impurities into the third conductor layer;

patterning the third conductor layer;

forming a third insulator layer above the third conductor layer;

forming a fourth conductor layer above the third insulator layer;

forming a fourth insulator layer above the fourth conductor layer;

forming a contact hole which extends from the fourth insulator layer, through the third conductor layer and the second conductor layer and reaches the first conductor layer;

forming a storage electrode of the memory capacitor by forming a fifth conductor layer which makes contact with the first conductor layer, the second conductor layer, the third layer and the fourth conductor layer through the contact hole;

patterning the fifth conductor layer, the fourth insulator layer and the fourth conductor layer, the patterned fifth and fourth conductor layers forming fins of the memory capacitor, the patterned fourth insulator layer forming a spacer of the memory capacitor between the storage electrode of the memory capacitor and the upper gate electrode of the respective thin film transistor load;

removing the fourth insulator layer; and successively forming a dielectric layer covering the storage electrode of the memory capacitor and a sixth conductor layer forming an opposing electrode of the memory capacitor, said opposing electrode also functioning as a shield electrode of the thin film transistor load.

15. The method of producing the semiconductor memory device as claimed in claim 14, wherein said step of forming the storage electrode comprises simultaneously patterning the fifth conductor layer, the fourth insulator layer and the fourth conductor layer to form the storage electrode of the memory capacitor.

16. The method of producing the semiconductor memory device as claimed in claim 14, wherein said step (j) of removing the fourth insulator layer comprises using the third insulator layer as an etching stopper when removing the fourth insulator layer.

17. The method of producing the semiconductor memory device as claimed in claim 15, wherein said step of forming the storage electrode comprises using a silicon nitride ($Si_3N_4$) layer as the third insulator layer.

18. The method of producing the semiconductor memory device as claimed in claim 14, wherein said step of forming the gate electrode of the driver transistor comprises forming the first conductor layer by forming a first layer made of a conductive material; and forming a second layer made of a conductive material on the first layer, said second layer being made of a material selected from a group consisting of refractory metals and refractory metal silicides.

* * * * *

UNITED STATES PATENT AND TRADEMARK OFFICE
CERTIFICATE OF CORRECTION

PATENT NO. : 5,514,615
DATED : May 7, 1996
INVENTOR(S) : Taiji EMA et al.

It is certified that error appears in the above-indentified patent and that said Letters Patent is hereby corrected as shown below:

Column 2, line 64, after "described, insert a comma (",").
Column 6, line 26, after "$cm^{-2}$", insert a comma (",");
    Line 27, after "example", insert a period (".");
    Line 39, delete "fellow" and insert therefor --reflow--.
Column 8, line 10, delete "and".
Column 14, lines 5 and 20, delete "A" and insert therefor --a--.
Column 16, line 6, delete "fellow" and insert therefor --reflow--.
Column 22, line 10, after "removed", insert a period (".");
    Line 17, after "58", insert a comma (",");
    Line 52, delete "fellow" and insert therefor --reflow--.
Column 38, line 57, after "example", insert a period (".").
Column 40, line 40, delete "SrAM" and insert therefor --SRAM--;
Column 43, line 44, delete "descried" and insert therefore --described--.

Column 45, line 51, delete "descried" and insert therefor
    --described--.
Column 47, line 19, after "layer", insert --on the semiconductor--.
Column 48, line 65, delete "(h)".
Column 50, line 49, delete "(j)";
    Line 64, delete "consisting of" and insert therefor
        --comprising--.

Signed and Sealed this

Twenty-second Day of October, 1996

*Attest:*

BRUCE LEHMAN

*Attesting Officer*     *Commissioner of Patents and Trademarks*